(12) United States Patent
Oh et al.

(10) Patent No.: US 10,075,188 B2
(45) Date of Patent: Sep. 11, 2018

(54) BROADCASTING RECEIVER AND BROADCAST SIGNAL PROCESSING METHOD

(71) Applicant: LG ELECTRONICS INC., Seoul (KR)

(72) Inventors: Hyen O Oh, Goyang-si (KR); In Hwan Choi, Gwacheon-si (KR); Kook Yeon Kwak, Anyang-si (KR); Byoung Gill Kim, Seoul (KR); Won Gyu Song, Seoul (KR); Jin Woo Kim, Seoul (KR); Hyoung Gon Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/407,711

(22) Filed: Jan. 17, 2017

(65) Prior Publication Data

US 2017/0134052 A1    May 11, 2017

Related U.S. Application Data

(63) Continuation of application No. 14/600,889, filed on Jan. 20, 2015, now Pat. No. 9,584,258, which is a (Continued)

(30) Foreign Application Priority Data

Jul. 1, 2008 (KR) .................. 10-2008-0063684

(51) Int. Cl.
*H03M 13/27* (2006.01)
*H04N 21/434* (2011.01)
(Continued)

(52) U.S. Cl.
CPC ... *H03M 13/2792* (2013.01); *H03M 13/2906* (2013.01); *H04H 20/71* (2013.01);
(Continued)

(58) Field of Classification Search
CPC .......... H03M 13/2792; H03M 13/2906; H04L 1/0071; H04L 1/0041; H04N 21/2365;
(Continued)

(56) References Cited

U.S. PATENT DOCUMENTS 5,867,503 A    2/1999 Ohsuga et al.
6,038,275 A    3/2000 Taura et al.
(Continued)

FOREIGN PATENT DOCUMENTS

EP    1211822    6/2002
EP    1689103    8/2006
(Continued)

OTHER PUBLICATIONS

Korean Intellectual Property Office Application Number 10-2008-0063684, Notice of Allowance dated Nov. 19, 2014, 2 pages.
(Continued)

*Primary Examiner* — Edan Orgad
*Assistant Examiner* — Ivan O LaTorre
(74) *Attorney, Agent, or Firm* — Dentons US LLP

(57) ABSTRACT

A digital broadcasting system which is robust against an error when mobile service data is transmitted and a method of processing data are disclosed. The mobile service data is subjected to an additional coding process and the coded mobile service data is transmitted. Accordingly, it is possible to cope with a serious channel variation while applying robustness to the mobile service data.

10 Claims, 82 Drawing Sheets

Related U.S. Application Data continuation of application No. 13/185,090, filed on Jul. 18, 2011, now Pat. No. 8,982,869, which is a continuation of application No. 12/167,232, filed on Jul. 2, 2008, now Pat. No. 8,014,332.

(60) Provisional application No. 60/947,447, filed on Jul. 2, 2007, provisional application No. 60/957,714, filed on Aug. 24, 2007, provisional application No. 60/974,084, filed on Sep. 21, 2007.

(51) Int. Cl.

| | | |
|---|---|---|
| *H04N 21/2365* | (2011.01) | |
| *H04N 21/438* | (2011.01) | |
| *H04N 19/44* | (2014.01) | |
| *H04N 19/42* | (2014.01) | |
| *H04N 19/89* | (2014.01) | |
| *H04H 20/71* | (2008.01) | |
| *H04L 1/00* | (2006.01) | |
| *H03M 13/29* | (2006.01) | |

(52) U.S. Cl.
CPC .......... *H04L 1/0041* (2013.01); *H04L 1/0071* (2013.01); *H04N 19/42* (2014.11); *H04N 19/44* (2014.11); *H04N 19/89* (2014.11); *H04N 21/2365* (2013.01); *H04N 21/4347* (2013.01); *H04N 21/4382* (2013.01)

(58) Field of Classification Search
CPC .... H04N 21/4347; H04N 19/89; H04N 19/44; H04N 19/42; H04N 21/4382; H04H 20/71
See application file for complete search history.

(56) References Cited

U.S. PATENT DOCUMENTS

| | | | |
|---|---|---|---|
| 6,049,651 A | 4/2000 | Oshima | |
| 6,211,800 B1 | 4/2001 | Yanagihara et al. | |
| 6,301,265 B1 | 10/2001 | Kleider et al. | |
| 6,317,462 B1* | 11/2001 | Boyce .............. | H04N 21/2381 375/240.27 |
| 6,373,534 B1 | 4/2002 | Yasuki et al. | |
| 6,373,634 B1 | 4/2002 | Seijiro et al. | |
| 6,512,759 B1 | 1/2003 | Hashimoto et al. | |
| 6,686,880 B1 | 2/2004 | Marko et al. | |
| 6,810,084 B1 | 10/2004 | Jun et al. | |
| 6,931,198 B1 | 8/2005 | Ichiro et al. | |
| 6,975,689 B1 | 12/2005 | McDonald et al. | |
| 6,985,537 B1 | 1/2006 | Milbar et al. | |
| 7,088,697 B1 | 8/2006 | Benz et al. | |
| 7,096,484 B2 | 8/2006 | Mao et al. | |
| 7,151,575 B1 | 12/2006 | Landry et al. | |
| 7,609,768 B2 | 10/2009 | Chung | |
| 7,668,264 B2 | 2/2010 | Park et al. | |
| 8,711,947 B2 | 4/2014 | Park et al. | |
| 2001/0034867 A1 | 10/2001 | Jaffe et al. | |
| 2002/0184038 A1 | 12/2002 | Costello et al. | |
| 2002/0194570 A1 | 12/2002 | Birru et al. | |
| 2003/0156594 A1 | 8/2003 | Trott et al. | |
| 2004/0090997 A1 | 5/2004 | Choi et al. | |
| 2004/0101046 A1* | 5/2004 | Yang ............... | H03M 13/15 375/240.08 |
| 2005/0024543 A1 | 2/2005 | Ramaswamy | |
| 2005/0030887 A1* | 2/2005 | Jacobsen ............... | H04L 1/0002 370/208 |
| 2005/0055714 A1 | 3/2005 | Lee | |
| 2005/0149821 A1 | 7/2005 | Lee et al. | |
| 2006/0072623 A1* | 4/2006 | Park ............... | H04H 20/28 370/487 |
| 2006/0126757 A1 | 6/2006 | Choi et al. | |
| 2006/0128302 A1 | 6/2006 | van Rooyen et al. | |
| 2006/0245488 A1 | 11/2006 | Puputti et al. | |
| 2006/0248563 A1* | 11/2006 | Lee ............... | H04H 20/33 725/117 |
| 2006/0268717 A1 | 11/2006 | Kanterakis | |
| 2007/0040937 A1 | 2/2007 | Eum | |
| 2007/0070179 A1* | 3/2007 | van Rooyen .... | H04N 21/41407 348/14.02 |
| 2007/0076721 A1 | 4/2007 | Kim et al. | |
| 2007/0076829 A1 | 4/2007 | Choi et al. | |
| 2007/0081595 A1* | 4/2007 | Choi ............... | H04B 1/68 375/240.26 |
| 2007/0086488 A1* | 4/2007 | Kim ............... | H04H 20/55 370/503 |
| 2007/0091857 A1 | 4/2007 | Elstermann | |
| 2007/0093943 A1 | 4/2007 | Nelson et al. | |
| 2007/0121681 A1* | 5/2007 | Kang ............... | H04N 21/234327 370/535 |
| 2007/0147432 A1 | 6/2007 | Kang et al. | |
| 2007/0237184 A1 | 10/2007 | Park et al. | |
| 2008/0008175 A1 | 1/2008 | Park | |
| 2008/0199021 A1 | 8/2008 | Park | |
| 2009/0040997 A1 | 2/2009 | Oh et al. | |
| 2009/0067542 A1* | 3/2009 | Haartsen .......... | H03M 13/3761 375/298 |
| 2010/0122310 A1 | 5/2010 | Chozui | |
| 2011/0280260 A1 | 11/2011 | Oh et al. | |

FOREIGN PATENT DOCUMENTS

| | | |
|---|---|---|
| JP | 11261906 | 9/1999 |
| JP | 2003101812 | 4/2003 |
| JP | 2004-140811 | 5/2004 |
| JP | 2005045819 | 2/2005 |
| JP | 2005094354 | 4/2005 |
| JP | 2007-010368 | 1/2007 |
| JP | 2007-096403 | 4/2007 |
| KR | 102003078354 | 10/2003 |
| KR | 10-2004-0074345 | 8/2004 |
| KR | 10-0466237 | 1/2005 |
| KR | 10-2005-0065898 | 6/2005 |
| KR | 10-2005-0121504 | 12/2005 |
| KR | 10-0565099 | 3/2006 |
| KR | 100565089 | 3/2006 |
| KR | 10-2006-0062464 | 6/2006 |
| KR | 10-2006-0063258 | 6/2006 |
| KR | 1020060072573 | 6/2006 |
| KR | 10-2006-0088622 | 8/2006 |
| KR | 1020060112499 | 11/2006 |
| KR | 10-0661005 | 12/2006 |
| KR | 10-2007-0021462 | 2/2007 |
| KR | 10-2007-0032558 | 3/2007 |
| KR | 10-2007-0040696 | 4/2007 |
| KR | 10-2007-0043587 | 4/2007 |
| KR | 10-0724891 | 5/2007 |
| KR | 10-2007-0073568 | 7/2007 |
| KR | 10-2007-0091962 | 9/2007 |
| KR | 10-2008-0079059 | 8/2008 |
| KR | 10-1328949 | 11/2013 |
| WO | 00-44145 | 7/2000 |
| WO | 00-45552 | 8/2000 |
| WO | 2004107619 | 12/2004 |
| WO | 2005045603 | 5/2005 |
| WO | 2006/028337 | 3/2006 |
| WO | 2006-001635 | 4/2006 |
| WO | 2006037925 | 4/2006 |
| WO | 06/065071 | 6/2006 |
| WO | 2007021157 | 2/2007 |
| WO | 2007/068294 | 6/2007 |

OTHER PUBLICATIONS

Uehara, M. et al: "Transmission Scheme for the Terrestrial ISDB System." IEEE Transaction on Consumer Electronics. Feb. 1999, vol. 45, No. 1, pp. 101-106.

* cited by examiner (187+P, 187)
RS encode
column-by-column

Add 2-byte CRC
checksum
row-by-row

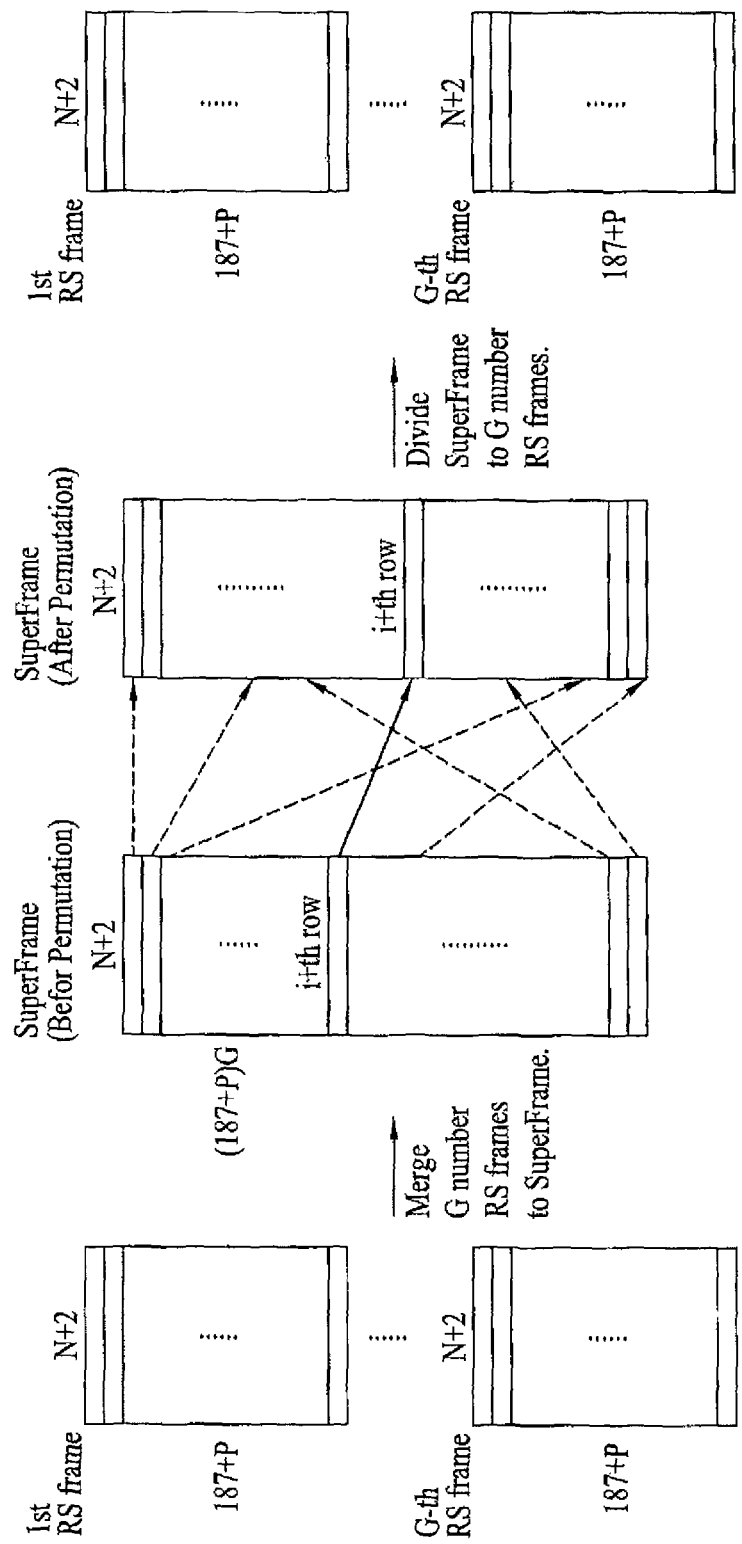

FIG. 26

| i | 0 | 1 | 2 | 3 | 4 | 5 | 6 | 7 | 8 | 9 | 10 | 11 | 12 | 13 | 14 | 15 | ... | 2110 | 2111 |
|---|---|---|---|---|---|---|---|---|---|---|---|---|---|---|---|---|---|---|---|
| P'(i) | 0 | 89 | 267 | 534 | 890 | 1335 | 1869 | 2492 | 3204 | 4005 | 799 | 1778 | 2846 | 4003 | 1153 | 2488 | ... | 2809 | 2272 |
| P(i) | 0 | 89 | 267 | 534 | 890 | 1335 | 1869 | 799 | 1778 | 1153 | 1329 | 526 | 79 | 2037 | 253 | 874 | ... | 444 | 2048 |

FIG. 31

| Syntax | No. of bits | Format |
|---|---|---|
| TPC_data { | | |
|   Sub-Frame_number | 3 | uimsbf |
|   Slot_number | 4 | uimsbf |
|   Parade_id | 7 | uimsbf |
|   starting_Group_number | 4 | uimsbf |
|   number_of_Groups | 3 | uimsbf |
|   Parade_repetition_cycle | 3 | uimsbf |
|   RS_Frame_mode | 2 | bslbf |
|   RS_code_mode_primary | 2 | bslbf |
|   RS_code_mode_secondary | 2 | bslbf |
|   SCCC_Block_mode | 2 | bslbf |
|   SCCC_outer_code_mode_A | 2 | bslbf |
|   SCCC_outer_code_mode_B | 2 | bslbf |
|   SCCC_outer_code_mode_C | 2 | bslbf |
|   SCCC_outer_code_mode_D | 2 | bslbf |
|   FIC_version | 5 | uimsbf |
|   Parade_continuity_counter | 4 | uimsbf |
|   TNoG | 5 | uimsbf |
|   reserved | 26 | bslbf |
| } | | |

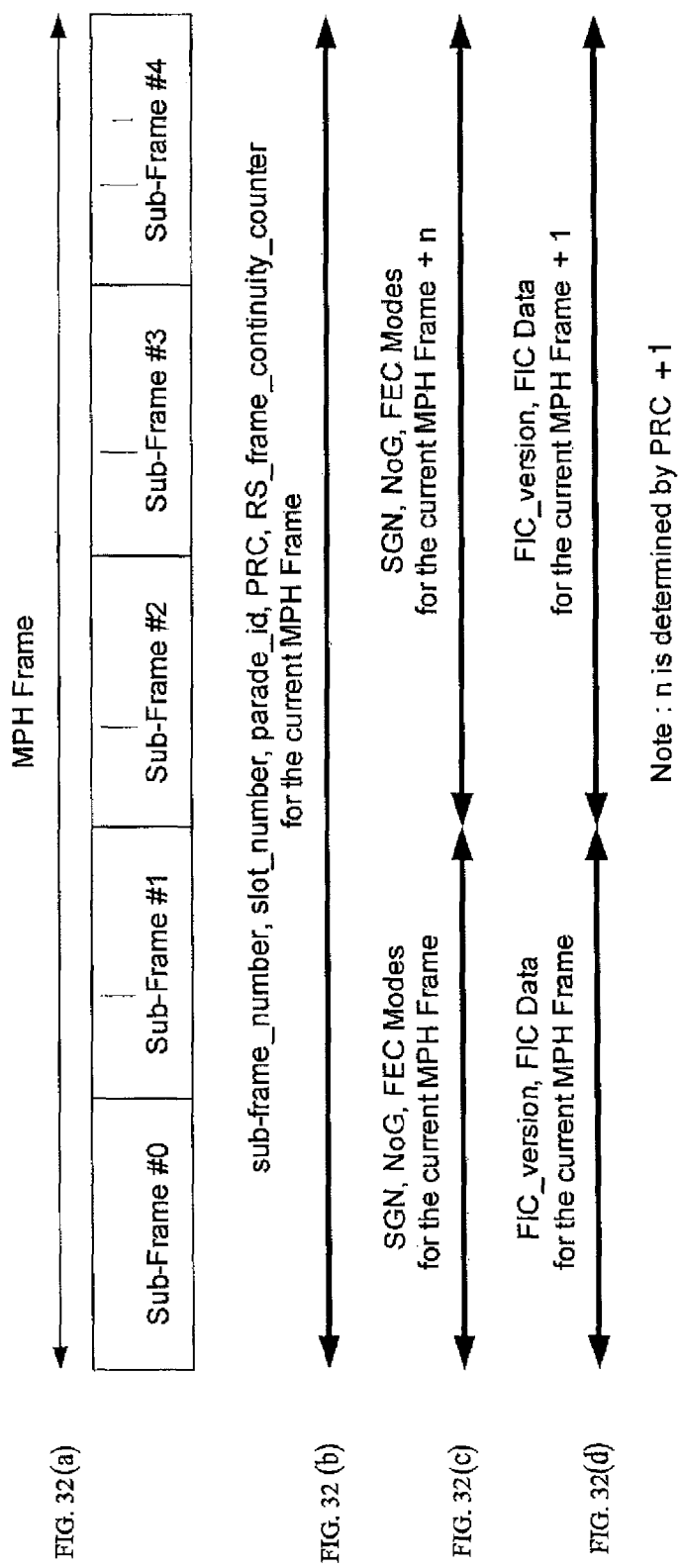

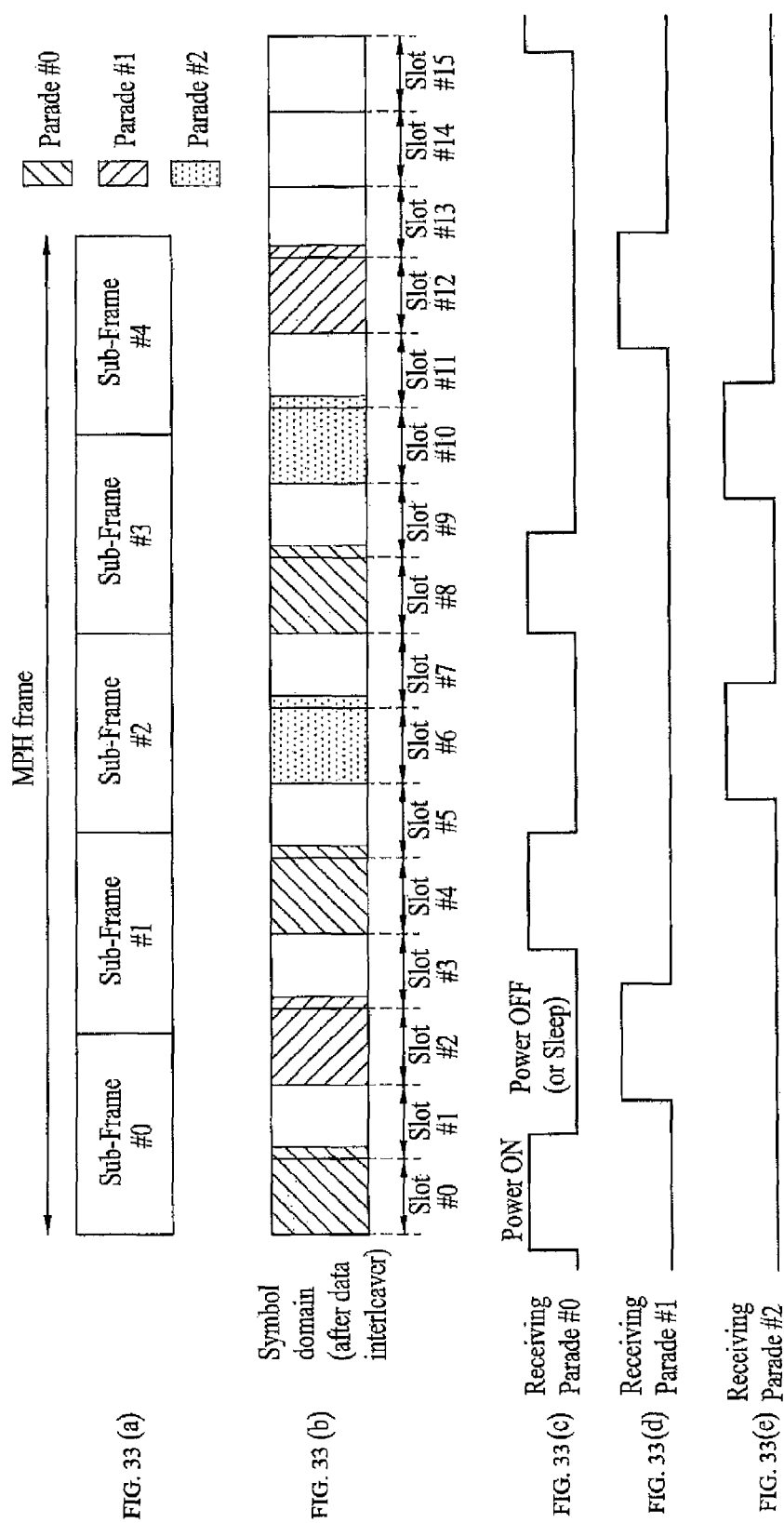

FIG. 43
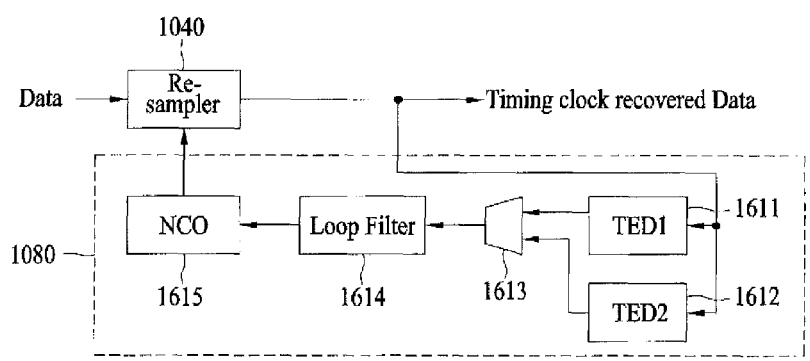
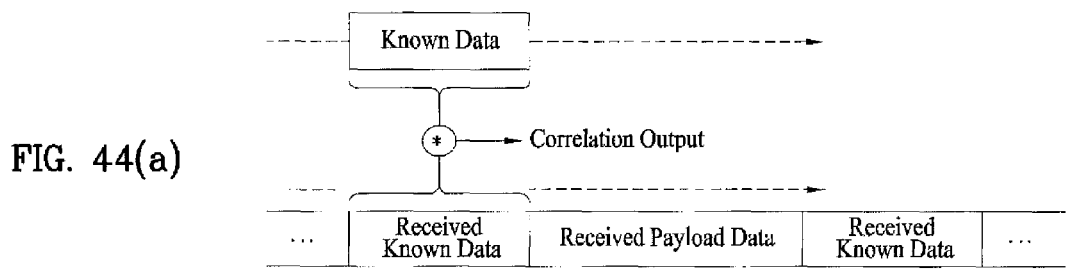
FIG. 44(a)
FIG. 44(b)

FIG. 67

| Syntax | No. of Bits | Format |
|---|---|---|
| virtual_channel_table_section(){ | | |
| table_id | 8 | 0xC8 |
| section_syntax_indicator | 1 | '1' |
| Private_indicator | 1 | '1' |
| reserved | 2 | '11' |
| section_length | 12 | uimsbf |
| transport_stream_id | 16 | uimsbf |
| reserved | 2 | '11' |
| version_number | 5 | uimsbf |
| current_next_indicator | 1 | bslbf |
| section_number | 8 | uimsbf |
| last_section_number | 8 | uimsbf |
| protocol_version | 8 | uimsbf |
| num_channels_in_section | 8 | uimsbf |
| for(i=0;i<num_channels_in_section;i++){ | | |
| short_name | 7*16 | uimsbf |
| reserved | 4 | '1111' |
| major_channel_number | 10 | uimsbf |
| minor_channel_number | 10 | uimsbf |
| modulation_mode | 8 | uimsbf |
| carrier_frequency | 32 | uimsbf |
| channel_TSID | 16 | uimsbf |
| program_number | 16 | uimsbf |
| ETM_location | 2 | uimsbf |
| access_controlled | 1 | bslbf |
| hidden | 1 | bslb |
| reserved | 6 | '111111' |
| service_type | 6 | uimsbf |
| source_id | 16 | uimsbf |
| reserved | 6 | '111111' |
| descriptors_length | 10 | uimsbf |
| for(i=0;i<N;i++){ | | |
| descriptors() | | |
| } | | |
| } | | |
| reserved | 6 | '111111' |
| additional_descriptors_length | 10 | uimsbf |
| for(j=0;j<N;j++){ | | |
| additional_descriptors() | | |
| } | | |
| CRC_32 | 32 | rpchof |
| } | | |

FIG. 68

| service_type | Meaning |
|---|---|
| 0x00 | [Reserved] |
| 0x01 | analog_television --- The virtual channel carries analog television programming |
| 0x02 | ATSC_digital_television --- The virtual channel carries television programming (audio, video and optional associated data) conforming to ATSC standards |
| 0x03 | ATSC_audio --- The virtual channel carries audio programming (audio service and optional associated data) conforming to ATSC standards |
| 0x04 | ATSC_data_only_service --- The virtual channel carries a data service conforming to ATSC standards, but no video of stream_type 0x02 or audio of stream_type 0x81 |
| 0x05 | mobile_service |
| 0x06 - 0x3F | [Reserved for future ATSC use] |

FIG. 69

| Syntax | Bits | Format |
|---|---|---|
| service_location_descriptor() { | | |
| descriptor_tag | 8 | 0xA1 |
| descriptor_length | 8 | uimsbf |
| reserved | 3 | '111' |
| PCR_PID | 13 | uimsbf |
| number_elements | 8 | uimsbf |
| for(i=0; i<number_elements; i++) { | | |
| stream_type | 8 | uimsbf |
| reserved | 3 | '111' |
| elementary_PID | 13 | uimsbf |
| ISO_639_language_code | 8*3 | uimsbf |
| } | | |
| } | | |

FIG. 70

| Value | Description |
|---|---|
| 0x00 | ITU-T | ISO/IEC Reserved |
| 0x01 | ISO/IEC 11172 Video |
| 0x02 | ITU-T Rec. H.262 | ISO/IEC 13818-2 Video or ISO/IEC 11172-2 constrained parameter video stream |
| 0x03 | ISO/IEC 11172 Audio |
| 0x04 | ISO/IEC 13818-3 Audio |
| 0x05 | ITU-T Rec. H.222.0 | ISO/IEC 13818-1 private_sections |
| 0x06 | ITU-T Rec. H.222.0 | ISO/IEC 13818-1 PES packets containing private data |
| | ISO/IEC 13522 MHEG |
| 0x07 | ITU-T Rec. H.222.0 | ISO/IEC 13818-1 Annex A DSM CC |
| 0x08 | ITU-T Rec. H.222.1 |
| 0x09 | ISO/IEC 13818-6 type A |
| 0x0A | ISO/IEC 13818-6 type B |
| 0x0B | ISO/IEC 13818-6 type C |
| 0x0C | ISO/IEC 13818-6 type D |
| 0x0D | ISO/IEC 13818-1 auxiliary |
| 0x0E | MPH - video stream : Non-hierarchical mode |
| 0x0F | MPH - audio stream : Non-hierarchical mode |
| 0x10 | MPH - Non-A/V stream : Non-hierarchical mode |
| 0x11 | MPH - High Priority video stream : Hierarchical mode |
| 0x12 | MPH - High Priority audio stream : Hierarchical mode |
| 0x13 | MPH - Low Priority video stream : Hierarchical mode |
| 0x14 | MPH - Low priority audio stream : Hierarchical mode |
| 0x15 | ITU-T Rec. H.222.0 | ISO/IEC 13818-1 Reserved |
| 0x16~0x7F | User Private |
| 0x80~0xFF | |

FIG. 71

| Syntax | No. of Bits | Format |
|---|---|---|
| event_information_table_section(){ | | |
|    table_id | 8 | 0xCB |
|    section_syntax_indicator | 1 | '1' |
|    Private_indicator | 1 | '1' |
|    reserved | 2 | '11' |
|    section_length | 12 | uimsbf |
|    source_id | 16 | uimsbf |
|    reserved | 2 | '11' |
|    version_number | 5 | uimsbf |
|    current_next_indicator | 1 | '1' |
|    section_number | 8 | uimsbf |
|    last_section_number | 8 | uimsbf |
|    protocol_version | 8 | uimsbf |
|    num_events_in_section | 8 | uimsbf |
|    for(j=0;j<num_events_in_section;j++){ | | |
|       reserved | 2 | '11' |
|       event_id | 14 | uimsbf |
|       start_time | 32 | uimsbf |
|       reserved | 2 | '11' |
|       ETM_location | 2 | uimsbf |
|       length_in_seconds | 20 | uimsbf |
|       title_length | 8 | uimsbf |
|       title_text() | var | |
|       reserved | 4 | '1111' |
|       descriptors_length | 12 | |
|       for(i=0;i<N;i++){ | | |
|          descriptors() | | |
|       } | | |
|    } | | |
|    CRC_32 | 32 | rpchof |
| } | | |

BROADCASTING RECEIVER AND BROADCAST SIGNAL PROCESSING METHOD

This application claims the benefit of the Korean Patent Application No. 10-2008-0063684, filed on Jul. 1, 2008, which is hereby incorporated by reference as if fully set forth herein. Also, this application claims the benefit of U.S. Provisional Application No. 60/947,447, filed on Jul. 2, 2007, which is hereby incorporated by reference. This application also claims the benefit of U.S. Provisional Application No. 60/957,714, filed on Aug. 24, 2007, which is hereby incorporated by reference. This application also claims the benefit of U.S. Provisional Application No. 60/974,084, filed on Sep. 21, 2007, which is hereby incorporated by reference.

BACKGROUND OF THE INVENTION

Field of the Invention

The present invention relates to a digital broadcasting system, and more particularly, to a broadcasting receiver and a broadcast signal processing method.

Discussion of the Related Art

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to a digital broadcasting system and a data processing method that substantially obviate one or more problems due to limitations and disadvantages of the related art.

An object of the present invention is to provide a digital broadcasting system and a data processing method that are highly resistant to channel changes and noise.

Another object of the present invention is to provide a digital broadcasting system and a data processing method that can enhance the receiving performance of the receiving system by performing additional encoding on mobile service data and by transmitting the processed data to the receiving system.

A further object of the present invention is to provide a digital broadcasting system and a data processing method that can also enhance the receiving performance of the receiving system by inserting known data already known in accordance with a pre-agreement between the receiving system and the transmitting system in a predetermined region within a data region.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital broadcast transmitting system may include a service multiplexer and a transmitter. The service multiplexer may multiplex mobile service data and main service data at a predetermined coding rate and may transmit the multiplexed data to the transmitter. The transmitter may perform additional encoding on the mobile service data being transmitted from the service multiplexer. The transmitter may also group a plurality of additionally encoded mobile service data packets in order to form a data group. The transmitter may multiplex mobile service data packets including mobile service data and main service data packets including main service data in packet units and may transmit the multiplexed data packets to a digital broadcast receiving system.

Herein, the data group may be divided into a plurality of regions depending upon a degree of interference of the main service data. Also, a long known data sequence may be periodically inserted in regions without interference of the main service data. Also, a digital broadcast receiving system according to an embodiment of the present invention may be used for modulating and channel equalizing the known data sequence.

In another aspect of the present invention, A broadcasting receiver includes a receiver which receives a broadcast signal including mobile service data and main service data, in which the mobile service data is able to construct a data group, the data group is divided into several areas, N number of known data streams are inserted into some areas from among the several areas, and a transmission parameter is inserted between a first known data stream and a second known data stream from among the N number of known data streams; a transmission parameter detector for detecting the transmission parameter; a block decoder for performing block-unit symbol-decoding of the mobile service data contained in the received broadcast signal on the basis of the detected transmission parameter; and a decoder for extracting audio data and additional information from the symbol-decoded mobile service data, dequantizing the audio data, converting the dequantized audio data into a time-domain signal for each block according to a length of a block indicated by an identifier contained in the additional information, and restoring an audio signal. Herein the known data stream is linearly inserted into some areas of the several areas, and initialization data for initializing a memory contained in a Trellis encoder of a transmitter is located at a start part of the known data stream. And the mobile service data is able to construct a RS frame, in which the RS frame includes at least one data packet of the mobile service data, a RS parity generated on the basis of the at least one data packet, a CRC checksum generated on the basis of the at least one data packet and the RS parity.

Also, the audio data is converted from a time-domain signal to a frequency-domain signal on the basis of a block unit which has different lengths according to audio-signal characteristics.

Also, the decoder performs an overlapping process such that it converts the dequantized audio data into the time-domain signal.

Also, the decoder performs an inverse modified discrete cosine transform (IMDCT), and converts the dequantized audio data into the time-domain signal.

Also, the decoder performs an inverse polyphase filter-bank process, such that it converts the dequantized audio data into the time-domain signal.

Also, the decoder includes a demultiplexing and error check unit for extracting the audio data and the additional information from the symbol-decoded mobile service data; a Huffman decoding unit for dequantizing the audio data; a descaling unit for descaling the dequantized audio data; and an inverse modified discrete cosine transform (IMDCT) unit for converting the descaled audio data into the time-domain signal for each block according to a length of a block indicated by the identifier contained in the additional information.

In another aspect of the present invention, A method for processing a broadcast signal includes a) receiving a broadcast signal including mobile service data and main service data; b) detecting a transmission parameter from the broadcast signal; c) performing block-unit symbol-decoding of the mobile service data contained in the received broadcast signal on the basis of the detected transmission parameter; and d) extracting audio data and additional information from the symbol-decoded mobile service data, dequantizing the audio data, converting the dequantized audio data into a time-domain signal for each block according to a length of a block indicated by an identifier contained in the additional information, and restoring an audio signal, in which the mobile service data is able to construct a data group, the data group is divided into several areas, N number of known data streams are inserted into some areas from among the several areas, and a transmission parameter is inserted between a first known data stream and a second known data stream from among the N number of known data streams. Herein the known data stream is linearly inserted into some areas of the several areas, and initialization data for initializing a memory contained in a Trellis encoder of a transmitter is located at a start part of the known data stream. Herein the mobile service data is able to construct a RS frame, in which the RS frame includes at least one data packet of the mobile service data, a RS parity generated on the basis of the at least one data packet, a CRC checksum generated on the basis of the at least one data packet and the RS parity. And the audio data is converted from a time-domain signal to a frequency-domain signal on the basis of a block unit which has different lengths according to audio-signal characteristics.

Also, the restoring step of the audio signal performs an overlapping process the dequantized audio data is converted into the time-domain signal.

Also, the restoring step of the audio signal performs an inverse modified discrete cosine transform (IMDCT), and converts the dequantized audio data into the time-domain signal.

Also, the restoring step of the audio signal performs an inverse polyphase filterbank process, converts the dequantized audio data into the time-domain signal, and restores the audio signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 21(a), FIG. 21(b), FIG. 21(c), and FIG. 21(d) illustrates an example of performing a row permutation (or interleaving) process in super frame units according to the present invention;

FIG. 26 illustrates a symbol interleaver of the block processor of FIG. 24;

FIG. 31 illustrates an example of a syntax structure of TPC data according to the present invention;

FIGS. 32(a), 32(b), 32(c), and 32(d) illustrates an example of power saving of in a receiver when transmitting 3 parades to an MPH frame level according to the present invention;

FIGS. 33(a), 33(b), 33(c), 33(d), and 33(e) illustrates an example of a transmission scenario of the TPC data and the FIC data level according to the present invention;

FIG. 43 illustrates a second example of the timing recovery unit according to the present invention;

FIG. 44(a) and FIG. 44(b) illustrate examples of detecting timing error in a time domain;

FIG. 67 illustrates a bit stream syntax for a VCT according to the present invention;

FIG. 68 illustrates a service type field according to an embodiment of the present invention;

FIG. 69 illustrates a service location descriptor according to an embodiment of the present invention;

FIG. 70 illustrates examples that may be assigned to the stream type field according to the present invention;

FIG. 71 illustrates a bit stream syntax for an EIT according to the present invention.

DETAILED DESCRIPTION OF THE INVENTION

Figure 1:
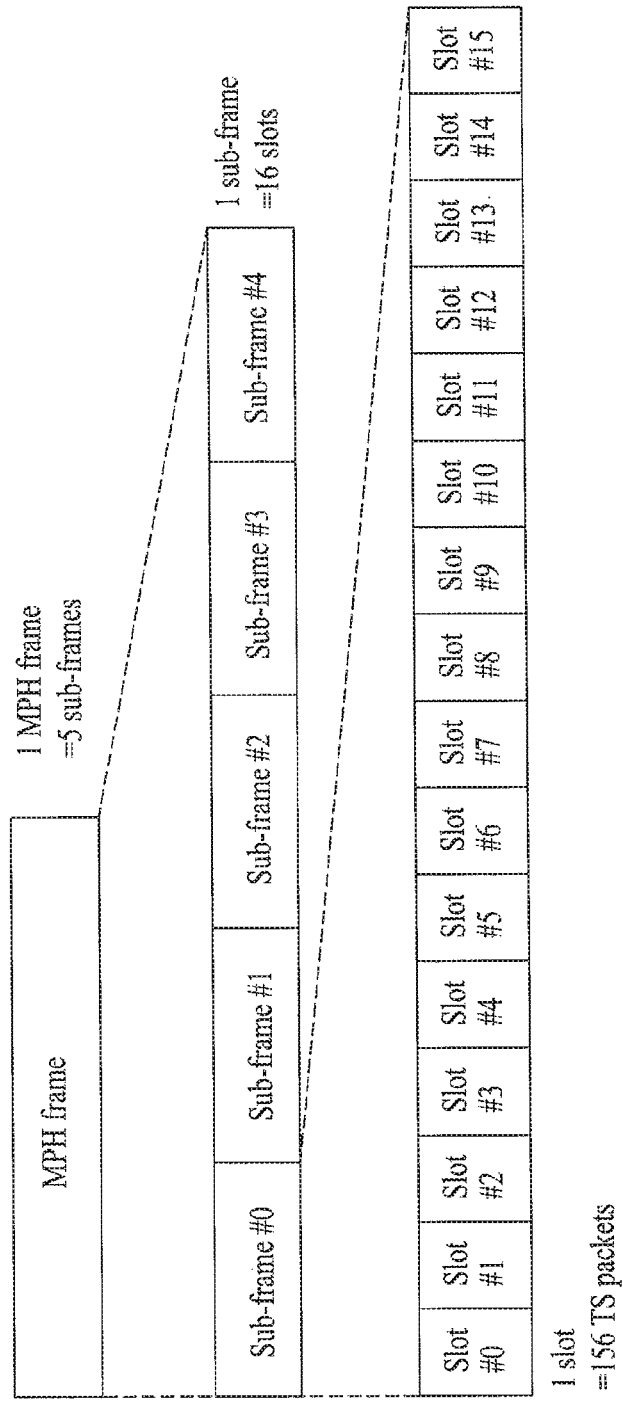
FIG. 1 illustrates a structure of a MPH frame for transmitting and receiving mobile service data according to the present invention.

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system. Additionally, among the terms used in the present invention, "MPH" corresponds to the initials of "mobile," "pedestrian," and "handheld" and represents the opposite concept of a fixed-type system. Furthermore, the MPH service data may include at least one of mobile service data, pedestrian service data, and handheld service data, and will also be referred to as "mobile service data" for simplicity. Herein, the mobile service data not only correspond to MPH service data but may also include any type of service data with mobile or portable characteristics. Therefore, the mobile service data according to the present invention are not limited only to the MPH service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above. In the present invention, the transmitting system provides backward compatibility in the main service data in order to be received by the conventional receiving system. Herein, the main service data and the mobile service data are multiplexed to the same physical channel and then transmitted.

Furthermore, the digital broadcast transmitting system according to the present invention performs additional encoding on the mobile service data and inserts the data already known by the receiving system and transmitting system (e.g., known data), thereby transmitting the processed data. Therefore, when using the transmitting system according to the present invention, the receiving system may receive the mobile service data during a mobile state and may also receive the mobile service data with stability despite various distortion and noise occurring within the channel.

MPH Frame Structure

In the embodiment of the present invention, the mobile service data are first multiplexed with main service data in MPH frame units and, then, modulated in a VSB mode and transmitted to the receiving system. At this point, one MPH frame consists of K1 number of sub-frames, wherein one sub-frame includes K2 number of slots. Also, each slot may be configured of K3 number of data packets. In the embodiment of the present invention, K1 will be set to 5, K2 will be set to 16, and K3 will be set to 156 (i.e., K1=5, K2=16, and K3=156). The values for K1, K2, and K3 presented in this embodiment either correspond to values according to a preferred embodiment or are merely exemplary. Therefore, the above-mentioned values will not limit the scope of the present invention.

FIG. 1 illustrates a structure of a MPH frame for transmitting and receiving mobile service data according to the present invention. In the example shown in FIG. 1, one MPH frame consists of 5 sub-frames, wherein each sub-frame includes 16 slots. In this case, the MPH frame according to the present invention includes 5 sub-frames and 80 slots. Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of data as a data segment, a data packet prior to being interleaved may also be used as a data segment. At this point, two VSB fields are grouped to form a VSB frame.

Figure 2:
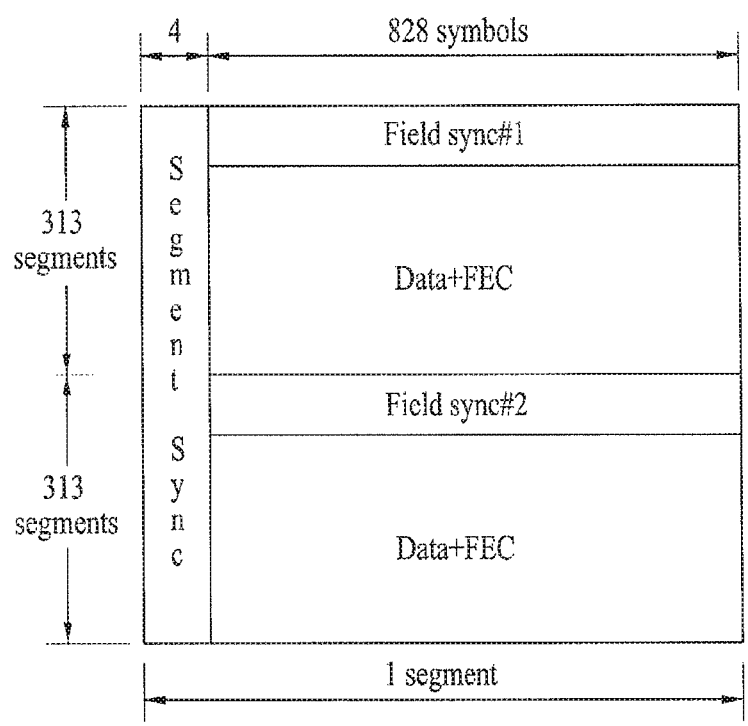
FIG. 2 illustrates an exemplary structure of a VSB frame.

FIG. 2 illustrates an exemplary structure of a VSB frame, wherein one VSB frame consists of 2 VSB fields (i.e., an odd field and an even field). Herein, each VSB field includes a field synchronization segment and 312 data segments. The slot corresponds to a basic time period for multiplexing the mobile service data and the main service data. Herein, one slot may either include the mobile service data or be configured only of the main service data. If one MPH frame is transmitted during one slot, the first 118 data packets within the slot correspond to a data group. And, the remaining 38 data packets become the main service data packets. In another example, when no data group exists in a slot, the corresponding slot is configured of 156 main service data packets. Meanwhile, when the slots are assigned to a VSB frame, an off-set exists for each assigned position.

Figure 3:
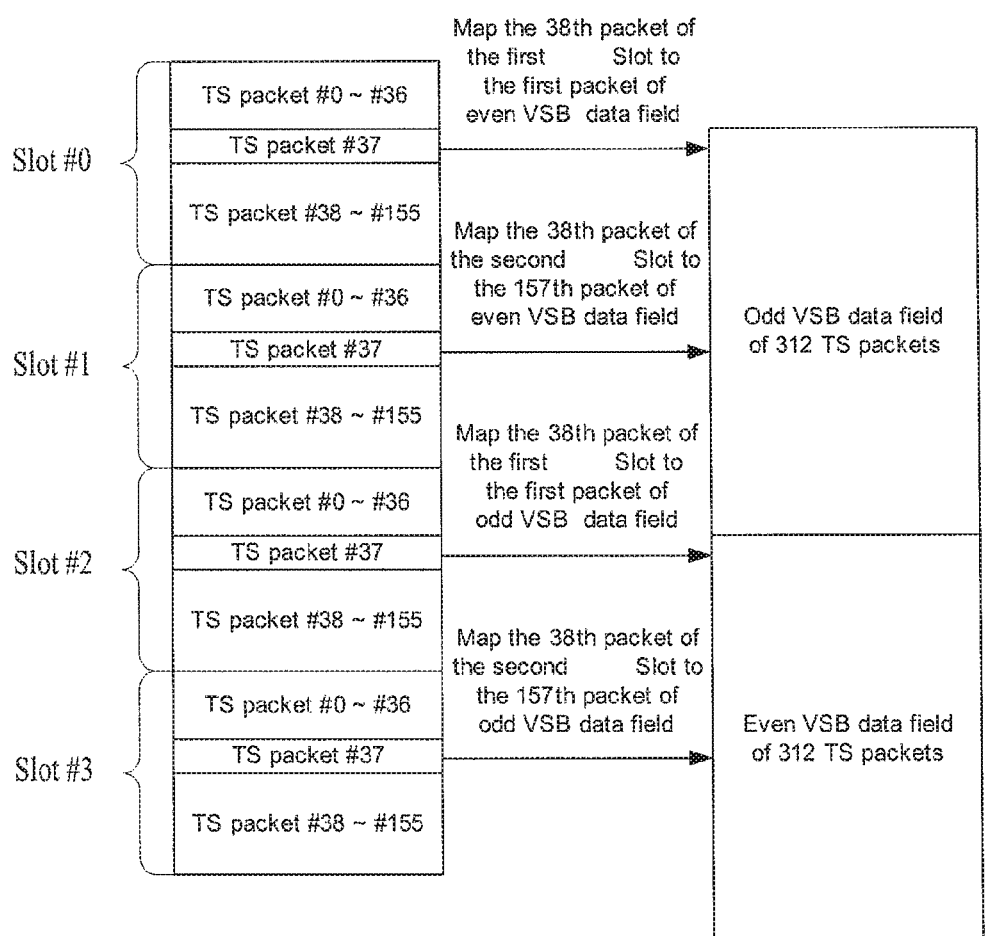
FIG. 3 illustrates a mapping example of the positions to which the first 4 slots of a sub-frame are assigned with respect to a VSB frame in a space region.
Figure 4:
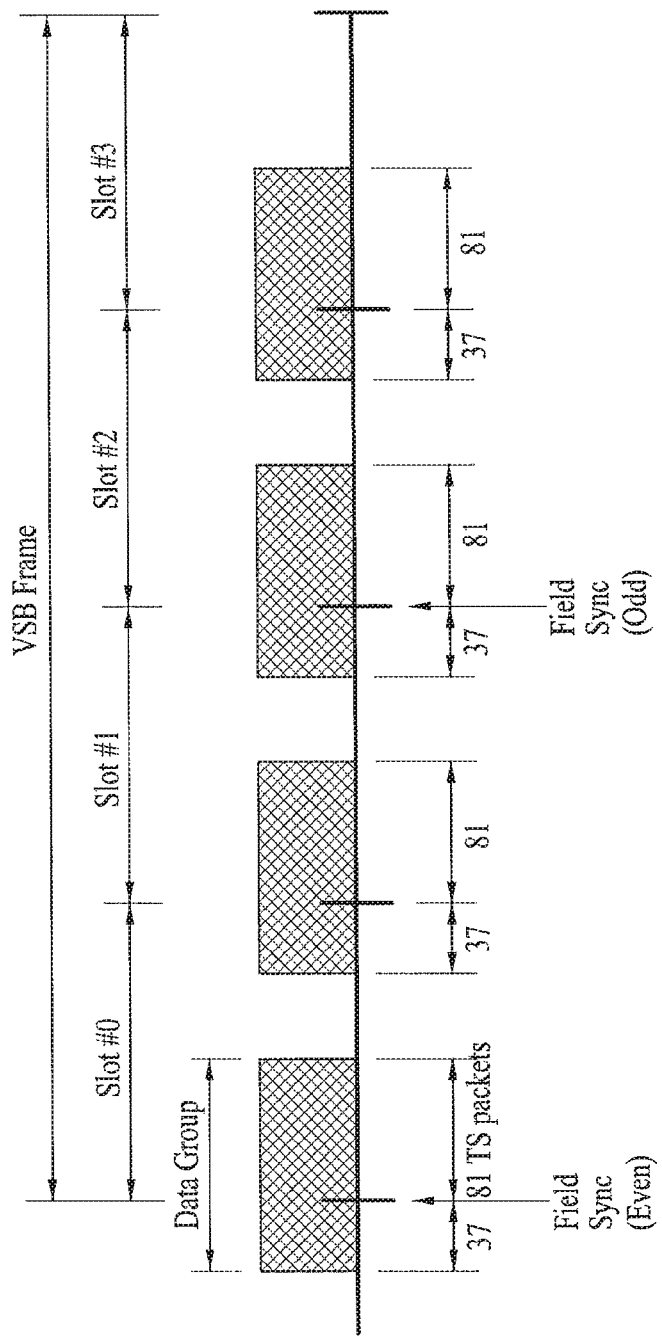
FIG. 4 illustrates a mapping example of the positions to which the first 4 slots of a sub-frame are assigned with respect to a VSB frame in a time region.

FIG. 3 illustrates a mapping example of the positions to which the first 4 slots of a sub-frame are assigned with respect to a VSB frame in a space region. And, FIG. 4 illustrates a mapping example of the positions to which the first 4 slots of a sub-frame are assigned with respect to a VSB frame in a time region. Referring to FIG. 3 and FIG. 4, a $38^{th}$ data packet (TS packet #37) of a $1^{st}$ slot (Slot #0) is mapped to the $1^{st}$ data packet of an odd VSB field. A $38^{th}$ data packet (TS packet #37) of a $2^{nd}$ slot (Slot #1) is mapped to the $157^{th}$ data packet of an odd VSB field. Also, a $38^{th}$ data packet (TS packet #37) of a $3^{rd}$ slot (Slot #2) is mapped to the $1^{st}$ data packet of an even VSB field. And, a $38^{th}$ data packet (TS packet #37) of a $4^{th}$ slot (Slot #3) is mapped to the $157^{th}$ data packet of an even VSB field. Similarly, the remaining 12 slots within the corresponding sub-frame are mapped in the subsequent VSB frames using the same method.

Meanwhile, one data group may be divided into at least one or more hierarchical regions. And, depending upon the characteristics of each hierarchical region, the type of mobile service data being inserted in each region may vary. For example, the data group within each region may be divided (or categorized) based upon the receiving performance. In an example given in the present invention, a data group is divided into regions A, B, C, and D in a data configuration prior to data deinterleaving.

Figure 5:
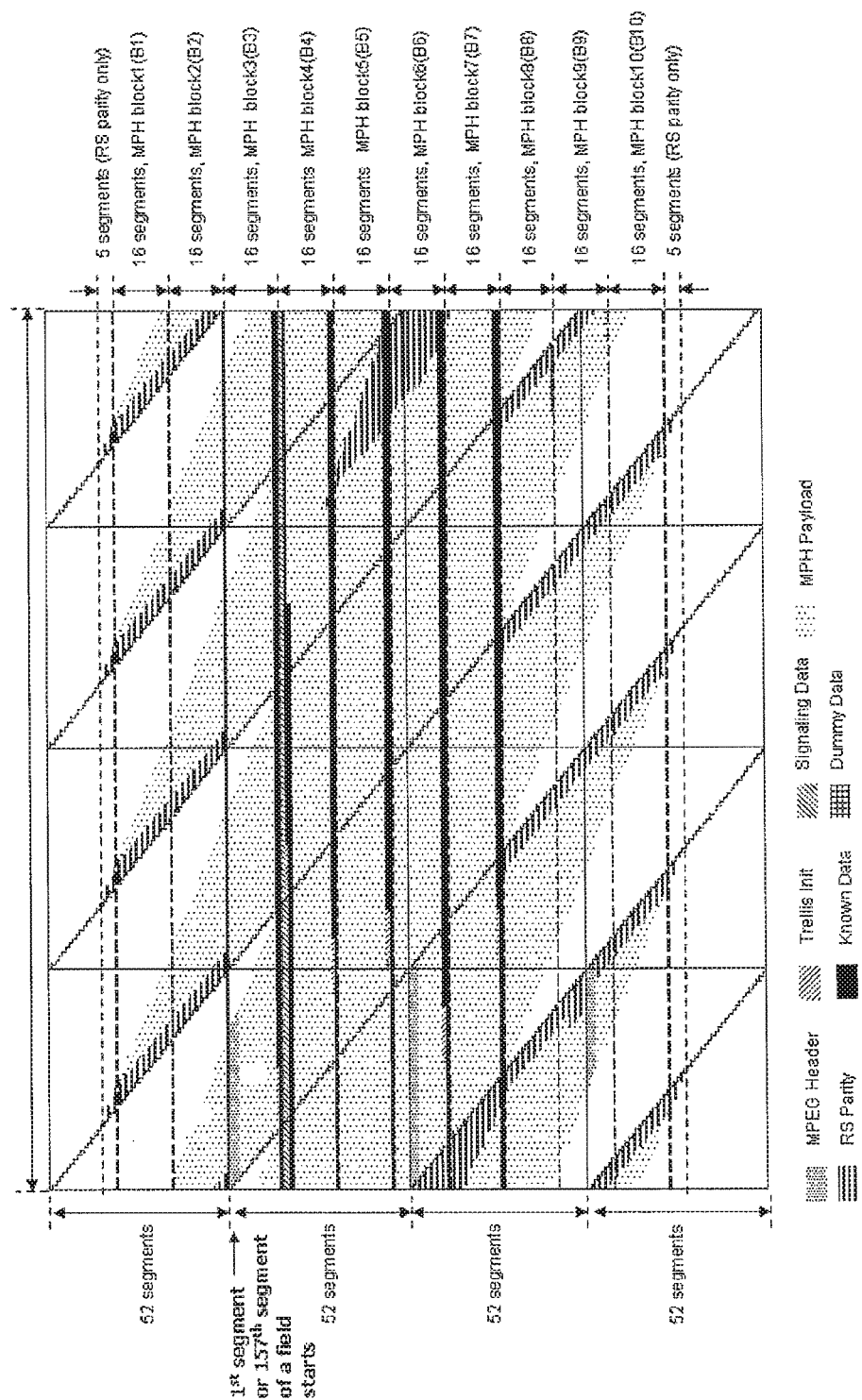
FIG. 5 illustrates an alignment of data after being data interleaved and identified.
Figure 6:
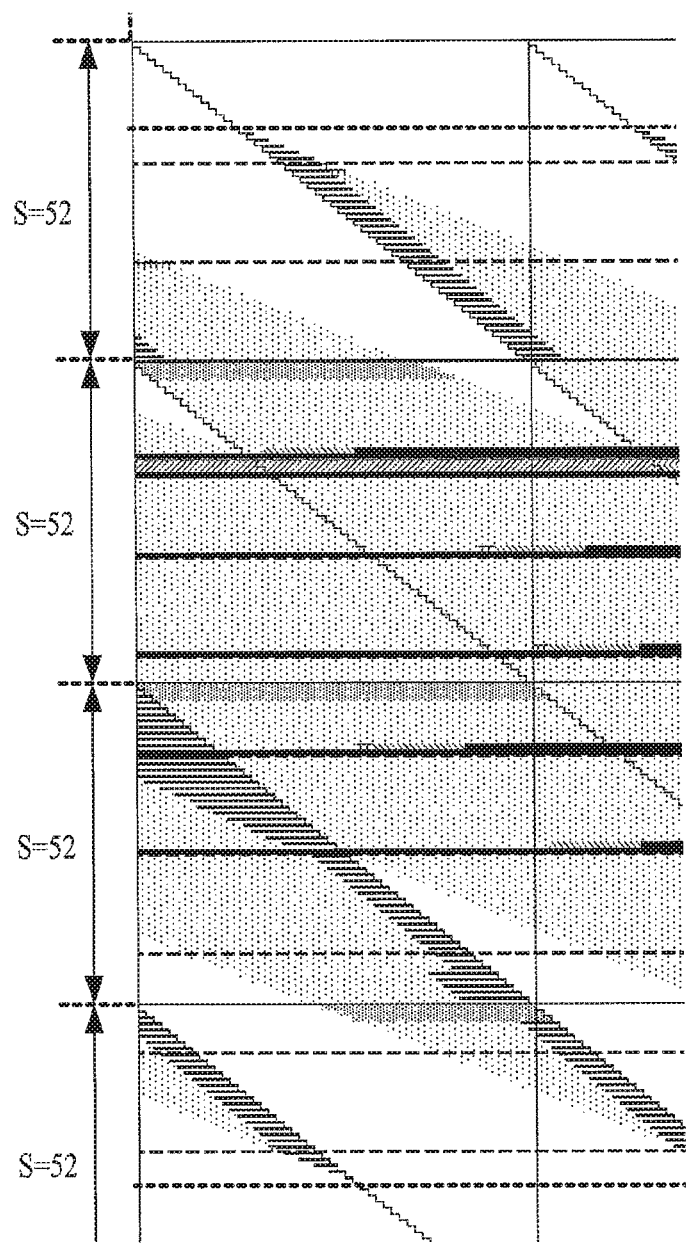
FIG. 6 illustrates an enlarged portion of the data group shown in FIG. 5 for a better understanding of the present invention.
Figure 7:
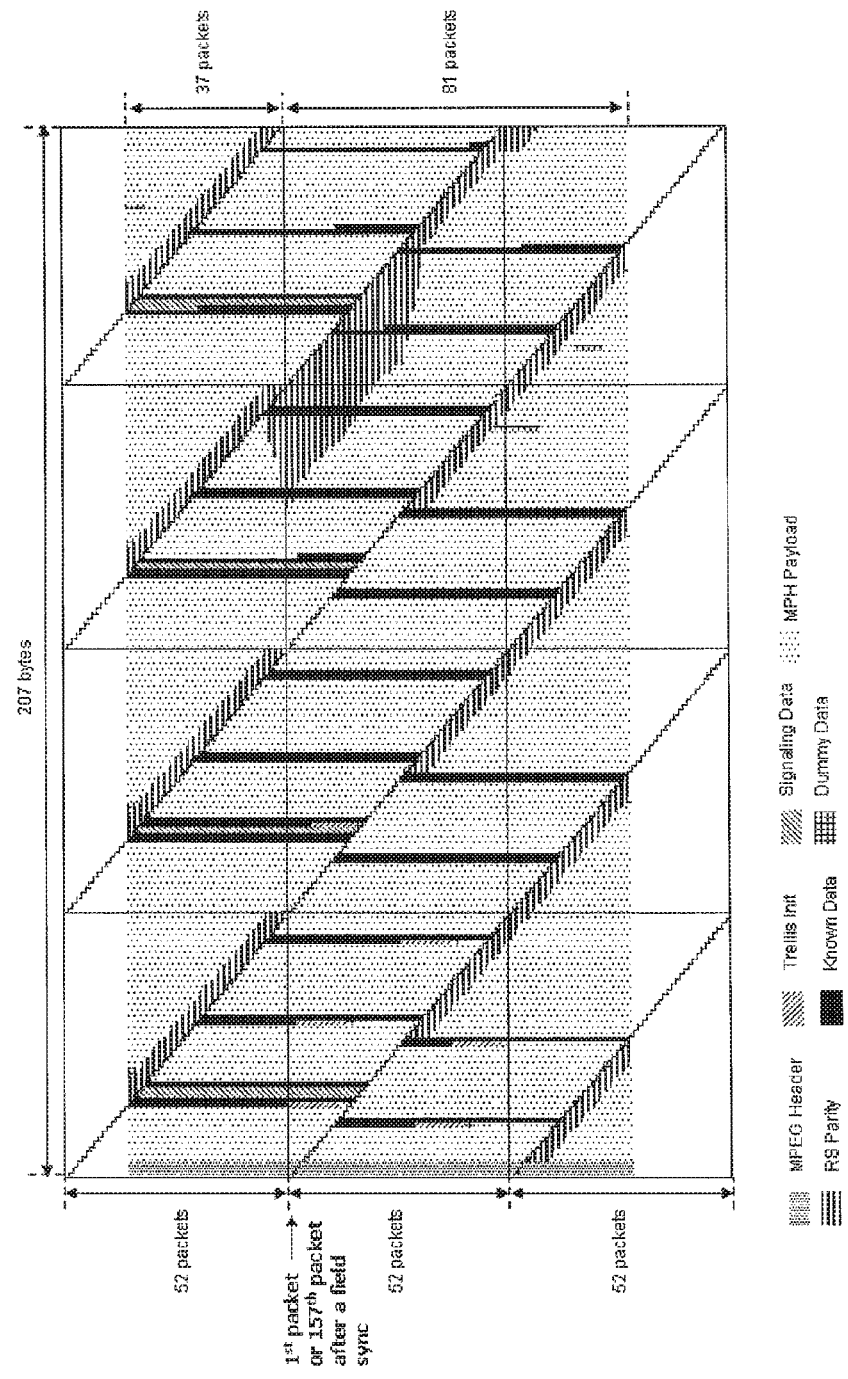
FIG. 7 illustrates an alignment of data before being data interleaved and identified.
Figure 8:
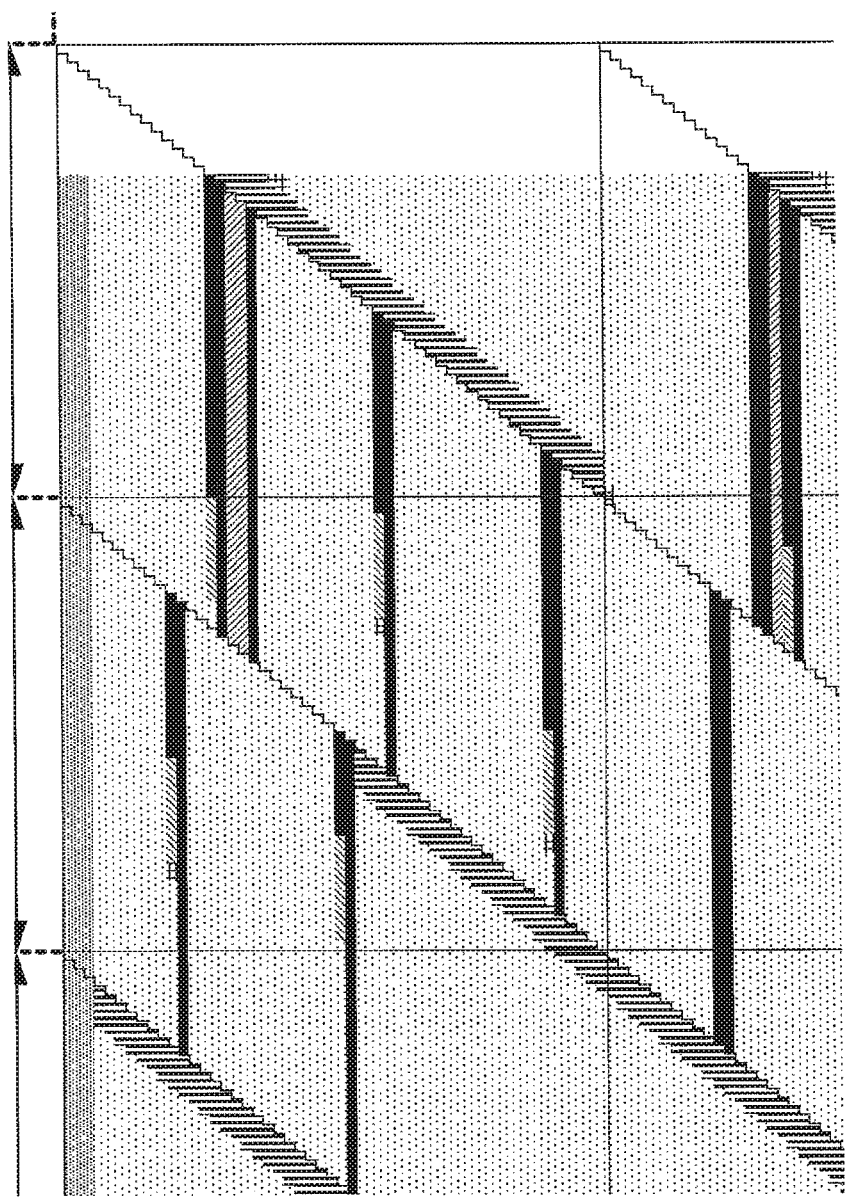
FIG. 8 illustrates an enlarged portion of the data group shown in FIG. 7 for a better understanding of the present invention.

FIG. 5 illustrates an alignment of data after being data interleaved and identified. FIG. 6 illustrates an enlarged portion of the data group shown in FIG. 5 for a better understanding of the present invention. FIG. 7 illustrates an alignment of data before being data interleaved and identified. And, FIG. 8 illustrates an enlarged portion of the data group shown in FIG. 7 for a better understanding of the present invention. More specifically, a data structure identical to that shown in FIG. 5 is transmitted to a receiving system. In other words, one data packet is data-interleaved in order to be scattered to a plurality of data segments, thereby being transmitted to the receiving system. FIG. 5 illustrates an example of one data group being scattered to 170 data segments. At this point, since one 207-byte packet has the same amount of data as one data segment, the packet that is not yet processed with data-interleaving may be used as the data segment.

FIG. 5 shows an example of dividing a data group prior to being data-interleaved into 10 MPH blocks (i.e., MPH block 1 (B1) to MPH block 10 (B10)). In this example, each MPH block has the length of 16 segments. Referring to FIG. 5, only the RS parity data are allocated to portions of the first 5 segments of the MPH block 1 (B1) and the last 5 segments of the MPH block 10 (B10). The RS parity data are excluded in regions A to D of the data group. More specifically, when it is assumed that one data group is divided into regions A, B, C, and D, each MPH block may be included in any one of region A to region D depending upon the characteristic of each MPH block within the data group.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

Referring to FIG. 5, MPH block 4 (B4) to MPH block 7 (B7) correspond to regions without interference of the main service data. MPH block 4 (B4) to MPH block 7 (B7) within the data group shown in FIG. 5 correspond to a region where no interference from the main service data occurs. In this example, a long known data sequence is inserted at both the beginning and end of each MPH block. In the description of the present invention, the region including MPH block 4 (B4) to MPH block 7 (B7) will be referred to as "region A (.B4+135+66+67)". As described above, when the data group includes region A having a long known data sequence inserted at both the beginning and end of each MPH block, the receiving system is capable of performing equalization by using the channel information that can be obtained from the known data. Therefore, the strongest equalizing performance may be yielded (or obtained) from one of region A to region D.

In the example of the data group shown in FIG. 5, MPH block 3 (B3) and MPH block 8 (B8) correspond to a region having little interference from the main service data. Herein, a long known data sequence is inserted in only one side of each MPH block B3 and B8. More specifically, due to the interference from the main service data, a long known data sequence is inserted at the end of MPH block 3 (B3), and another long known data sequence is inserted at the beginning of MPH block 8 (B8). In the present invention, the region including MPH block 3 (B3) and MPH block 8 (B8) will be referred to as "region B (=B3+B8)". As described above, when the data group includes region B having a long known data sequence inserted at only one side (beginning or end) of each MPH block, the receiving system is capable of performing equalization by using the channel information that can be obtained from the known data. Therefore, a stronger equalizing performance as compared to region C/D may be yielded (or obtained).

Referring to FIG. 5, MPH block 2 (B2) and MPH block 9 (B9) correspond to a region having more interference from the main service data as compared to region B. A long known data sequence cannot be inserted in any side of MPH block 2 (B2) and MPH block 9 (B9). Herein, the region including MPH block 2 (B2) and MPH block 9 (B9) will be referred to as "region C (=B2+B9)". Finally, in the example shown in FIG. 5, MPH block 1 (B1) and MPH block 10 (B10) correspond to a region having more interference from the main service data as compared to region C. Similarly, a long known data sequence cannot be inserted in any side of MPH block 1 (B1) and MPH block 10 (B10). Herein, the region including MPH block 1 (B1) and MPH block 10 (B10) will be referred to as "region D (=B1+B10)". Since region C/D is spaced further apart from the known data sequence, when the channel environment undergoes frequent and abrupt changes, the receiving performance of region C/D may be deteriorated.

FIG. 7 illustrates a data structure prior to data interleaving. More specifically, FIG. 7 illustrates an example of 118 data packets being allocated to a data group. FIG. 7 shows an example of a data group consisting of 118 data packets, wherein, based upon a reference packet (e.g., a $1^{st}$ packet (or data segment) or $157^{th}$ packet (or data segment) after a field synchronization signal), when allocating data packets to a VSB frame, 37 packets are included before the reference packet and 81 packets (including the reference packet) are included afterwards. In other words, with reference to FIG. 5, a field synchronization signal is placed (or assigned) between MPH block 2 (B2) and MPH block 3 (B3). Accordingly, this indicates that the slot has an off-set of 37 data packets with respect to the corresponding VSB field. The size of the data groups, number of hierarchical regions within the data group, the size of each region, the number of MPH blocks included in each region, the size of each MPH block, and so on described above are merely exemplary. Therefore, the present invention will not be limited to the examples described above.

Figure 9:
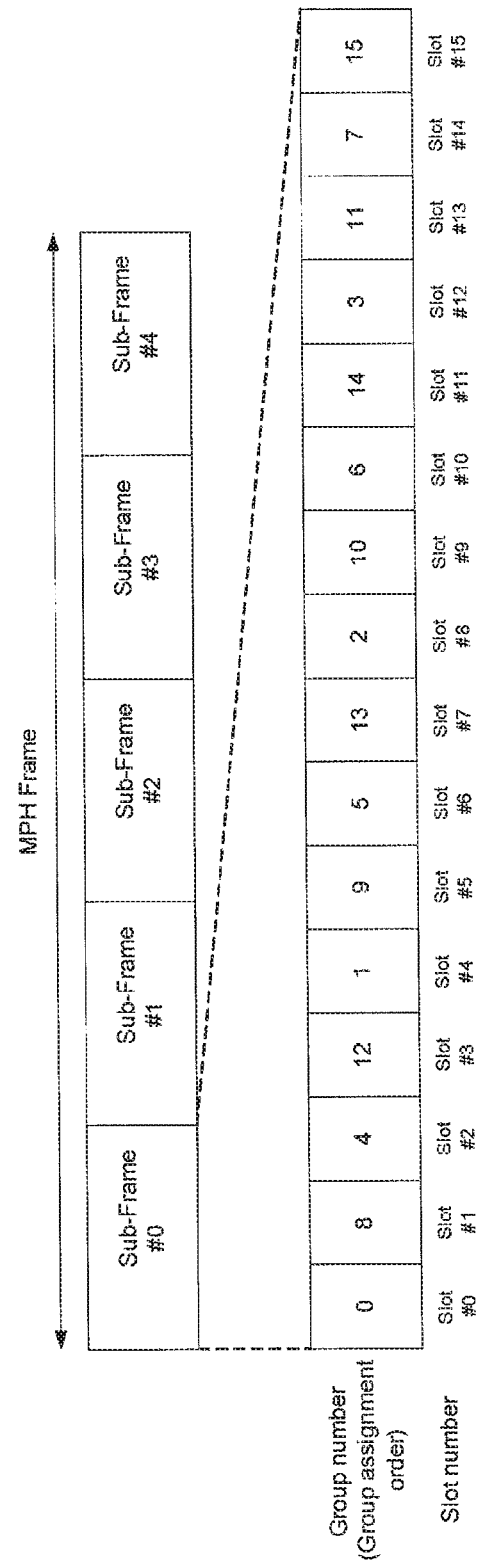
FIG. 9 illustrates an exemplary assignment order of data groups being assigned to one of 5 sub-frames according to the present invention.

FIG. 9 illustrates an exemplary assignment order of data groups being assigned to one of 5 sub-frames, wherein the 5 sub-frames configure an MPH frame. For example, the method of assigning data groups may be identically applied to all MPH frames or differently applied to each MPH frame. Furthermore, the method of assigning data groups may be identically applied to all sub-frames or differently applied to each sub-frame. At this point, when it is assumed that the data groups are assigned using the same method in all sub-frames of the corresponding MPH frame, the total number of data groups being assigned to an MPH frame is equal to a multiple of '5'. According to the embodiment of the present invention, a plurality of consecutive data groups is assigned to be spaced as far apart from one another as possible within the MPH frame. Thus, the system can be capable of responding promptly and effectively to any burst error that may occur within a sub-frame.

For example, when it is assumed that 3 data groups are assigned to a sub-frame, the data groups are assigned to a $1^{st}$ slot (Slot #0), a $5^{th}$ slot (Slot #4), and a $9^{th}$ slot (Slot #8) in the sub-frame, respectively. FIG. 9 illustrates an example of assigning 16 data groups in one sub-frame using the above-described pattern (or rule). In other words, each data group is serially assigned to 16 slots corresponding to the following numbers: 0, 8, 4, 12, 1, 9, 5, 13, 2, 10, 6, 14, 3, 11, 7, and 15. Equation 1 below shows the above-described rule (or pattern) for assigning data groups in a sub-frame.

$$j=(4i+0)\bmod 16 \quad \text{Equation 1}$$

0=0 if i<4,
Herein,
0=2 else if i<8, i
0=1 else if <12,
0=3 else.
Herein, j indicates the slot number within a sub-frame. The value of j may range from 0 to 15 (i.e., 0 15). Also, variable i indicates the data group number. The value of i may range from 0 to 15 (i.e., 0).

In the present invention, a collection of data groups included in a MPH frame will be referred to as a "parade". Based upon the RS frame mode, the parade transmits data of at least one specific RS frame. The mobile service data within one RS frame may be assigned either to all of regions A/B/C/D within the corresponding data group, or to at least one of regions A/B/C/D. In the embodiment of the present invention, the mobile service data within one RS frame may be assigned either to all of regions A/B/C/D, or to at least one of regions A/B and regions C/D. If the mobile service data are assigned to the latter case (i.e., one of regions A/B and regions C/D), the RS frame being assigned to regions A/B and the RS frame being assigned to regions C/D within the corresponding data group are different from one another.

In the description of the present invention, the RS frame being assigned to regions A/B within the corresponding data group will be referred to as a "primary RS frame", and the RS frame being assigned to regions C/D within the corresponding data group will be referred to as a "secondary RS frame", for simplicity. Also, the primary RS frame and the secondary RS frame form (or configure) one parade. More specifically, when the mobile service data within one RS frame are assigned either to all of regions A/B/C/D within the corresponding data group, one parade transmits one RS frame. Conversely, when the mobile service data within one RS frame are assigned either to at least one of regions A/B and regions C/D, one parade may transmit up to 2 RS frames. More specifically, the RS frame mode indicates whether a parade transmits one RS frame, or whether the parade transmits two RS frames. Table 1 below shows an example of the RS frame mode.

TABLE 1

| RS frame mode (2 bits) | Description |
| --- | --- |
| 00 | There is only one primary RS frame for all group regions |
| 01 | There are two separate RS frames. Primary RS frame for group regions A and B Secondary RS frame for group regions C and D |
| 10 | Reserved |
| 11 | Reserved |

Table 1 illustrates an example of allocating 2 bits in order to indicate the RS frame mode. For example, referring to Table 1, when the RS frame mode value is equal to '00', this indicates that one parade transmits one RS frame. And, when the RS frame mode value is equal to '01', this indicates that one parade transmits two RS frames, i.e., the primary RS frame and the secondary RS frame. More specifically, when the RS frame mode value is equal to '01', data of the primary RS frame for regions A/B are assigned and transmitted to regions A/B of the corresponding data group. Similarly, data of the secondary RS frame for regions C/D are assigned and transmitted to regions C/D of the corresponding data group.

Additionally, one RS frame transmits one ensemble. Herein, the ensemble is a collection of services requiring the same quality of service (QOS) and being encoded with the same FEC codes. More specifically, when one parade is configured of one RS frame, then one parade transmits one ensemble. Conversely, when one parade is configured of two RS frames, i.e., when one parade is configured of a primary RS frame and a secondary RS frame, then one parade transmits two ensembles (i.e., a primary ensemble and a secondary ensemble). More specifically, the primary ensemble is transmitted through a primary RS frame of a parade, and the secondary ensemble is transmitted through a secondary RS frame of a parade. The RS frame is a 2-dimensional data frame through which an ensemble is RS-CRC encoded.

As described in the assignment of data groups, the parades are aligned to be spaced as far apart from one another as possible within the sub-frame. Thus, the system can be capable of responding promptly and effectively to any burst error that may occur within a sub-frame. Furthermore, the method of assigning parades may be identically applied to all sub-frames or differently applied to each sub-frame. According to the embodiment of the present invention, the parades may be assigned differently for each MPH frame and identically for all sub-frames within an MPH frame. More specifically, the MPH frame structure may vary by MPH frame units. Thus, an ensemble rate may be adjusted on a more frequent and flexible basis.

Figure 10:
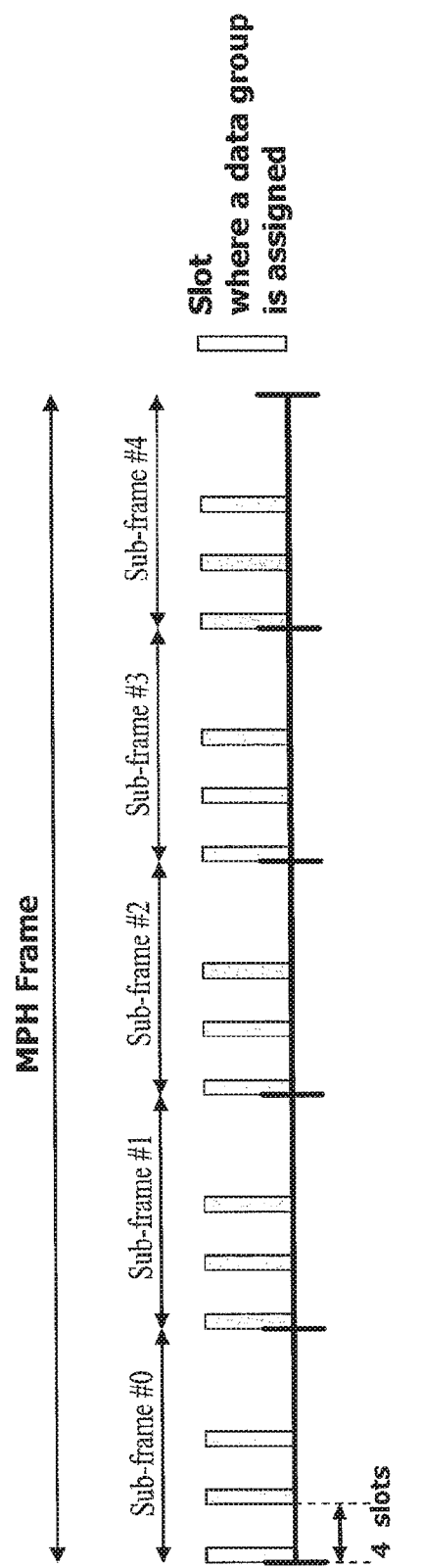
FIG. 10 illustrates an example of multiple data groups of a single parade being assigned (or allocated) to an MPH frame.

FIG. 10 illustrates an example of multiple data groups of a single parade being assigned (or allocated) to an MPH frame. More specifically, FIG. 10 illustrates an example of a plurality of data groups included in a single parade, wherein the number of data groups included in a sub-frame is equal to '3', being allocated to an MPH frame. Referring to FIG. 10, 3 data groups are sequentially assigned to a sub-frame at a cycle period of 4 slots. Accordingly, when this process is equally performed in the 5 sub-frames included in the corresponding MPH frame, 15 data groups are assigned to a single MPH frame. Herein, the 15 data groups correspond to data groups included in a parade. Therefore, since one sub-frame is configured of 4 VSB frame, and since 3 data groups are included in a sub-frame, the data group of the corresponding parade is not assigned to one of the 4 VSB frames within a sub-frame.

For example, when it is assumed that one parade transmits one RS frame, and that a RS frame encoder located in a later block performs RS-encoding on the corresponding RS frame, thereby adding 24 bytes of parity data to the corresponding RS frame and transmitting the processed RS frame, the parity data occupy approximately 11.37% (=24/(187+24)×100) of the total code word length. Meanwhile, when one sub-frame includes 3 data groups, and when the data groups included in the parade are assigned, as shown in FIG. 10, a total of 15 data groups form an RS frame. Accordingly, even when an error occurs in an entire data group due to a burst noise within a channel, the percentile is merely 6.67% (=1/15×100). Therefore, the receiving system may correct all errors by performing an erasure RS decoding process. More specifically, when the erasure RS decoding is performed, a number of channel errors corresponding to the number of RS parity bytes may be corrected. By doing so, the receiving system may correct the error of at least one data group within one parade. Thus, the minimum burst noise length correctable by a RS frame is over 1 VSB frame.

Meanwhile, when data groups of a parade are assigned as described above, either main service data may be assigned between each data group, or data groups corresponding to different parades may be assigned between each data group. More specifically, data groups corresponding to multiple parades may be assigned to one MPH frame. Basically, the method of assigning data groups corresponding to multiple parades is very similar to the method of assigning data groups corresponding to a single parade. In other words, data groups included in other parades that are to be assigned to an MPH frame are also respectively assigned according to a cycle period of 4 slots. At this point, data groups of a different parade may be sequentially assigned to the respective slots in a circular method. Herein, the data groups are assigned to slots starting from the ones to which data groups of the previous parade have not yet been assigned. For example, when it is assumed that data groups corresponding to a parade are assigned as shown in FIG. 10, data groups corresponding to the next parade may be assigned to a sub-frame starting either from the $12^{th}$ slot of a sub-frame. However, this is merely exemplary. In another example, the data groups of the next parade may also be sequentially assigned to a different slot within a sub-frame at a cycle period of 4 slots starting from the $3^{rd}$ slot.

Figure 11:
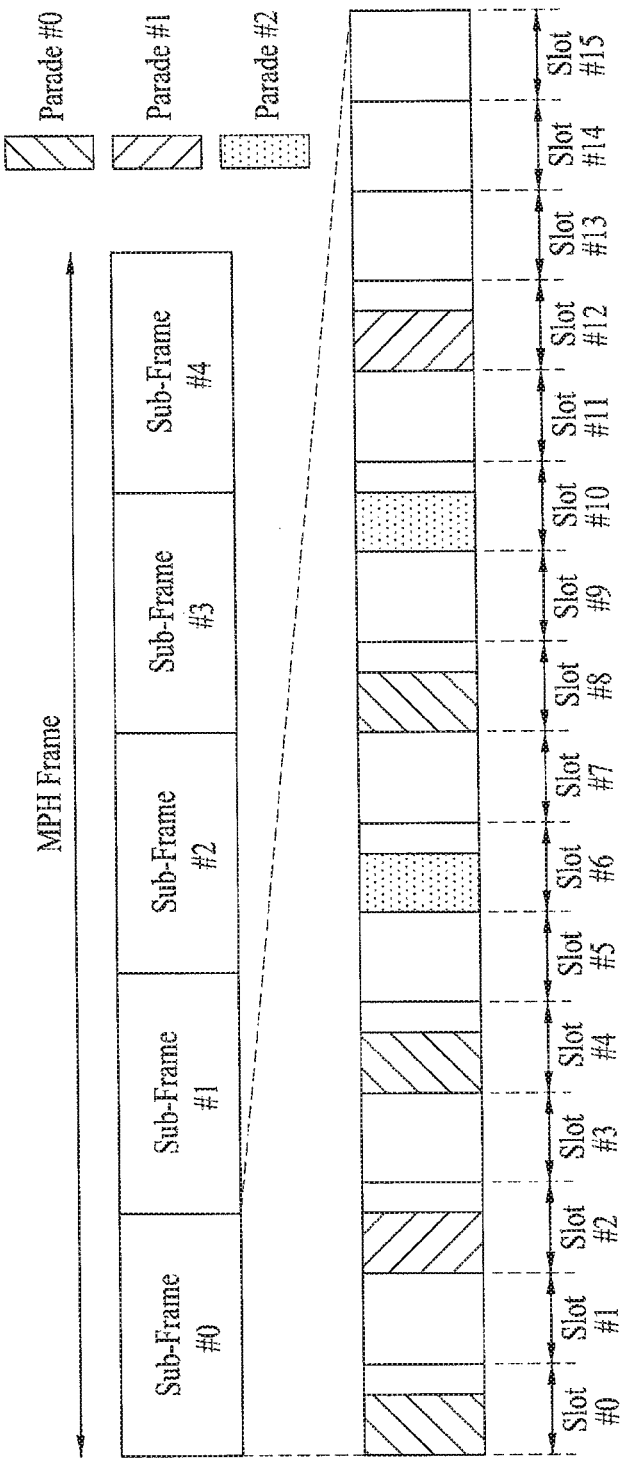
FIG. 11 illustrates an example of transmitting 3 parades to an MPH frame according to the present invention.

FIG. 11 illustrates an example of transmitting 3 parades (Parade #0, Parade #1, and Parade #2) to an MPH frame. More specifically, FIG. 11 illustrates an example of transmitting parades included in one of 5 sub-frames, wherein the 5 sub-frames configure one MPH frame. When the $1^{st}$ parade (Parade #0) includes 3 data groups for each sub-frame, the positions of each data groups within the sub-frames may be obtained by substituting values '0' to '2' for i in Equation 1. More specifically, the data groups of the $1^{st}$ parade (Parade #0) are sequentially assigned to the $1^{st}$, $5^{th}$ and $9^{th}$ slots (Slot #0, Slot #4, and Slot #8) within the sub-frame. Also, when the $2^{nd}$ parade includes 2 data groups for each sub-frame, the positions of each data groups within the sub-frames may be obtained by substituting values '3' and '4' for i in Equation 1. More specifically, the data groups of the $2^{nd}$ parade (Parade #1) are sequentially assigned to the $2^{nd}$ and $12^{th}$ slots (Slot #3 and Slot #11) within the sub-frame. Finally, when the $3^{rd}$ parade includes 2 data groups for each sub-frame, the positions of each data groups within the sub-frames may be obtained by substituting values '5' and '6' for i in Equation 1. More specifically, the data groups of the $3^{rd}$ parade (Parade #2) are sequentially assigned to the $7^{th}$ and $11^{th}$ slots (Slot #6 and Slot #10) within the sub-frame.

As described above, data groups of multiple parades may be assigned to a single MPH frame, and, in each sub-frame, the data groups are serially allocated to a group space having 4 slots from left to right. Therefore, a number of groups of one parade per sub-frame (NOG) may correspond to any one integer from '1' to '8'. Herein, since one MPH frame includes 5 sub-frames, the total number of data groups within a parade that can be allocated to an MPH frame may correspond to any one multiple of '5' ranging from '5' to '40'.

Figure 12:
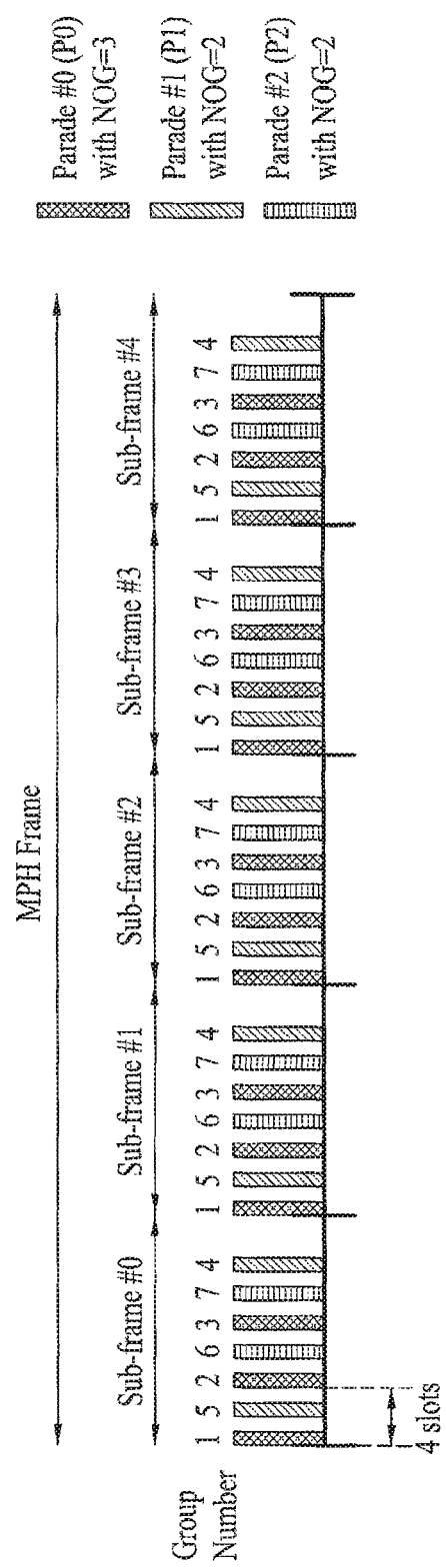
FIG. 12 illustrates an example of expanding the assignment process of 3 parades to 5 sub-frames within an MPH frame.

FIG. 12 illustrates an example of expanding the assignment process of 3 parades, shown in FIG. 11, to 5 sub-frames within an MPH frame.

General Description of the Transmitting System

Figure 13:
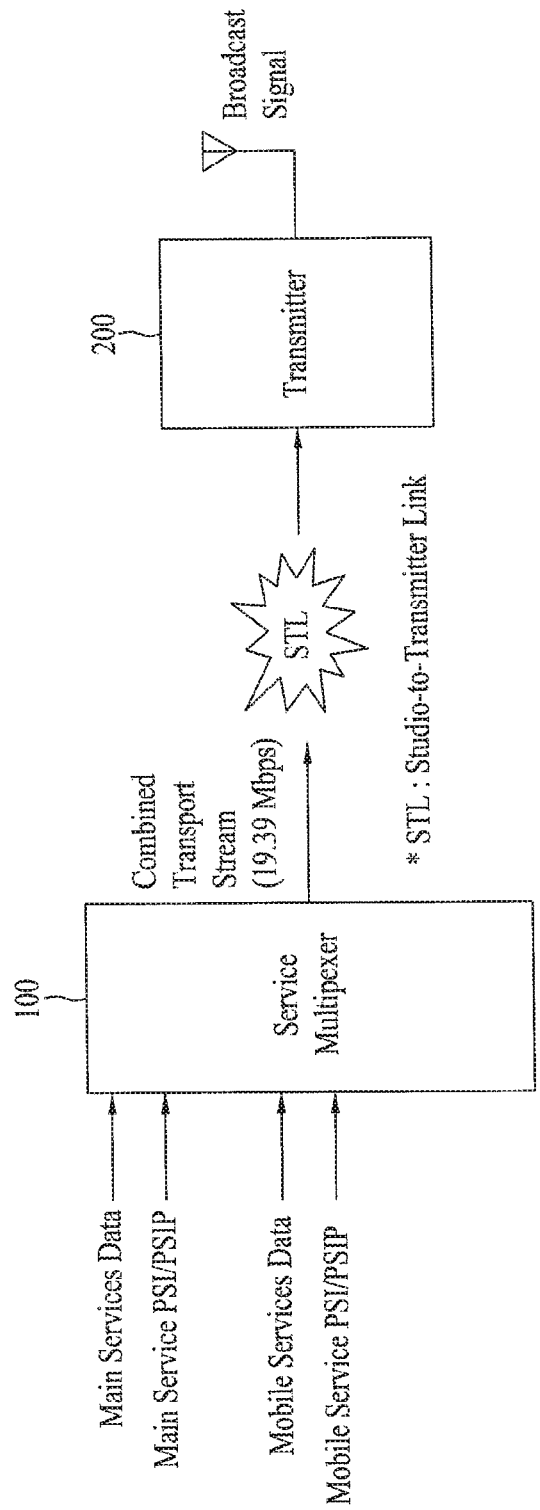
FIG. 13 illustrates a block diagram showing a general structure of a digital broadcast transmitting system according to an embodiment of the present invention.

FIG. 13 illustrates a block diagram showing a general structure of a digital broadcast transmitting system according to an embodiment of the present invention.

Herein, the digital broadcast transmitting includes a service multiplexer 100 and a transmitter 200. Herein, the service multiplexer 100 is located in the studio of each broadcast station, and the transmitter 200 is located in a site placed at a predetermined distance from the studio. The transmitter 200 may be located in a plurality of different locations. Also, for example, the plurality of transmitters may share the same frequency. And, in this case, the plurality of transmitters receives the same signal. Accordingly, in the receiving system, a channel equalizer may compensate signal distortion, which is caused by a reflected wave, in order to recover the original signal. In another example, the plurality of transmitters may have different frequencies with respect to the same channel.

A variety of methods may be used for data communication each of the transmitters, which are located in remote positions, and the service multiplexer. For example, an interface standard such as a synchronous serial interface for transport of MPEG-2 data (SMPTE-310M). In the SMPTE-310M interface standard, a constant data rate is decided as an output data rate of the service multiplexer. For example, in case of the 8VSB mode, the output data rate is 19.39 Mbps, and, in case of the 16VSB mode, the output data rate is 38.78 Mbps. Furthermore, in the conventional 8VSB mode transmitting system, a transport stream (TS) packet having a data rate of approximately 19.39 Mbps may be transmitted through a single physical channel. Also, in the transmitting system according to the present invention provided with backward compatibility with the conventional transmitting system, additional encoding is performed on the mobile service data. Thereafter, the additionally encoded mobile service data are multiplexed with the main service data to a TS packet form, which is then transmitted. At this point, the data rate of the multiplexed TS packet is approximately 19.39 Mbps.

At this point, the service multiplexer 100 receives at least one type of mobile service data and program specific information/program and system information protocol (PSI/PSIP) table data for each mobile service in order to encapsulate the received data to each TS packet. Also, the service multiplexer 100 receives at least one type of main service data and PSI/PSIP table data for each main service and encapsulates the received data to a transport stream (TS) packet. Subsequently, the TS packets are multiplexed according to a predetermined multiplexing rule and outputs the multiplexed packets to the transmitter 200.

Service Multiplexer

Figure 14:
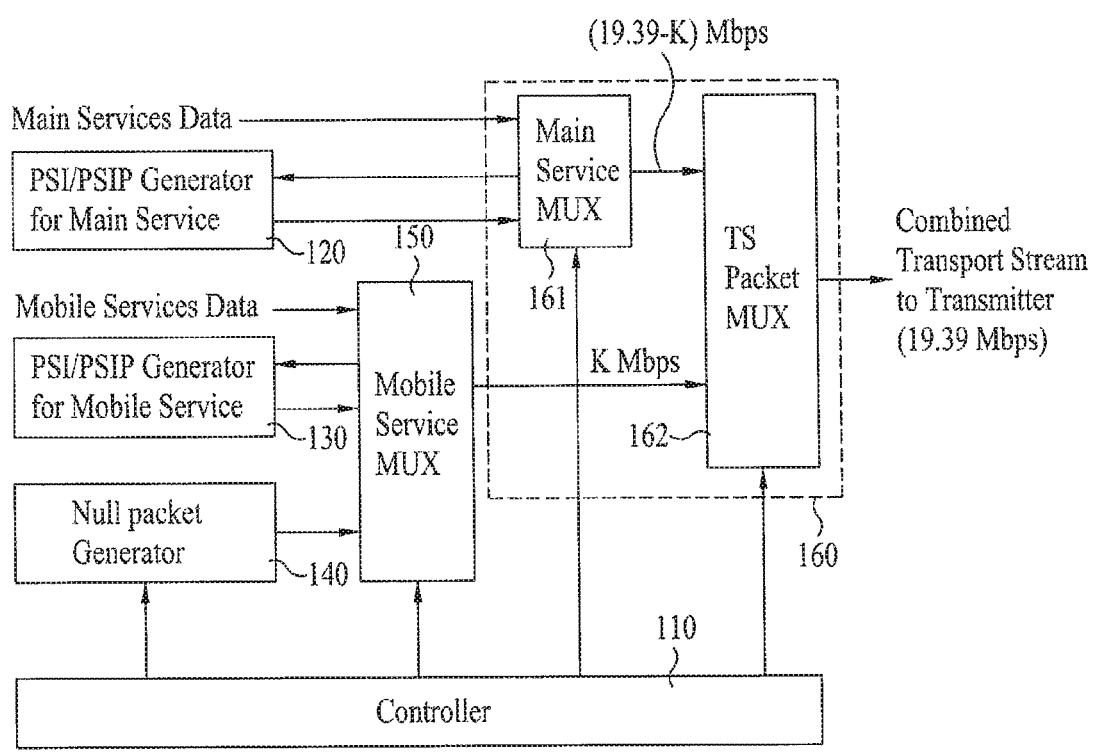
FIG. 14 illustrates a block diagram showing an example of a service multiplexer.

FIG. 14 illustrates a block diagram showing an example of the service multiplexer. The service multiplexer includes a controller 110 for controlling the overall operations of the service multiplexer, a PSI/PSIP generator 120 for the main service, a PSI/PSIP generator 130 for the mobile service, a null packet generator 140, a mobile service multiplexer 150, and a transport multiplexer 160.

The transport multiplexer 160 may include a main service multiplexer 161 and a transport stream (TS) packet multiplexer 162.

Referring to FIG. 14, at least one type of compression encoded main service data and the PSI/PSIP table data generated from the PSI/PSIP generator 120 for the main service are input to the main service multiplexer 161 of the transport multiplexer 160. The main service multiplexer 161 encapsulates each of the input main service data and PSI/PSIP table data to MPEG-2 TS packet forms. Then, the MPEG-2 TS packets are multiplexed and output to the TS packet multiplexer 162. Herein, the data packet being output from the main service multiplexer 161 will be referred to as a main service data packet for simplicity.

Thereafter, at least one type of the compression encoded mobile service data and the PSI/PSIP table data generated from the PSI/PSIP generator 130 for the mobile service are input to the mobile service multiplexer 150.

The mobile service multiplexer 150 encapsulates each of the input mobile service data and PSI/PSIP table data to MPEG-2 TS packet forms. Then, the MPEG-2 TS packets are multiplexed and output to the TS packet multiplexer 162. Herein, the data packet being output from the mobile service multiplexer 150 will be referred to as a mobile service data packet for simplicity.

At this point, the transmitter 200 requires identification information in order to identify and process the main service data packet and the mobile service data packet. Herein, the identification information may use values pre-decided in accordance with an agreement between the transmitting system and the receiving system, or may be configured of a separate set of data, or may modify predetermined location value with in the corresponding data packet.

As an example of the present invention, a different packet identifier (PID) may be assigned to identify each of the main service data packet and the mobile service data packet.

In another example, by modifying a synchronization data byte within a header of the mobile service data, the service data packet may be identified by using the synchronization data byte value of the corresponding service data packet. For example, the synchronization byte of the main service data packet directly outputs the value decided by the ISO/IEC13818-1 standard (i.e., 0x47) without any modification. The synchronization byte of the mobile service data packet modifies and outputs the value, thereby identifying the main service data packet and the mobile service data packet. Conversely, the synchronization byte of the main service data packet is modified and output, whereas the synchronization byte of the mobile service data packet is directly output without being modified, thereby enabling the main service data packet and the mobile service data packet to be identified.

A plurality of methods may be applied in the method of modifying the synchronization byte. For example, each bit of the synchronization byte may be inversed, or only a portion of the synchronization byte may be inversed.

As described above, any type of identification information may be used to identify the main service data packet and the mobile service data packet. Therefore, the scope of the present invention is not limited only to the example set forth in the description of the present invention.

Meanwhile, a transport multiplexer used in the conventional digital broadcasting system may be used as the transport multiplexer 160 according to the present invention. More specifically, in order to multiplex the mobile service data and the main service data and to transmit the multiplexed data, the data rate of the main service is limited to a data rate of (19.39-K) Mbps. Then, K Mbps, which corresponds to the remaining data rate, is assigned as the data rate of the mobile service. Thus, the transport multiplexer which is already being used may be used as it is without any modification.

Herein, the transport multiplexer 160 multiplexes the main service data packet being output from the main service multiplexer 161 and the mobile service data packet being output from the mobile service multiplexer 150. Thereafter, the transport multiplexer 160 transmits the multiplexed data packets to the transmitter 200.

However, in some cases, the output data rate of the mobile service multiplexer 150 may not be equal to K Mbps. In this case, the mobile service multiplexer 150 multiplexes and outputs null data packets generated from the null packet generator 140 so that the output data rate can reach K Mbps. More specifically, in order to match the output data rate of the mobile service multiplexer 150 to a constant data rate, the null packet generator 140 generates null data packets, which are then output to the mobile service multiplexer 150.

For example, when the service multiplexer 100 assigns K Mbps of the 19.39 Mbps to the mobile service data, and when the remaining (19.39-K) Mbps is, therefore, assigned to the main service data, the data rate of the mobile service data that are multiplexed by the service multiplexer 100 actually becomes lower than K Mbps. This is because, in case of the mobile service data, the pre-processor of the transmitting system performs additional encoding, thereby increasing the amount of data. Eventually, the data rate of the mobile service data, which may be transmitted from the service multiplexer 100, becomes smaller than K Mbps.

For example, since the pre-processor of the transmitter performs an encoding process on the mobile service data at a coding rate of at least ½, the amount of the data output from the pre-processor is increased to more than twice the amount of the data initially input to the pre-processor. Therefore, the sum of the data rate of the main service data and the data rate of the mobile service data, both being multiplexed by the service multiplexer 100, becomes either equal to or smaller than 19.39 Mbps.

Therefore, in order to match the data rate of the data that are finally output from the service multiplexer 100 to a constant data rate (e.g., 19.39 Mbps), an amount of null data packets corresponding to the amount of lacking data rate is generated from the null packet generator 140 and output to the mobile service multiplexer 150.

Accordingly, the mobile service multiplexer 150 encapsulates each of the mobile service data and the PSI/PSIP table data that are being input to a MPEG-2 TS packet form. Then, the above-described TS packets are multiplexed with the null data packets and, then, output to the TS packet multiplexer 162.

Thereafter, the TS packet multiplexer 162 multiplexes the main service data packet being output from the main service multiplexer 161 and the mobile service data packet being output from the mobile service multiplexer 150 and transmits the multiplexed data packets to the transmitter 200 at a data rate of 19.39 Mbps.

According to an embodiment of the present invention, the mobile service multiplexer 150 receives the null data packets. However, this is merely exemplary and does not limit the scope of the present invention. In other words, according to another embodiment of the present invention, the TS packet multiplexer 162 may receive the null data packets, in order to match the data rate of the finally output data to a constant data rate. Herein, the output path and multiplexing rule of the null data packet is controlled by the controller 110. The controller 110 controls the multiplexing processed performed by the mobile service multiplexer 150, the main service multiplexer 161 of the transport multiplexer 160, and the TS packet multiplexer 162, and also controls the null data packet generation of the null packet generator 140. At this point, the transmitter 200 discards the null data packets transmitted from the service multiplexer 100 instead of transmitting the null data packets.

Further, in order to allow the transmitter 200 to discard the null data packets transmitted from the service multiplexer 100 instead of transmitting them, identification information for identifying the null data packet is required. Herein, the identification information may use values pre-decided in accordance with an agreement between the transmitting system and the receiving system. For example, the value of the synchronization byte within the header of the null data packet may be modified in order to be used as the identification information. Alternatively, a transport error _indicator flag may also be used as the identification information.

In the description of the present invention, an example of using the transport error indicator flag as the identification information will be given to describe an embodiment of the present invention. In this case, the transport error indicator flag of the null data packet is set to '1', and the transport error indicator flag of the remaining data packets are reset to '0', in order to identify the null data packet. More specifically, when the null packet generator 140 generates the null data packets, if the transport error indicator flag from the header field of the null data packet is set to '1' and then transmitted, the null data packet may be identified and, therefore, be discarded. In the present invention, any type of identification information for identifying the null data packets may be used. Therefore, the scope of the present invention is not limited only to the examples set forth in the description of the present invention.

According to another embodiment of the present invention, a transmission parameter may be included in at least a portion of the null data packet, or at least one table or an operations and maintenance (OM) packet (or OMP) of the PSI/PSIP table for the mobile service. In this case, the transmitter 200 extracts the transmission parameter and outputs the extracted transmission parameter to the corresponding block and also transmits the extracted parameter to the receiving system if required. More specifically, a packet referred to as an OMP is defined for the purpose of operating and managing the transmitting system. For example, the OMP is configured in accordance with the MPEG-2 TS packet format, and the corresponding PID is given the value of 0x1 FFA. The OMP is configured of a 4-byte header and a 184-byte payload. Herein, among the 184 bytes, the first byte corresponds to an OM_type field, which indicates the type of the OM packet.

In the present invention, the transmission parameter may be transmitted in the form of an OMP. And, in this case, among the values of the reserved fields within the OM_type field, a pre-arranged value is used, thereby indicating that the transmission parameter is being transmitted to the transmitter 200 in the form of an OMP. More specifically, the transmitter 200 may find (or identify) the OMP by referring to the PID. Also, by parsing the OM_type field within the OMP, the transmitter 200 can verify whether a transmission parameter is included after the OM_type field of the corresponding packet. The transmission parameter corresponds to supplemental data required for processing mobile service data from the transmitting system and the receiving system.

The transmission parameter corresponds to supplemental data required for processing mobile service data from the transmitting system and the receiving system. Herein, the transmission parameter may include data group information, region information within the data group, block information, RS frame information, super frame information, MPH frame information, parade information, ensemble information, information associated with serial concatenated convolution code (SCCC), and RS code information. The significance of some information within the transmission parameters has already been described in detail. Descriptions of other information that have not yet been described will be in detail in a later process.

The transmission parameter may also include information on how signals of a symbol domain are encoded in order to transmit the mobile service data, and multiplexing information on how the main service data and the mobile service data or various types of mobile service data are multiplexed.

The information included in the transmission parameter is merely exemplary to facilitate the understanding of the present invention. And, the adding and deleting of the information included in the transmission parameter may be easily modified and changed by anyone skilled in the art. Therefore, the present invention is not limited to the examples proposed in the description set forth herein.

Furthermore, the transmission parameters may be provided from the service multiplexer 100 to the transmitter 200. Alternatively, the transmission parameters may also be set up by an internal controller (not shown) within the transmitter 200 or received from an external source.

Transmitter

Figure 15:
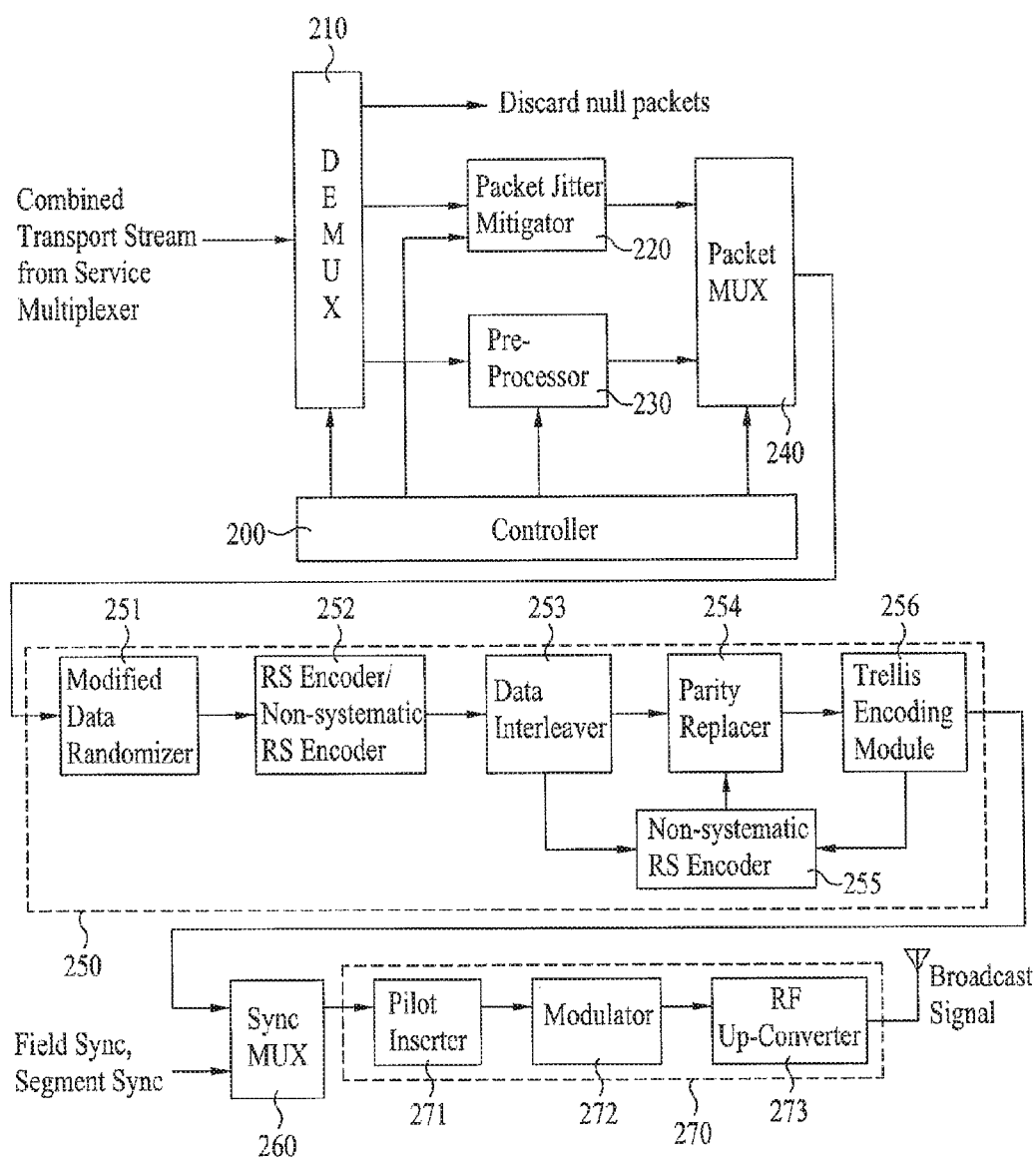
FIG. 15 illustrates a block diagram showing an example of a transmitter according to an embodiment of the present invention.

FIG. 15 illustrates a block diagram showing an example of the transmitter 200 according to an embodiment of the present invention. Herein, the transmitter 200 includes a controller 200, a demultiplexer 210, a packet jitter mitigator 220, a pre-processor 230, a packet multiplexer 240, a post-processor 250, a synchronization (sync) multiplexer 260, and a transmission unit 270. Herein, when a data packet is received from the service multiplexer 100, the demultiplexer 210 should identify whether the received data packet corresponds to a main service data packet, a mobile service data packet, or a null data packet. For example, the demultiplexer 210 uses the PID within the received data packet in order to identify the main service data packet and the mobile service data packet. Then, the demultiplexer 210 uses a transport error indicator field to identify the null data packet. The main service data packet identified by the demultiplexer 210 is output to the packet jitter mitigator 220, the mobile service data packet is output to the preprocessor 230, and the null data packet is discarded. If a transmission parameter is included in the null data packet, then the transmission parameter is first extracted and output to the corresponding block. Thereafter, the null data packet is discarded.

The pre-processor 230 performs an additional encoding process of the mobile service data included in the service data packet, which is demultiplexed and output from the demultiplexer 210. The pre-processor 230 also performs a process of configuring a data group so that the data group may be positioned at a specific place in accordance with the purpose of the data, which are to be transmitted on a transmission frame. This is to enable the mobile service data to respond swiftly and strongly against noise and channel changes. The preprocessor 230 may also refer to the transmission parameter when performing the additional encoding process. Also, the pre-processor 230 groups a plurality of mobile service data packets to configure a data group. Thereafter, known data, mobile service data, RS parity data, and MPEG header are allocated to predetermined regions within the data group.

Pre-Processor within Transmitter

Figure 16:
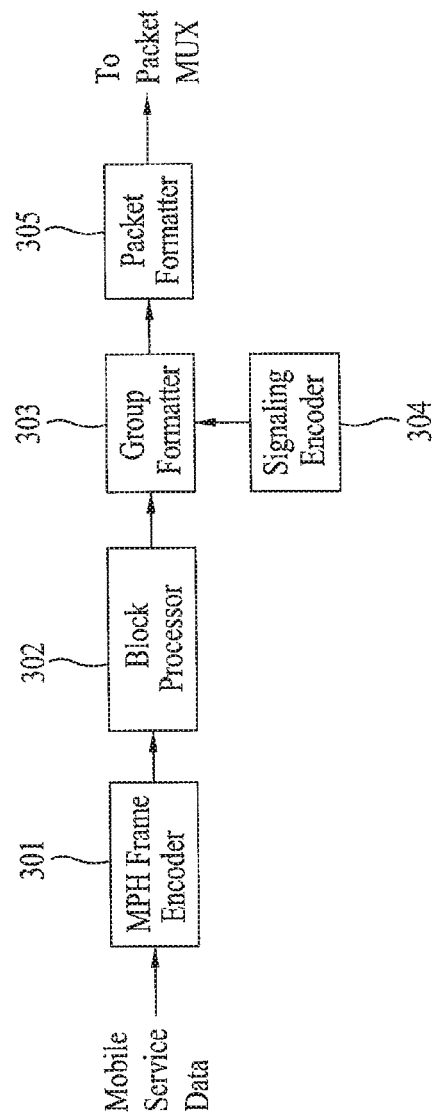
FIG. 16 illustrates a block diagram showing an example of a preprocessor according to the present invention.

FIG. 16 illustrates a block diagram showing the structure of a pre-processor 230 according to the present invention. Herein, the pre-processor 230 includes an MPH frame encoder 301, a block processor 302, a group formatter 303, a signaling encoder 304, and a packet formatter 305. The MPH frame encoder 301, which is included in the pre-processor 230 having the above-described structure, data-randomizes the mobile service data that are input to the demultiplexer 210, thereby creating a RS frame. Then, the MPH frame encoder 301 performs an encoding process for error correction in RS frame units. The MPH frame encoder 301 may include at least one RS frame encoder. More specifically, RS frame encoders may be provided in parallel, wherein the number of RS frame encoders is equal to the number of parades within the MPH frame. As described above, the MPH frame is a basic time cycle period for transmitting at least one parade. Also, each parade consists of one or two RS frames.

Figure 17:
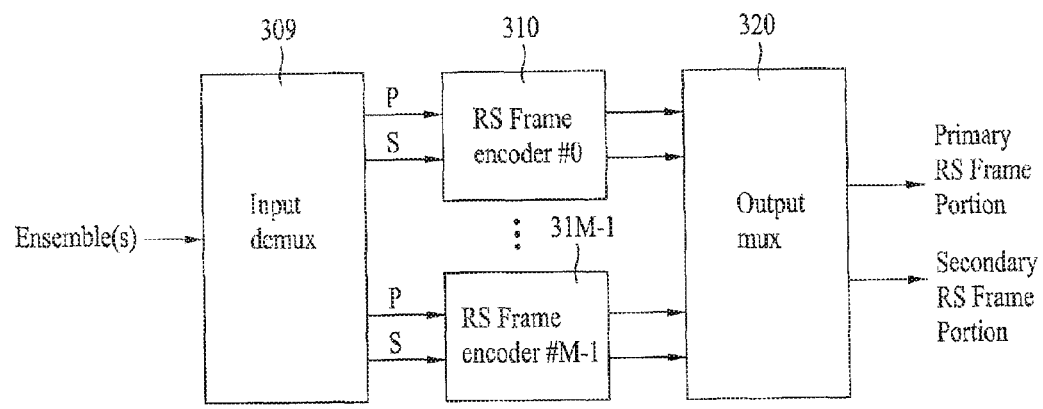
FIG. 17 illustrates a conceptual block diagram of the MPH frame encoder according to an embodiment of the present invention.

FIG. 17 illustrates a conceptual block diagram of the MPH frame encoder 301 according to an embodiment of the present invention. The MPH frame encoder 301 includes an input demultiplexer (DEMUX) 309, M number of RS frame encoders 310 to 31M−1, and an output multiplexer (MUX) 320. Herein, M represent the number of parades included in one MPH frame. The input demultiplexer (DEMUX) 309 splits input ensembles. Then, the split input ensembles decide the RS frame to which the ensembles are to be input. Thereafter, the input ensembles are output to the respective RS frame. At this point, an ensemble may be mapped to each RS frame encoder or parade. For example, when one parade configures one RS frame, the ensembles, RS frames, and parades may each be mapped to be in a one-to-one (1:1) correspondence with one another. More specifically, the data in one ensemble configure a RS frame. And, a RS frame is divided into a plurality of data groups. Based upon the RS frame mode of Table 1, the data within one RS frame may be assigned either to all of regions A/B/C/D within multiple data groups, or to at least one of regions A/B and regions C/D within multiple data groups.

When the RS frame mode value is equal to '01', i.e., when the data of the primary RS frame are assigned to regions A/B of the corresponding data group and data of the secondary RS frame are assigned to regions C/D of the corresponding data group, each RS frame encoder creates a primary RS frame and a secondary RS frame for each parade. Conversely, when the RS frame mode value is equal to '00', when the data of the primary RS frame are assigned to all of regions A/B/C/D, each RS frame encoder creates a RS frame (i.e., a primary RS frame) for each parade. Also, each RS frame encoder divides each RS frame into several portions. Each portion of the RS frame is equivalent to a data amount that can be transmitted by a data group.

The output multiplexer (MUX) 320 multiplexes portions within M number of RS frame encoders 310 to 310M−1 are multiplexed and then output to the block processor 302. For example, if one parade transmits two RS frames, portions of primary RS frames within M number of RS frame encoders 310 to 310M−1 are multiplexed and output. Thereafter, portions of secondary RS frames within M number of RS frame encoders 310 to 310M−1 are multiplexed and transmitted. The input demultiplexer (DEMUX) 309 and the output multiplexer (MUX) 320 operate based upon the control of the control unit 200. The control unit 200 may provide necessary (or required) FEC modes to each RS frame encoder. The FEC mode includes the RS code mode, which will be described in detail in a later process.

Figure 18:
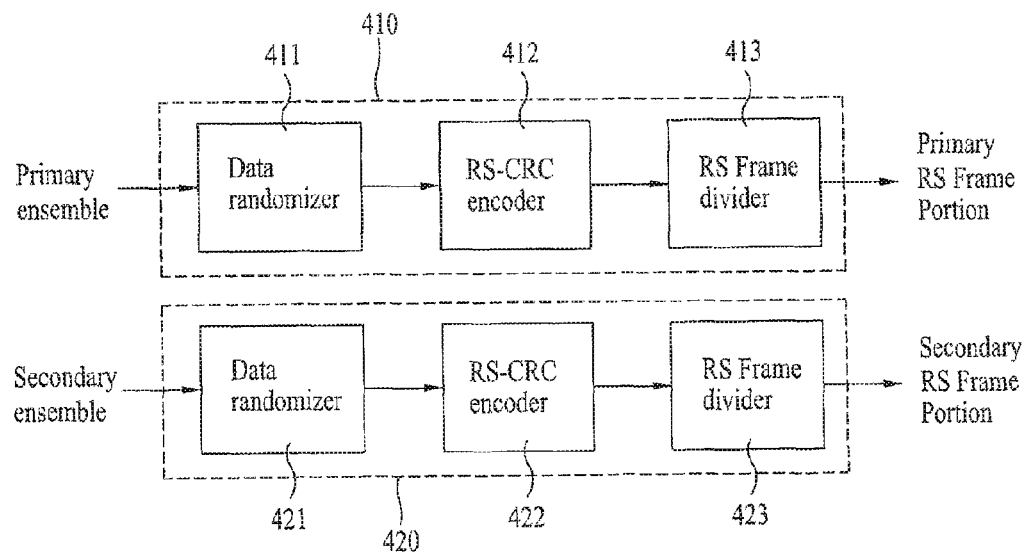
FIG. 18 illustrates a detailed block diagram of an RS frame encoder among a plurality of RS frame encoders within an MPH frame encoder.

FIG. 18 illustrates a detailed block diagram of an RS frame encoder among a plurality of RS frame encoders within an MPH frame encoder. One RS frame encoder may include a primary encoder 410 and a secondary encoder 420. Herein, the secondary encoder 420 may or may not operate based upon the RS frame mode. For example, when the RS frame mode value is equal to '00', as shown in Table 1, the secondary encoder 420 does not operate. The primary encoder 410 may include a data randomizer 411, a Reed-Solomon-cyclic redundancy check (RS-CRC) encoder (412), and a RS frame divider 413. And, the secondary encoder 420 may also include a data randomizer 421, a RS-CRC encoder (422), and a RS frame divider 423.

More specifically, the data randomizer 411 of the primary encoder 410 receives mobile service data of a primary ensemble output from the output demultiplexer (DEMUX) 309. Then, after randomizing the received mobile service data, the data randomizer 411 outputs the randomized data to the RS-CRC encoder 412. At this point, since the data randomizer 411 performs the randomizing process on the mobile service data, the randomizing process that is to be performed by the data randomizer 251 of the post-processor 250 on the mobile service data may be omitted. The data randomizer 411 may also discard the synchronization byte within the mobile service data packet and perform the randomizing process. This is an option that may be chosen by the system designer. In the example given in the present invention, the randomizing process is performed without discarding the synchronization byte within the corresponding mobile service data packet.

The RS-CRC encoder 412 uses at least one of a Reed-Solomon (RS) code and a cyclic redundancy check (CRC) code, in order to perform forward error collection (FEC) encoding on the randomized primary ensemble, thereby forming a primary RS frame. Therefore, the RS-CRC encoder 412 outputs the newly formed primary RS frame to the RS frame divider 413. The RS-CRC encoder 412 groups a plurality of mobile service data packets that is randomized and input, in order to create a RS frame. Then, the RS-CRC encoder 412 performs at least one of an error correction encoding process and an error detection encoding process in RS frame units. Accordingly, robustness may be provided to the mobile service data, thereby scattering group error that may occur during changes in a frequency environment, thereby enabling the mobile service data to respond to the frequency environment, which is extremely vulnerable and liable to frequent changes. Also, the RS-CRC encoder 412 groups a plurality of RS frame in order to create a super frame, thereby performing a row permutation process in super frame units. The row permutation process may also be referred to as a "row interleaving process". Hereinafter, the process will be referred to as "row permutation" for simplicity.

More specifically, when the RS-CRC encoder 412 performs the process of permuting each row of the super frame in accordance with a predetermined rule, the position of the rows within the super frame before and after the row permutation process is changed. If the row permutation process is performed by super frame units, and even though the section having a plurality of errors occurring therein becomes very long, and even though the number of errors included in the RS frame, which is to be decoded, exceeds the extent of being able to be corrected, the errors become dispersed within the entire super frame. Thus, the decoding ability is even more enhanced as compared to a single RS frame.

At this point, as an example of the present invention, RS-encoding is applied for the error correction encoding process, and a cyclic redundancy check (CRC) encoding is applied for the error detection process in the RS-CRC encoder 412. When performing the RS-encoding, parity data that are used for the error correction are generated. And, when performing the CRC encoding, CRC data that are used for the error detection are generated. The CRC data generated by CRC encoding may be used for indicating whether or not the mobile service data have been damaged by the errors while being transmitted through the channel. In the present invention, a variety of error detection coding methods other than the CRC encoding method may be used, or the error correction coding method may be used to enhance the overall error correction ability of the receiving system. Herein, the RS-CRC encoder 412 refers to a pre-determined transmission parameter provided by the control unit 200 and/or a transmission parameter provided from the service multiplexer 100 in order to perform operations including RS frame configuration, RS encoding, CRC encoding, super frame configuration, and row permutation in super frame units.

Figure 19A:
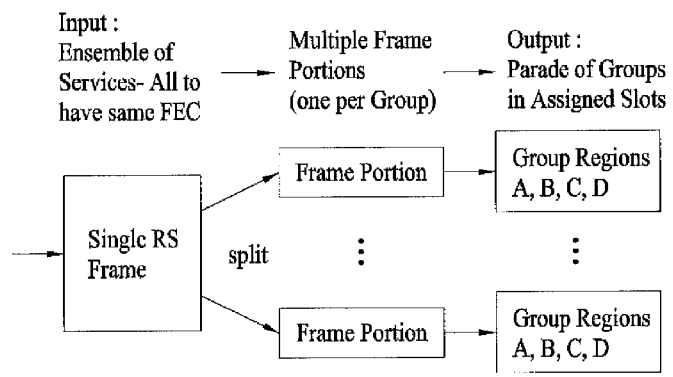
FIG. 19(a) and FIG. 19(b) illustrate a process of one or two RS frame being divided into several portions, based upon an RS frame mode value, and a process of each portion being assigned to a corresponding region within the respective data group.
Figure 19B:
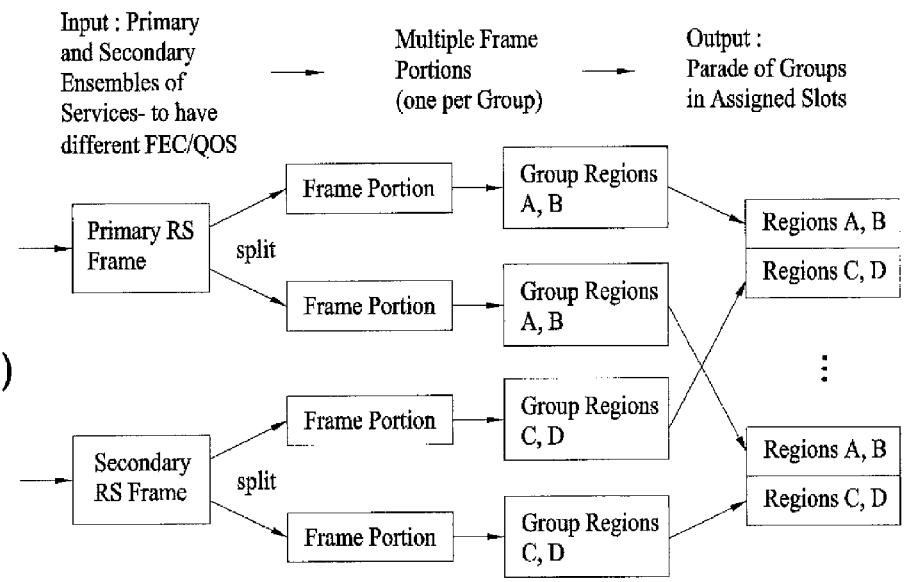

FIG. 19 illustrates a process of one or two RS frame being divided into several portions, based upon an RS frame mode value, and a process of each portion being assigned to a corresponding region within the respective data group. More specifically, FIG. 19(a) shows an example of the RS frame mode value being equal to '00'. Herein, only the primary encoder 410 of FIG. 18 operates, thereby forming one RS frame for one parade. Then, the RS frame is divided into several portions, and the data of each portion are assigned to regions A/B/C/D within the respective data group. FIG. 19(b) shows an example of the RS frame mode value being equal to '01'. Herein, both the primary encoder 410 and the secondary encoder 420 of FIG. 18 operate, thereby forming two RS frames for one parade, i.e., one primary RS frame and one secondary RS frame. Then, the primary RS frame is divided into several portions, and the secondary RS frame is divided into several portions. At this point, the data of each portion of the primary RS frame are assigned to regions A/B within the respective data group. And, the data of each portion of the secondary RS frame are assigned to regions C/D within the respective data group.

Detailed Description of the RS Frame

Figure 20A:
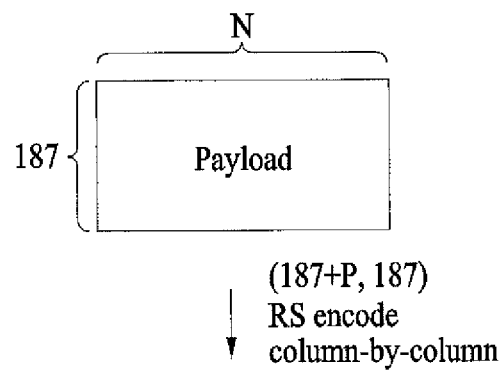
FIG. 20(a) to FIG. 20(c) illustrate error correction encoding and error detection encoding processes according to an embodiment of the present invention.

FIG. 20(a) illustrates an example of an RS frame being generated from the RS-CRC encoder 412 according to the present invention. According to this embodiment, in the RS frame, the length of a column (i.e., number of rows) is set to 187 bytes, and the length of a row (i.e., number of column) is set to N bytes. At this point, the value of N, which corresponds to the number of columns within an RS frame, can be decided according to Equation 2.

$$N = \left\lfloor \frac{5 \times NoG \times PL}{187 + P} \right\rfloor - 2 \qquad \text{Equation 2}$$

Herein, NoG indicates the number of data groups assigned to a sub-frame. PL represents the number of SCCC payload data bytes assigned to a data group. And, P signifies the number of RS parity data bytes added to each column of the RS frame. Finally, $\lfloor x \rfloor$ is the greatest integer that is equal to or smaller than X.

More specifically, in Equation 2, PL corresponds to the length of an RS frame portion. The value of PL is equivalent to the number of SCCC payload data bytes that are assigned to the corresponding data group. Herein, the value of PL may vary depending upon the RS frame mode, SCCC block mode, and SCCC outer code mode. Table 2 to Table 5 below respectively show examples of PL values, which vary in accordance with the RS frame mode, SCCC block mode, and SCCC outer code mode. The SCCC block mode and the SCCC outer code mode will be described in detail in a later process.

TABLE 2

| SCCC outer code mode | | | | |
|---|---|---|---|---|
| for Region A | for Region B | for Region C | for Region D | PL |
| 00 | 00 | 00 | 00 | 9624 |
| 00 | 00 | 00 | 01 | 9372 |
| 00 | 00 | 01 | 00 | 8886 |
| 00 | 00 | 01 | 01 | 8634 |
| 00 | 01 | 00 | 00 | 8403 |
| 00 | 01 | 00 | 01 | 8151 |
| 00 | 01 | 01 | 00 | 7665 |
| 00 | 01 | 01 | 01 | 7413 |
| 01 | 00 | 00 | 00 | 7023 |
| 01 | 00 | 00 | 01 | 6771 |
| 01 | 00 | 01 | 00 | 6285 |
| 01 | 00 | 01 | 01 | 6033 |
| 01 | 01 | 00 | 00 | 5802 |

TABLE 2-continued

| \multicolumn{4}{c|}{SCCC outer code mode} | |
|---|---|---|---|---|
| for Region A | for Region B | for Region C | for Region D | PL |
| 01 | 01 | 00 | 01 | 5550 |
| 01 | 01 | 01 | 00 | 5064 |
| 01 | 01 | 01 | 01 | 4812 |
| \multicolumn{4}{c|}{Others} | Reserved |

Table 2 shows an example of the PL values for each data group within an RS frame, wherein each PL value varies depending upon the SCCC outer code mode, when the RS frame mode value is equal to '00', and when the SCCC block mode value is equal to '00'. For example, when it is assumed that each SCCC outer code mode value of regions A/B/C/D within the data group is equal to '00' (i.e., the block processor 302 of a later block performs encoding at a coding rate of ½), the PL value within each data group of the corresponding RS frame may be equal to 9624 bytes. More specifically, 9624 bytes of mobile service data within one RS frame may be assigned to regions A/B/C/D of the corresponding data group.

TABLE 3

| SCCC outer code mode | PL |
|---|---|
| 00 | 9624 |
| 01 | 4812 |
| Others | Reserved |

Table 3 shows an example of the PL values for each data group within an RS frame, wherein each PL value varies depending upon the SCCC outer code mode, when the RS frame mode value is equal to '00', and when the SCCC block mode value is equal to '01'.

TABLE 4

| \multicolumn{2}{c|}{SCCC outer code mode} | |
|---|---|---|
| for Region A | for Region B | PL |
| 00 | 00 | 7644 |
| 00 | 01 | 6423 |
| 01 | 00 | 5043 |
| 01 | 01 | 3822 |
| \multicolumn{2}{c|}{Others} | Reserved |

Table 4 shows an example of the PL values for each data group within a primary RS frame, wherein each PL value varies depending upon the SCCC outer code mode, when the RS frame mode value is equal to '01', and when the SCCC block mode value is equal to '00'. For example, when each SCCC outer code mode value of regions NB is equal to '00', 7644 bytes of mobile service data within a primary RS frame may be assigned to regions A/B of the corresponding data group.

TABLE 5

| \multicolumn{2}{c|}{SCCC outer code mode} | |
|---|---|---|
| for Region C | for Region D | PL |
| 00 | 00 | 1980 |
| 00 | 01 | 1728 |
| 01 | 00 | 1242 |
| 01 | 01 | 990 |
| \multicolumn{2}{c|}{Others} | Reserved |

Table 5 shows an example of the PL values for each data group within a secondary RS frame, wherein each PL value varies depending upon the SCCC outer code mode, when the RS frame mode value is equal to '01', and when the SCCC block mode value is equal to '00'. For example, when each SCCC outer code mode value of regions C/D is equal to '00', 1980 bytes of mobile service data within a secondary RS frame may be assigned to regions C/D of the corresponding data group.

According to the embodiment of the present invention, the value of N is equal to or greater than 187 (i.e., N 187). More specifically, the RS frame of FIG. 20(*a*) has the size of N (row)×187 (column) bytes. More specifically, the RS-CRC encoder 412 first divides the input mobile service data bytes to units of a predetermined length. The predetermined length is decided by the system designer. And, in the example of the present invention, the predetermined length is equal to 187 bytes, and, therefore, the 187-byte unit will be referred to as a "packet" for simplicity. For example, the input mobile service data may correspond either to an MPEG transport stream (TS) packet configured of 188-byte units or to an IP datagram. Alternatively, the IP datagram may be encapsulated to a TS packet of 188-byte units and, then, input.

When the mobile service data that are being input correspond to a MPEG transport packet stream configured of 188-byte units, the first synchronization byte is removed in order to configure a 187-byte unit. Then, N number of packets are grouped to form an RS frame. Herein, the synchronization byte is removed because each mobile service data packet has the same value. Meanwhile, when the input mobile service data of the RS frame do not correspond to the MPEG TS packet format, the mobile service data are input N number of times in 187-byte units without being processed with the removing of the MPEG synchronization byte, thereby creating a RS frame.

In addition, when the input data format of the RS frame supports both the input data corresponding to the MPEG TS packet and the input data not corresponding to the MPEG TS packet, such information may be included in a transmission parameter transmitted from the service multiplexer 100, thereby being sent to the transmitter 200. Accordingly, the RS-CRC encoder 412 of the transmitter 200 receives this information to be able to control whether or not to perform the process of removing the MPEG synchronization byte. Also, the transmitter provides such information to the receiving system in order to control the process of inserting the MPEG synchronization byte that is to be performed by the RS frame decoder of the receiving system. Herein, the process of removing the synchronization byte may be performed during a randomizing process of the data randomizer 411 in an earlier process. In this case, the process of the removing the synchronization byte by the RS-CRC encoder 412 may be omitted.

Moreover, when adding synchronization bytes from the receiving system, the process may be performed by the data derandomizer instead of the RS frame decoder. Therefore, if a removable fixed byte (e.g., synchronization byte) does not exist within the mobile service data packet that is being input to the RS-CRC encoder 412, or if the mobile service data that are being input are not configured in a packet format, the mobile service data that are being input are divided into 187-byte units, thereby configuring a packet for each 187-byte unit.

Subsequently, N number of packets configured of 187 bytes is grouped to configure a RS frame. At this point, the RS frame is configured as a RS frame having the size of N (row)×187 (column) bytes, in which 187-byte packets are sequentially input in a row direction. More specifically, each of the N number of columns included in the RS frame includes 187 bytes. When the RS frame is created, as shown in FIG. 20(a), the RS-CRC encoder 412 performs a (Nc, Kc)-RS encoding process on each column, in order to generate Nc−Kc (=P) number of parity bytes. Then, the RS-CRC encoder 412 adds the newly generated P number of parity bytes after the very last byte of the corresponding column, thereby creating a column of (187+P) bytes. Herein, as shown in FIG. 20(a), Kc is equal to 187 (i.e., Kc=187), and Nc is equal to 187+P (i.e., Nc=187+P). Herein, the value of P may vary depending upon the RS code mode. Table 6 below shows an example of an RS code mode, as one of the RS encoding information.

TABLE 6

| RS code mode | RS code | Number of Parity Bytes (P) |
|---|---|---|
| 00 | (211,187) | 24 |
| 01 | (223,187) | 36 |
| 10 | (235,187) | 48 |
| 11 | Reserved | Reserved |

Table 6 shows an example of 2 bits being assigned in order to indicate the RS code mode. The RS code mode represents the number of parity bytes corresponding to the RS frame. For example, when the RS code mode value is equal to '10', (235,187)-RS-encoding is performed on the RS frame of FIG. 20(a), in order to generate 48 parity data bytes. Thereafter, the 48 parity bytes are added after the last data byte of the corresponding column, thereby creating a column of 235 data bytes. When the RS frame mode value is equal to '00' in Table 1 (i.e., when the RS frame mode indicates a single RS frame), only the RS code mode of the corresponding RS frame is indicated. However, when the RS frame mode value is equal to '01' in Table 1 (i.e., when the RS frame mode indicates multiple RS frames), the RS code mode corresponding to a primary RS frame and a secondary RS frame. More specifically, it is preferable that the RS code mode is independently applied to the primary RS frame and the secondary RS frame.

Figure 20B:
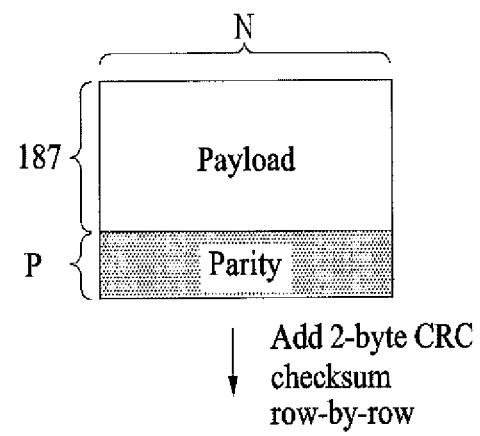

When such RS encoding process is performed on all N number of columns, a RS frame having the size of N (row)×(187+P) (column) bytes may be created, as shown in FIG. 20(b). Each row of the RS frame is configured of N bytes. However, depending upon channel conditions between the transmitting system and the receiving system, error may be included in the RS frame. When errors occur as described above, CRC data (or CRC code or CRC checksum) may be used on each row unit in order to verify whether error exists in each row unit. The RS-CRC encoder 412 may perform CRC encoding on the mobile service data being RS encoded in order to create (or generate) the CRC data. The CRC data being generated by CRC encoding may be used to indicate whether the mobile service data have been damaged while being transmitted through the channel.

Figure 20C:
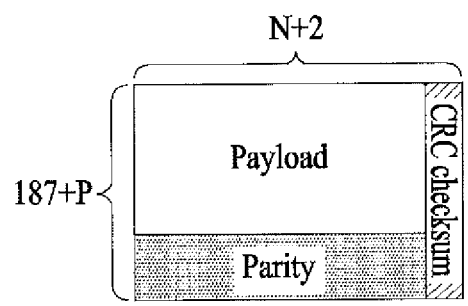

The present invention may also use different error detection encoding methods other than the CRC encoding method. Alternatively, the present invention may use the error correction encoding method to enhance the overall error correction ability of the receiving system. FIG. 20(c) illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes. Equation 3 below corresponds to an exemplary equation for generating a 2-byte CRC checksum for each row being configured of N number of bytes.

$$g(x) = x16 + x^{12} + x5 + 1 \qquad \text{Equation 3}$$

The process of adding a 2-byte checksum in each row is only exemplary. Therefore, the present invention is not limited only to the example proposed in the description set forth herein. As described above, when the process of RS encoding and CRC encoding are completed, the (N×187)-byte RS frame is expanded to a (N+2)×(187+P)-byte RS frame. Based upon an error correction scenario of a RS frame expanded as described above, the data bytes within the RS frame are transmitted through a channel in a row direction. At this point, when a large number of errors occur during a limited period of transmission time, errors also occur in a row direction within the RS frame being processed with a decoding process in the receiving system. However, in the perspective of RS encoding performed in a column direction, the errors are shown as being scattered. Therefore, error correction may be performed more effectively. At this point, a method of increasing the number of parity data bytes (P) may be used in order to perform a more intense error correction process. However, using this method may lead to a decrease in transmission efficiency. Therefore, a mutually advantageous method is required. Furthermore, when performing the decoding process, an erasure decoding process may be used to enhance the error correction performance.

Additionally, the RS-CRC encoder 412 according to the present invention also performs a row permutation (or interleaving) process in super frame units in order to further enhance the error correction performance when error correction the RS frame. FIG. 21(a) to FIG. 21(d) illustrates an example of performing a row permutation process in super frame units according to the present invention. More specifically, G number of RS frames RS-CRC-encoded is grouped to form a super frame, as shown in FIG. 21(a). At this point, since each RS frame is formed of (N+2)×(187+P) number of bytes, one super frame is configured to have the size of (N+2)×(187+P)×G bytes.

When a row permutation process permuting each row of the super frame configured as described above is performed based upon a pre-determined permutation rule, the positions of the rows prior to and after being permuted (or interleaved) within the super frame may be altered. More specifically, the $i^{th}$ row of the super frame prior to the interleaving process, as shown in FIG. 21(b), is positioned in the $j^{th}$ row of the same super frame after the row permutation process, as shown in FIG. 21(c). The above-described relation between i and j can be easily understood with reference to a permutation rule as shown in Equation 4 below.

$$j = G(i \bmod (187+P)) + Li/(187+P)]i = (187+P)(j \bmod G) + DIG] \qquad \text{Equation 4}$$

where $0 \leq i,j \leq (187+P)G-1$;
or where $0 \leq i,j < (187+P)G$

Herein, each row of the super frame is configured of (N+2) number of data bytes even after being row-permuted in super frame units.

When all row permutation processes in super frame units are completed, the super frame is once again divided into G number of row-permuted RS frames, as shown in FIG. 21(d), and then provided to the RS frame divider 413. Herein, the number of RS parity bytes and the number of columns should be equally provided in each of the RS frames, which configure a super frame. As described in the error correction scenario of a RS frame, in case of the super frame, a section having a large number of error occurring therein is so long that, even when one RS frame that is to be decoded includes an excessive number of errors (i.e., to an extent that the errors cannot be corrected), such errors are scattered throughout the entire super frame. Therefore, in comparison with a single RS frame, the decoding performance of the super frame is more enhanced.

The above description of the present invention corresponds to the processes of forming (or creating) and encoding an RS frame, when a data group is divided into regions A/B/C/D, and when data of an RS frame are assigned to all of regions A/B/C/D within the corresponding data group. More specifically, the above description corresponds to an embodiment of the present invention, wherein one RS frame is transmitted using one parade. In this embodiment, the secondary encoder 420 does not operate (or is not active).

Meanwhile, 2 RS frames are transmitting using one parade, the data of the primary RS frame may be assigned to regions A/B within the data group and be transmitted, and the data of the secondary RS frame may be assigned to regions C/D within the data group and be transmitted. At this point, the primary encoder 410 receives the mobile service data that are to be assigned to regions A/B within the data group, in order to form the primary RS frame, thereby performing RS-encoding and CRC-encoding. Similarly, the secondary encoder 420 receives the mobile service data that are to be assigned to regions C/D within the data group, in order to form the secondary RS frame, thereby performing RS-encoding and CRC-encoding. More specifically, the primary RS frame and the secondary RS frame are created independently.

Figure 22A:
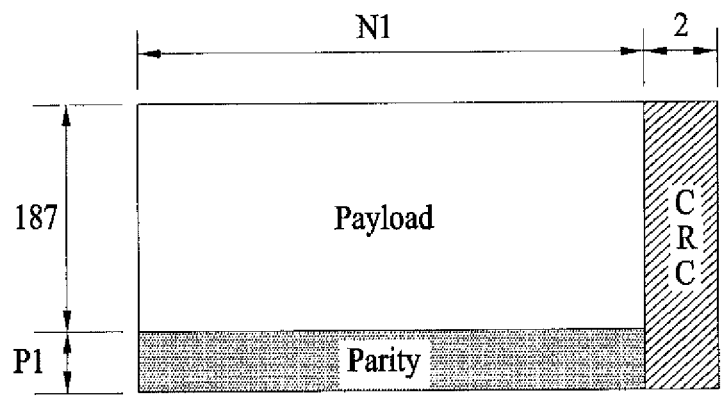
FIG. 22(a) and FIG. 22(b) illustrate an example of creating an RS frame by grouping data, thereby performing error correction encoding and error detection encoding.

FIG. 22 illustrates examples of receiving the mobile service data that are to be assigned to regions A/B within the data group, in order to form the primary RS frame, and receives the mobile service data that are to be assigned to regions C/D within the data group, in order to form the secondary RS frame, thereby performing error correction encoding and error detection encoding on each of the first and secondary RS frames. More specifically, FIG. 22(a) illustrates an example of the RS-CRC encoder 412 of the primary encoder 410 receiving mobile service data of the primary ensemble that are to be assigned to regions A/B within the corresponding data group, in order to create an RS frame having the size of N1(row)×187(column). Then, in this example, the primary encoder 410 performs RS-encoding on each column of the RS frame created as described above, thereby adding P1 number of parity data bytes in each column. Finally, the primary encoder 410 performs CRC-encoding on each row, thereby adding a 2-byte checksum in each row.

Figure 22B:
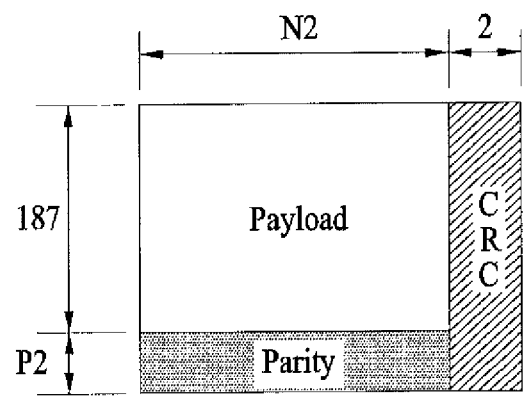

FIG. 22(b) illustrates an example of the RS-CRC encoder 422 of the secondary encoder 420 receiving mobile service data of the secondary ensemble that are to be assigned to regions C/D within the corresponding data group, in order to create an RS frame having the size of N2(row)×187(column). Then, in this example, the secondary encoder 420 performs RS-encoding on each column of the RS frame created as described above, thereby adding P2 number of parity data bytes in each column. Finally, the secondary encoder 420 performs CRC-encoding on each row, thereby adding a 2-byte checksum in each row. At this point, each of the RS-CRC encoders 412 and 422 may refer to a predetermined transmission parameter provided by the control unit 200 and/or a transmission parameter provided from the service multiplexer 100, the RS-CRC encoders 412 and 422 may be informed of RS frame information (including RS frame mode), RS encoding information (including RS code mode), SCCC information (including SCCC block information and SCCC outer code mode), data group information, and region information within a data group. The RS-CRC encoders 412 and 422 may refer to the transmission parameters for the purpose of RS frame configuration, error correction encoding, error detection encoding. Furthermore, the transmission parameters should also be transmitted to the receiving system so that the receiving system can perform a normal decoding process.

The data of the primary RS frame, which is encoded by RS frame units and row-permuted by super frame units from the RS-CRC encoder 412 of the primary encoder 410, are output to the RS frame divider 413. If the secondary encoder 420 also operates in the embodiment of the present invention, the data of the secondary RS frame, which is encoded by RS frame units and row-permuted by super frame units from the RS-CRC encoder 422 of the secondary encoder 420, are output to the RS frame divider 423. The RS frame divider 413 of the primary encoder 410 divides the primary RS frame into several portions, which are then output to the output multiplexer (MUX) 320. Each portion of the primary RS frame is equivalent to a data amount that can be transmitted by one data group. Similarly, the RS frame divider 423 of the secondary encoder 420 divides the secondary RS frame into several portions, which are then output to the output multiplexer (MUX) 320.

Hereinafter, the RS frame divider 413 of the primary RS encoder 410 will now be described in detail. Also, in order to simplify the description of the present invention, it is assumed that an RS frame having the size of N (row)×187 (column), as shown in FIG. 20(a) to FIG. 20(c), that P number of parity data bytes are added to each column by RS-encoding the RS frame, and that a 2-byte checksum is added to each row by CRC-encoding the RS frame. Accordingly, the RS frame divider 413 divides (or partitions) the encoded RS frame having the size of (N+2) (row)×187 (column) into several portions, each having the size of PL (wherein PL corresponds to the length of the RS frame portion).

At this point, as shown in Table 2 to Table 5, the value of PL may vary depending upon the RS frame mode, SCCC block mode, and SCCC outer coder mode. Also, the total number of data bytes of the RS-encoded and CRC-encoded RS frame is equal to or smaller than 5×1\10G×PL. In this case, the RS frame is divided (or partitioned) into ((5× NoG)−1) number of portions each having the size of PL and one portion having a size equal to smaller than PL. More specifically, with the exception of the last portion of the RS frame, each of the remaining portions of the RS frame has an equal size of PL. If the size of the last portion is smaller than PL, a stuffing byte (or dummy byte) may be inserted in order to fill (or replace) the lacking number of data bytes, thereby enabling the last portion of the RS frame to also be equal to PL. Each portion of an RS frame corresponds to the amount of data that are to be SCCC-encoded and mapped into a single data group of a parade.

Figures 23A, 23B:
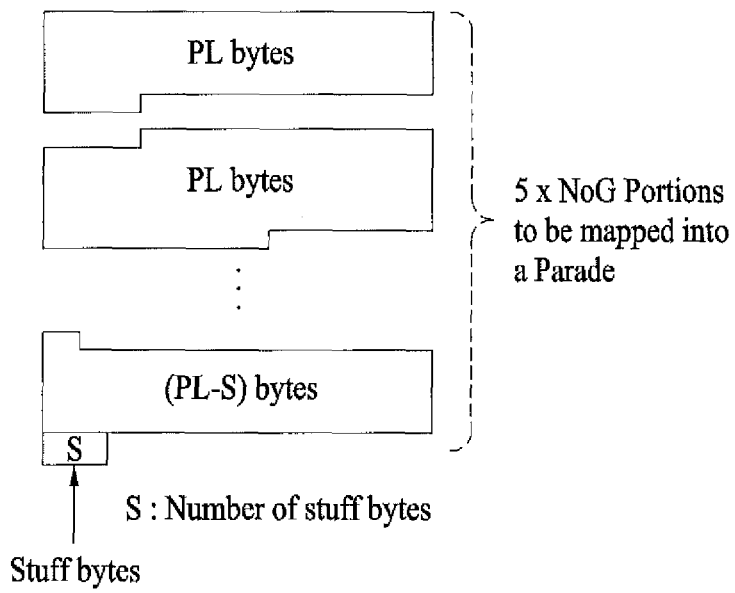
FIG. 23(a) and FIG. 23(b) illustrate an exemplary process of dividing an RS frame for configuring a data group according to the present invention.

FIG. 23(a) and FIG. 23(b) respectively illustrate examples of adding S number of stuffing bytes, when an RS frame having the size of (N+2)(row)×(187+P)(column) is divided into 5× NoG number of portions, each having the size of PL. More specifically, the RS-encoded and CRC-encoded RS frame, shown in FIG. 23(a), is divided into several portions, as shown in FIG. 23(b). The number of divided portions at the RS frame is equal to (5× NoG). Particularly, the first ((5× NoG)−1) number of portions each has the size of PL, and the last portion of the RS frame may be equal to or smaller than PL. If the size of the last portion is smaller than PL, a stuffing byte (or dummy byte) may be inserted in order to fill (or replace) the lacking number of data bytes, as shown in Equation 5 below, thereby enabling the last portion of the RS frame to also be equal to PL.

$$S=(5 \times NoG \times PL)-((N+2) \times (187+P)) \quad \text{Equation 5}$$

Herein, each portion including data having the size of PL passes through the output multiplexer 320 of the MPH frame encoder 301, which is then output to the block processor 302.

At this point, the mapping order of the RS frame portions to a parade of data groups in not identical with the group assignment order defined in Equation 1. When given the group positions of a parade in an MPH frame, the SCCC-encoded RS frame portions will be mapped in a time order (i.e., in a left-to-right direction). For example, as shown in FIG. 11, data groups of the $2^{nd}$ parade (Parade #1) are first assigned (or allocated) to the $13^{th}$ slot (Slot #12) and then assigned to the $3^{rd}$ slot (Slot #2). However, when the data are actually placed in the assigned slots, the data are placed in a time sequence (or time order, i.e., in a left-to-right direction). More specifically, the $1^{st}$ data group of Parade #1 is placed in Slot #2, and the $2^{nd}$ data group of Parade #1 is placed in Slot #12.

Block Processor

Meanwhile, the block processor 302 performs an SCCC outer encoding process on the output of the MPH frame encoder 301. More specifically, the block processor 302 receives the data of each error correction encoded portion. Then, the block processor 302 encodes the data once again at a coding rate of 1/H (wherein H is an integer equal to or greater than 2 (i.e., H 2)), thereby outputting the 1/H-rate encoded data to the group formatter 303. According to the embodiment of the present invention, the input data are encoded either at a coding rate of ½ (also referred to as "½-rate encoding") or at a coding rate of ¼ (also referred to as "¼-rate encoding"). The data of each portion output from the MPH frame encoder 301 may include at least one of pure mobile service data, RS parity data, CRC data, and stuffing data. However, in a broader meaning, the data included in each portion may correspond to data for mobile services. Therefore, the data included in each portion will all be considered as mobile service data and described accordingly.

The group formatter 303 inserts the mobile service data SCCC-outer-encoded and output from the block processor 302 in the corresponding region within the data group, which is formed in accordance with a pre-defined rule. Also, in association with the data deinterleaving process, the group formatter 303 inserts various place holders (or known data place holders) in the corresponding region within the data group. Thereafter, the group formatter 303 deinterleaves the data within the data group and the place holders.

According to the present invention, with reference to data after being data-interleaved, as shown in FIG. 5, a data groups is configured of 10 MPH blocks (B1 to B10) and divided into 4 regions (A, B, C, and D). Also, as shown in FIG. 5, when it is assumed that the data group is divided into a plurality of hierarchical regions, as described above, the block processor 302 may encode the mobile service data, which are to be inserted to each region based upon the characteristic of each hierarchical region, at different coding rates. For example, the block processor 302 may encode the mobile service data, which are to be inserted in region A/B within the corresponding data group, at a coding rate of ½. Then, the group formatter 303 may insert the ½-rate encoded mobile service data to region A/B. Also, the block processor 302 may encode the mobile service data, which are to be inserted in region C/D within the corresponding data group, at a coding rate of ¼ having higher (or stronger) error correction ability than the ½-coding rate. Thereafter, the group formatter 303 may insert the ½-rate encoded mobile service data to region C/D. In another example, the block processor 302 may encode the mobile service data, which are to be inserted in region C/D, at a coding rate having higher error correction ability than the ¼-coding rate. Then, the group formatter 303 may either insert the encoded mobile service data to region C/D, as described above, or leave the data in a reserved region for future usage.

According to another embodiment of the present invention, the block processor 302 may perform a 1/H-rate encoding process in SCCC block units. Herein, the SCCC block includes at least one MPH block. At this point, when 1/H-rate encoding is performed in MPH block units, the MPH blocks (B1 to B10) and the SCCC block (SCB1 to SCB10) become identical to one another (i.e., SCB1=B1, SCB2=B2, SCB3=B3, SCB4=B4, SCB5=B5, SCB6=B6, SCB7=B7, SCB8=B8, SCB9=B9, and SCB10=B10). For example, the MPH block 1 (B1) may be encoded at the coding rate of ½, the MPH block 2 (B2) may be encoded at the coding rate of ¼, and the MPH block 3 (B3) may be encoded at the coding rate of ½. The coding rates are applied respectively to the remaining MPH blocks.

Alternatively, a plurality of MPH blocks within regions A, B, C, and D may be grouped into one SCCC block, thereby being encoded at a coding rate of 1/H in SCCC block units. Accordingly, the receiving performance of region C/D may be enhanced. For example, MPH block 1 (B1) to MPH block 5 (B5) may be grouped into one SCCC block and then encoded at a coding rate of ½. Thereafter, the group formatter 303 may insert the ½-rate encoded mobile service data to a section starting from MPH block 1 (B1) to MPH block 5 (B5). Furthermore, MPH block 6 (B6) to MPH block 10 (B10) may be grouped into one SCCC block and then encoded at a coding rate of ¼. Thereafter, the group formatter 303 may insert the ¼-rate encoded mobile service data to another section starting from MPH block 6 (B6) to MPH block 10 (B10). In this case, one data group may consist of two SCCC blocks.

According to another embodiment of the present invention, one SCCC block may be formed by grouping two MPH blocks. For example, MPH block 1 (B1) and MPH block 6 (B6) may be grouped into one SCCC block (SCB1). Similarly, MPH block 2 (B2) and MPH block 7 (B7) may be grouped into another SCCC block (SCB2). Also, MPH block 3 (B3) and MPH block 8 (B8) may be grouped into another SCCC block (SCB3). And, MPH block 4 (B4) and MPH block 9 (B9) may be grouped into another SCCC block (SCB4). Furthermore, MPH block 5 (B5) and MPH block 10 (B10) may be grouped into another SCCC block (SCB5). In the above-described example, the data group may consist of 10 MPH blocks and 5 SCCC blocks. Accordingly, in a data (or signal) receiving environment undergoing frequent and severe channel changes, the receiving performance of regions C and D, which is relatively more deteriorated than the receiving performance of region A, may be reinforced. Furthermore, since the number of mobile service data symbols increases more and more from region A to region D, the error correction encoding performance becomes more and more deteriorated. Therefore, when grouping a plurality of MPH block to form one SCCC block, such deterioration in the error correction encoding performance may be reduced.

As described-above, when the block processor 302 performs encoding at a 1/H-coding rate, information associated with SCCC should be transmitted to the receiving system in order to accurately recover the mobile service data. Table 7 below shows an example of a SCCC block mode, which indicating the relation between an MPH block and an SCCC block, among diverse SCCC block information.

TABLE 7

| SCCC Block Mode | 00 | 01 | 10 | 11 |
|---|---|---|---|---|
| Description | One MPH Block per SCCC Block | Two MPH Blocks per SCCC Block | Reserved | Reserved |
| SCB | SCB input, MPH Block | SCB input, MPH Blocks | | |
| SCB1 | B1 | B1 + B6 | | |
| SCB2 | B2 | B2 + B7 | | |
| SCB3 | B3 | B3 + B8 | | |
| SCB4 | B4 | B4 + B9 | | |
| SCB5 | B5 | B5+ 1310 | | |
| SCB6 | B6 | — | | |
| SCB7 | B7 | — | | |
| SCB8 | B8 | — | | |
| SCB9 | B9 | — | | |
| SCB10 | B10 | — | | |

More specifically, Table 4 shows an example of 2 bits being allocated in order to indicate the SCCC block mode. For example, when the SCCC block mode value is equal to '00', this indicates that the SCCC block and the MPH block are identical to one another. Also, when the SCCC block mode value is equal to '01', this indicates that each SCCC block is configured of 2 MPH blocks.

As described above, if one data group is configured of 2 SCCC blocks, although it is not indicated in Table 7, this information may also be indicated as the SCCC block mode. For example, when the SCCC block mode value is equal to '10', this indicates that each SCCC block is configured of 5 MPH blocks and that one data group is configured of 2 SCCC blocks. Herein, the number of MPH blocks included in an SCCC block and the position of each MPH block may vary depending upon the settings made by the system designer. Therefore, the present invention will not be limited to the examples given herein. Accordingly, the SCCC mode information may also be expanded.

An example of coding rate information of the SCCC block, i.e., SCCC outer code mode, is shown in Table 8 below.

TABLE 8

| SCCC outer code mode (2 bits) | Description |
|---|---|
| 00 | Outer code rate of SCCC block is 1/2 rate |

TABLE 8-continued

| SCCC outer code mode (2 bits) | Description |
|---|---|
| 01 | Outer code rate of SCCC block is 1/4 rate |
| 10 | Reserved |
| 11 | Reserved |

More specifically, Table 8 shows an example of 2 bits being allocated in order to indicate the coding rate information of the SCCC block. For example, when the SCCC outer code mode value is equal to '00', this indicates that the coding rate of the corresponding SCCC block is ½. And, when the SCCC outer code mode value is equal to '01', this indicates that the coding rate of the corresponding SCCC block is ¼.

If the SCCC block mode value of Table 7 indicates '00', the SCCC outer code mode may indicate the coding rate of each MPH block with respect to each MPH block. In this case, since it is assumed that one data group includes 10 MPH blocks and that 2 bits are allocated for each SCCC block mode, a total of 20 bits are required for indicating the SCCC block modes of the 10 MPH modes. In another example, when the SCCC block mode value of Table 7 indicates '00', the SCCC outer code mode may indicate the coding rate of each region with respect to each region within the data group. In this case, since it is assumed that one data group includes 4 regions (i.e., regions A, B, C, and D) and that 2 bits are allocated for each SCCC block mode, a total of 8 bits are required for indicating the SCCC block modes of the 4 regions. In another example, when the SCCC block mode value of Table 7 is equal to '01', each of the regions A, B, C, and D within the data group has the same SCCC outer code mode.

Meanwhile, an example of an SCCC output block length (SOBL) for each SCCC block, when the SCCC block mode value is equal to '00', is shown in Table 9 below.

TABLE 9

| SCCC Block | SOBL | SIBL 1/2 rate | SIBL 1/4 rate |
|---|---|---|---|
| SCB1 (B1) | 528 | 264 | 132 |
| SCB2 (B2) | 1536 | 768 | 384 |
| SCB3 (B3) | 2376 | 1188 | 594 |
| SCB4 (B4) | 2388 | 1194 | 597 |
| SCB5 (B5) | 2772 | 1386 | 693 |
| SCB6 (B6) | 2472 | 1236 | 618 |
| SCB7 (B7) | 2772 | 1386 | 693 |
| SCB8 (B8) | 2508 | 1254 | 627 |
| SCB9 (B9) | 1416 | 708 | 354 |
| SCB10 (B10) | 480 | 240 | 120 |

More specifically, when given the SCCC output block length (SOBL) for each SCCC block, an SCCC input block length (SIBL) for each corresponding SCCC block may be decided based upon the outer coding rate of each SCCC block. The SOBL is equivalent to the number of SCCC output (or outer-encoded) bytes for each SCCC block. And, the SIBL is equivalent to the number of SCCC input (or payload) bytes for each SCCC block. Table 10 below shows an example of the SOBL and SIBL for each SCCC block, when the SCCC block mode value is equal to '01'.

TABLE 10

| SCCC Block | SOBL | SIBL 1/2 rate | SIBL 1/4 rate |
|---|---|---|---|
| SCB1 (B1 + 136) | 528 | 264 | 132 |
| SCB2 (B2 + 137) | 1536 | 768 | 384 |
| SCB3 (B3 + 138) | 2376 | 1188 | 594 |
| SCB4 (B4 + 139) | 2388 | 1194 | 597 |
| SCB5 (B5 + 1310) | 2772 | 1386 | 693 |

Figure 24:
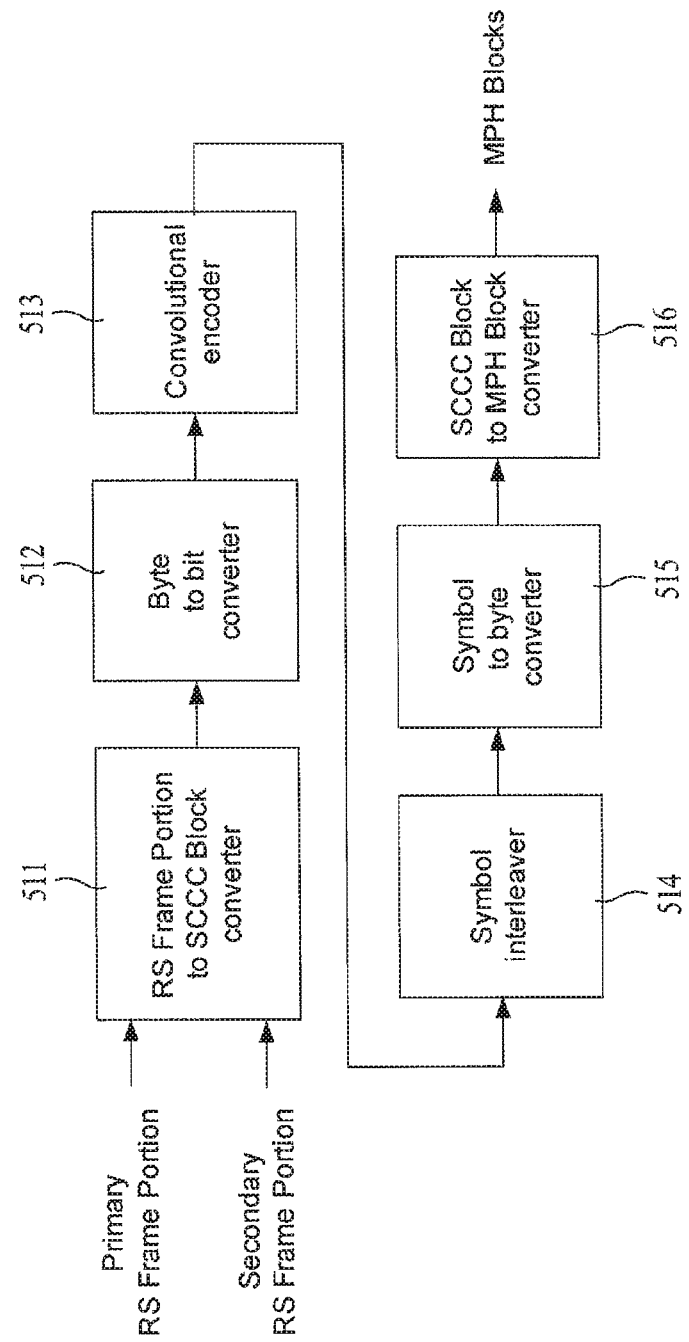
FIG. 24 illustrates a block diagram of a block processor according to an embodiment of the present invention.

In order to do so, as shown in FIG. 24, the block processor 302 includes a RS frame portion-SCCC block converter 511, a byte-bit converter 512, a convolution encoder 513, a symbol interleaver 514, a symbol-byte converter 515, and an SCCC block-MPH block converter 516. The convolutional encoder 513 and the symbol interleaver 514 are virtually concatenated with the trellis encoding module in the post-processor in order to configure an SCCC block. More specifically, the RS frame portion-SCCC block converter 511 divides the RS frame portions, which are being input, into multiple SCCC blocks using the SIBL of Table 9 and Table 10 based upon the RS code mode, SCCC block mode, and SCCC outer code mode. Herein, the MPH frame encoder 301 may output only primary RS frame portions or both primary RS frame portions and secondary RS frame portions in accordance with the RS frame mode.

When the RS Frame mode is set to '00', a portion of the primary RS Frame equal to the amount of data, which are to be SCCC outer encoded and mapped to 10 MPH blocks (B1 to B10) of a data group, will be provided to the block processor 302. When the SCCC block mode value is equal to '00', then the primary RS frame portion will be split into 10 SCCC Blocks according to Table 9. Alternatively, when the SCCC block mode value is equal to '01', then the primary RS frame will be split into 5 SCCC blocks according to Table 10.

When the RS frame mode value is equal to '01', then the block processor 302 may receive two RS frame portions. The RS frame mode value of '01' will not be used with the SCCC block mode value of '01'. The first portion from the primary RS frame will be SCCC-outer-encoded as SCCC Blocks SCB3, SCB4, SCB5, SCB6, SCB7, and SCBE by the block processor 302. The SCCC Blocks S3 and S8 will be mapped to region B and the SCCC blocks SCB4, SCB5, SCB6, and SCB7 shall be mapped to region A by the group formatter 303. The second portion from the secondary RS frame will also be SCCC-outer-encoded, as SCB1, SCB2, SCB9, and SCB10, by the block processor 302. The group formatter 303 will map the SCCC blocks SCB1 and SCB10 to region D as the MPH blocks B1 and B10, respectively. Similarly, the SCCC blocks SCB2 and SCB9 will be mapped to region C as the MPH blocks B2 and B9.

The byte-bit converter 512 identifies the mobile service data bytes of each SCCC block output from the RS frame portion-SCCC block converter 511 as data bits, which are then output to the convolution encoder 513. The convolution encoder 513 performs one of ½-rate encoding and ¼-rate encoding on the input mobile service data bits.

Figure 25:
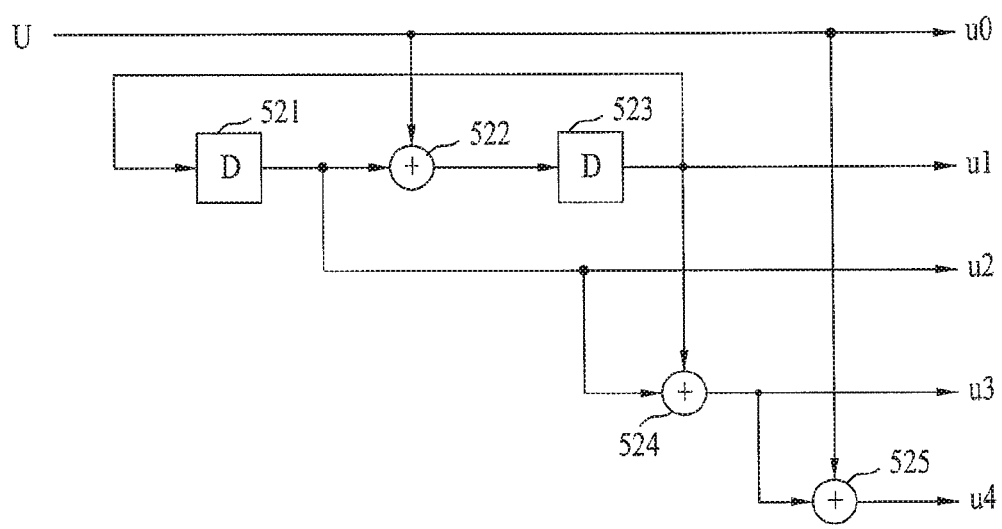
FIG. 25 illustrates a detailed block diagram of a convolution encoder of the block processor of FIG. 24.

FIG. 25 illustrates a detailed block diagram of the convolution encoder 513. The convolution encoder 513 includes two delay units 521 and 523 and three adders 522, 524, and 525. Herein, the convolution encoder 513 encodes an input data bit U and outputs the coded bit U to 5 bits (u0 to u4). At this point, the input data bit U is directly output as uppermost bit u0 and simultaneously encoded as lower bit u1u2u3u4 and then output. More specifically, the input data bit U is directly output as the uppermost bit u0 and simultaneously output to the first and third adders 522 and 525.

The first adder 522 adds the input data bit U and the output bit of the first delay unit 521 and, then, outputs the added bit to the second delay unit 523. Then, the data bit delayed by a pre-determined time (e.g., by 1 clock) in the second delay unit 523 is output as a lower bit u1 and simultaneously fed-back to the first delay unit 521. The first delay unit 521 delays the data bit fed-back from the second delay unit 523 by a pre-determined time (e.g., by 1 clock). Then, the first delay unit 521 outputs the delayed data bit as a lower bit u2 and, at the same time, outputs the fed-back data to the first adder 522 and the second adder 524. The second adder 524 adds the data bits output from the first and second delay units 521 and 523 and outputs the added data bits as a lower bit u3. The third adder 525 adds the input data bit U and the output of the second delay unit 523 and outputs the added data bit as a lower bit u4.

At this point, the first and second delay units 521 and 523 are reset to '0', at the starting point of each SCCC block. The convolution encoder 513 of FIG. 25 may be used as a ½-rate encoder or a ¼-rate encoder. More specifically, when a portion of the output bit of the convolution encoder 513, shown in FIG. 25, is selected and output, the convolution encoder 513 may be used as one of a ½-rate encoder and a ¼-rate encoder. Table 11 below shown an example of output symbols of the convolution encoder 513.

TABLE 11

| | | 1/4 rate | |
|---|---|---|---|
| Region | 1/2 rate | SCCC block mode = '00' | SCCC block mode = '01' |
| A, B | (u0, u1) | (u0, u2), (u1, u3) | (u0, u2), (u1, u4) |
| C, D | | (u0, u1), (u3, u4) | |

For example, at the ½-coding rate, 1 output symbol (i.e., u0 and u1 bits) may be selected and output. And, at the ¼-coding rate, depending upon the SCCC block mode, 2 output symbols (i.e., 4 bits) may be selected and output. For example, when the SCCC block mode value is equal to '01', and when an output symbol configured of u0 and u2 and another output symbol configured of u1 and u4 are selected and output, a ¼-rate coding result may be obtained.

The mobile service data encoded at the coding rate of ½ or ¼ by the convolution encoder 513 are output to the symbol interleaver 514. The symbol interleaver 514 performs block interleaving, in symbol units, on the output data symbol of the convolution encoder 513. More specifically, the symbol interleaver 514 is a type of block interleaver. Any interleaver performing structural rearrangement (or realignment) may be applied as the symbol interleaver 514 of the block processor. However, in the present invention, a variable length symbol interleaver that can be applied even when a plurality of lengths is provided for the symbol, so that its order may be rearranged, may also be used.

FIG. 26 illustrates a symbol interleaver according to an embodiment of the present invention. Particularly, FIG. 26 illustrates an example of the symbol interleaver when B=2112 and L=4096. Herein, B indicates a block length in symbols that are output for symbol interleaving from the convolution encoder 513. And, L represents a block length in symbols that are actually interleaved by the symbol interleaver 514. At this point, the block length in symbols B input to the symbol interleaver 514 is equivalent to 4×SOBL. More specifically, since one symbol is configured of 2 bits, the value of B may be set to be equal to 4×SOBL.

In the present invention, when performing the symbol-intereleaving process, the conditions of $L=2^m$ (wherein m is an integer) and of LB should be satisfied. If there is a difference in value between B and L, (L−B) number of null (or dummy) symbols is added, thereby creating an interleaving pattern, as shown in P'(i) of FIG. 26. Therefore, B becomes a block size of the actual symbols that are input to the symbol interleaver 514 in order to be interleaved. L becomes an interleaving unit when the interleaving process is performed by an interleaving pattern created from the symbol interleaver 514.

Equation 6 shown below describes the process of sequentially receiving B number of symbols, the order of which is to be rearranged, and obtaining an L value satisfying the conditions of L=2m (wherein m is an integer) and of LB, thereby creating the interleaving in order to realign (or rearrange) the symbol order.

In relation to all places, wherein 0 i B−1, $$13'(i)=\{89 \times i \times (i+1)/2\} \bmod L \qquad \text{Equation 6}$$

Herein, L B, L=2m, wherein m is an integer.

As shown in P'(i) of FIG. 26, the order of B number of input symbols and (L-B) number of null symbols is rearranged by using the above-mentioned Equation 6. Then, as shown in P(i) of FIG. 26, the null byte places are removed, in order to rearrange the order. Starting with the lowest value of i, the P(i) are shifted to the left in order to fill the empty entry locations. Thereafter, the symbols of the aligned interleaving pattern P(i) are output to the symbol-byte converter 515 in order. Herein, the symbol-byte converter 515 converts to bytes the mobile service data symbols, having the rearranging of the symbol order completed and then output in accordance with the rearranged order, and thereafter outputs the converted bytes to the SCCC block-MPH block converter 516. The SCCC block-MPH block converter 516 converts the symbol-interleaved SCCC blocks to MPH blocks, which are then output to the group formatter 303.

If the SCCC block mode value is equal to '00', the SCCC block is mapped at a one-to-one (1:1) correspondence with each MPH block within the data group. In another example, if the SCCC block mode value is equal to '01', each SCCC block is mapped with two MPH blocks within the data group. For example, the SCCC block SCB1 is mapped with (B1, B6), the SCCC block SCB2 is mapped with (B2, B7), the SCCC block SCB3 is mapped with (B3, B8), the SCCC block SCB4 is mapped with (B4, B9), and the SCCC block SOBS is mapped with (B5, B10). The MPH block that is output from the SCCC block-MPH block converter 516 is configured of mobile service data and FEC redundancy. In the present invention, the mobile service data as well as the FEC redundancy of the MPH block will be collectively considered as mobile service data.

Group Formatter

The group formatter 303 inserts data of MPH blocks output from the block processor 302 to the corresponding MPH blocks within the data group, which is formed in accordance with a pre-defined rule. Also, in association with the data-deinterleaving process, the group formatter 303 inserts various place holders (or known data place holders) in the corresponding region within the data group. More specifically, apart from the encoded mobile service data output from the block processor 302, the group formatter 303 also inserts MPEG header place holders, non-systematic RS parity place holders, main service data place holders, which are associated with the data deinterleaving in a later process, as shown in FIG. 5.

Herein, the main service data place holders are inserted because the mobile service data bytes and the main service data bytes are alternately mixed with one another in regions B to D based upon the input of the data deinterleaver, as shown in FIG. 5. For example, based upon the data output after data deinterleaving, the place holder for the MPEG header may be allocated at the very beginning of each packet. Also, in order to configure an intended group format, dummy bytes may also be inserted. Furthermore, the group formatter 303 inserts place holders for initializing the trellis encoding module 256 in the corresponding regions. For example, the initialization data place holders may be inserted in the beginning of the known data sequence. Additionally, the group formatter 303 may also insert signaling information, which are encoded and output from the signaling encoder 304, in corresponding regions within the data group. At this point, reference may be made to the signaling information when the group formatter 303 inserts each data type and respective place holders in the data group. The process of encoding the signaling information and inserting the encoded signaling information to the data group will be described in detail in a later process.

Figure 27:
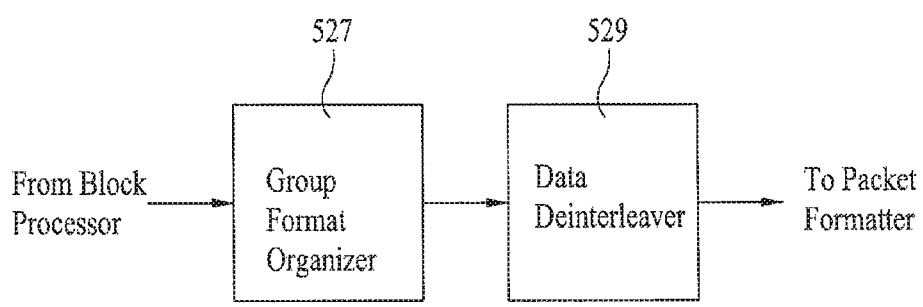
FIG. 27 illustrates a block diagram of a group formatter according to an embodiment of the present invention.

After inserting each data type and respective place holders in the data group, the group formatter 303 may deinterleave the data and respective place holders, which have been inserted in the data group, as an inverse process of the data interleaver, thereby outputting the deinterleaved data and respective place holders to the packet formatter 305. More specifically, when the data and respective place holders within the data group, which is configured (or structured) as shown in FIG. 5, are deinterleaved by the group formatter 303 and output to the packet formatter 305, the structure of the data group may be identical to the structure shown in FIG. 7. In order to do so, the group formatter 303 may include a group format organizer 527, and a data deinterleaver 529, as shown in FIG. 27. The group format organizer 527 inserts data and respective place holders in the corresponding regions within the data group, as described above. And, the data deinterleaver 529 deinterleaves the inserted data and respective place holders as an inverse process of the data interleaver.

The packet formatter 305 removes the main service data place holders and the RS parity place holders that were allocated for the deinterleaving process from the deinterleaved data being input. Then, the packet formatter 305 groups the remaining portion and inserts the 3-byte MPEG header place holder in an MPEG header having a null packet PID (or an unused PID from the main service data packet). Furthermore, the packet formatter 305 adds a synchronization data byte at the beginning of each 187-byte data packet. Also, when the group formatter 303 inserts known data place holders, the packet formatter 303 may insert actual known data in the known data place holders, or may directly output the known data place holders without any modification in order to make replacement insertion in a later process. Thereafter, the packet formatter 305 identifies the data within the packet-formatted data group, as described above, as a 188-byte unit mobile service data packet (i.e., MPEG TS packet), which is then provided to the packet multiplexer 240.

Based upon the control of the control unit 200, the packet multiplexer 240 multiplexes the data group packet-formatted and output from the packet formatter 306 and the main service data packet output from the packet jitter mitigator 220. Then, the packet multiplexer 240 outputs the multiplexed data packets to the data randomizer 251 of the post-processor 250. More specifically, the control unit 200 controls the time-multiplexing of the packet multiplexer 240. If the packet multiplexer 240 receives 118 mobile service data packets from the packet formatter 305, 37 mobile service data packets are placed before a place for inserting VSB field synchronization. Then, the remaining 81 mobile service data packets are placed after the place for inserting VSB field synchronization. The multiplexing method may be adjusted by diverse variables of the system design. The multiplexing method and multiplexing rule of the packet multiplexer 240 will be described in more detail in a later process.

Also, since a data group including mobile service data in-between the data bytes of the main service data is multiplexed (or allocated) during the packet multiplexing process, the shifting of the chronological position (or place) of the main service data packet becomes relative. Also, a system object decoder (i.e., MPEG decoder) for processing the main service data of the receiving system, receives and decodes only the main service data and recognizes the mobile service data packet as a null data packet.

Therefore, when the system object decoder of the receiving system receives a main service data packet that is multiplexed with the data group, a packet jitter occurs.

At this point, since a multiple-level buffer for the video data exists in the system object decoder and the size of the buffer is relatively large, the packet jitter generated from the packet multiplexer 240 does not cause any serious problem in case of the video data. However, since the size of the buffer for the audio data in the object decoder is relatively small, the packet jitter may cause considerable problem. More specifically, due to the packet jitter, an overflow or underflow may occur in the buffer for the main service data of the receiving system (e.g., the buffer for the audio data). Therefore, the packet jitter mitigator 220 readjusts the relative position of the main service data packet so that the overflow or underflow does not occur in the system object decoder.

In the present invention, examples of repositioning places for the audio data packets within the main service data in order to minimize the influence on the operations of the audio buffer will be described in detail. The packet jitter mitigator 220 repositions the audio data packets in the main service data section so that the audio data packets of the main service data can be as equally and uniformly aligned and positioned as possible. Additionally, when the positions of the main service data packets are relatively re-adjusted, associated program clock reference (PCR) values may also be modified accordingly. The PCR value corresponds to a time reference value for synchronizing the time of the MPEG decoder. Herein, the PCR value is inserted in a specific region of a TS packet and then transmitted.

In the example of the present invention, the packet jitter mitigator 220 also performs the operation of modifying the PCR value. The output of the packet jitter mitigator 220 is input to the packet multiplexer 240. As described above, the packet multiplexer 240 multiplexes the main service data packet output from the packet jitter mitigator 220 with the mobile service data packet output from the pre-processor 230 into a burst structure in accordance with a pre-determined multiplexing rule. Then, the packet multiplexer 240 outputs the multiplexed data packets to the data randomizer 251 of the post-processor 250.

If the input data correspond to the main service data packet, the data randomizer 251 performs the same randomizing process as that of the conventional randomizer. More specifically, the synchronization byte within the main service data packet is deleted. Then, the remaining 187 data bytes are randomized by using a pseudo random byte generated from the data randomizer 251. Thereafter, the randomized data are output to the RS encoder/non-systematic RS encoder 252.

On the other hand, if the input data correspond to the mobile service data packet, the data randomizer 251 may randomize only a portion of the data packet. For example, if it is assumed that a randomizing process has already been performed in advance on the mobile service data packet by the pre-processor 230, the data randomizer 251 deletes the synchronization byte from the 4-byte MPEG header included in the mobile service data packet and, then, performs the randomizing process only on the remaining 3 data bytes of the MPEG header. Thereafter, the randomized data bytes are output to the RS encoder/non-systematic RS encoder 252. More specifically, the randomizing process is not performed on the remaining portion of the mobile service data excluding the MPEG header. In other words, the remaining portion of the mobile service data packet is directly output to the RS encoder/non-systematic RS encoder 252 without being randomized. Also, the data randomizer 251 may or may not perform a randomizing process on the known data (or known data place holders) and the initialization data place holders included in the mobile service data packet.

The RS encoder/non-systematic RS encoder 252 performs an RS encoding process on the data being randomized by the data randomizer 251 or on the data bypassing the data randomizer 251, in order to add 20 bytes of RS parity data. Thereafter, the processed data are output to the data interleaver 253. Herein, if the input data correspond to the main service data packet, the RS encoder/non-systematic RS encoder 252 performs the same systematic RS encoding process as that of the conventional broadcasting system, thereby adding the 20-byte RS parity data at the end of the 187-byte data. Alternatively, if the input data correspond to the mobile service data packet, the RS encoder/non-systematic RS encoder 252 performs a non-systematic RS encoding process. At this point, the 20-byte RS parity data obtained from the non-systematic RS encoding process are inserted in a pre-decided parity byte place within the mobile service data packet.

The data interleaver 253 corresponds to a byte unit convolutional interleaver. The output of the data interleaver 253 is input to the parity replacer 254 and to the non-systematic RS encoder 255. Meanwhile, a process of initializing a memory within the trellis encoding module 256 is primarily required in order to decide the output data of the trellis encoding module 256, which is located after the parity replacer 254, as the known data pre-defined according to an agreement between the receiving system and the transmitting system. More specifically, the memory of the trellis encoding module 256 should first be initialized before the received known data sequence is trellis-encoded. At this point, the beginning portion of the known data sequence that is received corresponds to the initialization data place holder and not to the actual known data. Herein, the initialization data place holder has been included in the data by the group formatter within the pre-processor 230 in an earlier process. Therefore, the process of generating initialization data and replacing the initialization data place holder of the corresponding memory with the generated initialization data are required to be performed immediately before the input known data sequence is trellis-encoded.

Additionally, a value of the trellis memory initialization data is decided and generated based upon a memory status of the trellis encoding module 256. Further, due to the newly replaced initialization data, a process of newly calculating the RS parity and replacing the RS parity, which is output from the data interleaver 253, with the newly calculated RS parity is required. Therefore, the non-systematic RS encoder 255 receives the mobile service data packet including the initialization data place holders, which are to be replaced with the actual initialization data, from the data interleaver 253 and also receives the initialization data from the trellis encoding module 256.

Among the input mobile service data packet, the initialization data place holders are replaced with the initialization data, and the RS parity data that are added to the mobile service data packet are removed and processed with non-systematic RS encoding. Thereafter, the new RS parity obtained by performing the non-systematic RS encoding process is output to the parity replacer 255. Accordingly, the parity replacer 255 selects the output of the data interleaver 253 as the data within the mobile service data packet, and the parity replacer 255 selects the output of the non-systematic RS encoder 255 as the RS parity. The selected data are then output to the trellis encoding module 256.

Meanwhile, if the main service data packet is input or if the mobile service data packet, which does not include any initialization data place holders that are to be replaced, is input, the parity replacer 254 selects the data and RS parity that are output from the data interleaver 253. Then, the parity replacer 254 directly outputs the selected data to the trellis encoding module 256 without any modification. The trellis encoding module 256 converts the byte-unit data to symbol units and performs a 12-way interleaving process in order to trellis-encode the received data. Thereafter, the processed data are output to the synchronization multiplexer 260.

Figure 28:
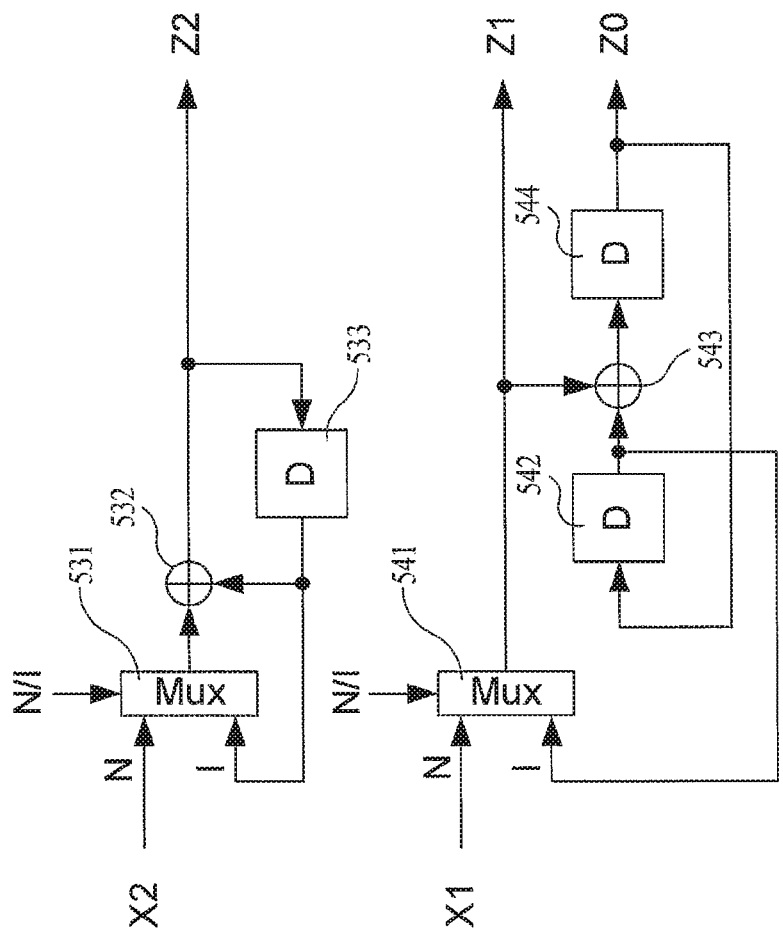
FIG. 28 illustrates a detailed diagram of one of 12 trellis encoders included in the trellis encoding module of FIG. 15.

FIG. 28 illustrates a detailed diagram of one of 12 trellis encoders included in the trellis encoding module 256. Herein, the trellis encoder includes first and second multiplexers 531 and 541, first and second adders 532 and 542, and first to third memories 533, 542, and 544. More specifically, the first to third memories 533, 542, and 544 are initialized by a set of trellis initialization data inserted in an initialization data place holder by the parity replacer 254 and, then, output. More specifically, when the first two 2-bit symbols, which are converted from each trellis initialization data byte, are input, the input bits of the trellis encoder will be replaced by the memory values of the trellis encoder, as shown in FIG. 28.

Since 2 symbols (i.e., 4 bits) are required for trellis initialization, the last 2 symbols (i.e., 4 bits) from the trellis initialization bytes are not used for trellis initialization and are considered as a symbol from a known data byte and processed accordingly. When the trellis encoder is in the initialization mode, the input comes from an internal trellis status (or state) and not from the parity replacer 254. When the trellis encoder is in the normal mode, the input symbol provided from the parity replacer 254 will be processed. The trellis encoder provides the converted (or modified) input data for trellis initialization to the non-systematic RS encoder 255.

More specifically, when a selection signal designates a normal mode, the first multiplexer 531 selects an upper bit X2 of the input symbol. And, when a selection signal designates an initialization mode, the first multiplexer 531 selects the output of the first memory 533 and outputs the selected output data to the first adder 532. The first adder 532 adds the output of the first multiplexer 531 and the output of the first memory 533, thereby outputting the added result to the first memory 533 and, at the same time, as a most significant (or uppermost) bit Z2. The first memory 533 delays the output data of the first adder 532 by 1 clock, thereby outputting the delayed data to the first multiplexer 531 and the first adder 532.

Meanwhile, when a selection signal designates a normal mode, the second multiplexer 541 selects a lower bit X1 of the input symbol. And, when a selection signal designates an initialization mode, the second multiplexer 541 selects the output of the second memory 542, thereby outputting the selected result to the second adder 543 and, at the same time, as a lower bit Z1. The second adder 543 adds the output of the second multiplexer 541 and the output of the second memory 542, thereby outputting the added result to the third memory 544. The third memory 544 delays the output data of the second adder 543 by 1 clock, thereby outputting the delayed data to the second memory 542 and, at the same time, as a least significant (or lowermost) bit ZO. The second memory 542 delays the output data of the third memory 544 by 1 clock, thereby outputting the delayed data to the second adder 543 and the second multiplexer 541.

The synchronization multiplexer 260 inserts a field synchronization signal and a segment synchronization signal to the data output from the trellis encoding module 256 and, then, outputs the processed data to the pilot inserter 271 of the transmission unit 270. Herein, the data having a pilot inserted therein by the pilot inserter 271 are modulated by the modulator 272 in accordance with a predetermined modulating method (e.g., a VSB method). Thereafter, the modulated data are transmitted to each receiving system though the radio frequency (RF) up-converter 273.

Multiplexing Method of Packet Multiplexer 240

Data of the error correction encoded and 1/H-rate encoded primary RS frame (i.e., when the RS frame mode value is equal to '00') or primary/secondary RS frame (i.e., when the RS frame mode value is equal to '01'), are divided into a plurality of data groups by the group formatter 303. Then, the divided data portions are assigned to at least one of regions A to D of each data group or to an MPH block among the MPH blocks B1 to B10, thereby being deinterleaved. Then, the deinterleaved data group passes through the packet formatter 305, thereby being multiplexed with the main service data by the packet multiplexer 240 based upon a de-decided multiplexing rule. The packet multiplexer 240 multiplexes a plurality of consecutive data groups, so that the data groups are assigned to be spaced as far apart from one another as possible within the sub-frame. For example, when it is assumed that 3 data groups are assigned to a sub-frame, the data groups are assigned to a $1^{st}$ slot (Slot #0), a $5^{th}$ slot (Slot #4), and a $9^{th}$ slot (Slot #8) in the sub-frame, respectively.

As described-above, in the assignment of the plurality of consecutive data groups, a plurality of parades are multiplexed and output in order to be spaced as far apart from one another as possible within a sub-MPH frame. For example, the method of assigning data groups and the method of assigning parades may be identically applied to all sub-frames for each MPH frame or differently applied to each MPH frame.

FIG. 10 illustrates an example of a plurality of data groups included in a single parade, wherein the number of data groups included in a sub-frame is equal to '3', and wherein the data groups are assigned to an MPH frame by the packet multiplexer 240. Referring to FIG. 10, 3 data groups are sequentially assigned to a sub-frame at a cycle period of 4 slots. Accordingly, when this process is equally performed in the 5 sub-frames included in the corresponding MPH frame, 15 data groups are assigned to a single MPH frame. Herein, the 15 data groups correspond to data groups included in a parade.

When data groups of a parade are assigned as shown in FIG. 10, the packet multiplexer 240 may either assign main service data to each data group, or assign data groups corresponding to different parades between each data group. More specifically, the packet multiplexer 240 may assign data groups corresponding to multiple parades to one MPH frame. Basically, the method of assigning data groups corresponding to multiple parades is very similar to the method of assigning data groups corresponding to a single parade. In other words, the packet multiplexer 240 may assign data groups included in other parades to an MPH frame according to a cycle period of 4 slots. At this point, data groups of a different parade may be sequentially assigned to the respective slots in a circular method. Herein, the data groups are assigned to slots starting from the ones to which data groups of the previous parade have not yet been assigned. For example, when it is assumed that data groups corresponding to a parade are assigned as shown in FIG. 10, data groups corresponding to the next parade may be assigned to a sub-frame starting either from the $12^{th}$ slot of a sub-frame.

FIG. 11 illustrates an example of assigning and transmitting 3 parades (Parade #0, Parade #1, and Parade #2) to an MPH frame. For example, when the $1^{st}$ parade (Parade #0) includes 3 data groups for each sub-frame, the packet multiplexer 240 may obtain the positions of each data groups within the sub-frames by substituting values '0' to '2' for i in Equation 1. More specifically, the data groups of the $1^{st}$ parade (Parade #0) are sequentially assigned to the 1st, 5th and $9^{th}$ slots (Slot #0, Slot #4, and Slot #8) within the sub-frame. Also, when the $2^{nd}$ parade includes 2 data groups for each sub-frame, the packet multiplexer 240 may obtain the positions of each data groups within the sub-frames by substituting values '3' and '4' for i in Equation 1. More specifically, the data groups of the $2^{nd}$ parade (Parade #1) are sequentially assigned to the $2^{nd}$ and $12^{th}$ slots (Slot #3 and Slot #11) within the sub-frame. Finally, when the $3^{rd}$ parade includes 2 data groups for each sub-frame, the packet multiplexer 240 may obtain the positions of each data groups within the sub-frames by substituting values '5' and '6' for i in Equation 1. More specifically, the data groups of the $3^{rd}$ parade (Parade #2) are sequentially assigned and output to the $7^{th}$ and $11^{th}$ slots (Slot #6 and Slot #10) within the sub-frame.

As described above, the packet multiplexer 240 may multiplex and output data groups of multiple parades to a single MPH frame, and, in each sub-frame, the multiplexing process of the data groups may be performed serially with a group space of 4 slots from left to right. Therefore, a number of groups of one parade per sub-frame (NOG) may correspond to any one integer from '1' to '8'. Herein, since one MPH frame includes 5 sub-frames, the total number of data groups within a parade that can be allocated to an MPH frame may correspond to any one multiple of '5' ranging from '5' to '40'.

Processing Signaling Information

Figure 29:
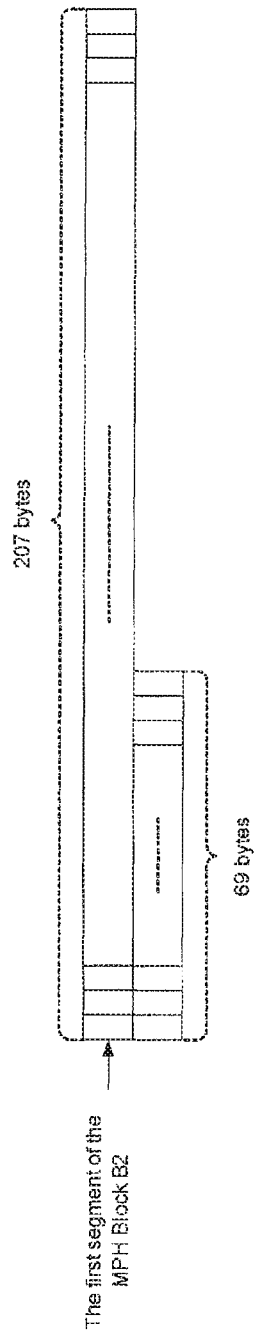
FIG. 29 illustrates an example of assigning signaling information area according to an embodiment of the present invention.

The present invention assigns signaling information areas for inserting signaling information to some areas within each data group. FIG. 29 illustrates an example of assigning signaling information areas for inserting signaling information starting from the $1^{st}$ segment of the $4^{th}$ MPH block (B4) to a portion of the $2^{nd}$ segment. More specifically, 276 (=207+69) bytes of the $4^{th}$ MPH block (B4) in each data group are assigned as the signaling information area. In other words, the signaling information area consists of 207 bytes of the $1^{st}$ segment and the first 69 bytes of the $2^{nd}$ segment of the $4^{th}$ MPH block (B4). For example, the $1^{st}$ segment of the $4^{th}$ MPH block (B4) corresponds to the $17^{th}$ or $173^{rd}$ segment of a VSB field. The signaling information that is to be inserted in the signaling information area is FEC-encoded by the signaling encoder 304, thereby input to the group formatter 303.

The group formatter 303 inserts the signaling information, which is FEC-encoded and output by the signaling encoder 304, in the signaling information area within the data group. Herein, the signaling information may be identified by two different types of signaling channels: a transmission parameter channel (TPC) and a fast information channel (FIC). Herein, the TPC information corresponds to signaling information including transmission parameters, such as RS frame-associated information, SCCC-associated information, and MPH frame-associated information. However, the signaling information presented herein is merely exemplary. And, since the adding or deleting of signaling information included in the TPC may be easily adjusted and modified by one skilled in the art, the present invention will, therefore, not be limited to the examples set forth herein. Furthermore, the FIC is provided to enable a fast service acquisition of data receivers, and the FIC includes cross layer information between the physical layer and the upper layer(s).

Figure 30:
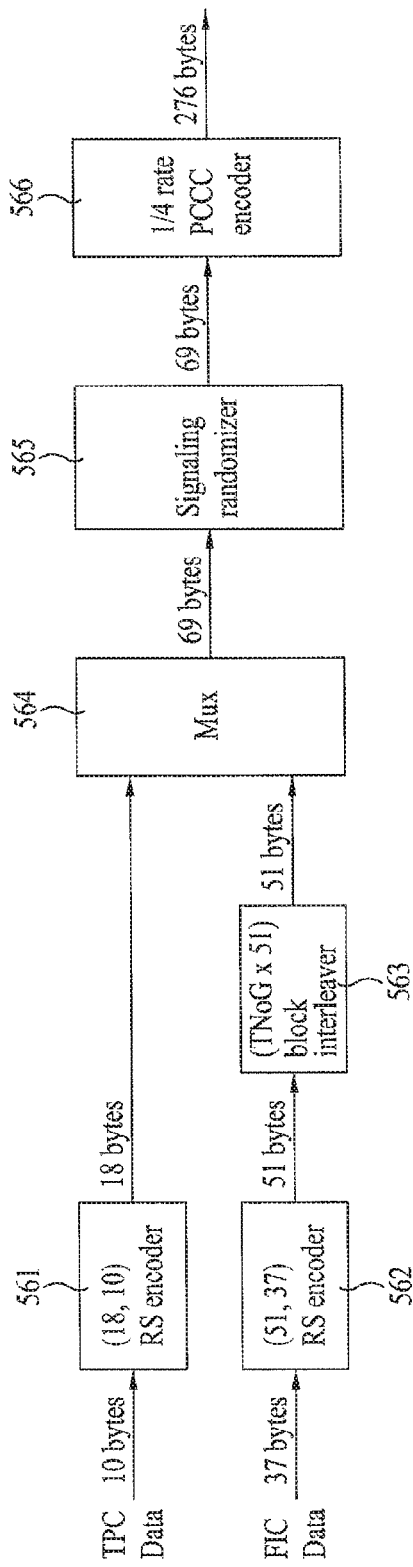
FIG. 30 illustrates a detailed block diagram of a signaling encoder according to the present invention.

FIG. 30 illustrates a detailed block diagram of the signaling encoder 304 according to the present invention. Referring to FIG. 30, the signaling encoder 304 includes a TPC encoder 561, an FIC encoder 562, a block interleaver 563, a multiplexer 564, a signaling randomizer 565, and a PCCC encoder 566. The TPC encoder 561 receives 10-bytes of TPC data and performs (18,10)-RS encoding on the 10-bytes of TPC data, thereby adding 8 bytes of parity data to the 10 bytes of TPC data. The 18 bytes of RS-encoded TPC data are output to the multiplexer 564. The FIC encoder 562 receives 37-bytes of FIC data and performs (51,37)-RS encoding on the 37-bytes of FIC data, thereby adding 14 bytes of parity data to the 37 bytes of FIC data. Thereafter, the 51 bytes of RS-encoded FIC data are input to the block interleaver 563, thereby being interleaved in predetermined block units.

Herein, the block interleaver 563 corresponds to a variable length block interleaver. The block interleaver 563 interleaves the FIC data within each sub-frame in TNoG (column)×51 (row) block units and then outputs the interleaved data to the multiplexer 564. Herein, the TNoG corresponds to the total number of data groups being assigned to all sub-frames within an MPH frame. The block interleaver 563 is synchronized with the first set of FIC data in each sub-frame. The block interleaver 563 writes 51 bytes of incoming (or input) RS codewords in a row direction (i.e., row-by-row) and left-to-right and up-to-down directions and reads 51 bytes of RS codewords in a column direction (i.e., column-by-column) and left-to-right and up-to-down directions, thereby outputting the RS codewords.

The multiplexer 564 multiplexes the RS-encoded TPC data from the TPC encoder 561 and the block-interleaved FIC data from the block interleaver 563 along a time axis. Then, the multiplexer 564 outputs 69 bytes of the multiplexed data to the signaling randomizer 565. The signaling randomizer 565 randomizes the multiplexed data and outputs the randomized data to the PCCC encoder 566. The signaling randomizer 565 may use the same generator polynomial of the randomizer used for mobile service data. Also, initialization occurs in each data group. The PCCC encoder 566 corresponds to an inner encoder performing PCCC-encoding on the randomized data (i.e., signaling information data). The PCCC encoder 566 may include 6 even component encoders and 6 odd component encoders.

FIG. 31 illustrates an example of a syntax structure of TPC data being input to the TPC encoder 561. The TPC data are inserted in the signaling information area of each data group and then transmitted. The TPC data may include a sub-frame number field, a slot number field, a parade id field, a starting group number (SGN) field, a number of groups (NoG) field, a parade repetition cycle (PRC) field, an RS frame mode field, an RS code mode primary field, an RS code mode secondary field, an SCCC block mode field, an SCCC outer code mode A field, an SCCC outer code mode B field, an SCCC outer code mode C field, an SCCC outer code mode D field, an FIC version field, a parade continuity counter field, and a TNoG field.

The Sub-Frame number field corresponds to the current Sub-Frame number within the MPH frame, which is transmitted for MPH frame synchronization. The value of the Sub-Frame number field may range from 0 to 4. The Slot_number field indicates the current slot number within the sub-frame, which is transmitted for MPH frame synchronization. Also, the value of the Sub-Frame number field may range from 0 to 15. The Parade_id field identifies the parade to which this group belongs. The value of this field may be any 7-bit value. Each parade in a MPH transmission shall have a unique Parade_id field.

Communication of the Parade_id between the physical layer and the management layer may be performed by means of an Ensemble_id field formed by adding one bit to the left of the Parade_id field. If the Ensemble_id field is used for the primary Ensemble delivered through this parade, the added MSB shall be equal to '0'. Otherwise, if the Ensemble_id field is used for the secondary ensemble, the added MSB shall be equal to '1'. Assignment of the Parade_id field values may occur at a convenient level of the system, usually in the management layer. The starting group number (SGN) field shall be the first Slot_number for a parade to which this group belongs, as determined by Equation 1 (i.e., after the Slot numbers for all preceding parades have been calculated). The SGN and NoG shall be used according to Equation 1 to obtain the slot numbers to be allocated to a parade within the sub-frame.

The number of Groups (NoG) field shall be the number of groups in a sub-frame assigned to the parade to which this group belongs, minus 1, e.g., NoG=0 implies that one group is allocated (or assigned) to this parade in a sub-frame. The value of NoG may range from 0 to 7. This limits the amount of data that a parade may take from the main (legacy) service data, and consequently the maximum data that can be carried by one parade. The slot numbers assigned to the corresponding Parade can be calculated from SGN and NoG, using Equation 1. By taking each parade in sequence, the specific slots for each parade will be determined, and consequently the SGN for each succeeding parade. For example, if for a specific parade SGN=3 and NoG=3 (010b for 3-bit field of NoG), substituting i=3, 4, and 5 in Equation 1 provides slot numbers 12, 2, and 6. The Parade repetition cycle (PRC) field corresponds to the cycle time over which the parade is transmitted, minus 1, specified in units of MPH frames, as described in Table 12.

TABLE 12

| PRC | Description |
|---|---|
| 000 | This parade shall be transmitted once every MPH frame. |
| 001 | This parade shall be transmitted once every 2 MPH frames. |

TABLE 12-continued

| PRC | Description |
|---|---|
| 010 | This parade shall be transmitted once every 3 MPH frames. |
| 011 | This parade shall be transmitted once every 4 MPH frames. |
| 100 | This parade shall be transmitted once every 5 MPH frames. |
| 101 | This parade shall be transmitted once every 6 MPH frames. |
| 110 | This parade shall be transmitted once every 7 MPH frames. |
| 111 | Reserved |

The RS Frame mode field shall be as defined in Table 1. The RS code mode primary field shall be the RS code mode for the primary RS frame. Herein, the RS code mode is defined in Table 6. The RS code mode secondary field shall be the RS code mode for the secondary RS frame. Herein, the RS code mode is defined in Table 6. The SCCC Block mode field shall be as defined in Table 7. The SCCC outer code mode _A field corresponds to the SCCC outer code mode for Region A. The SCCC outer code mode is defined in Table 8. The SCCC outer code mode B field corresponds to the SCCC outer code mode for Region B. The SCCC outer code mode C field corresponds be the SCCC outer code mode for Region C. And, the SCCC outer code mode D field corresponds to the SCCC outer code mode for Region D.

The FIC version field may be supplied by the management layer (which also supplies the FIC data). The Parade continuity counter field counter may increase from 0 to 15 and then repeat its cycle. This counter shall increment by 1 every (PRC+1) MPH frames. For example, as shown in Table 12, PRC=011 (decimal 3) implies that Parade continuity counter increases every fourth MPH frame. The TNoG field may be identical for all sub-frames in an MPH Frame. However, the information included in the TPC data presented herein is merely exemplary. And, since the adding or deleting of information included in the TPC may be easily adjusted and modified by one skilled in the art, the present invention will, therefore, not be limited to the examples set forth herein.

Since the TPC parameters (excluding the Sub-Frame number field and the Slot number field) for each parade do not change their values during an MPH frame, the same information is repeatedly transmitted through all MPH groups belonging to the corresponding parade during an MPH frame. This allows very robust and reliable reception of the TPC data. Because the Sub-Frame number and the Slot_number are increasing counter values, they also are robust due to the transmission of regularly expected values.

Furthermore, the FIC information is provided to enable a fast service acquisition of data receivers, and the FIC information includes cross layer information between the physical layer and the upper layer(s).

FIG. 32 illustrates an example of a transmission scenario of the TPC data and the FIC data. The values of the Sub-Frame number field, Slot_number field, Parade id field, Parade repetition cycle field, and Parade continuity counter field may corresponds to the current MPH frame throughout the 5 sub-frames within a specific MPH frame. Some of TPC parameters and FIC data are signaled in advance. The SGN, NoG and all FEC modes may have values corresponding to the current MPH frame in the first two sub-frames. The SGN, NoG and all FEC modes may have values corresponding to the frame in which the parade next appears throughout the 3rd 4th and 5th sub-frames of the current MPH frame. This enables the MPH receivers to receive (or acquire) the transmission parameters in advance very reliably.

For example, when Parade repetition cycle='000', the values of the 3rd, 4Ath3 and 5th sub-frames of the current MPH frame correspond to the next MPH frame. Also, when Parade repetition cycle='011', the values of the $3^{rd}$, $4^{th}$ and $5^{th}$ sub-frames of the current MPH frame correspond to the $4^{th}$ MPH frame and beyond. The FIC version field and the FIC data field may have values that apply to the current MPH Frame during the $1^{St}$ sub-frame and the $2^{nd}$ sub-frame, and they shall have values corresponding to the MPH frame immediately following the current MPH frame during the $3^{rd}$, $4^{th}$ 3 and $5^{th}$ sub-frames of the current MPH frame.

Meanwhile, the receiving system may turn the power on only during a slot to which the data group of the designated (or desired) parade is assigned, and the receiving system may turn the power off during the remaining slots, thereby reducing power consumption of the receiving system. Such characteristic is particularly useful in portable or mobile receivers, which require low power consumption. For example, it is assumed that data groups of a $1^{st}$ parade with NOG=3, a $2^{nd}$ parade with NOG=2, and a $3^{rd}$ parade with NOG=3 are assigned to one MPH frame, as shown in FIG. 33. It is alin ordersumed that the user has selected a mobile service included in the $1^{st}$ parade using the keypad provided on the remote controller or terminal. In this case, the receiving system turns the power on only during a slot that data groups of the $1^{st}$ parade is assigned, as shown in FIG. 33, and turns the power off during the remaining slots, thereby reducing power consumption, as described above. At this point, the power is required to be turned on briefly earlier than the slot to which the actual designated data group is assigned (or allocated). This is to enable the tuner or demodulator to converge in advance.

Assignment of Known Data (or Training Signal)

Figure 34:
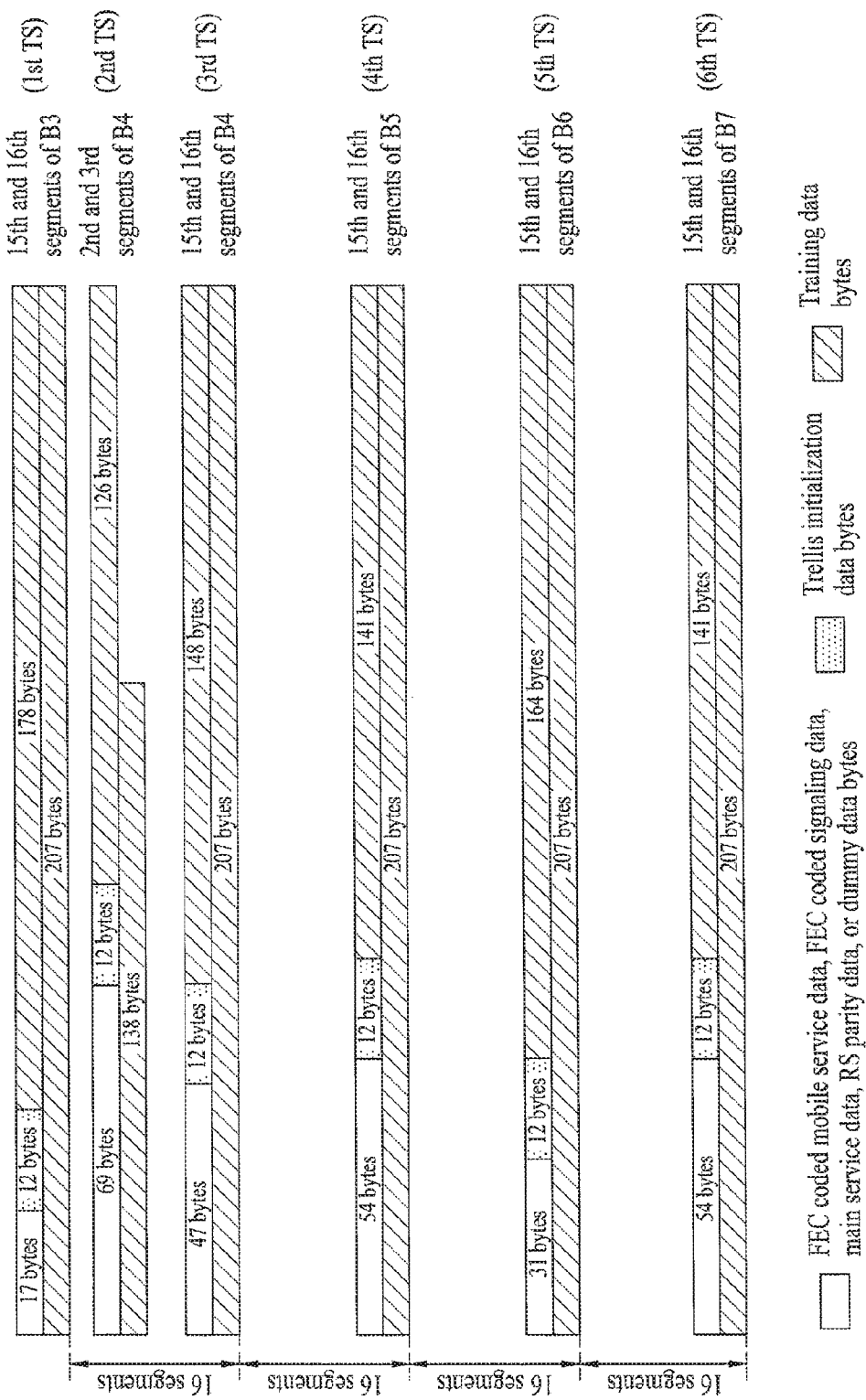
FIG. 34 illustrates an example of a training sequence at the byte level according to the present invention.

In addition to the payload data, the MPH transmission system inserts long and regularly spaced training sequences into each group. The regularity is an especially useful feature since it provides the greatest possible benefit for a given number of training symbols in high-Doppler rate conditions. The length of the training sequences is also chosen to allow fast acquisition of the channel during bursted power-saving operation of the demodulator. Each group contains 6 training sequences. The training sequences are specified before trellis-encoding. The training sequences are then trellis-encoded and these trellis-encoded sequences also are known sequences. This is because the trellis encoder memories are initialized to pre-determined values at the beginning of each sequence. The form of the 6 training sequences at the byte level (before trellis-encoding) is shown in FIG. 34. This is the arrangement of the training sequence at the group formatter 303.

The $1^{st}$ training sequence is located at the last 2 segments of the $3^{rd}$ MPH block (B3). The $2^{nd}$ training sequence may be inserted at the $2^{nd}$ and $3^{rd}$ segments of the $4^{th}$ MPH block (B4). The $2^{nd}$ training sequence is next to the signaling area, as shown in FIG. 5. Then, the $3^{rd}$ training sequence, the $4^{th}$ training sequence, the $5^{th}$ training sequence, and the $6^{th}$ training sequence may be placed at the last 2 segments of the $4^{th}$, $5^{m}$ n,$^{th}$, and $7^{th}$ MPH blocks (B4, B5, B6, and B7), respectively. As shown in FIG. 34, the $1^{st}$ training sequence, the $3^{rd}$ training sequence, the $4^{th}$ training sequence, the $5^{th}$ training sequence, and the $6^{th}$ training sequence are spaced 16 segments apart from one another. Referring to FIG. 34, the dotted area indicates trellis initialization data bytes, the lined area indicates training data bytes, and the white area includes other bytes such as the FEC-coded MPH service data bytes, FEC-coded signaling data, main service data bytes, RS parity data bytes (for backwards compatibility with legacy ATSC receivers) and/or dummy data bytes.

Figure 35:
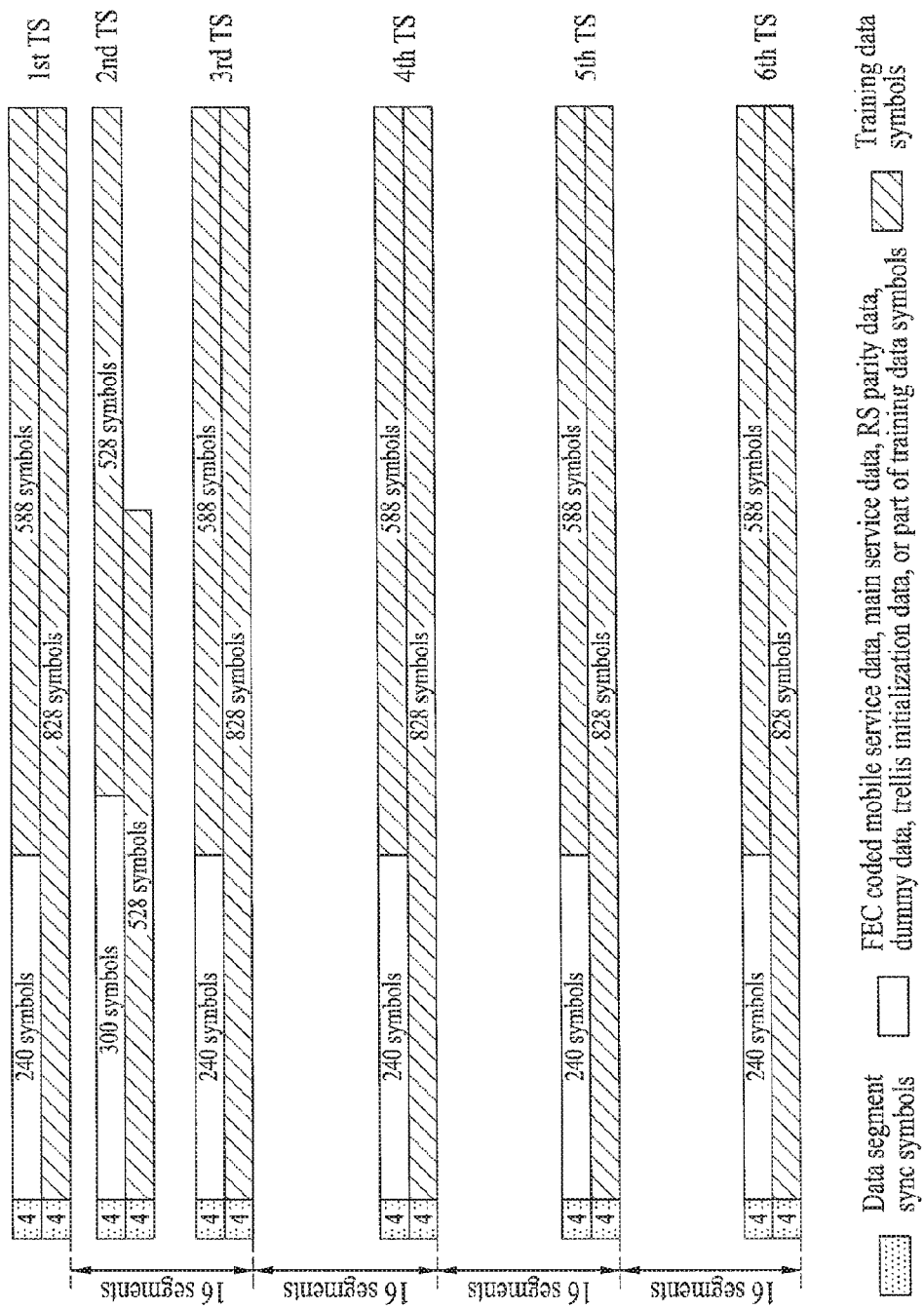
FIG. 35 illustrates an example of a training sequence at the symbol according to the present invention.

FIG. 35 illustrates the training sequences (at the symbol level) after trellis-encoding by the trellis encoder. Referring to FIG. 35, the dotted area indicates data segment sync symbols, the lined area indicates training data symbols, and the white area includes other symbols, such as FEC-coded mobile service data symbols, FEC-coded signaling data, main service data symbols, RS parity data symbols (for backwards compatibility with legacy ATSC receivers), dummy data symbols, trellis initialization data symbols, and/or the first part of the training sequence data symbols. Due to the intra-segment interleaving of the trellis encoder, various types of data symbols will be mixed in the white area.

After the trellis-encoding process, the last 1416 (=588+ 828) symbols of the $1^{st}$ training sequence, the $3^{rd}$ training sequence, the $4^{th}$ training sequence, the $5^{th}$ training sequence, and the $6^{th}$ training sequence commonly share the same data pattern. Including the data segment synchronization symbols in the middle of and after each sequence, the total length of each common training pattern is 1424 symbols. The $2^{nd}$ training sequence has a first 528-symbol sequence and a second 528-symbol sequence that have the same data pattern. More specifically, the 528-symbol sequence is repeated after the 4-symbol data segment synchronization signal. At the end of each training sequence, the memory contents of the twelve modified trellis encoders shall be set to zero (0).

Demodulating Unit within Receiving System

Figure 36:
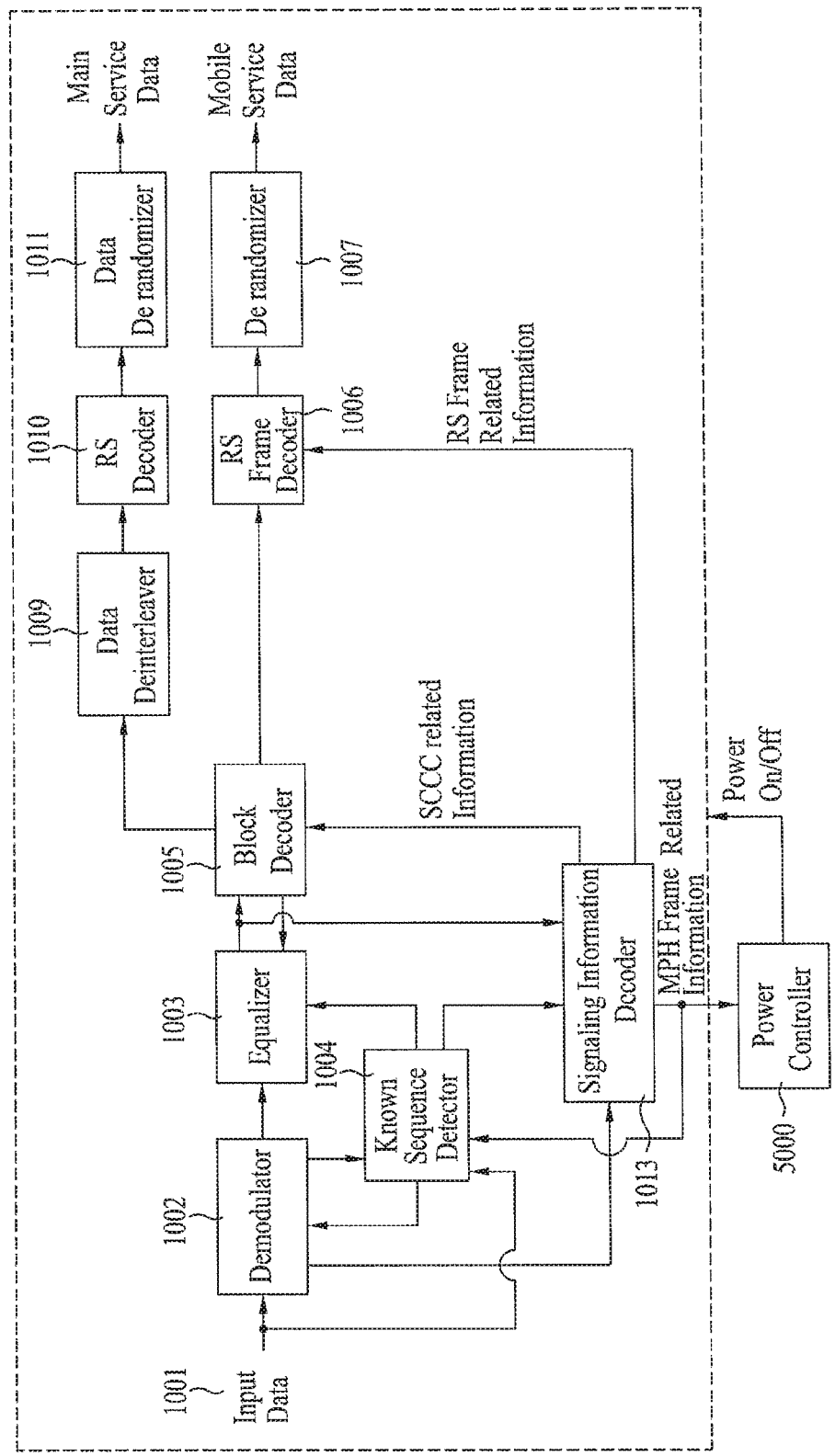
FIG. 36 illustrates a block diagram of a demodulating unit in a receiving system according to the present invention.

FIG. 36 illustrates an example of a demodulating unit in a digital broadcast receiving system according to the present invention. The demodulating unit of FIG. 36 uses known data information, which is inserted in the mobile service data section and, then, transmitted by the transmitting system, in order to perform carrier synchronization recovery, frame synchronization recovery, and channel equalization, thereby enhancing the receiving performance. Also the demodulating unit may turn the power on only during a slot to which the data group of the designated (or desired) parade is assigned, thereby reducing power consumption of the receiving system.

Referring to FIG. 36, the demodulating unit includes a demodulator 1002, an equalizer 1003, a known sequence detector 1004, a block decoder 1005, a RS frame decoder 1006, a derandomizer 1007. The demodulating unit may further include a data deinterleaver 1009, a RS decoder 1010, and a data derandomizer 1011. The demodulating unit may further include a signaling information decoder 1013. The receiving system also may further include a power controller 5000 for controlling power supply of the demodulating unit.

Herein, for simplicity of the description of the present invention, the RS frame decoder 1006, and the derandomizer 1007 will be collectively referred to as a mobile service data processing unit. And, the data deinterleaver 1009, the RS decoder 1010, and the data derandomizer 1011 will be collectively referred to as a main service data processing unit. More specifically, a frequency of a particular channel tuned by a tuner down converts to an intermediate frequency (IF) signal. Then, the down-converted data 1001 outputs the down-converted IF signal to the demodulator 1002 and the known sequence detector 1004. At this point, the down-converted data 1001 is input to the demodulator 1002 and the known sequence detector 1004 via analog/digital converter ADC (not shown). The ADC converts pass-band analog IF signal into pass-band digital IF signal.

The demodulator 1002 performs self gain control, carrier recovery, and timing recovery processes on the input passband digital IF signal, thereby modifying the IF signal to a base-band signal. Then, the demodulator 1002 outputs the newly created base-band signal to the equalizer 1003 and the known sequence detector 1004. The equalizer 1003 compensates the distortion of the channel included in the demodulated signal and then outputs the error-compensated signal to the block decoder 1005.

At this point, the known sequence detector 1004 detects the known sequence place inserted by the transmitting end from the input/output data of the demodulator 1002 (i.e., the data prior to the demodulation process or the data after the demodulation process). Thereafter, the place information along with the symbol sequence of the known data, which are generated from the detected place, is output to the demodulator 1002 and the equalizer 1003. Also, the known data detector 1004 outputs a set of information to the block decoder 1005. This set of information is used to allow the block decoder 1005 of the receiving system to identify the mobile service data that are processed with additional encoding from the transmitting system and the main service data that are not processed with additional encoding. In addition, although the connection status is not shown in FIG. 36, the information detected from the known data detector 1004 may be used throughout the entire receiving system and may also be used in the RS frame decoder 1006.

The demodulator 1002 uses the known data symbol sequence during the timing and/or carrier recovery, thereby enhancing the demodulating performance. Similarly, the equalizer 1003 uses the known data in order to enhance the equalizing performance. Moreover, the decoding result of the block decoder 1005 may be fed-back to the equalizer 1003, thereby enhancing the equalizing performance.

Power on/Off Control

The data demodulated in the demodulator 1002 or the data equalized in the channel equalizer 1003 is input to the signaling information decoder 1013. The known data information detected in the known sequence detector 1004 is input to the signaling information decoder 1013.

The signaling information decoder 1013 extracts and decodes signaling information from the input data, the decoded signaling information provides to blocks requiring the signaling information. For example, the SCCC-associated information may output to the block decoder 1005, and the RS frame-associated information may output to the RS frame decoder 1006. The MPH frame-associated information may output to the known sequence detector 1004 and the power controller 5000.

Herein, the RS frame-associated information may include RS frame mode information and RS code mode information. The SCCC-associated information may include SCCC block mode information and SCCC outer code mode information. The MPH frame-associated information may include subframe count information, slot count information, parade id information, SGN information, NoG information, and so on, as shown in FIG. 32.

More specifically, the signaling information between first known data area and second known data area can know by using known data information being output in the known sequence detector 1004. Therefore, the signaling information decoder 1013 may extract and decode signaling information from the data being output in the demodulator 1002 or the channel equalizer 1003.

The power controller 5000 is input the MPH frame-associated information from the signaling information decoder 1013, and controls power of the tuner and the demodulating unit.

According to the embodiment of the present invention, the power controller 5000 turns the power on only during a slot to which a slot of the parade including user-selected mobile service is assigned. The power controller 5000 then turns the power off during the remaining slots.

For example, it is assumed that data groups of a $1^{st}$ parade with NOG=3, a $2^{nd}$ parade with NOG=2, and a $3^{rd}$ parade with NOG=3 are assigned to one MPH frame, as shown in FIG. 33. It is alin ordersumed that the user has selected a mobile service included in the $1^{st}$ parade using the keypad provided on the remote controller or terminal. In this case, the power controller 5000 turns the power on only during a slot that data groups of the $1^{st}$ parade is assigned, as shown in FIG. 33, and turns the power off during the remaining slots, thereby reducing power consumption.

Demodulator and Known Sequence Detector

At this point, the transmitting system may receive a data frame (or VSB frame) including a data group which known data sequence (or training sequence) is periodically inserted therein. Herein, the data group is divided into regions A to D, as shown in FIG. 5. More specifically, in the example of the present invention, each region A, B, C, and D are further divided into MPH blocks B4 to B7, MPH blocks B3 and B8, MPH blocks B2 and B9, MPH blocks B1 and B10, respectively.

Figure 37:
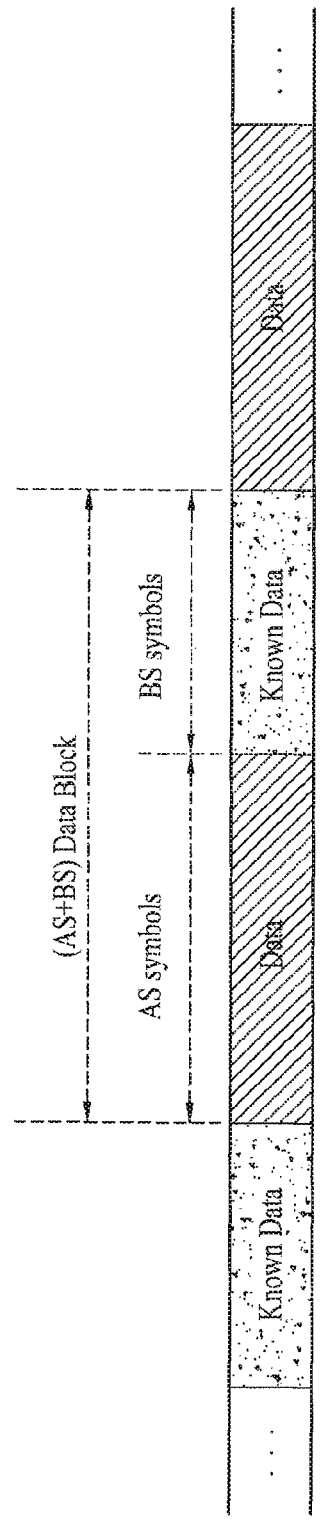
FIG. 37 illustrates a data structure showing an example of known data being periodically inserted in valid data according to the present invention.

FIG. 37 illustrates an example of known data sequence being periodically inserted and transmitted in-between actual data by the transmitting system. Referring to FIG. 37, AS represents the number of valid data symbols, and BS represents the number of known data symbols. Therefore, BS number of known data symbols are inserted and transmitted at a period of (AS+BS) symbols. Herein, AS may correspond to mobile service data, main service data, or a combination of mobile service data and main service data. In order to be differentiated from the known data, data corresponding to AS will hereinafter be referred to as valid data.

Referring to FIG. 37, known data sequence having the same pattern are included in each known data section that is being periodically inserted. Herein, the length of the known data sequence having identical data patterns may be either equal to or different from the length of the entire (or total) known data sequence of the corresponding known data section (or block). If the two lengths are different from one another, the length of the entire known data sequence should be longer than the length of the known data sequence having identical data patterns. In this case, the same known data sequences are included in the entire known data sequence. The known sequence detector 1004 detects the position of the known data being periodically inserted and transmitted as described above. At the same time, the known sequence detector 1004 may also estimate initial frequency offset during the process of detecting known data. In this case, the demodulator 1002 may estimate with more accuracy carrier frequency offset from the information on the known data position (or known sequence position indicator) and initial frequency offset estimation value, thereby compensating the estimated initial frequency offset.

Figure 38:
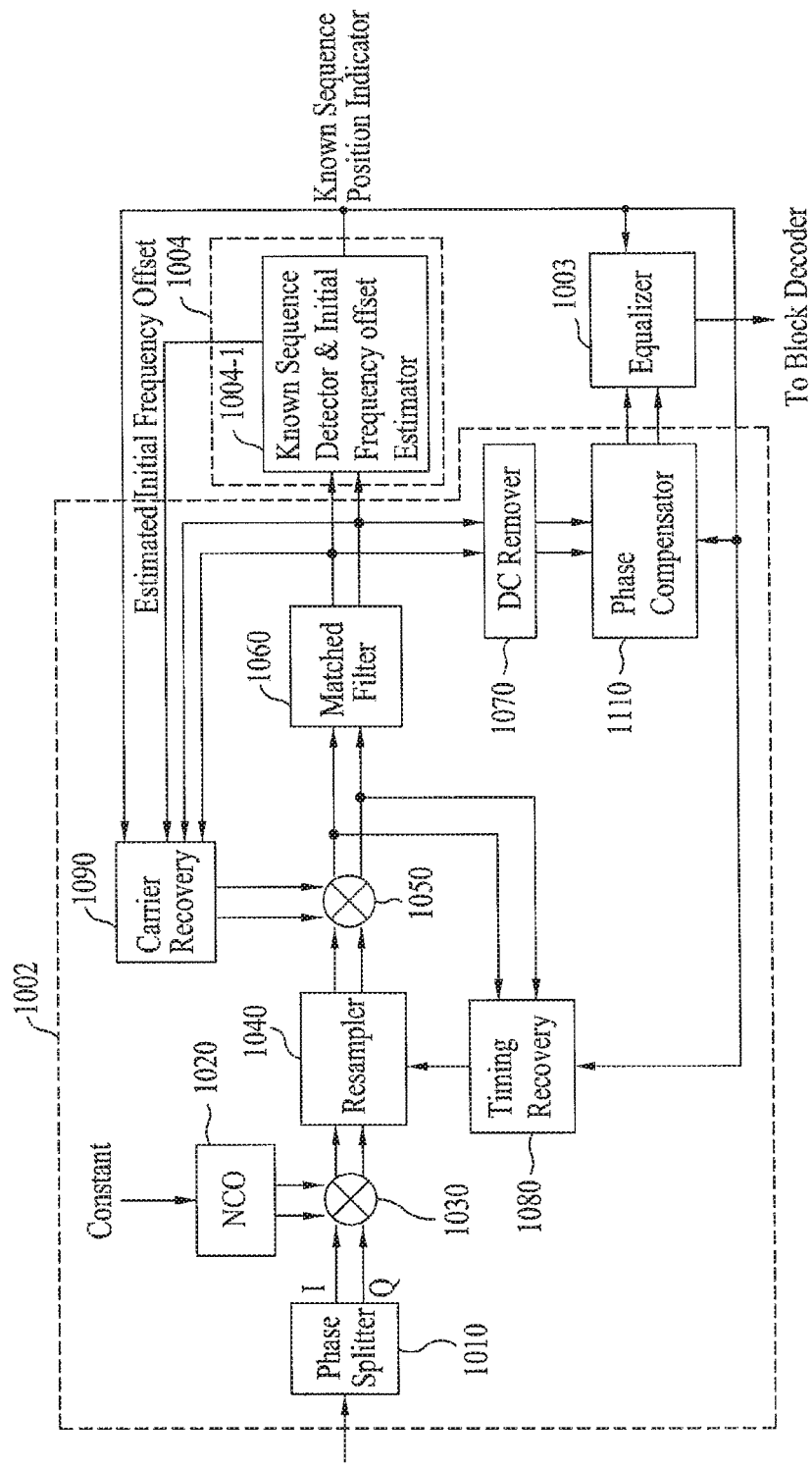
FIG. 38 illustrates a block diagram showing a structure of a demodulator of the demodulating unit shown in FIG. 36.

FIG. 38 illustrates a detailed block diagram of a demodulator according to the present invention. Referring to FIG. 38, the demodulator includes a phase splitter 1010, a numerically controlled oscillator (NCO) 1020, a first multiplier 1030, a resampler 1040, a second multiplier 1050, a matched filter 1060, a DC remover 1070, a timing recovery unit 1080, a carrier recovery unit 1090, and a phase compensator 1110. Herein, the known sequence detector 1004 includes a known sequence detector and initial frequency offset estimator 1004-1 for estimating known data information and initial frequency offset. Also referring to FIG. 38, the phase splitter 1010 receives a pass band digital signal and splits the received signal into a pass band digital signal of a real number element and a pass band digital signal of an imaginary number element both having a phase of 90 degrees between one another. In other words, the pass band digital signal is split into complex signals. The split portions of the pass band digital signal are then output to the first multiplier 1030. Herein, the real number signal output from the phase splitter 1010 will be referred to as an 'I' signal, and the imaginary number signal output from the phase splitter 1010 will be referred to as a 'Q' signal, for simplicity of the description of the present invention.

The first multiplier 1030 multiplies the I and Q pass band digital signals, which are output from the phase splitter 1010, to a complex signal having a frequency proportional to a constant being output from the NCO 1020, thereby changing the I and Q pass band digital signals to baseband digital complex signals. Then, the baseband digital signals of the first multiplier 1030 are input to the resampler 1040. The resampler 1040 resamples the signals being output from the first multiplier 1030 so that the signal corresponds to the timing clock provided by the timing recovery unit 1080. Thereafter, the resampler 1040 outputs the resampled signals to the second multiplier 1050.

For example, when the analog/digital converter uses a 25 MHz fixed oscillator, the baseband digital signal having a frequency of 25 MHz, which is created by passing through the analog/digital converter, the phase splitter 1010, and the first multiplier 1030, is processed with an interpolation process by the resampler 1040. Thus, the interpolated signal is recovered to a baseband digital signal having a frequency twice that of the receiving signal of a symbol clock (i.e., a frequency of 21.524476 MHz). Alternatively, if the analog/digital converter uses the timing clock of the timing recovery unit 1080 as the sampling frequency (i.e., if the analog/digital converter uses a variable frequency) in order to perform an A/D conversion process, the resampler 1040 is not required and may be omitted.

The second multiplier 1050 multiplies an output frequency of the carrier recovery unit 1090 with the output of the resampler 1040 in order to compensate any remaining carrier included in the output signal of the resampler 1040. Thereafter, the compensated carrier is output to the matched filter 1060 and the timing recovery unit 1080. The signal matched-filtered by the matched filter 1060 is input to the DC remover 1070, the known sequence detector and initial frequency offset estimator 1004-1, and the carrier recovery unit 1090.

The known sequence detector and initial frequency offset estimator 1004-1 detects the place (or position) of the known data sequences that are being periodically or non-periodically transmitted. Simultaneously, the known sequence detector and initial frequency offset estimator 1004-1 estimates an initial frequency offset during the known sequence detection process. More specifically, while the transmission data frame is being received, as shown in FIG. 5, the known sequence detector and initial frequency offset estimator 1004-1 detects the position (or place) of the known data included in the transmission data frame. Then, the known sequence detector and initial frequency offset estimator 1004-1 outputs the detected information on the known data place (i.e., a known sequence position indicator) to the timing recovery unit 1080, the carrier recovery unit 1090, and the phase compensator 1110 of the demodulator 1002 and the equalizer 1003. Furthermore, the known sequence detector and initial frequency offset estimator 1004-1 estimates the initial frequency offset, which is then output to the carrier recovery unit 1090. At this point, the known sequence detector and initial frequency offset estimator 1004-1 may either receive the output of the matched filter 1060 or receive the output of the resampler 1040. This may be optionally decided depending upon the design of the system designer.

The timing recovery unit 1080 uses the output of the second multiplier 1050 and the known sequence position indicator detected from the known sequence detector and initial frequency offset estimator 1004-1, in order to detect the timing error and, then, to output a sampling clock being in proportion with the detected timing error to the resampler 1040, thereby adjusting the sampling timing of the resampler 1040. At this point, the timing recovery unit 1080 may receive the output of the matched filter 1060 instead of the output of the second multiplier 1050. This may also be optionally decided depending upon the design of the system designer.

Meanwhile, the DC remover 1070 removes a pilot tone signal (i.e., DC signal), which has been inserted by the transmitting system, from the matched-filtered signal. Thereafter, the DC remover 1070 outputs the processed signal to the phase compensator 1110. The phase compensator 1110 uses the data having the DC removed by the DC remover 1070 and the known sequence position indicator detected by the known sequence detector and initial frequency offset estimator 1004-1 to estimate the frequency offset and, then, to compensate the phase change included in the output of the DC remover 1070. The data having its phase change compensated are input to the equalizer 1003. Herein, the phase compensator 1110 is optional. If the phase compensator 1110 is not provided, then the output of the DC remover 1070 is input to the equalizer 1003 instead.

Figure 39:
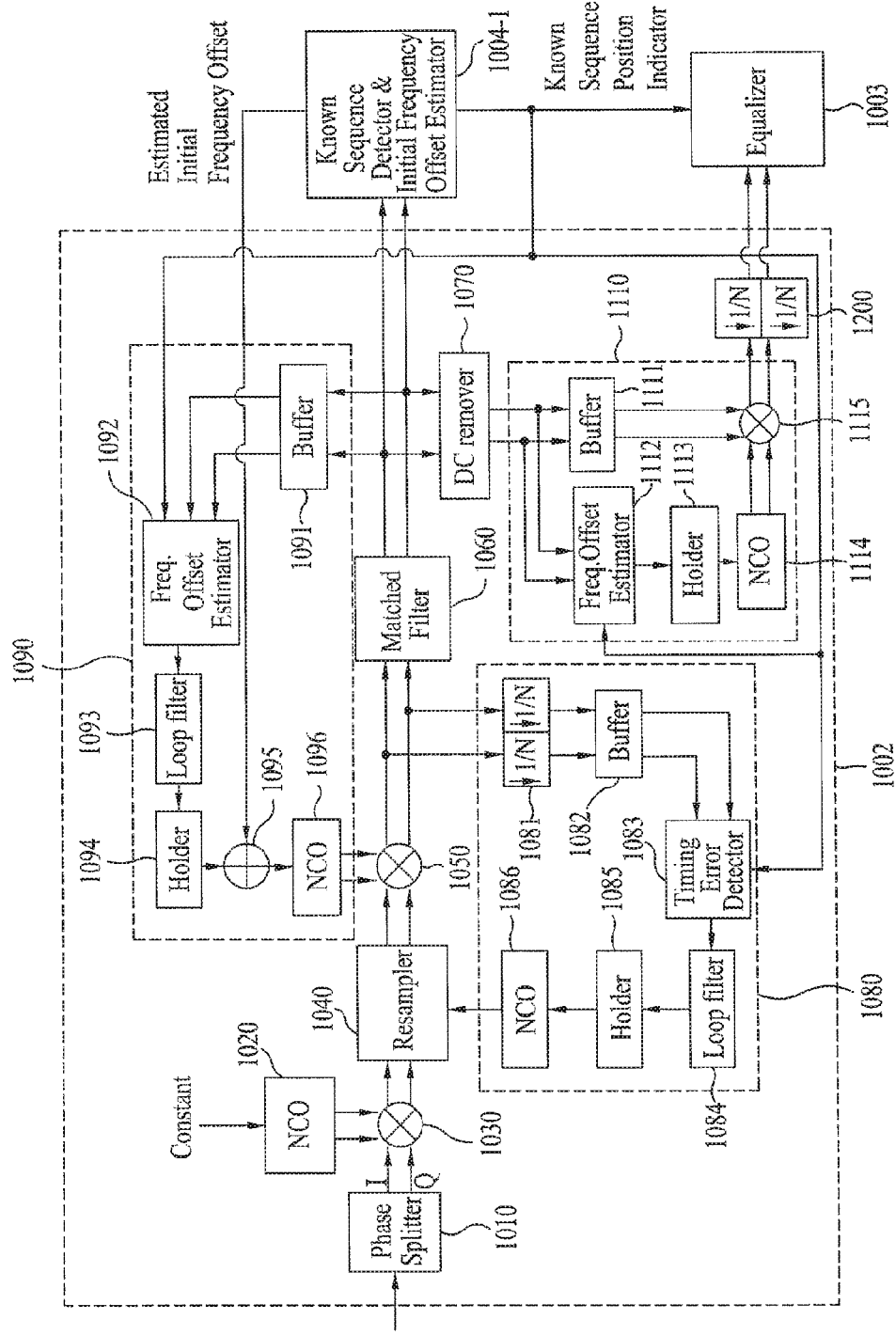
FIG. 39 illustrates a detailed block diagram of the demodulator shown in FIG. 38.

FIG. 39 includes detailed block diagrams of the timing recovery unit 1080, the carrier recovery unit 1090, and the phase compensator 1110 of the demodulator. According to an embodiment of the present invention, the carrier recovery unit 1090 includes a buffer 1091, a frequency offset estimator 1092, a loop filter 1093, a holder 1094, an adder 1095, and a NCO 1096. Herein, a decimator may be included before the buffer 1091. The timing recovery unit 1080 includes a decimator 1081, a buffer 1082, a timing error detector 1083, a loop filter 1084, a holder 1085, and a NCO 1086. Finally, the phase compensator 1110 includes a buffer 1111, a frequency offset estimator 1112, a holder 1113, a NCO 1114, and a multiplier 1115. Furthermore, a decimator 1200 may be included between the phase compensator 1110 and the equalizer 1003. The decimator 1200 may be output in front of the DC remover 1070 instead of at the outputting end of the phase compensator 1110.

Herein, the decimators correspond to components required when a signal being input to the demodulator is oversampled to N times by the analog/digital converter. More specifically, the integer N represents the sampling rate of the received signal. For example, when the input signal is oversampled to 2 times (i.e., when N=2) by the analog/digital converter, this indicates that two samples are included in one symbol. In this case, each of the decimators corresponds to a ½ decimator. Depending upon whether or not the oversampling process of the received signal has been performed, the signal may bypass the decimators.

Meanwhile, the output of the second multiplier 1050 is temporarily stored in the decimator 1081 and the buffer 1082 both included in the timing recovery unit 1080. Subsequently, the temporarily stored output data are input to the timing error detector 1083 through the decimator 1081 and the buffer 1082. Assuming that the output of the second multiplier 1050 is oversampled to N times its initial state, the decimator 1081 decimates the output of the second multiplier 1050 at a decimation rate of 1/N. Then, the 1/N-decimated data are input to the buffer 1082. In other words, the decimator 1081 performs decimation on the input signal in accordance with a VSB symbol cycle. Furthermore, the decimator 1081 may also receive the output of the matched filter 1060 instead of the output of the second multiplier 1050. The timing error detector 1083 uses the data prior to or after being processed with matched-filtering and the known sequence position indicator output from the known sequence detector and initial frequency offset estimator 1004-1 in order to detect a timing error. Thereafter, the detected timing error is output to the loop filter 1084. Accordingly, the detected timing error information is obtained once during each repetition cycle of the known data sequence.

For example, if a known data sequence having the same pattern is periodically inserted and transmitted, as shown in FIG. 37, the timing error detector 1083 may use the known data in order to detect the timing error. There exists a plurality of methods for detecting timing error by using the known data. In the example of the present invention, the timing error may be detected by using a correlation characteristic between the known data and the received data in the time domain, the known data being already known in accordance with a pre-arranged agreement between the transmitting system and the receiving system. The timing error may also be detected by using the correlation characteristic of the two known data types being received in the frequency domain. Thus, the detected timing error is output. In another example, a spectral lining method may be applied in order to detect the timing error. Herein, the spectral lining method corresponds to a method of detecting timing error by using sidebands of the spectrum included in the received signal.

The loop filter 1084 filters the timing error detected by the timing error detector 1083 and, then, outputs the filtered timing error to the holder 1085. The holder 1085 holds (or maintains) the timing error filtered and output from the loop filter 1084 during a pre-determined known data sequence cycle period and outputs the processed timing error to the NCO 1086. Herein, the order of positioning of the loop filter 1084 and the holder 1085 may be switched with one another. In additionally, the function of the holder 1085 may be included in the loop filter 1084, and, accordingly, the holder 1085 may be omitted. The NCO 1086 accumulates the timing error output from the holder 1085. Thereafter, the NCO 1086 outputs the phase element (i.e., a sampling clock) of the accumulated timing error to the resampler 1040, thereby adjusting the sampling timing of the resampler 1040.

Meanwhile, the buffer 1091 of the carrier recovery unit 1090 may receive either the data input to the matched filter 1060 or the data output from the matched filter 1060 and, then, temporarily store the received data. Thereafter, the temporarily stored data are output to the frequency offset estimator 1092. If a decimator is provided in front of the buffer 1091, the input data or output data of the matched filter 1060 are decimated by the decimator at a decimation rate of 1/N. Thereafter, the decimated data are output to the buffer 1091. For example, when the input data or output data of the matched filter 1060 are oversampled to 2 times (i.e., when N=2), this indicates that the input data or output data of the matched filter 1060 are decimated at a rate of ½ by the decimator 1081 and then output to the buffer 1091. More specifically, when a decimator is provided in front of the buffer 1091, the carrier recovery unit 1090 operates in symbol units. Alternatively, if a decimator is not provided, the carrier recovery unit 1090 operates in oversampling units.

The frequency offset estimator 1092 uses the input data or output data of the matched filter 1060 and the known sequence position indicator output from the known sequence detector and initial frequency offset estimator 1004-1 in order to estimate the frequency offset. Then, the estimated frequency offset is output to the loop filter 1093. Therefore, the estimated frequency offset value is obtained once every repetition period of the known data sequence. The loop filter 1093 performs low pass filtering on the frequency offset value estimated by the frequency offset estimator 1092 and outputs the low pass-filtered frequency offset value to the holder 1094. The holder 1094 holds (or maintains) the low pass-filtered frequency offset value during a pre-determined known data sequence cycle period and outputs the frequency offset value to the adder 1095. Herein, the positions of the loop filter 1093 and the holder 1094 may be switched from one to the other. Furthermore, the function of the holder 1085 may be included in the loop filter 1093, and, accordingly, the holder 1094 may be omitted.

The adder 1095 adds the value of the initial frequency offset estimated by the known sequence detector and initial frequency offset estimator 1004-1 to the frequency offset value output from the loop filter 1093 (or the holder 1094). Thereafter, the added offset value is output to the NCO 1096. Herein, if the adder 1095 is designed to also receive the constant being input to the NCO 1020, the NCO 1020 and the first multiplier 1030 may be omitted. In this case, the second multiplier 1050 may simultaneously perform changing signals to baseband signals and removing remaining carrier.

The NCO 1096 generates a complex signal corresponding to the frequency offset output from the adder 1095, which is then output to the second multiplier 1050. Herein, the NCO 1096 may include a ROM. In this case, the NCO 1096 generates a compensation frequency corresponding to the frequency offset being output from the adder 1095. Then, the NCO 1096 reads a complex cosine corresponding to the compensation frequency from the ROM, which is then output to the second multiplier 1050. The second multiplier 1050 multiplies the output of the NCO 1094 included in the carrier recovery unit 1090 to the output of the resampler 1040, in order to remove the carrier offset included in the output signal of the resampler 1040.

Figure 40:
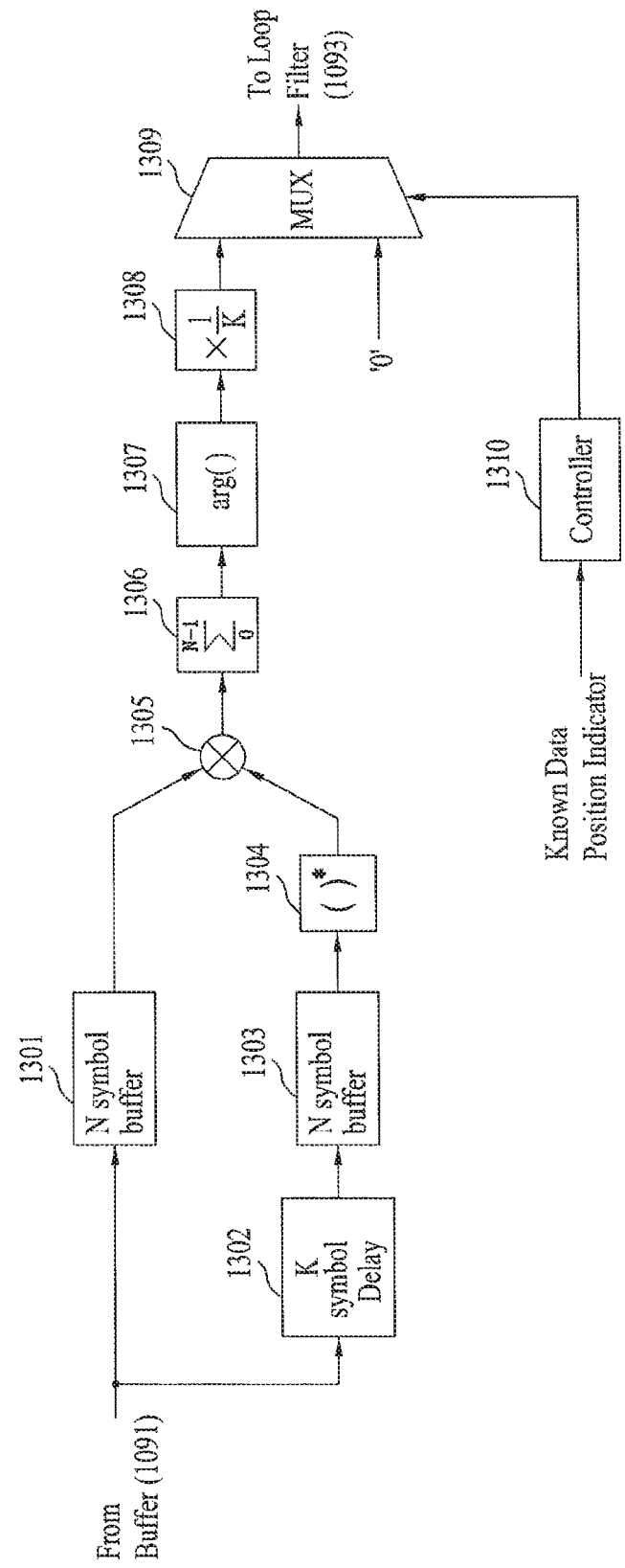
FIG. 40 illustrates a block diagram of a frequency offset estimator according to an embodiment of the present invention.

FIG. 40 illustrates a detailed block diagram of the frequency offset estimator 1092 of the carrier recovery unit 1090 according to an embodiment of the present invention. Herein, the frequency offset estimator 1092 operates in accordance with the known sequence position indicator detected from the known sequence detector and initial frequency offset estimator 1004-1. At this point, if the input data or output data of the matched filter 1060 are input through the decimator, the frequency offset estimator 1092 operates in symbol units. Alternatively, if a decimator is not provided, the frequency offset estimator 1092 operates in oversampling units. In the example given in the description of the present invention, the frequency offset estimator 1092 operates in symbol units. Referring to FIG. 40, the frequency offset estimator 1092 includes a controller 1310, a first N symbol buffer 1301, a K symbol delay 1302, a second N symbol buffer 1303, a conjugator 1304, a multiplier 1305, an accumulator 1306, a phase detector 1307, a multiplier 1308, and a multiplexer 1309. The frequency offset estimator 1092 having the above-described structure, as shown in FIG. 40, will now be described in detail with respect to an operation example during a known data section.

The first N symbol buffer 1301 may store a maximum of N number of symbol being input thereto. The symbol data that are temporarily stored in the first N symbol buffer 1301 are then input to the multiplier 1305. At the same time, the input symbol is input to the K symbol delay 1302 in order to be delayed by K symbols. Thereafter, the delayed symbol passes through the second N symbol buffer 1303 in order to be conjugated by the conjugator 1304. Thereafter, the conjugated symbol is input to the multiplier 1305. The multiplier 1305 multiplies the output of the first N symbol buffer 1301 and the output of the conjugator 1304. Then, the multiplier 1305 outputs the multiplied result to the accumulator 1306. Subsequently, the accumulator 1306 accumulates the output of the multiplier 1305 during N symbol periods, thereby output the accumulated result to the phase detector 1307.

The phase detector 1307 extracts the corresponding phase information from the output of the accumulator 1306, which is then output to the multiplier 1308. The multiplier 1308 then divides the phase information by K, thereby outputting the divided result to the multiplexer 1309. Herein, the result of the phase information divided by becomes the frequency offset estimation value. More specifically, at the point where the input of the known data ends or at a desired point, the frequency offset estimator 1092 accumulates during an N symbol period multiplication of the complex conjugate of N number of the input data stored in the first N symbol buffer 1301 and the complex conjugate of the N number of the input data that are delayed by K symbols and stored in the second N symbol buffer 1303. Thereafter, the accumulated value is divided by K, thereby extracting the frequency offset estimation value.

Based upon a control signal of the controller 1310, the multiplexer 1309 selects either the output of the multiplier 1308 or '0' and, then, outputs the selected result as the final frequency offset estimation value. The controller 1310 receives the known data sequence position indicator from the known sequence detector and initial frequency offset estimator 1004-1 in order to control the output of the multiplexer 1309. More specifically, the controller 1310 determines based upon the known data sequence position indicator whether the frequency offset estimation value being output from the multiplier 1308 is valid. If the controller 1310 determines that the frequency offset estimation value is valid, the multiplexer 1309 selects the output of the multiplier 1308. Alternatively, if the controller 1310 determines that the frequency offset estimation value is invalid, the controller 1310 generates a control signal so that the multiplexer 1309 selects '0'. At this point, it is preferable that the input signals stored in the first N symbol buffer 1301 and in the second N symbol buffer 1303 correspond to signals each being transmitted by the same known data and passing through almost the same channel. Otherwise, due to the influence of the transmission channel, the frequency offset estimating performance may be largely deteriorated.

Further, the values N and K of the frequency offset estimator 1092 (shown in FIG. 40) may be diversely decided. This is because a particular portion of the known data that are identically repeated may be used herein. For example, when the data having the structure described in FIG. 37 are being transmitted, N may be set as BS (i.e., N=BS), and K may be set as (AS+BS) (i.e., K=AS+BS)). The frequency offset estimation value range of the frequency offset estimator 1092 is decided in accordance with the value K. If the value K is large, then the frequency offset estimation value range becomes smaller. Alternatively, if the value K is small, then the frequency offset estimation value range becomes larger. Therefore, when the data having the structure of FIG. 37 is transmitted, and if the repetition cycle (AS+BS) of the known data is long, then the frequency offset estimation value range becomes smaller.

In this case, even if the initial frequency offset is estimated by the known sequence detector and initial frequency offset estimator 1004-1, and if the estimated value is compensated by the second multiplier 1050, the remaining frequency offset after being compensated will exceed the estimation range of the frequency offset estimator 1092. In order to overcome such problems, the known data sequence that is regularly transmitted may be configured of a repetition of a same data portion by using a cyclic extension process. For example, if the known data sequence shown in FIG. 37 is configured of two identical portions having the length of BS/2, then the N and K values of the frequency offset estimator 1092 (shown in FIG. 40) may be respectively set as B/2 and B/2 (i.e., N=BS/2 and K=BS/2). In this case, the estimation value range may become larger than when using repeated known data.

Meanwhile, the known sequence detector and initial frequency offset estimator 1004-1 detects the place (o position) of the known data sequences that are being periodically or non-periodically transmitted. Simultaneously, the known sequence detector and initial frequency offset estimator 1004-1 estimates an initial frequency offset during the known sequence detection process. The known data sequence position indicator detected by the known sequence detector and initial frequency offset estimator 1004-1 is output to the timing recovery unit 1080, the carrier recovery unit 1090, and the phase compensator 1110 of the demodulator 1002, and to the equalizer 1003. Thereafter, the estimated initial frequency offset is output to the carrier recovery unit 1090. At this point, the known sequence detector and initial frequency offset estimator 1004-1 may either receive the output of the matched filter 1060 or receive the output of the resampler 1040. This may be optionally decided depending upon the design of the system designer. Herein, the frequency offset estimator shown in FIG. 40 may be directly applied in the known sequence detector and initial frequency offset estimator 1004-1 or in the phase compensator 1110 of the frequency offset estimator.

Figure 41:
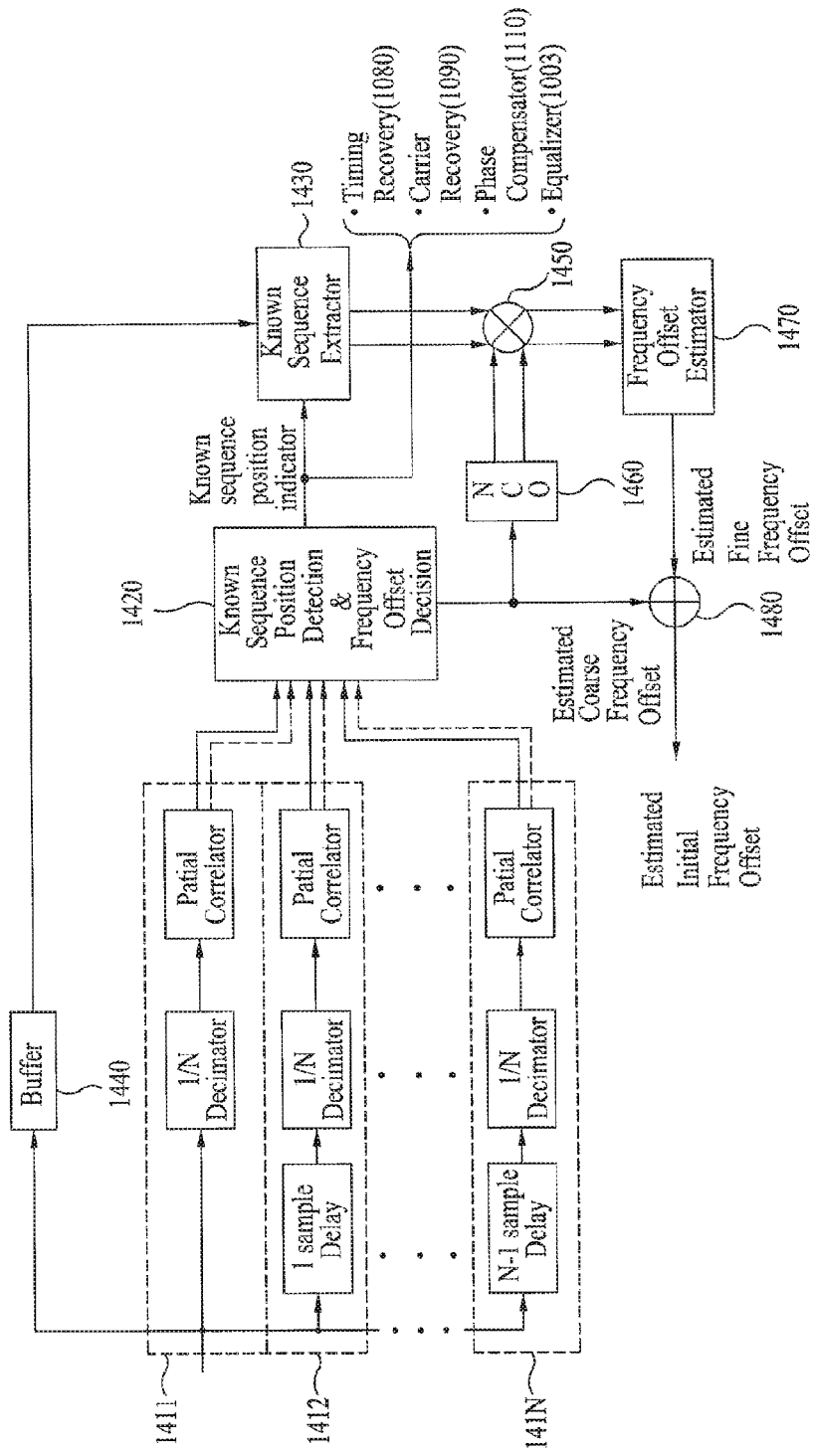
FIG. 41 illustrates a block diagram of a known data detector and initial frequency offset estimator according to the present invention.

FIG. 41 illustrates a detailed block diagram showing a known sequence detector and initial frequency offset estimator according to an embodiment of the present invention. More specifically, FIG. 41 illustrates an example of an initial frequency offset being estimated along with the known sequence position indicator. Herein, FIG. 41 shows an example of an input signal being oversampled to N times of its initial state. In other words, N represents the sampling rate of a received signal. Referring to FIG. 41, the known sequence detector and initial frequency offset estimator includes N number of partial correlators 1411 to 141N configured in parallel, a known data place detector and frequency offset decider 1420, a known data extractor 1430, a buffer 1440, a multiplier 1450, a NCO 1460, a frequency offset estimator 1470, and an adder 1480. Herein, the first partial correlator 1411 consists of a 1/N decimator, and a partial correlator. The second partial correlator 1412 consists of a 1 sample delay, a 1/N decimator, and a partial correlator. And, the $N^{th}$ partial correlator 141 N consists of an N−1 sample delay, a 1/N decimator, and a partial correlator. These are used to match (or identify) the phase of each of the samples within the oversampled symbol with the phase of the original (or initial) symbol, and to decimate the samples of the remaining phases, thereby performing partial correlation on each sample. More specifically, the input signal is decimated at a rate of 1/N for each sampling phase, in order to pass through each partial correlator.

For example, when the input signal is oversampled to 2 times (i.e., when N=2), this indicates that two samples are included in one signal. In this case, two partial correlators (e.g., 1411 and 1412) are required, and each 1/N decimator becomes a ½ decimator. At this point, the 1/N decimator of the first partial correlator 1411 decimates (or removes), among the input samples, the samples located in-between symbol places (or positions). Then, the corresponding 1/N decimator outputs the decimated sample to the partial correlator. Furthermore, the 1 sample delay of the second partial correlator 1412 delays the input sample by 1 sample (i.e., performs a 1 sample delay on the input sample) and outputs the delayed input sample to the 1/N decimator. Subsequently, among the samples input from the 1 sample delay, the 1/N decimator of the second partial correlator 1412 decimates (or removes) the samples located in-between symbol places (or positions). Thereafter, the corresponding 1/N decimator outputs the decimated sample to the partial correlator.

After each predetermined period of the VSB symbol, each of the partial correlators outputs a correlation value and an estimation value of the coarse frequency offset estimated at that particular moment to the known data place detector and frequency offset decider 1420. The known data place detector and frequency offset decider 1420 stores the output of the partial correlators corresponding to each sampling phase during a data group cycle or a pre-decided cycle. Thereafter, the known data place detector and frequency offset decider 1420 decides a position (or place) corresponding to the highest correlation value, among the stored values, as the place (or position) for receiving the known data. Simultaneously, the known data place detector and frequency offset decider 1420 finally decides the estimation value of the frequency offset estimated at the moment corresponding to the highest correlation value as the coarse frequency offset value of the receiving system. At this point, the known sequence position indicator is input to the known data extractor 1430, the timing recovery unit 1080, the carrier recovery unit 1090, the phase compensator 1110, and the equalizer 1003, and the coarse frequency offset is input to the adder 1480 and the NCO 1460.

In the meantime, while the N numbers of partial correlators 1411 to 141 N detect the known data place (or known sequence position) and estimate the coarse frequency offset, the buffer 1440 temporarily stores the received data and outputs the temporarily stored data to the known data extractor 1430. The known data extractor 1430 uses the known sequence position indicator, which is output from the known data place detector and frequency offset decider 1420, in order to extract the known data from the output of the buffer 1440. Thereafter, the known data extractor 1430 outputs the extracted data to the multiplier 1450. The NCO 1460 generates a complex signal corresponding to the coarse frequency offset being output from the known data place detector and frequency offset decider 1420. Then, the NCO 1460 outputs the generated complex signal to the multiplier 1450.

The multiplier 1450 multiplies the complex signal of the NCO 1460 to the known data being output from the known data extractor 1430, thereby outputting the known data having the coarse frequency offset compensated to the frequency offset estimator 1470. The frequency offset estimator 1470 estimates a fine frequency offset from the known data having the coarse frequency offset compensated. Subsequently, the frequency offset estimator 1470 outputs the estimated fine frequency offset to the adder 1480. The adder 1480 adds the coarse frequency offset to the fine frequency offset. Thereafter, the adder 1480 decides the added result as a final initial frequency offset, which is then output to the adder 1095 of the carrier recovery unit 1090 included in the demodulator 1002. More specifically, during the process of acquiring initial synchronization, the present invention may estimate and use the coarse frequency offset as well as the fine frequency offset, thereby enhancing the estimation performance of the initial frequency offset.

It is assumed that the known data is inserted within the data group and then transmitted, as shown in FIG. 5. Then, the known sequence detector and initial frequency offset estimator 1004-1 may use the known data that have been additionally inserted between the A1 area and the A2 area, in order to estimate the initial frequency offset. The known position indicator, which was periodically inserted within the A area estimated by the known sequence detector and initial frequency offset estimator 1004-1, is input to the timing error detector 1083 of the timing error recovery unit 1080, to the frequency offset estimator 1092 of the carrier recovery unit 1090, to the frequency offset estimator 1112 of the phase compensator 1110, and to the equalizer 1003.

Figure 42:
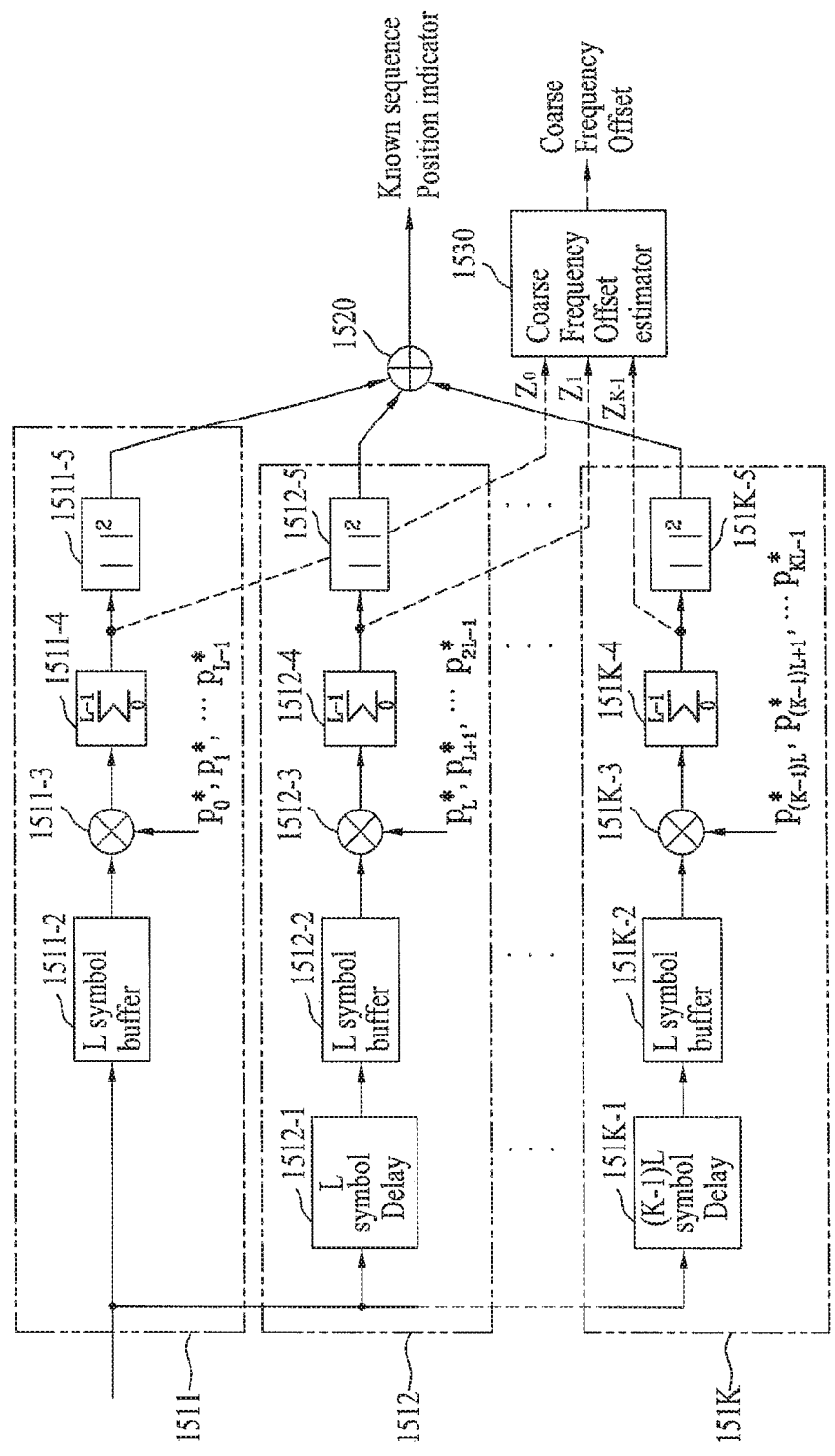
FIG. 42 illustrates a block diagram of a partial correlator shown in FIG. 41.

FIG. 42 illustrates a block diagram showing the structure of one of the partial correlators shown in FIG. 41. During the step of detecting known data, since a frequency offset is included in the received signal, each partial correlator divides the known data, which is known according to an agreement between the transmitting system and the receiving system, to K number of parts each having an L symbol length, thereby correlating each divided part with the corresponding part of the received signal. In order to do so, each partial correlator includes K number of phase and size detector 1511 to 151K each formed in parallel, an adder 1520, and a coarse frequency offset estimator 1530.

The first phase and size detector 1511 includes an L symbol buffer 1511-2, a multiplier 1511-3, an accumulator 1511-4, and a squarer 1511-5. Herein, the first phase and size detector 1511 calculates the correlation value of the known data having a first L symbol length among the K number of sections. Also, the second phase and size detector 1512 includes an L symbol delay 1512-1, an L symbol buffer 1512-2, a multiplier 1512-3, an accumulator 1512-4, and a squarer 1512-5. Herein, the second phase and size detector 1512 calculates the correlation value of the known data having a second L symbol length among the K number of sections. Finally, the Nth phase and size detector 151 K includes a (K−1)L symbol delay 151 K−1, an L symbol buffer 151 K−2, a multiplier 151 K−3, an accumulator 151K−4, and a squarer 151K−5. Herein, the $N^{th}$ phase and size detector 151K calculates the correlation value of the known data having an $N^{th}$ L symbol length among the K number of sections.

Referring to FIG. 42, {Po, P1, . . . , PKL−1} each being multiplied with the received signal in the multiplier represents the known data known by both the transmitting system and the receiving system (i.e., the reference known data generated from the receiving system). And, * represents a complex conjugate. For example, in the first phase and size detector 1511, the signal output from the 1/N decimator of the first partial correlator 1411, shown in FIG. 41, is temporarily stored in the L symbol buffer 1511-2 of the first phase and size detector 1511 and then input to the multiplier 1511-3. The multiplier 1511-3 multiplies the output of the L symbol buffer 1511-2 with the complex conjugate of the known data parts Po, P1, . . . , PKL_i, each having a first L symbol length among the known K number of sections. Then, the multiplied result is output to the accumulator 1511-4. During the L symbol period, the accumulator 1511-4 accumulates the output of the multiplier 1511-3 and, then, outputs the accumulated value to the squarer 1511-5 and the coarse frequency offset estimator 1530. The output of the accumulator 1511-4 is a correlation value having a phase and a size. Accordingly, the squarer 1511-5 calculates an absolute value of the output of the multiplier 1511-4 and squares the calculated absolute value, thereby obtaining the size of the correlation value. The obtained size is then input to the adder 1520.

The adder 1520 adds the output of the squares corresponding to each size and phase detector 1511 to 151 K. Then, the adder 1520 outputs the added result to the known data place detector and frequency offset decider 1420. Also, the coarse frequency offset estimator 1530 receives the output of the accumulator corresponding to each size and phase detector 1511 to 151 K, in order to estimate the coarse frequency offset at each corresponding sampling phase. Thereafter, the coarse frequency offset estimator 1530 outputs the estimated offset value to the known data place detector and frequency offset decider 1420.

When the K number of inputs that are output from the accumulator of each phase and size detector 1511 to 151 K are each referred to as {Zo, Z1, ZK−1}, the output of the coarse frequency offset estimator 1530 may be obtained by using Equation 7 shown below.

$$\omega_0 = \frac{1}{L}\arg\left\{\sum_{n=1}^{K-1}\left(\frac{Z_n}{|Z_n|}\right)\left(\frac{Z_{n-1}}{|Z_{n-1}|}\right)^*\right\}$$ Equation 7

The known data place detector and frequency offset decider 1420 stores the output of the partial correlator corresponding to each sampling phase during an enhanced data group cycle or a pre-decided cycle. Then, among the stored correlation values, the known data place detector and frequency offset decider 1420 decides the place (or position) corresponding to the highest correlation value as the place for receiving the known data.

Furthermore, the known data place detector and frequency offset decider 1420 decides the estimated value of the frequency offset taken (or estimated) at the point of the highest correlation value as the coarse frequency offset value of the receiving system. For example, if the output of the partial correlator corresponding to the second partial correlator 1412 is the highest value, the place corresponding to the highest value is decided as the known data place. Thereafter, the coarse frequency offset estimated by the second partial correlator 1412 is decided as the final coarse frequency offset, which is then output to the demodulator 1002.

Meanwhile, the output of the second multiplier 1050 is temporarily stored in the decimator 1081 and the buffer 1082 both included in the timing recovery unit 1080. Subsequently, the temporarily stored output data are input to the timing error detector 1083 through the decimator 1081 and the buffer 1082. Assuming that the output of the second multiplier 1050 is oversampled to N times its initial state, the decimator 1081 decimates the output of the second multiplier 1050 at a decimation rate of 1/N. Then, the 1/N-decimated data are input to the buffer 1082. In other words, the decimator 1081 performs decimation on the input signal in accordance with a VSB symbol cycle. Furthermore, the decimator 1081 may also receive the output of the matched filter 1060 instead of the output of the second multiplier 1050.

The timing error detector 1083 uses the data prior to or after being processed with matched-filtering and the known sequence position indicator output from the known data detector and initial frequency offset estimator 1004-1 in order to detect a timing error. Thereafter, the detected timing error is output to the loop filter 1084. Accordingly, the detected timing error information is obtained once during each repetition cycle of the known data sequence.

For example, if a known data sequence having the same pattern is periodically inserted and transmitted, as shown in FIG. 37, the timing error detector 1083 may use the known data in order to detect the timing error. There exists a plurality of methods for detecting timing error by using the known data.

In the example of the present invention, the timing error may be detected by using a correlation characteristic between the known data and the received data in the time domain, the known data being already known in accordance with a pre-arranged agreement between the transmitting system and the receiving system. The timing error may also be detected by using the correlation characteristic of the two known data types being received in the frequency domain. Thus, the detected timing error is output. In another example, a spectral lining method may be applied in order to detect the timing error. Herein, the spectral lining method corresponds to a method of detecting timing error by using sidebands of the spectrum included in the received signal.

The loop filter 1084 filters the timing error detected by the timing error detector 1083 and, then, outputs the filtered timing error to the holder 1085.

The holder 1085 holds (or maintains) the timing error filtered and output from the loop filter 1084 during a pre-determined known data sequence cycle period and outputs the processed timing error to the NCO 1086. Herein, the order of positioning of the loop filter 1084 and the holder 1085 may be switched with one another. In additionally, the function of the holder 1085 may be included in the loop filter 1084, and, accordingly, the holder 1085 may be omitted.

The NCO 1086 accumulates the timing error output from the holder 1085. Thereafter, the NCO 1086 outputs the phase element (i.e., a sampling clock) of the accumulated timing error to the resampler 1040, thereby adjusting the sampling timing of the resampler 1040.

FIG. 43 illustrates an example of the timing recovery unit included in the demodulator 1002 shown in FIG. 36. Referring to FIG. 43, the timing recovery unit 1080 includes a first timing error detector 1611, a second timing error detector 1612, a multiplexer 1613, a loop-filter 1614, and an NCO 1615. The timing recovery unit 1080 would be beneficial when the input signal is divided into a first area in which known data having a predetermined length are inserted at predetermined position(s) and a second area that includes no known data. Assuming that the first timing error detector 1611 detects a first timing error using a sideband of a spectrum of an input signal and the second timing error detector 1612 detects a second timing error using the known data, the multiplexer 1613 can output the first timing error for the first area and can output the second timing error for the second area. The multiplexer 1613 may output both of the first and second timing errors for the first area in which the known data are inserted. By using the known data a more reliable timing error can be detected and the performance of the timing recovery unit 1080 can be enhanced.

This disclosure describes two ways of detecting a timing error. One way is to detect a timing error using correlation in the time domain between known data pre-known to a transmitting system and a receiving system (reference known data) and the known data actually received by the receiving system, and the other way is to detect a timing error using correlation in the frequency domain between two known data actually received by the receiving system. In FIG. 44, a timing error is detected by calculating correlation between the reference known data pre-known to and generated by the receiving system and the known data actually received. In FIG. 44, correlation between an entire portion of the reference known data sequence and an entire portion of the received known data sequence is calculated. The correlation output has a peak value at the end of each known data sequence actually received.

Figures 45A, 45B:
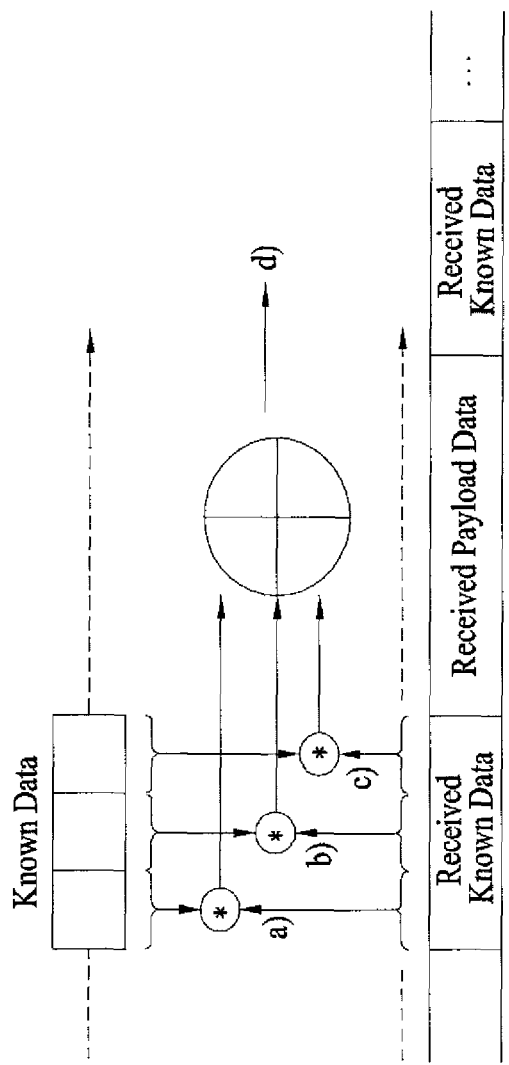
FIG. 45(a) and FIG. 45(b) illustrate other examples of detecting timing error in a time domain.

In FIG. 45, a timing error is detected by calculating correlation values between divided portions of the reference known data sequence and divided portions of the received known data sequence, respectively. The correlation output has a peak value at the end of each divided portion of the received known data sequence. The correlation values may be added as a total correlation value, as shown FIG. 45, and the total correlation value can be used to calculate the timing error. When an entire portion of the received known data is used for correlation calculation, the timing error can be obtained for each data block. If the correlation level of the entire portion of the known data sequence is low, a more precise correlation can be obtained by using divided portions of the known data sequence as shown in FIG. 45.

The use of a final correlation value which is obtained based upon a plurality of correlation values of divided portions of a received known data sequence may reduce the carrier frequency error. In addition, the process time for the timing recovery can be greatly reduced when the plurality of correlation values are used to calculate the timing error. For example, when the reference known data sequence which is pre-known to the transmitting system and receiving system is divided into K portions, K correlation values between the K portions of the reference known data sequence and the corresponding divided portions of the received known data sequence can be calculated, or any combination(s) of the correlation values can be used. Therefore, the period of the timing error detection can be reduced when the divided portions of the known data sequence are used instead of the entire portion of the sequence.

Figure 46:
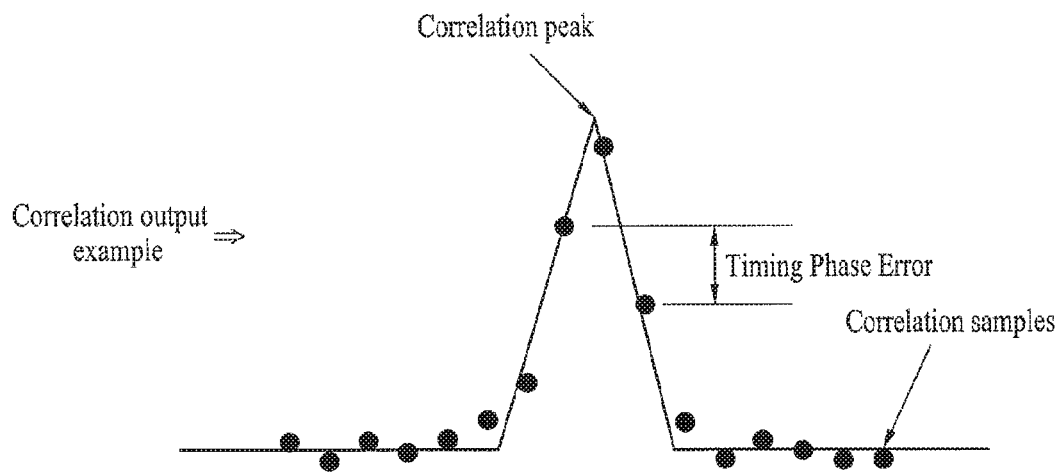
FIG. 46 illustrates an example of detecting timing error using correlation values of FIG. 44 and FIG. 45.

The timing error can be calculated from the peak value of the correlation values. The timing error is obtained for each data block if an entire portion of the known data sequence is used as shown in FIG. 46. On the other hand, if K divided portions of the known data sequence are used for correlation calculation, K correlation values and corresponding peak values can be obtained. This indicates that the timing error can be detected K times.

A method of detecting a timing error using the correlation between the reference known data and the received known data shown will now be described in more detail. FIG. 46 illustrates correlation values between the reference known data and the received known data. The correlation values correspond to data samples sampled at a rate two times greater than the symbol clock. When the random data effect is minimized and there is no timing clock error, the correlation values between the reference known data and the received known data are symmetrical. However, if a timing phase error exists, the correlation values adjacent to the peak value are not symmetrical as shown in FIG. 46. Therefore, the timing error can be obtained by using a difference (timing phase error shown in FIG. 46) between the correlation values before and after the peak value.

Figure 47:
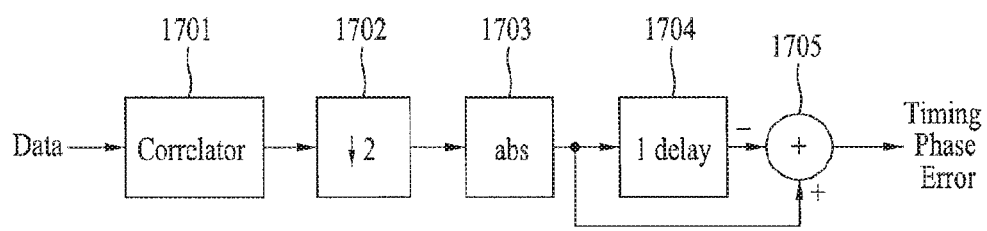
FIG. 47 illustrates an example of a timing error detector according to the present invention.

FIG. 47 illustrates an example of the timing error detector shown in FIG. 43. The timing error detector includes a correlator 1701, a down sampler 1702, an absolute value calculator 1703, a delay 1704, and a subtractor 1705. The correlator 1701 receives a known data sequence sampled at a rate at least two times higher than the symbol clock frequency and calculates the correlation values between the received known data sequence and a reference known data sequence. The down sampler 1702 performs down sampling on the correlation values and obtains samples having a symbol frequency. For example, if the data input to the correlator 1701 is pre-sampled at a sampling rate of 2, then the down sampler 1702 performs down sampling at a rate of ½ to obtain samples having the symbol frequency. The absolute value calculator 1703 calculates absolute values (or square values) of the down-sampled correlation values. These absolute values are input to the delay 1704 and the subtractor 1705. The delay 1704 delays the absolute values for a symbol and the subtractor then outputs a timing error by subtracting the delayed absolute value from the values output from the absolute value calculator 1703.

The arrangement of the correlator 1701, the down sampler 1702, the absolute value calculator 1703, and the delay 1704, and the subtractor 1705 shown in FIG. 47 can be modified. For example, the timing phase error can be calculated in the order of the down sampler 1702, the correlator 1701, and the absolute value calculator 1703, or in the order of the correlator 1701, the absolute value calculator 1703, and the down sampler 1702.

Figure 48:
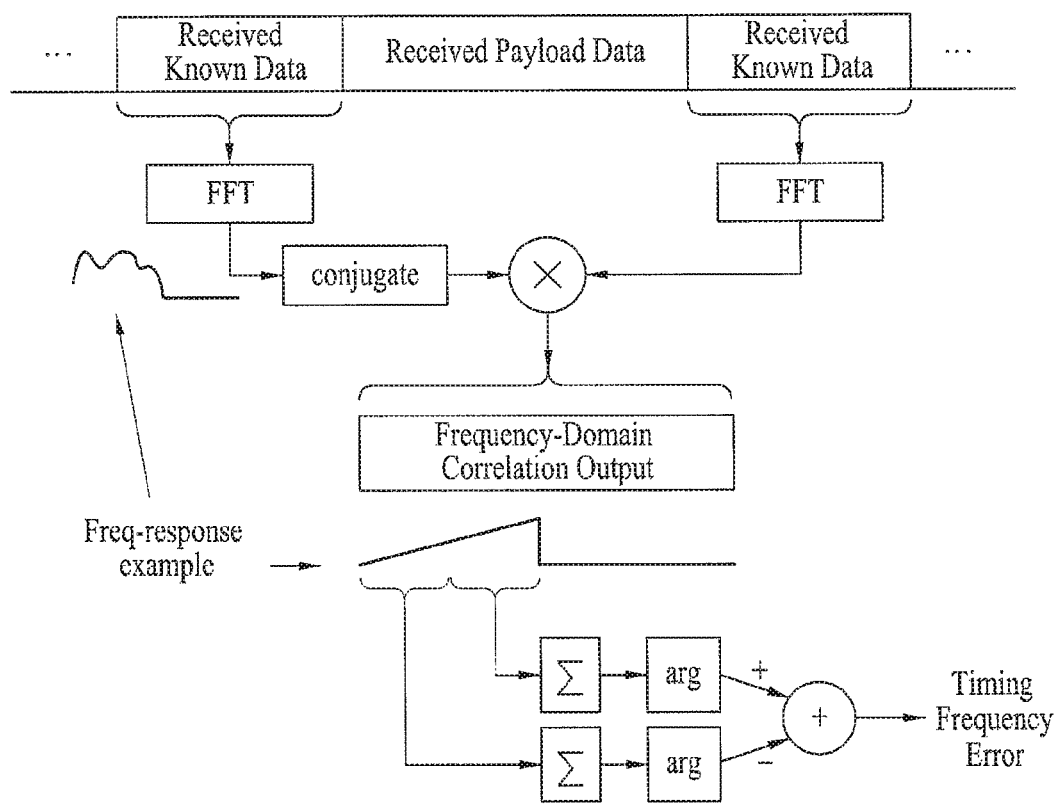
FIG. 48 illustrates an example of detecting timing error in a frequency domain according to an embodiment of the present invention.

The timing error can also be obtained using the frequency characteristic of the known data. When there is a timing frequency error, a phase of the input signal increases at a fixed slope as the frequency of the signal increases and this slope is different for current and next data block. Therefore, the timing error can be calculated based on the frequency characteristic of two different known data blocks. In FIG. 48, a current known data sequence (right) and a previous known data sequence (left) are converted into first and second frequency domain signals, respectively, using a Fast Fourier Transform (FFT) algorithm. The conjugate value of the first frequency domain signal is then multiplied with the second frequency domain signal in order to obtain the correlation value between two frequency domain signals. In other words, the correlation between the frequency value of the previous known data sequence and the frequency value of the current known data sequence is used to detect a phase change between the known data blocks for each frequency. In this way the phase distortion of a channel can be eliminated.

The frequency response of a complex VSB signal does not have a full symmetric distribution as shown in FIG. 46. Rather, its distribution is a left or right half of the distribution and the frequency domain correlation values also have a half distribution. In order to the phase difference between the frequency domain correlation values, the frequency domain having the correlation values can be divided into two sub-areas and a phase of a combined correlation value in each sub-area can be obtained. Thereafter, the difference between the phases of sub-areas can be used to calculate a timing frequency error. When a phase of a combined correlation values is used for each frequency, the magnitude of each correlation value is proportional to reliability and a phase component of each correlation value is reflected to the final phase component in proportion to the magnitude.

Figure 49:
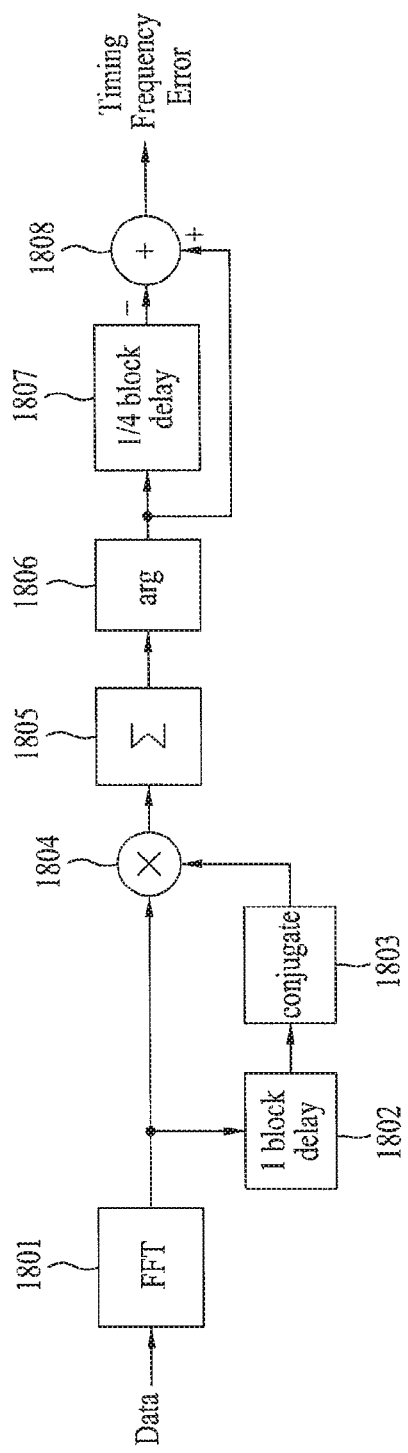
FIG. 49 illustrates another example of a timing error detector according to the present invention.

FIG. 49 illustrates another example of the timing error detector shown in FIG. 43. The timing error detector shown in FIG. 49 includes a Fast Fourier Transform (FFT) unit 1801, a first delay 1802, a conjugator 1803, a multiplier 1804, an accumulator (adder) 1805, a phase detector 1806, a second delay 1807, and a subtractor 1808. The first delay 1802 delays for one data block and the second delay 1807 delays for ¼ data block. One data block includes a frequency response of a sequence of N known data symbol sequences. When a known data region is known and the data symbols are received, the FFT unit 1801 converts complex values of consecutive N known data symbol sequences into complex values in the frequency domain. The first delay 1802 delays the frequency domain complex values for a time corresponding to one data block, and the conjugator 1803 generate conjugate values of the delayed complex values. The multiplier 1804 multiplies the current block of known data output from the FFT unit 1801 with the previous block of known data output from the conjugator 1803. The output of the multiplier 1804 represents frequency region correlation values within a known data block.

Since the complex VSB data exist only on a half of the frequency domain, the accumulator 1805 divides a data region in the known data block into two sub-regions, and accumulates correlation values for each sub-region. The phase detector 1806 detects a phase of the accumulated correlation value for each sub-region. The second delay 1807 delays the detected phase for a time corresponding to a ¼ data block. The subtractor 1808 obtains a phase difference between the delayed phase and the phase output from the accumulator 1806 and outputs the phase difference as a timing frequency error.

In the method of calculating a timing error by using a peak of correlation between the reference known data and the received known data in the time domain, the contribution of the correlation values may affect a channel when the channel is a multi path channel. However, this can be greatly eliminated if the timing error is obtained using the correlation between two received known data. In addition, the timing error can be detected using an entire portion of the known data sequence inserted by the transmitting system, or it can be detected using a portion of the known data sequence which is robust to random or noise data.

Meanwhile, the DC remover 1070 removes pilot tone signal (i.e., DC signal), which has been inserted by the transmitting system, from the matched-filtered signal. Thereafter, the DC remover 1070 outputs the processed signal to the phase compensator 1110.

Figure 50:
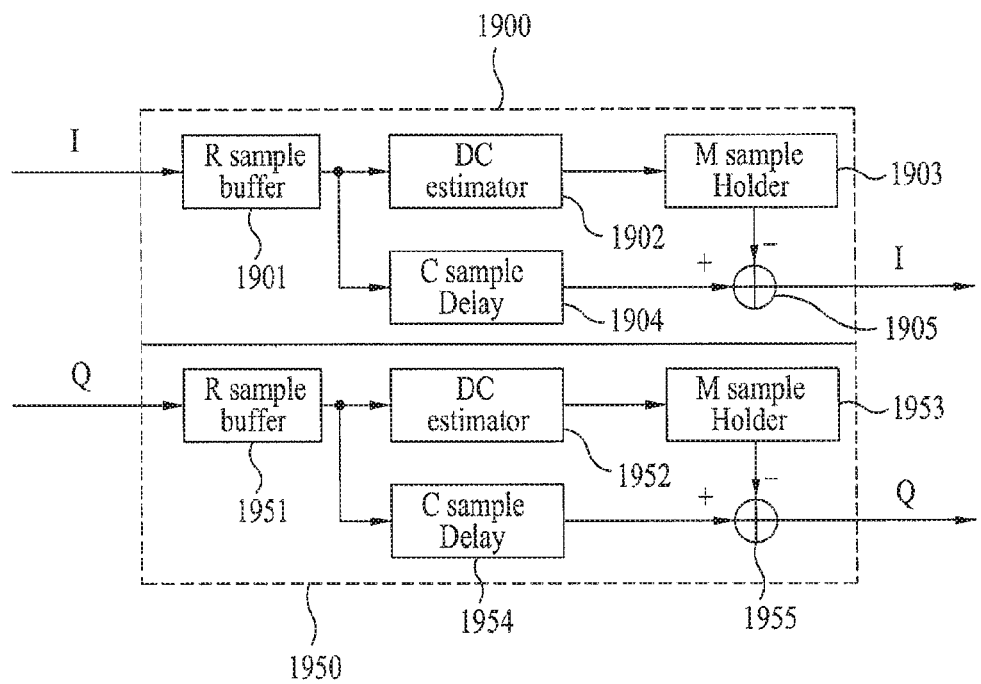
FIG. 50 illustrates a block diagram of a DC remover according to an embodiment of the present invention.

FIG. 50 illustrates a detailed block diagram of a DC remover according to an embodiment of the present invention. Herein, identical signal processing processes are performed on each of a real number element (or in-phase (I)) and an imaginary number element (or a quadrature (Q)) of the input complex signal, thereby estimating and removing the DC value of each element. In order to do so, the DC remover shown in FIG. 50 includes a first DC estimator and remover 1900 and a second DC estimator and remover 1950. Herein, the first DC estimator and remover 1900 includes an R sample buffer 1901, a DC estimator 1902, an M sample holder 1903, a C sample delay 1904, and a subtractor 1905. Herein, the first DC estimator and remover 1900 estimates and removes the DC of the real number element (i.e., an in-phase DC). Furthermore, the second DC estimator and remover 1950 includes an R sample buffer 1951, a DC estimator 1952, an M sample holder 1953, a C sample delay 1954, and a subtractor 1955. The second DC estimator and remover 1950 estimates and removes the DC of the imaginary number element (i.e., a quadrature DC). In the present invention, the first DC estimator and remover 1900 and the second DC estimator and remover 1950 may receive different input signals. However, each DC estimator and remover 1900 and 1950 has the same structure. Therefore, a detailed description of the first DC estimator and remover 1900 will be presented herein, and the second DC estimator and remover 1950 will be omitted for simplicity.

More specifically, the in-phase signal matched-filtered by the matched filter 1060 is input to the R sample buffer 1901 of the first DC estimator and remover 1900 within the DC remover 1070 and is then stored. The R sample buffer 1901 is a buffer having the length of R sample. Herein, the output of the R sample buffer 1901 is input to the DC estimator 1902 and the C sample delay 1904. The DC estimator 1902 uses the data having the length of R sample, which are output from the buffer 1901, in order to estimate the DC value by using Equation 8 shown below.

$$y[n] = \frac{1}{R}\sum_{k=0}^{R-1} \times [k + M*n] \qquad \text{Equation 8}$$

In the above-described Equation 8, x[n] represents the input sample data stored in the buffer 1901. And, y[n] indicates the DC estimation value. More specifically, the DC estimator 1902 accumulates R number of sample data stored in the buffer 1901 and estimates the DC value by dividing the accumulated value by R. At this point, the stored input sample data set is shifted as much as M sample. Herein, the DC estimation value is output once every M samples.

Figure 51:
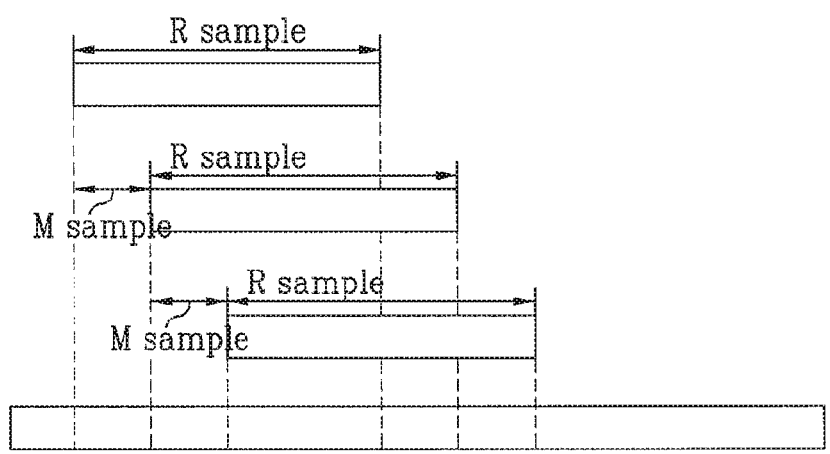
FIG. 51 illustrates an example of shifting sample data input to a DC estimator shown in FIG. 50.

FIG. 51 illustrates a shifting of the input sample data used for DC estimation. For example, when M is equal to 1 (i.e., M=1), the DC estimator 1902 estimates the DC value each time a sample is shifted to the buffer 1901. Accordingly, each estimated result is output for each sample. If M is equal to R (i.e., M=R), the DC estimator 1902 estimates the DC value each time R number of samples are shifted to the buffer 1901. Accordingly, each estimated result is output for each cycle of R samples. Therefore, in this case, the DC estimator 1902 corresponds to a DC estimator that operates in a block unit of R samples. Herein, any value within the range of 1 and R may correspond to the value M.

As described above, since the output of the DC estimator 1902 is output after each cycle of M samples, the M sample holder 1903 holds the DC value estimated from the DC estimator 1902 for a period of M samples. Then, the estimated DC value is output to the subtractor 1905. Also, the C sample delay 1904 delays the input sample data stored in the buffer 1901 by C samples, which are then output to the subtractor 1905. The subtractor 1905 subtracts the output of the M sample holder 1903 from the output of the C sample delay 1904. Thereafter, the subtractor 1905 outputs the signal having the in-phase DC removed.

Herein, the C sample delay 1904 decides which portion of the input sample data is to be compensated with the output of the DC estimator 1902. More specifically, the DC estimator and remover 1900 may be divided into a DC estimator 1902 for estimating the DC and the subtractor for compensating the input sample data within the estimated DC value.

At this point, the C sample delay 1904 decides which portion of the input sample data is to be compensated with the estimated DC value. For example, when C is equal to 0 (i.e., 0=0), the beginning of the R samples is compensated with the estimated DC value obtained by using R samples. Alternatively, when C is equal to R (i.e., C=R), the end of the R samples is compensated with the estimated DC value obtained by using R samples. Similarly, the data having the DC removed are input to the buffer 1111 and the frequency offset estimator 1112 of the phase compensator 1110.

Figure 52:
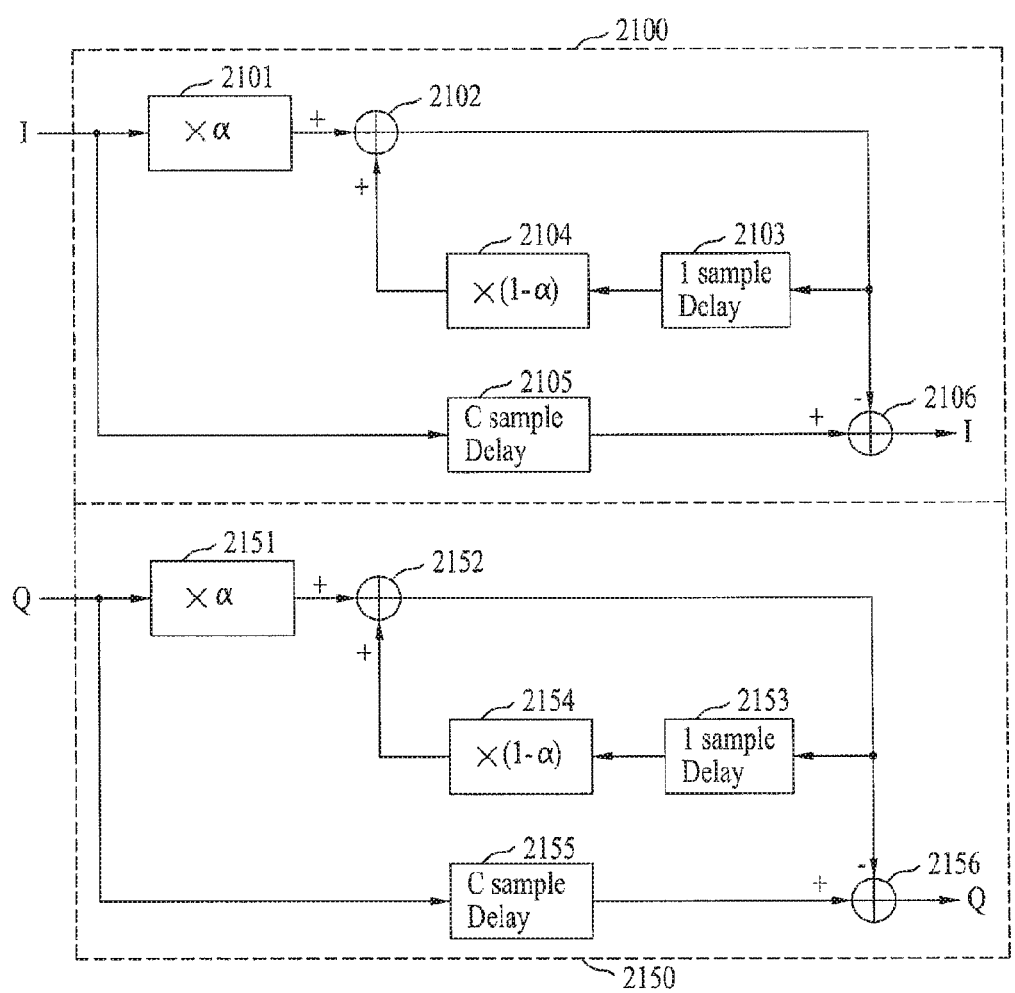
FIG. 52 illustrates a block diagram of a DC remover according to another embodiment of the present invention.

Meanwhile, FIG. 52 illustrates a detailed block diagram of a DC remover according to another embodiment of the present invention. Herein, identical signal processing processes are performed on each of a real number element (or in-phase (I)) and an imaginary number element (or a quadrature (Q)) of the input complex signal, thereby estimating and removing the DC value of each element. In order to do so, the DC remover shown in FIG. 52 includes a first DC estimator and remover 2100 and a second DC estimator and remover 2150. FIG. 52 corresponds to an infinite impulse response (IIR) structure.

Herein, the first DC estimator and remover 2100 includes a multiplier 2101, an adder 2102, an 1 sample delay 2103, a multiplier 2104, a C sample delay 2105, and a subtractor 2106. Also, the second DC estimator and remover 2150 includes a multiplier 2151, an adder 2152, an 1 sample delay 2153, a multiplier 2154, a C sample delay 2155, and a subtractor 2156. In the present invention, the first DC estimator and remover 2100 and the second DC estimator and remover 2150 may receive different input signals. However, each DC estimator and remover 2100 and 2150 has the same structure. Therefore, a detailed description of the first DC estimator and remover 2100 will be presented herein, and the second DC estimator and remover 2150 will be omitted for simplicity.

More specifically, the in-phase signal matched-filtered by the matched filter 1060 is input to the multiplier 2101 and the C sample delay 2105 of the first DC estimator and remover 2100 within the DC remover 1070. The multiplier 2101 multiplies a pre-determined constant a to the in-phase signal that is being input. Then, the multiplier 2101 outputs the multiplied result to the adder 2102. The adder 2102 adds the output of the multiplier 2101 to the output of the multiplier 2104 that is being fed-back. Thereafter, the adder 2102 outputs the added result to the 1 sample delay 2103 and the subtractor 2106. More specifically, the output of the adder 2102 corresponds to the estimated in-phase DC value.

The 1 sample delay 2103 delays the estimated DC value by 1 sample and outputs the DC value delayed by 1 sample to the multiplier 2104. The multiplier 2104 multiplies a pre-determined constant (1-a) to the DC value delayed by 1 sample. Then, the multiplier 2104 feeds-back the multiplied result to the adder 2102.

Subsequently, the C sample delay 2105 delays the in-phase sample data by C samples and, then, outputs the delayed in-phase sample data to the subtractor 2106. The subtractor 2106 subtracts the output of the adder 2102 from the output of the C sample delay 2105, thereby outputting the signal having the in-phase DC removed therefrom.

Similarly, the data having the DC removed are input to the buffer 1111 and the frequency offset estimator 1112 of the phase compensator 1110 of FIG. 39.

The frequency offset estimator 1112 uses the known sequence position indicator output from the known sequence detector and initial frequency offset estimator 1004-1 in order to estimate the frequency offset from the known data sequence that is being input, the known data sequence having the DC removed by the DC remover 1070. Then, the frequency offset estimator 1112 outputs the estimated frequency offset to the holder 1113. Similarly, the frequency offset estimation value is obtained at each repetition cycle of the known data sequence.

Therefore, the holder 1113 holds the frequency offset estimation value during a cycle period of the known data sequence and then outputs the frequency offset estimation value to the NCO 1114. The NCO 1114 generates a complex signal corresponding to the frequency offset held by the holder 1113 and outputs the generated complex signal to the multiplier 1115.

The multiplier 1115 multiplies the complex signal output from the NCO 1114 to the data being delayed by a set period of time in the buffer 1111, thereby compensating the phase change included in the delayed data. The data having the phase change compensated by the multiplier 1115 pass through the decimator 1200 in order to be input to the equalizer 1003. At this point, since the frequency offset estimated by the frequency offset estimator 1112 of the phase compensator 1110 does not pass through the loop filter, the estimated frequency offset indicates the phase difference between the known data sequences. In other words, the estimated frequency offset indicates a phase offset.

Channel Equalizer

The demodulated data using the known data in the demodulator 1002 is input to the channel equalizer 1003. The demodulated data is input to the known sequence detector 1004.

The equalizer 1003 may perform channel equalization by using a plurality of methods. An example of estimating a channel impulse response (CIR) in order to perform channel equalization will be given in the description of the present invention. Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and/or the field synchronization data, in order to estimate the CIR, the present invention may be able to perform channel equalization with more stability.

Herein, the data group that is input for the equalization process is divided into regions A to D, as shown in FIG. 5. More specifically, in the example of the present invention, each region A, B, C, and D are further divided into MPH blocks B4 to B7, MPH blocks B3 and B8, MPH blocks B2 and B9, MPH blocks B1 and B10, respectively.

More specifically, a data group can be assigned and transmitted a maximum the number of 4 in a VSB frame in the transmitting system. In this case, all data group do not include field synchronization data. In the present invention, the data group including the field synchronization data performs channel-equalization using the field synchronization data and known data. And the data group not including the field synchronization data performs channel-equalization using the known data. For example, the data of the MPH block B3 including the field synchronization data performs channel-equalization using the CIR calculated from the field synchronization data area and the CIR calculated from the first known data area. Also, the data of the MPH blocks B1 and B2 performs channel-equalization using the CIR calculated from the field synchronization data area and the CIR calculated from the first known data area. Meanwhile, the data of the MPH blocks B4 to B6 not including the field synchronization data performs channel-equalization using CIRS calculated from the first known data area and the third known data area.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated in order to create a new CIR, which is then used for the channel equalization process.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(Q) of a function F(x) at a particular point Q and a value F(S) of the function F(x) at another particular point S are known, extrapolation refers to estimating a function value of a point outside of the section between points Q and S. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

Figure 53:
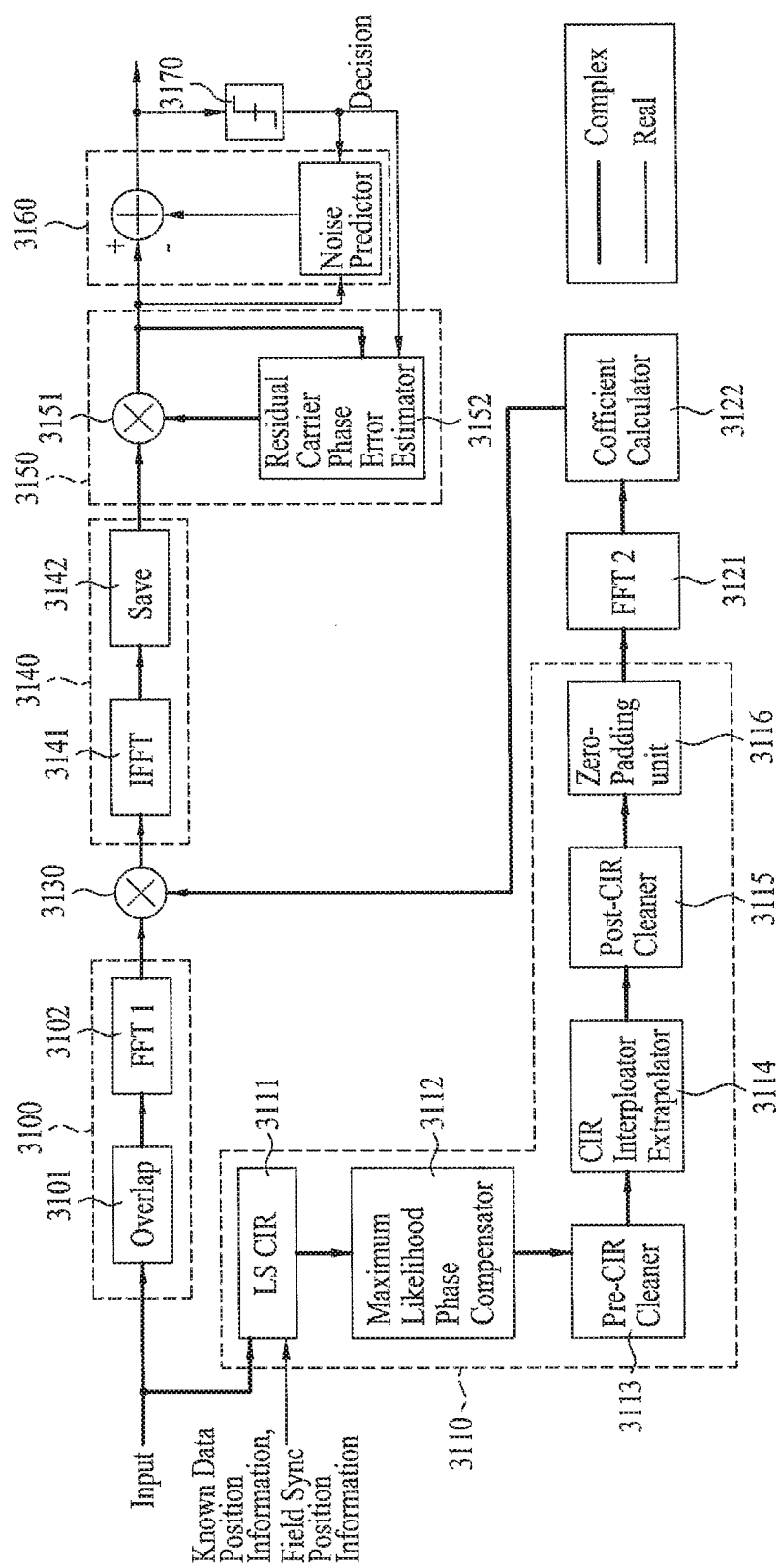
FIG. 53 illustrates a block diagram of another example of a channel equalizer according to the present invention.

FIG. 53 illustrates a block diagram of a channel equalizer according to another embodiment of the present invention. Herein, by estimating and compensating a remaining carrier phase error from a channel-equalized signal, the receiving system of the present invention may be enhanced. Referring to FIG. 53, the channel equalizer includes a first frequency domain converter 3100, a channel estimator 3110, a second frequency domain converter 3121, a coefficient calculator 3122, a distortion compensator 3130, a time domain converter 3140, a remaining carrier phase error remover 3150, a noise canceller (NC) 3160, and a decision unit 3170.

Herein, the first frequency domain converter 3100 includes an overlap unit 3101 overlapping input data, and a fast Fourier transform (FFT) unit 3102 converting the data output from the overlap unit 3101 to frequency domain data.

The channel estimator 3110 includes a CIR estimator, a phase compensator 3112, a pre-CIR cleaner 3113, CIR interpolator/extrapolator 3114, a post-CIR cleaner, and a zero-padding unit.

The second frequency domain converter 3121 includes a fast Fourier transform (FFT) unit converting the CIR being output from the channel estimator 3110 to frequency domain CIR.

The time domain converter 3140 includes an IFFT unit 3141 converting the data having the distortion compensated by the distortion compensator 3130 to time domain data, and a save unit 3142 extracting only valid data from the data output from the IFFT unit 3141.

The remaining carrier phase error remover 3150 includes an error compensator 3151 removing the remaining carrier phase error included in the channel equalized data, and a remaining carrier phase error estimator 3152 using the channel equalized data and the decision data of the decision unit 3170 in order to estimate the remaining carrier phase error, thereby outputting the estimated error to the error compensator 3151. Herein, any device performing complex number multiplication may be used as the distortion compensator 3130 and the error compensator 3151.

At this point, since the received data correspond to data modulated to VSB type data, 8-level scattered data exist only in the real number element. Therefore, referring to FIG. 53, all of the signals used in the noise canceller 3160 and the decision unit 3170 correspond to real number (or in-phase) signals. However, in order to estimate and compensate the remaining carrier phase error and the phase noise, both real number (in-phase) element and imaginary number (quadrature) element are required. Therefore, the remaining carrier phase error remover 3150 receives and uses the quadrature element as well as the in-phase element. Generally, prior to performing the channel equalization process, the demodulator 902 within the receiving system performs frequency and phase recovery of the carrier. However, if a remaining carrier phase error that is not sufficiently compensated is input to the channel equalizer, the performance of the channel equalizer may be deteriorated. Particularly, in a dynamic channel environment, the remaining carrier phase error may be larger than in a static channel environment due to the frequent and sudden channel changes. Eventually, this acts as an important factor that deteriorates the receiving performance of the present invention.

Furthermore, a local oscillator (not shown) included in the receiving system should preferably include a single frequency element. However, the local oscillator actually includes the desired frequency elements as well as other frequency elements. Such unwanted (or undesired) frequency elements are referred to as phase noise of the local oscillator. Such phase noise also deteriorates the receiving performance of the present invention. It is difficult to compensate such remaining carrier phase error and phase noise from the general channel equalizer. Therefore, the present invention may enhance the channel equaling performance by including a carrier recovery loop (i.e., a remaining carrier phase error remover 3150) in the channel equalizer, as shown in FIG. 53, in order to remove the remaining carrier phase error and the phase noise.

More specifically, the receiving data demodulated in FIG. 53 are overlapped by the overlap unit 3101 of the first frequency domain converter 3100 at a pre-determined overlapping ratio, which are then output to the FFT unit 3102. The FFT unit 3102 converts the overlapped time domain data to overlapped frequency domain data through by processing the data with FFT. Then, the converted data are output to the distortion compensator 3130.

The distortion compensator 3130 performs a complex number multiplication on the overlapped frequency domain data output from the FFT unit 3102 included in the first frequency domain converter 3100 and the equalization coefficient calculated from the coefficient calculator 3122, thereby compensating the channel distortion of the overlapped data output from the FFT unit 3102. Thereafter, the compensated data are output to the IFFT unit 3141 of the time domain converter 3140. The IFFT unit 3141 performs IFFT on the overlapped data having the channel distortion compensated, thereby converting the overlapped data to time domain data, which are then output to the error compensator 3151 of the remaining carrier phase error remover 3150.

The error compensator 3151 multiplies a signal compensating the estimated remaining carrier phase error and phase noise with the valid data extracted from the time domain.

Thus, the error compensator 3151 removes the remaining carrier phase error and phase noise included in the valid data.

The data having the remaining carrier phase error compensated by the error compensator 3151 are output to the remaining carrier phase error estimator 3152 in order to estimate the remaining carrier phase error and phase noise and, at the same time, output to the noise canceller 3160 in order to remove (or cancel) the noise.

The remaining carrier phase error estimator 3152 uses the output data of the error compensator 3151 and the decision data of the decision unit 3170 to estimate the remaining carrier phase error and phase noise. Thereafter, the remaining carrier phase error estimator 3152 outputs a signal for compensating the estimated remaining carrier phase error and phase noise to the error compensator 3151. In this embodiment of the present invention, an inverse number of the estimated remaining carrier phase error and phase noise is output as the signal for compensating the remaining carrier phase error and phase noise.

Figure 54:
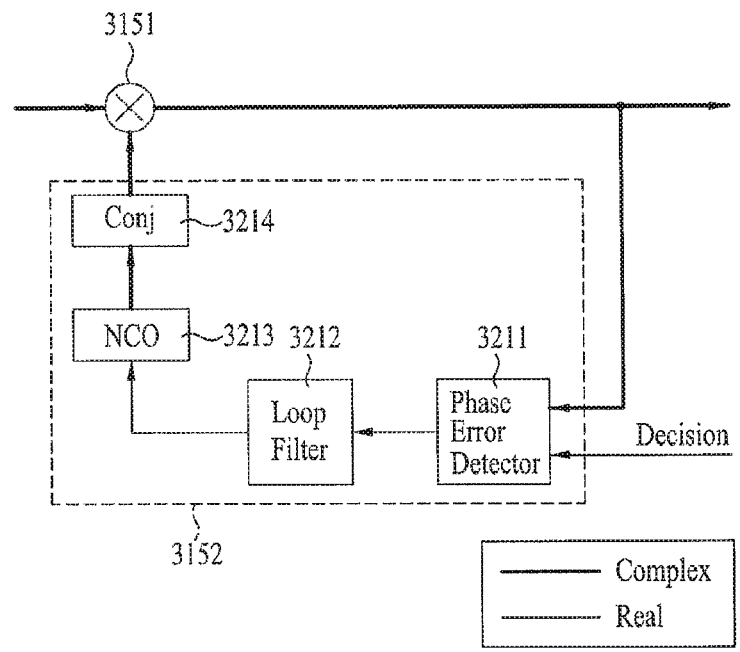
FIG. 54 illustrates a detailed block diagram of an example of a remaining carrier phase error estimator according to the present invention.

FIG. 54 illustrates a detailed block diagram of the remaining carrier phase error estimator 3152 according to an embodiment of the present invention. Herein, the remaining carrier phase error estimator 3152 includes a phase error detector 3211, a loop filter 3212, a numerically controlled oscillator (NCO) 3213, and a conjugator 3214. Referring to FIG. 54, the decision data, the output of the phase error detector 3211, and the output of the loop filter 3212 are all real number signals. And, the output of the error compensator 3151, the output of the NCO 3213, and the output of the conjugator 3214 are all complex number signals.

The phase error detector 3211 receives the output data of the error compensator 3151 and the decision data of the decision unit 3170 in order to estimate the remaining carrier phase error and phase noise. Then, the phase error detector 3211 outputs the estimated remaining carrier phase error and phase noise to the loop filter.

The loop filter 3212 then filters the remaining carrier phase error and phase noise, thereby outputting the filtered result to the NCO 3213. The NCO 3213 generates a cosine corresponding to the filtered remaining carrier phase error and phase noise, which is then output to the conjugator 3214.

The conjugator 3214 calculates the conjugate value of the cosine wave generated by the NCO 3213. Thereafter, the calculated conjugate value is output to the error compensator 3151. At this point, the output data of the conjugator 3214 becomes the inverse number of the signal compensating the remaining carrier phase error and phase noise. In other words, the output data of the conjugator 3214 becomes the inverse number of the remaining carrier phase error and phase noise.

The error compensator 3151 performs complex number multiplication on the equalized data output from the time domain converter 3140 and the signal output from the conjugator 3214 and compensating the remaining carrier phase error and phase noise, thereby removing the remaining carrier phase error and phase noise included in the equalized data. Meanwhile, the phase error detector 3211 may estimate the remaining carrier phase error and phase noise by using diverse methods and structures. According to this embodiment of the present invention, the remaining carrier phase error and phase noise are estimated by using a decision-directed method.

If the remaining carrier phase error and phase noise are not included in the channel-equalized data, the decision-directed phase error detector according to the present invention uses the fact that only real number values exist in the correlation values between the channel-equalized data and the decision data. More specifically, if the remaining carrier phase error and phase noise are not included, and when the input data of the phase error detector 3211 are referred to as $x_i + jx_q$, the correlation value between the input data of the phase error detector 3211 and the decision data may be obtained by using Equation 9 shown below:

$$Et(c_i + j \times ji_i + fic_q)^*$$ Equation 9

At this point, there is no correlation between $x_i$ and $x_q$. Therefore, the correlation value between $x_i$ and $x_q$ is equal to 0. Accordingly, if the remaining carrier phase error and phase noise are not included, only the real number values exist herein. However, if the remaining carrier phase error and phase noise are included, the real number element is shown in the imaginary number value, and the imaginary number element is shown in the real number value. Thus, in this case, the imaginary number element is shown in the correlation value. Therefore, it can be assumed that the imaginary number portion of the correlation value is in proportion with the remaining carrier phase error and phase noise. Accordingly, as shown in Equation 10 below, the imaginary number of the correlation value may be used as the remaining carrier phase error and phase noise.

$$\text{Phase Error} = \text{imag}\{(x_i + j \times x_q t i_i + l i_q)^*\}$$

$$\text{Phase Error} = x_q \frac{X\,i}{z\,q}$$ Equation 10

Figure 55:
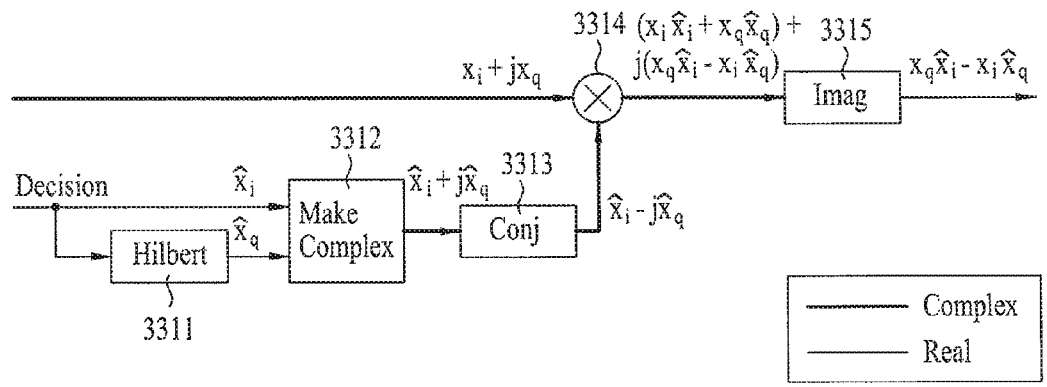
FIG. 55 illustrates a block diagram of a phase error detector obtaining a remaining carrier phase error and phase noise according to the present invention.

FIG. 55 illustrates a block diagram of a phase error detector 3211 obtaining the remaining carrier phase error and phase noise. Herein, the phase error detector 3211 includes a Hilbert converter 3311, a complex number configurator 3312, a conjugator 3313, a multiplier 3314, and a phase error output 3315. More specifically, the Hilbert converter 3311 creates an imaginary number decision data $X'_q$ by performing a Hilbert conversion on the decision value $X_i$ of the decision unit 3170. The generated imaginary number decision value is then output to the complex number configurator 3312. The complex number configurator 3312 uses the decision data $X_i$ and $X'_q$ to configure the complex number decision data $X_i + fi_g$, which are then output to the conjugator 3313. The conjugator 3313 conjugates the output of the complex number configurator 3312, thereby outputting the conjugated value to the multiplier 3314. The multiplier 3314 performs a complex number multiplication on the output data of the error compensator 3151 and the output data $X_i - fi_g$ of the conjugator 3313, thereby obtaining the correlation between the output data $x_i + jx_q$ of the error compensator 3151 and the decision value $x - ft_q$ of the decision unit 3170. The correlation data obtained from the multiplier 3314 are then input to the phase error output 3315. The phase error output 3315 outputs the imaginary number portion $x_q . i,_q$ of the correlation data output from the multiplier 3314 as the remaining carrier phase error and phase noise.

The phase error detector shown in FIG. 55 is an example of a plurality of phase error detecting methods. Therefore, other types of phase error detectors may be used in the present invention. Therefore, the present invention is not limited only to the examples and embodiments presented in the description of the present invention. Furthermore, according to another embodiment of the present invention, at least 2 phase error detectors are combined in order to detect the remaining carrier phase error and phase noise.

Accordingly, the output of the remaining carrier phase error remover 3150 having the detected remaining carrier phase error and phase noise removed as described above, is configured of an addition of the original (or initial) signal having the channel equalization, the remaining carrier phase error and phase noise, and the signal corresponding to a white noise being amplified to a colored noise during the channel equalization.

Therefore, the noise canceller 3160 receives the output data of the remaining carrier phase error remover 3150 and the decision data of the decision unit 3170, thereby estimating the colored noise. Then, the noise canceller 3160 subtracts the estimated colored noise from the data having the remaining carrier phase error and phase noise removed therefrom, thereby removing the noise amplified during the equalization process.

In order to do so, the noise canceller 3160 includes a subtractor and a noise predictor. More specifically, the subtractor subtracts the noise predicted by the noise predictor from the output data of the residual carrier phase error estimator 3150. Then, the subtractor outputs the signal from which amplified noise is cancelled (or removed) for data recovery and, simultaneously, outputs the same signal to the decision unit 3170. The noise predictor calculates a noise element by subtracting the output of the decision unit 3170 from the signal having residual carrier phase error removed therefrom by the residual carrier phase error estimator 3150. Thereafter, the noise predictor uses the calculated noise element as input data of a filter included in the noise predictor. Also, the noise predictor uses the filter (not shown) in order to predict any color noise element included in the output symbol of the residual carrier phase error estimator 3150. Accordingly, the noise predictor outputs the predicted color noise element to the subtractor.

The data having the noise removed (or cancelled) by the noise canceller 3160 are output for the data decoding process and, at the same time, output to the decision unit 3170.

The decision unit 3170 selects one of a plurality of pre-determined decision data sets (e.g., 8 decision data sets) that is most approximate to the output data of the noise canceller 3160, thereby outputting the selected data to the remaining carrier phase error estimator 3152 and the noise canceller 3160.

Meanwhile, the received data are input to the overlap unit 3101 of the first frequency domain converter 3100 included in the channel equalizer and, at the same time, input to the CIR estimator 3111 of the channel estimator 3110.

The CIR estimator 3111 uses a training sequence, for example, data being input during the known data section and the known data in order to estimate the CIR, thereby outputting the estimated CIR to the phase compensator 3112. If the data to be channel-equalizing is the data within the data group including field synchronization data, the training sequence using in the CIR estimator 3111 may become the field synchronization data and known data. Meanwhile, if the data to be channel-equalizing is the data within the data group not including field synchronization data, the training sequence using in the CIR estimator 3111 may become only the known data.

For example, the CIR estimator 3111 estimates CIR using the known data correspond to reference known data generated during the known data section by the receiving system in accordance with an agreement between the receiving system and the transmitting system. For this, the CIR estimator 3111 is provided known data position information from the known sequence detector 1004. Also the CIR estimator 3111 may be provided field synchronization position information from the known sequence detector 1004.

Furthermore, in this embodiment of the present invention, the CIR estimator 3111 estimates the CIR by using the least square (LS) method.

The LS estimation method calculates a cross correlation value p between the known data that have passed through the channel during the known data section and the known data that are already known by the receiving end. Then, a cross correlation matrix R of the known data is calculated. Subsequently, a matrix operation is performed on $R^{-1}$-p so that the cross correlation portion within the cross correlation value p between the received data and the initial known data, thereby estimating the CIR of the transmission channel.

The phase compensator 3112 compensates the phase change of the estimated CIR. Then, the phase compensator 3112 outputs the compensated CIR to the linear interpolator 3113. At this point, the phase compensator 3112 may compensate the phase change of the estimated CIR by using a maximum likelihood method.

More specifically, the remaining carrier phase error and phase noise that are included in the demodulated received data and, therefore, being input change the phase of the CIR estimated by the CIR estimator 3111 at a cycle period of one known data sequence. At this point, if the phase change of the input CIR, which is to be used for the linear interpolation process, is not performed in a linear form due to a high rate of the phase change, the channel equalizing performance of the present invention may be deteriorated when the channel is compensated by calculating the equalization coefficient from the CIR, which is estimated by a linear interpolation method.

Therefore, the present invention removes (or cancels) the amount of phase change of the CIR estimated by the CIR estimator 3111 so that the distortion compensator 3130 allows the remaining carrier phase error and phase noise to bypass the distortion compensator 3130 without being compensated. Accordingly, the remaining carrier phase error and phase noise are compensated by the remaining carrier phase error remover 3150.

For this, the present invention removes (or cancels) the amount of phase change of the CIR estimated by the phase compensator 3112 by using a maximum likelihood method.

The basic idea of the maximum likelihood method relates to estimating a phase element mutually (or commonly) existing in all CIR elements, then to multiply the estimated CIR with an inverse number of the mutual (or common) phase element, so that the channel equalizer, and most particularly, the distortion compensator 3130 does not compensate the mutual phase element.

More specifically, when the mutual phase element is referred to as θ, the phase of the newly estimated CIR is rotated by θ as compared to the previously estimated CIR. When the CIR of a point t is referred to as $h_i(t)$, the maximum likelihood phase compensation method obtains a phase ° M.1, corresponding to when $h_i$ (t) is rotated by θ, the squared value of the difference between the CIR of $h_i(t)$ and the CIR of h (t+1), i.e., the CIR of a point (t+1), becomes a minimum value. Herein, when i represents a tap of the estimated CIR, and when N represents a number of taps of the CIR being estimated by the CIR estimator 3111, the value of $\theta_{ML}$ is equal to or greater than 0 and equal to or less than N−1. This value may be calculated by using Equation 11 shown below:

$$\theta_{ML} = \min_{\theta} \sum_{i=0}^{N-1} |h_i(t)e^{j\theta} - h_i(t+1)|^2 \qquad \text{Equation 11}$$

Herein, in light of the maximum likelihood method, the mutual phase element $0_{ML}$ is equal to the value of 0, when the right side of Equation 11 being differentiated with respect to 0 is equal to 0. The above-described condition is shown in Equation 12 below:

$$\frac{d}{d\theta} \sum_{i=0}^{N-1} |h_i(t)e^{j\theta} - h_i(t+1)|^2 =$$

$$\frac{d}{d\theta} \sum_{i=0}^{N-1} (h_i(t)e^{j\theta} - h_i(t+1))(h_i(t)e^{j\theta} - h_i(t+1))^* =$$

$$\frac{d}{d\theta} \sum_{i=0}^{N-1} \{|h_i(t)|^2 + |h_{i+1}(t)|^2 -$$

$$h_i(t)h_i^*(t+1)e^{j\theta} - h_i^*(t)h_i(t+1)e^{-j\theta}\} =$$

$$\sum_{i=0}^{N-1} \{jh_i^*(t)h_i(t+1)e^{-j\theta} = jh_i^*(t)h_i(t+1)e^{j\theta}\} =$$

$$j\sum_{i=0}^{N-1} 2\text{Im}\{h_i^*(t)h_i(t+1)e^{-j\theta}\} = 0$$

Equation 12

The above Equation 12 may be simplified as shown in Equation 13 below:

$$\text{Im}\left\{e^{-j\theta}\sum_{i=0}^{N-1}\{h_i^*(t)h_i(t+1)\}\right\} = 0$$

$$\theta_{ML} = \arg\left(\sum_{i=0}^{N-1} h_i^*(t)h_i(t+1)\right)$$

Equation 13

More specifically, Equation 13 corresponds to the OML value that is to be estimated by the argument of the correlation value between h (t) and $h_i$ (t+1).

Figure 56:
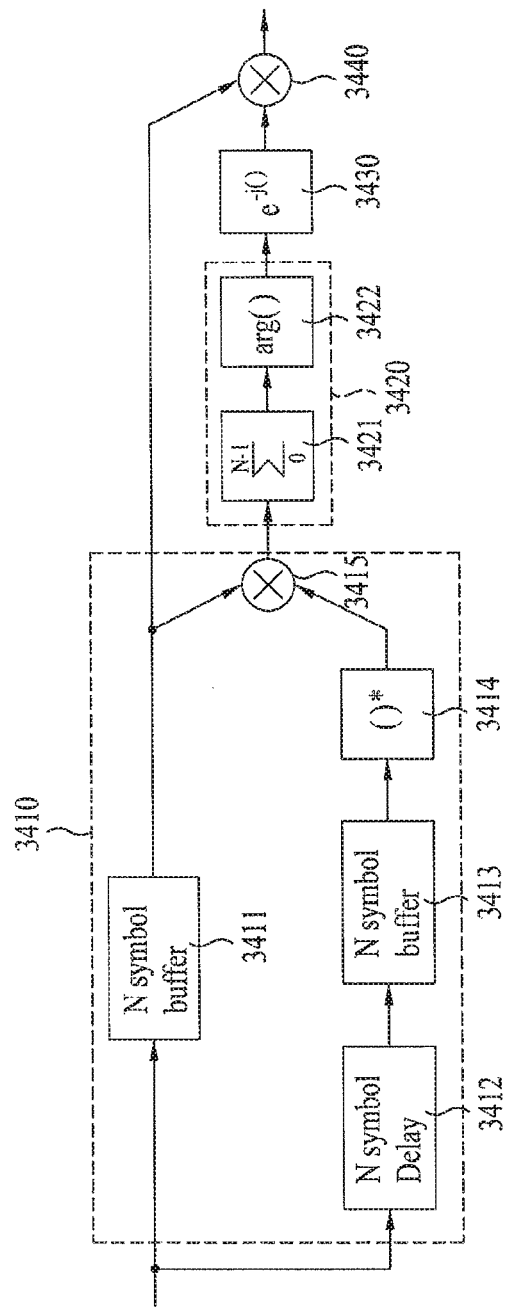
FIG. 56 illustrates a phase compensator according to an embodiment of the present invention.

FIG. 56 illustrates a phase compensator according to an embodiment of the present invention, wherein the mutual phase element 0, . . . , is calculated as described above, and wherein the estimated phase element is compensated at the estimated CIR. Referring to FIG. 56, the phase compensator includes a correlation calculator 3410, a phase change estimator 3420, a compensation signal generator 3430, and a multiplier 3440.

The correlation calculator 3410 includes a first N symbol buffer 3411, an N symbol delay 3412, a second N symbol buffer 3413, a conjugator 3414, and a multiplier 3415. More specifically, the first N symbol buffer 3411 included in the correlation calculator 3410 is capable of storing the data being input from the CIR estimator 3111 in symbol units to a maximum limit of N number of symbols. The symbol data being temporarily stored in the first N symbol buffer 3411 are then input to the multiplier 3415 included in the correlation calculator 3410 and to the multiplier 3440.

At the same time, the symbol data being output from the CIR estimator 3111 are delayed by N symbols from the N symbol delay 3412. Then, the delayed symbol data pass through the second $N_{145}$ symbol buffer 3413 and input to the conjugator 3414, in order to be conjugated and then input to the multiplier 3415.

The multiplier 3415 multiplies the output of the first N symbol buffer 3411 and the output of the conjugator 3414. Then, the multiplier 3415 outputs the multiplied result to an accumulator 3421 included in the phase change estimator 3420.

More specifically, the correlation calculator 3410 calculates a correlation between a current CIR $h_i(t+1)$ having the length of N and a previous CIR $h_i(t)$ also having the length of N. The correlation calculator 3410 then outputs the calculated correlation value to the accumulator 3421 of the phase change estimator 3420.

The accumulator 3421 accumulates the correlation values output from the multiplier 3415 during an N symbol period. Then, the accumulator 3421 outputs the accumulated value to the phase detector 3422. The phase detector 3422 then calculates a mutual phase element 0, . . . , from the output of the accumulator 3421 as shown in the above-described Equation 11. Thereafter, the calculated $O_m$, value is output to the compensation signal generator 3430.

The compensation signal generator 3430 outputs a complex signal $e^{-1^e}mL$ having a phase opposite to that of the detected phase as the phase compensation signal to the multiplier 3440. The multiplier 3440 multiplies the current CIR $h_i(t+1)$ being output from the first N symbol buffer 3411 with the phase compensation signal $e^-j^emL$, thereby removing the amount of phase change of the estimated CIR.

The CIR having its phase change compensated, as described above, passes through a first cleaner (or pre-CIR cleaner) 3113 or bypasses the first cleaner 3113, thereby being input to a CIR calculator (or CIR interpolator-extrapolator) 3114. The CIR interpolator-extrapolator 3114 either interpolates or extrapolates an estimated CIR, which is then output to a second cleaner (or post-CIR cleaner) 3115. Herein, the estimated CIR corresponds to a CIR having its phase change compensated. The first cleaner 3113 may or may not operate depending upon whether the CIR interpolator-extrapolator 3114 interpolates or extrapolates the estimated CIR. For example, if the CIR interpolator-extrapolator 3114 interpolates the estimated CIR, the first cleaner 3113 does not operate. Conversely, if the CIR interpolator-extrapolator 3114 extrapolates the estimated CIR, the first cleaner 3113 operates.

More specifically, the CIR estimated from the known data includes a channel element that is to be obtained as well as a jitter element caused by noise. Since such jitter element deteriorates the performance of the equalizer, it preferable that a coefficient calculator 3122 removes the jitter element before using the estimated CIR. Therefore, according to the embodiment of the present invention, each of the first and second cleaners 3113 and 3115 removes a portion of the estimated CIR having a power level lower than the predetermined threshold value (i.e., so that the estimated CIR becomes equal to '0'). Herein, this removal process will be referred to as a "CIR cleaning" process.

The CIR interpolator-extrapolator 3114 performs CIR interpolation by multiplying a CIR estimated from the CIR estimator 3112 by a coefficient and by multiplying a CIR having its phase change compensated from the phase compensator (or maximum likelihood phase compensator) 3112 by another coefficient, thereby adding the multiplied values. At this point, some of the noise elements of the CIR may be added to one another, thereby being cancelled. Therefore, when the CIR interpolator-extrapolator 3114 performs CIR interpolation, the original (or initial) CIR having noise elements remaining therein. In other words, when the CIR interpolator-extrapolator 3114 performs CIR interpolation, an estimated CIR having its phase change compensated by the phase compensator 3112 bypasses the first cleaner 3113 and is input to the CIR interpolator-extrapolator 3114. Subsequently, the second cleaner 3115 cleans the CIR interpolated by the CIR interpolator-extrapolator 3114.

Conversely, the CIR interpolator-extrapolator 3114 performs CIR extrapolation by using a difference value between two CIRs, each having its phase change compensated by the phase compensator 3112, in order to estimate a CIR positioned outside of the two CIRs. Therefore, in this case, the noise element is rather amplified. Accordingly, when the CIR interpolator-extrapolator 3114 performs CIR extrapolation, the CIR cleaned by the first cleaner 3113 is used. More specifically, when the CIR interpolator-extrapolator 3114 performs CIR extrapolation, the extrapolated CIR passes through the second cleaner 3115, thereby being input to the zero-padding unit 3116.

Meanwhile, when a second frequency domain converter (or fast fourier transform (FFT2)) 3121 converts the CIR, which has been cleaned and output from the second cleaner 3115, to a frequency domain, the length and of the input CIR and the FFT size may not match (or be identical to one another). In other words, the CIR length may be smaller than the FFT size. In this case, the zero-padding unit 3116 adds a number of zeros 'O's corresponding to the difference between the FFT size and the CIR length to the input CIR, thereby outputting the processed CIR to the second frequency domain converter (FFT2) 3121. Herein, the zero-padded CIR may correspond to one of the interpolated CIR, extrapolated CIR, and the CIR estimated in the known data section.

The second frequency domain converter 3121 performs FFT on the CIR being output from the zero padding unit 3116, thereby converting the CIR to a frequency domain CIR. Then, the second frequency domain converter 3121 outputs the converted CIR to the coefficient calculator 3122.

The coefficient calculator 3122 uses the frequency domain CIR being output from the second frequency domain converter 3121 to calculate the equalization coefficient. Then, the coefficient calculator 3122 outputs the calculated coefficient to the distortion compensator 3130. Herein, for example, the coefficient calculator 3122 calculates a channel equalization coefficient of the frequency domain that can provide minimum mean square error (MMSE) from the CIR of the frequency domain, which is output to the distortion compensator 3130.

The distortion compensator 3130 performs a complex number multiplication on the overlapped data of the frequency domain being output from the FFT unit 3102 of the first frequency domain converter 3100 and the equalization coefficient calculated by the coefficient calculator 3122, thereby compensating the channel distortion of the overlapped data being output from the FFT unit 3102.

Figure 57:
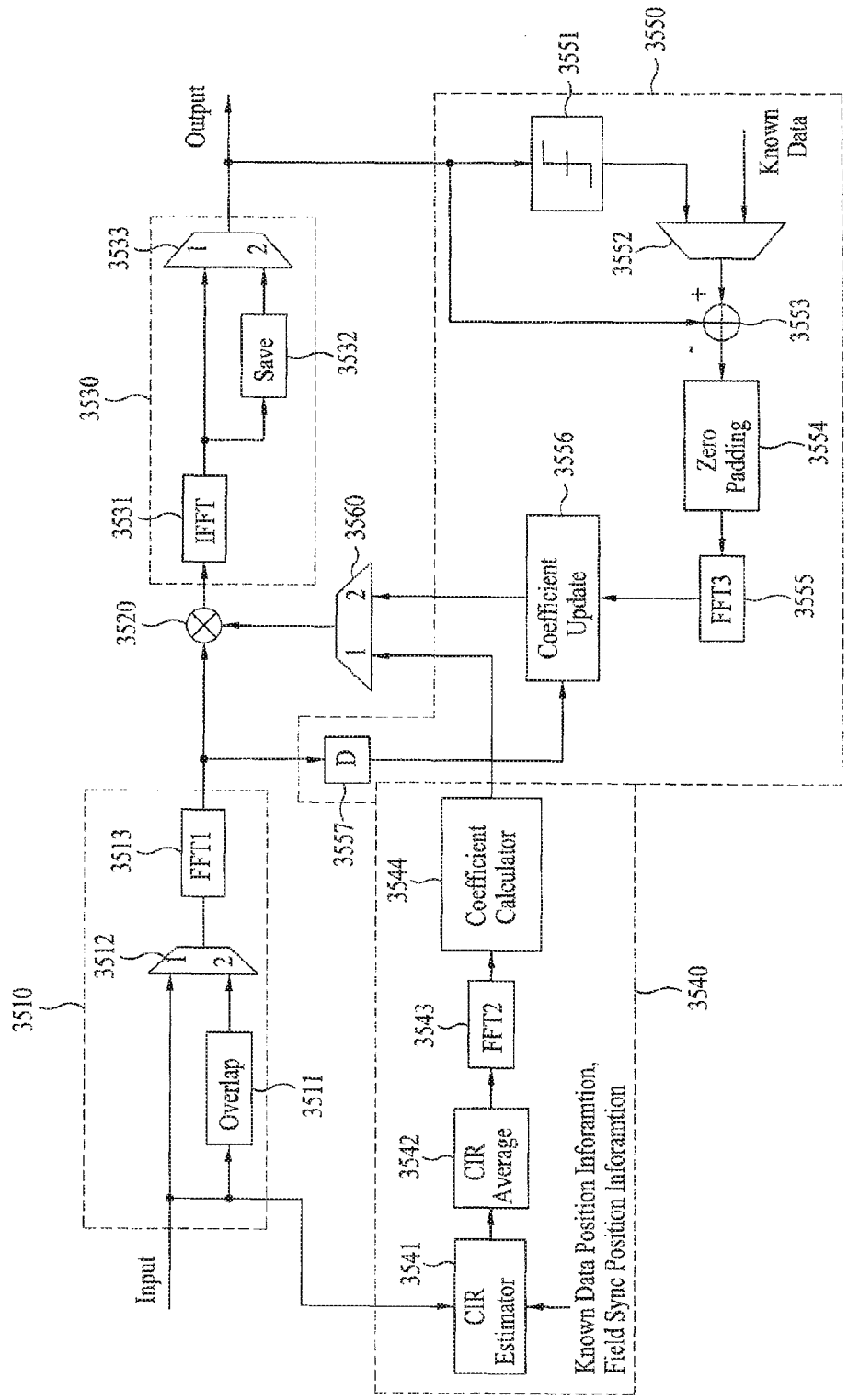
FIG. 57 illustrates a block diagram of another example of a channel equalizer according to the present invention.

FIG. 57 illustrates a block diagram of a channel equalizer according to another embodiment of the present invention. In other words, FIG. 57 illustrates a block diagram showing another example of a channel equalizer by using different CIR estimation and application methods in accordance with regions A, B, C, and D, when the data group is divided into the structure shown in FIG. 5.

More specifically, as shown in FIG. 5, known data that are sufficiently are being periodically transmitted in regions NB (i.e., MPH blocks B3 to B8). Therefore, an indirect equalizing method using the CIR may be used herein. However, in regions C/D (i.e., MPH blocks B1, B2, B9, and B10), the known data are neither able to be transmitted at a sufficiently long length nor able to be periodically and equally transmitted. Therefore, it is inadequate to estimate the CIR by using the known data. Accordingly, in regions C/D, a direct equalizing method in which an error is obtained from the output of the equalizer, in order to update the coefficient.

The examples presented in the embodiments of the present invention shown in FIG. 57 include a method of performing indirect channel equalization by using a cyclic prefix on the data of regions A/B, and a method of performing direct channel equalization by using an overlap & save method on the data of regions C/D.

Accordingly, referring to FIG. 57, the frequency domain channel equalizer includes a frequency domain converter 3510, a distortion compensator 3520, a time domain converter 3530, a first coefficient calculating unit 3540, a second coefficient calculating unit 3550, and a coefficient selector 3560.

Herein, the frequency domain converter 3510 includes an overlap unit 3511, a select unit 3512, and a first FFT unit 3513.

The time domain converter 3530 includes an IFFT unit 3531, a save unit 3532, and a select unit 3533.

The first coefficient calculating unit 3540 includes a CIR estimator 3541, an average calculator 3542, and second FFT unit 3543, and a coefficient calculator 3544.

The second coefficient calculating unit 3550 includes a decision unit 3551, a select unit 3552, a subtractor 3553, a zero-padding unit 3554, a third FFT unit 3555, a coefficient updater 3556, and a delay unit 3557.

Also, a multiplexer (MUX), which selects data that are currently being input as the input data depending upon whether the data correspond to regions A/B or to regions C/D, may be used as the select unit 3512 of the frequency domain converter 3510, the select unit 3533 of the time domain converter 3530, and the coefficient selector 3560.

In the channel equalizer having the above-described structure, as shown in FIG. 57, if the data being input correspond to the data of regions A/B, the select unit 3512 of the frequency domain converter 3510 selects the input data and not the output data of the overlap unit 3511. In the same case, the select unit 3533 of the time domain converter 3530 selects the output data of the IFFT unit 3531 and not the output data of the save unit 3532. The coefficient selector 3560 selects the equalization coefficient being output from the first coefficient calculating unit 3540.

Conversely, if the data being input correspond to the data of regions C/D, the select unit 3512 of the frequency domain converter 3510 selects the output data of the overlap unit 3511 and not the input data. In the same case, the select unit 3533 of the time domain converter 3530 selects the output data of the save unit 3532 and not the output data of the IFFT unit 3531. The coefficient selector 3560 selects the equalization coefficient being output from the second coefficient calculating unit 3550.

More specifically, the received data are input to the overlap unit 3511 and select unit 3512 of the frequency domain converter 3510, and to the first coefficient calculating unit 3540. If the input data correspond to the data of regions A/B, the select unit 3512 selects the received data, which are then output to the first FFT unit 3513. On the other hand, if the input data correspond to the data of regions C/D, the select unit 3512 selects the data that are overlapped by the overlap unit 3513 and are, then, output to the first FFT unit 3513. The first FFT unit 3513 performs FFT on the time domain data that are output from the select unit 3512, thereby converting the time domain data to frequency domain data. Then, the converted data are output to the distortion compensator 3520 and the delay unit 3557 of the second coefficient calculating unit 3550.

The distortion compensator 3520 performs complex multiplication on frequency domain data output from the first FFT unit 3513 and the equalization coefficient output from the coefficient selector 3560, thereby compensating the channel distortion detected in the data that are being output from the first FFT unit 3513.

Thereafter, the distortion-compensated data are output to the IFFT unit 3531 of the time domain converter 3530. The IFFT unit 3531 of the time domain converter 3530 performs IFFT on the channel-distortion-compensated data, thereby converting the compensated data to time domain data. The converted data are then output to the save unit 3532 and the select unit 3533. If the input data correspond to the data of regions A/B, the select unit 3533 selects the output data of the IFFT unit 3531. On the other hand, if the input data correspond to regions C/D, the select unit 3533 selects the valid data extracted from the save unit 3532. Thereafter, the selected data are output to be decoded and, simultaneously, output to the second coefficient calculating unit 3550.

The CIR estimator 3541 of the first coefficient calculating unit 3540 uses the data being received during the known data section and the known data of the known data section, the known data being already known by the receiving system in accordance with an agreement between the receiving system and the transmitting system, in order to estimate the CIR. Subsequently, the estimated CIR is output to the average calculator 3542. The average calculator 3542 calculates an average value of the CIRs that are being input consecutively. Then, the calculated average value is output to the second FFT unit 3543. For example, referring to FIG. 37, the average value of the CIR value estimated at point T1 and the CIR value estimated at point T2 is used for the channel equalization process of the general data existing between point T1 and point T2. Accordingly, the calculated average value is output to the second FFT unit 3543.

The second FFT unit 3543 performs FFT on the CIR of the time domain that is being input, in order to convert the input CIR to a frequency domain CIR. Thereafter, the converted frequency domain CIR is output to the coefficient calculator 3544. The coefficient calculator 3544 calculates a frequency domain equalization coefficient that satisfies the condition of using the CIR of the frequency domain in order to minimize the mean square error. The calculated equalizer coefficient of the frequency domain is then output to the coefficient calculator 3560.

The decision unit 3551 of the second coefficient calculating unit 3550 selects one of a plurality of decision values (e.g., 8 decision values) that is most approximate to the equalized data and outputs the selected decision value to the select unit 3552. Herein, a multiplexer may be used as the select unit 3552. In a general data section, the select unit 3552 selects the decision value of the decision unit 3551. Alternatively, in a known data section, the select unit 3552 selects the known data and outputs the selected known data to the subtractor 3553. The subtractor 3553 subtracts the output of the select unit 3533 included in the time domain converter 3530 from the output of the select unit 652 in order to calculate (or obtain) an error value. Thereafter, the calculated error value is output to the zero-padding unit 3554.

The zero-padding unit 3554 adds (or inserts) the same amount of zeros (0) corresponding to the overlapped amount of the received data in the input error. Then, the error extended with zeros (0) is output to the third FFT unit 3555. The third FFT unit 3555 converts the error of the time domain having zeros (0) added (or inserted) therein, to the error of the frequency domain. Thereafter, the converted error is output to the coefficient update unit 3556. The coefficient update unit 3556 uses the received data of the frequency domain that have been delayed by the delay unit 3557 and the error of the frequency domain in order to update the previous equalization coefficient. Thereafter, the updated equalization coefficient is output to the coefficient selector 3560.

At this point, the updated equalization coefficient is stored in order that it can be used as a previous equalization coefficient in a later process. If the input data correspond to the data of regions A/B, the coefficient selector 3560 selects the equalization coefficient calculated from the first coefficient calculating unit 3540. On the other hand, if the input data correspond to the data of regions C/D, the coefficient selector 3560 selects the equalization coefficient updated by the second coefficient calculating unit 3550. Thereafter, the selected equalization coefficient is output to the distortion compensator 3520.

Figure 58:
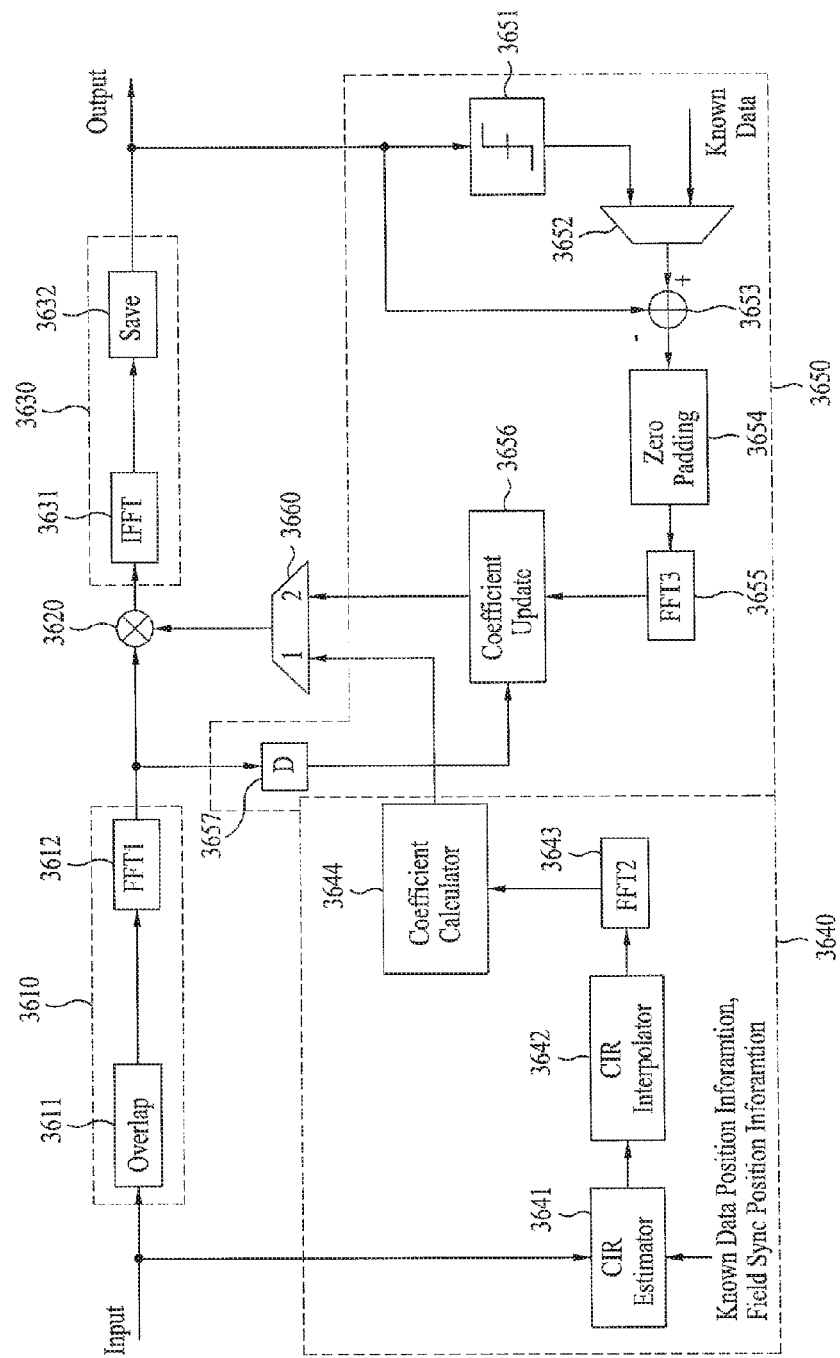
FIG. 58 illustrates a block diagram of another example of a channel equalizer according to the present invention.

FIG. 58 illustrates a block diagram of a channel equalizer according to another embodiment of the present invention. In other words, FIG. 58 illustrates a block diagram showing another example of a channel equalizer by using different CIR estimation and application methods in accordance with regions A, B, C, and D, when the data group is divided into the structure shown in FIG. 5. In this example, a method of performing indirect channel equalization by using an overlap & save method on the data of regions A/B, and a method of performing direct channel equalization by using an overlap & save method on the data of regions C/D are illustrated.

Accordingly, referring to FIG. 58, the frequency domain channel equalizer includes a frequency domain converter 3610, a distortion compensator 3620, a time domain converter 3630, a first coefficient calculating unit 3640, a second coefficient calculating unit 3650, and a coefficient selector 3660.

Herein, the frequency domain converter 3610 includes an overlap unit 3611 and a first FFT unit 3612.

The time domain converter 3630 includes an IFFT unit 3631 and a save unit 3632.

The first coefficient calculating unit 3640 includes a CIR estimator 3641, an interpolator 3642, a second FFT unit 3643, and a coefficient calculator 3644.

The second coefficient calculating unit 3650 includes a decision unit 3651, a select unit 3652, a subtractor 3653, a zero-padding unit 3654, a third FFT unit 3655, a coefficient updater 3656, and a delay unit 3657.

Also, a multiplexer (MUX), which selects data that are currently being input as the input data depending upon whether the data correspond to regions A/B or to regions C/D, may be used as the coefficient selector 3660. More specifically, if the input data correspond to the data of regions A/B, the coefficient selector 3660 selects the equalization coefficient calculated from the first coefficient calculating unit 3640. On the other hand, if the input data correspond to the data of regions C/D, the coefficient selector 3660 selects the equalization coefficient updated by the second coefficient calculating unit 3650.

In the channel equalizer having the above-described structure, as shown in FIG. 58, the received data are input to the overlap unit 3611 of the frequency domain converter 3610 and to the first coefficient calculating unit 3640. The overlap unit 3611 overlaps the input data to a pre-determined overlapping ratio and outputs the overlapped data to the first FFT unit 3612. The first FFT unit 3612 performs FFT on the overlapped time domain data, thereby converting the overlapped time domain data to overlapped frequency domain data. Then, the converted data are output to the distortion compensator 3620 and the delay unit 3657 of the second coefficient calculating unit 3650.

The distortion compensator 3620 performs complex multiplication on the overlapped frequency domain data output from the first FFT unit 3612 and the equalization coefficient output from the coefficient selector 3660, thereby compensating the channel distortion detected in the overlapped data that are being output from the first FFT unit 3612. Thereafter, the distortion-compensated data are output to the IFFT unit 3631 of the time domain converter 3630. The IFFT unit 3631 of the time domain converter 3630 performs IFFT on the distortion-compensated data, thereby converting the compensated data to overlapped time domain data. The converted overlapped data are then output to the save unit 3632. The save unit 3632 extracts only the valid data from the overlapped time domain data, which are then output for data decoding and, at the same time, output to the second coefficient calculating unit 3650 in order to update the coefficient.

The CIR estimator 3641 of the first coefficient calculating unit 3640 uses the data received during the known data section and the known data in order to estimate the CIR. Subsequently, the estimated CIR is output to the interpolator 3642. The interpolator 3642 uses the input CIR to estimate the CIRs (i.e., CIRs of the region that does not include the known data) corresponding to the points located between the estimated CIRs according to a predetermined interpolation method. Thereafter, the estimated result is output to the second FFT unit 3643. The second FFT unit 3643 performs FFT on the input CIR, in order to convert the input CIR to a frequency domain CIR. Thereafter, the converted frequency domain CIR is output to the coefficient calculator 3644. The coefficient calculator 3644 calculates a frequency domain equalization coefficient that satisfies the condition of using the CIR of the frequency domain in order to minimize the mean square error. The calculated equalizer coefficient of the frequency domain is then output to the coefficient calculator 3660.

The structure and operations of the second coefficient calculating unit 3650 is identical to those of the second coefficient calculating unit 3550 shown in FIG. 57. Therefore, the description of the same will be omitted for simplicity.

If the input data correspond to the data of regions A/B, the coefficient selector 3660 selects the equalization coefficient calculated from the first coefficient calculating unit 3640. On the other hand, if the input data correspond to the data of regions C/D, the coefficient selector 3660 selects the equalization coefficient updated by the second coefficient calculating unit 3650. Thereafter, the selected equalization coefficient is output to the distortion compensator 3620.

Figure 59:
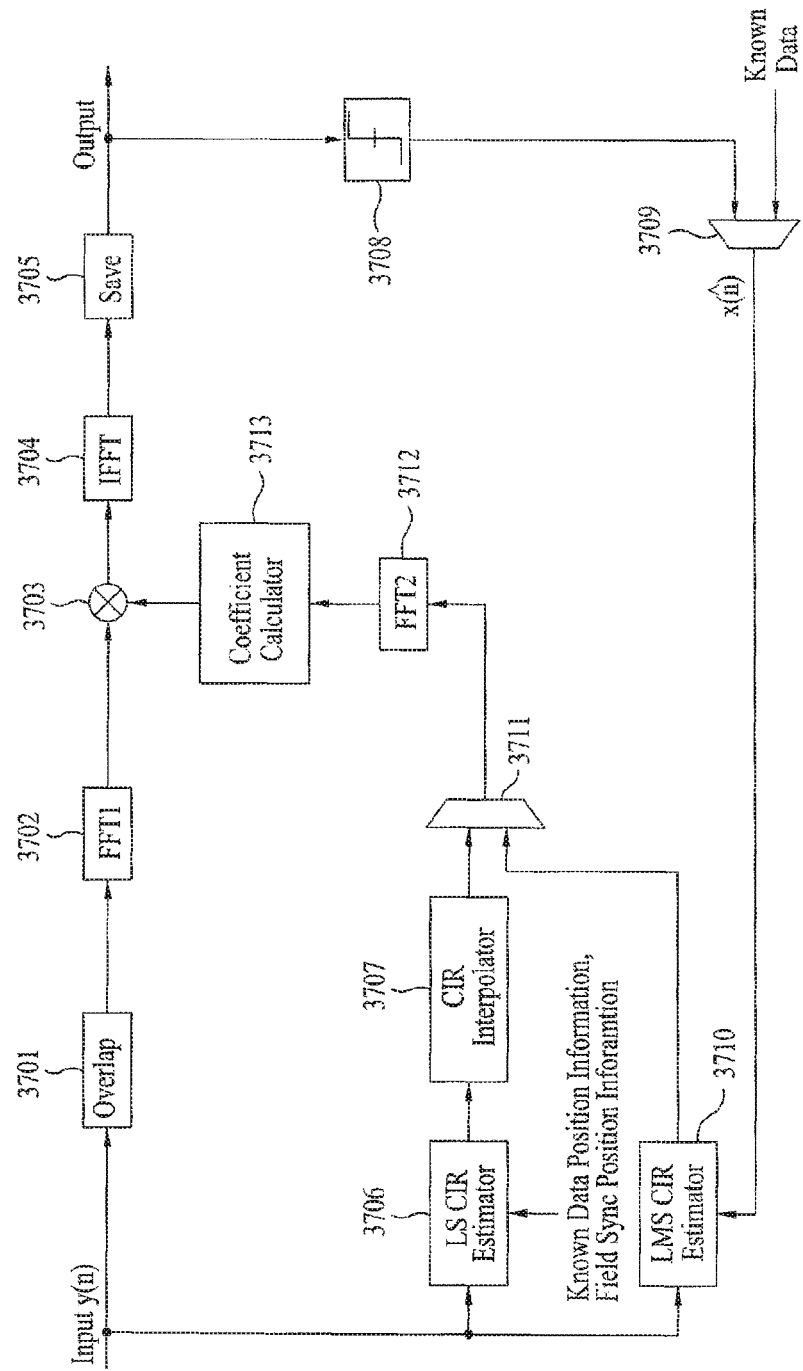
FIG. 59 illustrates a block diagram of another example of a channel equalizer according to the present invention.

FIG. 59 illustrates a block diagram of a channel equalizer according to another embodiment of the present invention. In other words, FIG. 59 illustrates a block diagram showing another example of a channel equalizer by using different CIR estimation and application methods in accordance with regions A, B, C, and D, when the data group is divided into the structure shown in FIG. 5. For example, in regions A/B, the present invention uses the known data in order to estimate the CIR by using a least square (LS) method, thereby performing the channel equalization process. On the other hand, in regions C/D, the present invention estimates the CIR by using a least mean square (LMS) method, thereby performing the channel equalization process. More specifically, since the periodic known data do not exist in regions C/D, as in regions A/B, the same channel equalization process as that of regions A/B cannot be performed in regions C/D. Therefore, the channel equalization process may only be performed by using the LMS method.

Referring to FIG. 59, the channel equalizer includes an overlap unit 3701, a first fast fourier transform (FFT) unit 3702, a distortion compensator 3703, an inverse fast fourier transform (IFFT) unit 3704, a save unit 3705, a first CIR estimator 3706, a CIR interpolator 3707, a decision unit 3708, a second CIR estimator 3710, a selection unit 3711, a second FFT unit 3712, and a coefficient calculator 3713. Herein, any device performed complex number multiplication may be used as the distortion compensator 3703. In the channel equalizer having the above-described structure, as shown in FIG. 59, the overlap unit 3701 overlaps the data being input to the channel equalizer to a predetermined overlapping ratio and then outputs the overlapped data to the first FFT unit 3702. The first FFT unit 3702 converts (or transforms) the overlapped data of the time domain to overlapped data of the frequency domain by using fast Fourier transform (FFT). Then, the converted data are output to the distortion compensator 3703.

The distortion converter 3703 performs complex multiplication on the equalization coefficient calculated from the coefficient calculator 3713 and the overlapped data of the frequency domain, thereby compensating the channel distortion of the overlapped data being output from the first FFT unit 3702. Thereafter, the distortion-compensated data are output to the IFFT unit 3704. The IFFT unit 3704 performs inverse fast Fourier transform (IFFT) on the distortion-compensated overlapped data, in order to convert the corresponding data back to data (i.e., overlapped data) of the time domain. Subsequently, the converted data are output to the save unit 3705. The save unit 3705 extracts only the valid data from the overlapped data of the time domain. Then, the save unit 3705 outputs the extracted valid data for a data decoding process and, at the same time, outputs the extracted valid data to the decision unit 3708 for a channel estimation process.

The decision unit 3708 selects one of a plurality of decision values (e.g., 8 decision values) that is most approximate to the equalized data and outputs the selected decision value to the select unit 3709. Herein, a multiplexer may be used as the select unit 3709. In a general data section, the select unit 3709 selects the decision value of the decision unit 3708. Alternatively, in a known data section, the select unit 3709 selects the known data and outputs the selected known data to the second CIR estimator 3710.

Meanwhile, the first CIR estimator 3706 uses the data that are being input in the known data section and the known data in order to estimate the CIR.

Thereafter, the first CIR estimator 3706 outputs the estimated CIR to the CIR interpolator 3707. Herein, the known data correspond to reference known data created during the known data section by the receiving system in accordance to an agreement between the transmitting system and the receiving system. At this point, according to an embodiment of the present invention, the first CIR estimator 3706 uses the LS method to estimate the CIR. The LS estimation method calculates a cross correlation value p between the known data that have passed through the channel during the known data section and the known data that are already known by the receiving end. Then, a cross correlation matrix R of the known data is calculated. Subsequently, a matrix operation is performed on $R^{-1} \cdot p$ so that the cross correlation portion within the cross correlation value p between the received data and the initial known data, thereby estimating the CIR of the transmission channel.

The CIR interpolator 3707 receives the CIR from the first CIR estimator 3706. And, in the section between two sets of known data, the CIR is interpolated in accordance with a pre-determined interpolation method. Then, the interpolated CIR is output. At this point, the pre-determined interpolation method corresponds to a method of estimating a particular set of data at an unknown point by using a set of data known by a particular function. For example, such method includes a linear interpolation method. The linear interpolation method is only one of the most simple interpolation methods. A variety of other interpolation methods may be used instead of the above-described linear interpolation method. It is apparent that the present invention is not limited only to the example set forth in the description of the present invention. More specifically, the CIR interpolator 3707 uses the CIR that is being input in order to estimate the CIR of the section that does not include any known data by using the pre-determined interpolation method. Thereafter, the estimated CIR is output to the select unit 3711.

The second CIR estimator 3710 uses the input data of the channel equalizer and the output data of the select unit 3709 in order to estimate the CIR. Then, the second CIR estimator 3710 outputs the estimated CIR to the select unit 3711. At this point, according to an embodiment of the present invention, the CIR is estimated by using the LMS method. The LMS estimation method will be described in detail in a later process.

In regions A/B (i.e., MPH blocks B3 to B8), the select unit 3711 selects the CIR output from the CIR interpolator 3707. And, in regions C/D (i.e., MPH blocks B1, B2, B9, and B10), the select unit 3711 selects the CIR output from the second CIR estimator 3710. Thereafter, the select unit 3711 outputs the selected CIR to the second FFT unit 3712.

The second FFT unit 3712 converts the CIR that is being input to a CIR of the frequency domain, which is then output to the coefficient calculator 3713. The coefficient calculator 3713 uses the CIR of the frequency domain that is being input, in order to calculate the equalization coefficient and to output the calculated equalization coefficient to the distortion compensator 3703. At this point, the coefficient calculator 3713 calculates a channel equalization coefficient of the frequency domain that can provide minimum mean square error (MMSE) from the CIR of the frequency domain. At this point, the second CIR estimator 3710 may use the CIR estimated in regions A/B as the CIR at the beginning of regions C/D. For example, the CIR value of MPH block B8 may be used as the CIR value at the beginning of the MPH block B9. Accordingly, the convergence speed of regions C/D may be reduced.

The basic principle of estimating the CIR by using the LMS method in the second CIR estimator 3710 corresponds to receiving the output of an unknown transmission channel and to updating (or renewing) the coefficient of an adaptive filter (not shown) so that the difference value between the output value of the unknown channel and the output value of the adaptive filter is minimized. More specifically, the coefficient value of the adaptive filter is renewed so that the input data of the channel equalizer is equal to the output value of the adaptive filter (not shown) included in the second CIR estimator 3710. Thereafter, the filter coefficient is output as the CIR after each FFT cycle.

Figure 60:
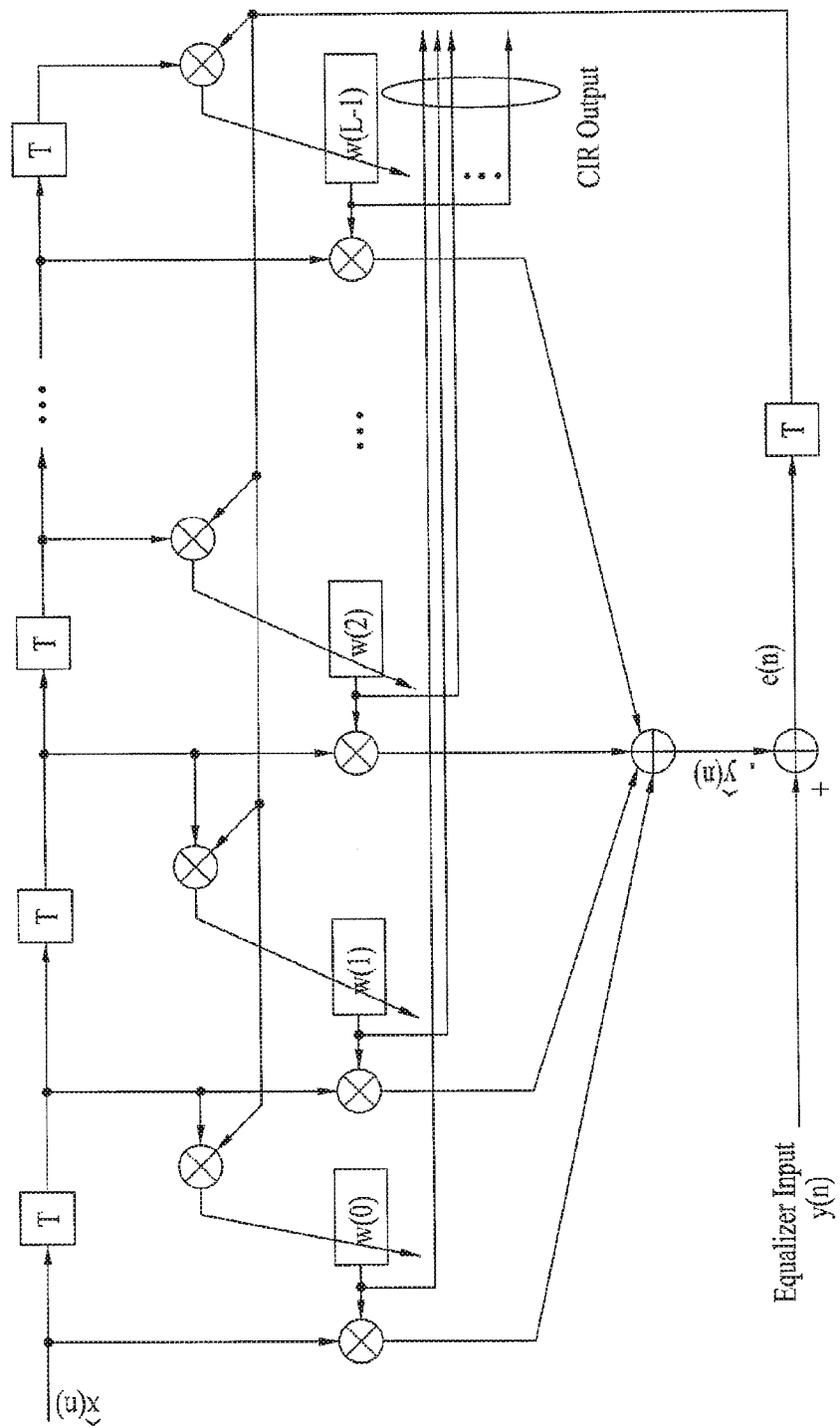
FIG. 60 illustrates a block diagram of an example of a CIR estimator according to the present invention.

Referring to FIG. 60, the second CIR estimator 3710 includes a delay unit T, a multiplier, and a coefficient renewal unit for each tab. Herein, the delay unit T sequentially delays the output data i(n) of the select unit 3709. The multiplier multiplies respective output data output from each delay unit T with error data e(n). The coefficient renewal unit renews the coefficient by using the output corresponding to each multiplier. Herein, the multipliers that are being provided as many as the number of tabs will be referred to as a first multiplying unit for simplicity. Furthermore, the second CIR estimator 3710 further includes a plurality of multipliers each multiplying the output data of the select unit 3709 and the output data of the delay unit T (wherein the output data of the last delay unit are excluded) with the output data corresponding to each respective coefficient renewal unit. These multipliers are also provided as many as the number of tabs. This group of multipliers will be referred to as a second multiplying unit for simplicity.

The second CIR estimator 3710 further includes an adder and a subtractor. Herein, the adder adds all of the data output from each multipliers included in the second multiplier unit. Then, the added value is output as the estimation value 9(n) of the data input to the channel equalizer. The subtractor calculates the difference between the output data 9(n) of the adder and the input data y(n) of the channel equalizer. Thereafter, the calculated difference value is output as the error data e(n). Referring to FIG. 60, in a general data section, the decision value of the equalized data is input to the first delay unit included in the second CIR estimator 3710 and to the first multiplier included in the second multiplier. In the known data section, the known data are input to the first delay unit included in the second CIR estimator 3710 and to the first multiplier included in the second multiplier unit. The input data 9(n) are sequentially delayed by passing through a number of serially connected delay units T, the number corresponding to the number of tabs. The output data of each delay unit T and the error data e(n) are multiplied by each corresponding multiplier included in the first multiplier unit. Thereafter, the coefficients are renewed by each respective coefficient renewal unit.

Each coefficient that is renewed by the corresponding coefficient renewal unit is multiplied with the input data the output data i(n) and also with the output data of each delay unit T with the exception of the last delay. Thereafter, the multiplied value is input to the adder. The adder then adds all of the output data output from the second multiplier unit and outputs the added value to the subtractor as the estimation value 9(n) of the input data of the channel equalizer. The subtractor calculates a difference value between the estimation value 9(n) and the input data y(n) of the channel equalizer. The difference value is then output to each multiplier of the first multiplier unit as the error data e(n). At this point, the error data e(n) is output to each multiplier of the first multiplier unit by passing through each respective delay unit T. As described above, the coefficient of the adaptive filter is continuously renewed. And, the output of each coefficient renewal unit is output as the CIR of the second CIR estimator 3710 after each FFT cycle.

Block Decoder

Meanwhile, if the data being input to the block decoder 1005, after being channel-equalized by the equalizer 1003, correspond to the data having both block encoding and trellis encoding performed thereon (i.e., the data within the RS frame, the signaling information data, etc.) by the transmitting system, trellis decoding and block decoding processes are performed on the input data as inverse processes of the transmitting system. Alternatively, if the data being input to the block decoder 1005 correspond to the data having only trellis encoding performed thereon (i.e., the main service data), and not the block encoding, only the trellis decoding process is performed on the input data as the inverse process of the transmitting system.

The trellis decoded and block decoded data by the block decoder 1005 are then output to the RS frame decoder 1006. More specifically, the block decoder 1005 removes the known data, data used for trellis initialization, and signaling information data, MPEG header, which have been inserted in the data group, and the RS parity data, which have been added by the RS encoder/non-systematic RS encoder or non-systematic RS encoder of the transmitting system. Then, the block decoder 1005 outputs the processed data to the RS frame decoder 1006. Herein, the removal of the data may be performed before the block decoding process, or may be performed during or after the block decoding process.

Meanwhile, the data trellis-decoded by the block decoder 1005 are output to the data deinterleaver 1009. At this point, the data being trellis-decoded by the block decoder 1005 and output to the data deinterleaver 1009 may not only include the main service data but may also include the data within the RS frame and the signaling information. Furthermore, the RS parity data that are added by the transmitting system after the pre-processor 230 may also be included in the data being output to the data deinterleaver 1009.

According to another embodiment of the present invention, data that are not processed with block decoding and only processed with trellis encoding by the transmitting system may directly bypass the block decoder 1005 in order to be output to the data deinterleaver 1009. In this case, a trellis decoder should be provided before the data deinterleaver 1009. More specifically, if the input data correspond to the data having only trellis encoding performed thereon and not block encoding, the block decoder 1005 performs Viterbi (or trellis) decoding on the input data in order to output a hard decision value or to perform a hard-decision on a soft decision value, thereby outputting the result.

Meanwhile, if the input data correspond to the data having both block encoding process and trellis encoding process performed thereon, the block decoder 1005 outputs a soft decision value with respect to the input data.

In other words, if the input data correspond to data being processed with block encoding by the block processor 302 and being processed with trellis encoding by the trellis encoding module 256, in the transmitting system, the block decoder 1005 performs a decoding process and a trellis decoding process on the input data as inverse processes of the transmitting system. At this point, the RS frame encoder of the pre-processor included in the transmitting system may be viewed as an outer (or external) encoder. And, the trellis encoder may be viewed as an inner (or internal) encoder. When decoding such concatenated codes, in order to allow the block decoder 1005 to maximize its performance of decoding externally encoded data, the decoder of the internal code should output a soft decision value.

Figure 61:
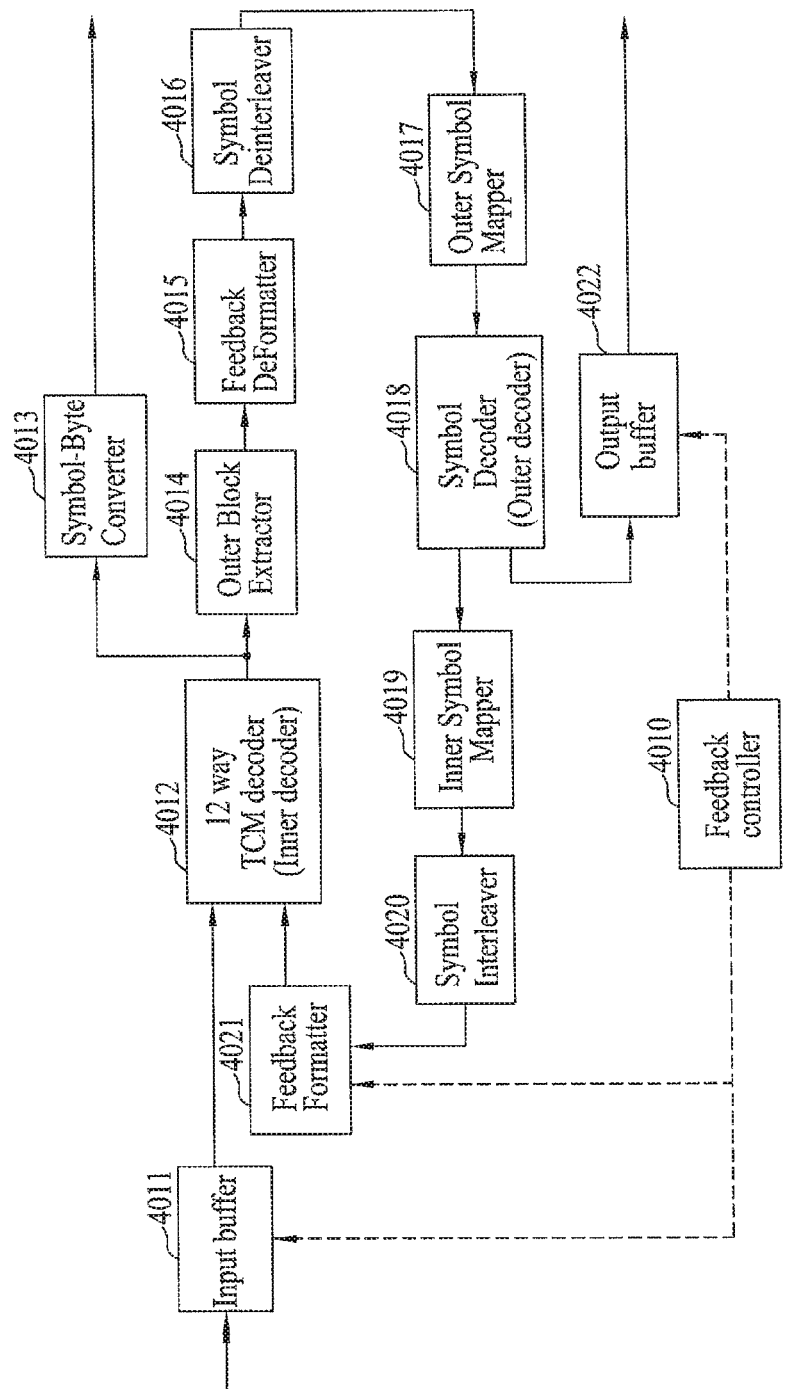
FIG. 61 illustrates a block diagram of an example of a block decoder according to the present invention.

FIG. 61 illustrates a detailed block diagram of the block decoder 1005 according to an embodiment of the present invention. Referring to FIG. 61, the block decoder 1005 includes a feedback controller 4010, an input buffer 4011, a trellis decoding unit (or 12-way trellis coded modulation (TCM) decoder or inner decoder) 4012, a symbol-byte converter 4013, an outer block extractor 4014, a feedback deformatter 4015, a symbol deinterleaver 4016, an outer symbol mapper 4017, a symbol decoder 4018, an inner symbol mapper 4019, a symbol interleaver 4020, a feedback formatter 4021, and an output buffer 4022. Herein, just as in the transmitting system, the trellis decoding unit 4012 may be viewed as an inner (or internal) decoder. And, the symbol decoder 4018 may be viewed as an outer (or external) decoder.

The input buffer 4011 temporarily stores the mobile service data symbols being channel-equalized and output from the equalizer 1003. (Herein, the mobile service data symbols may include symbols corresponding to the signaling information, RS parity data symbols and CRC data symbols added during the encoding process of the RS frame.) Thereafter, the input buffer 4011 repeatedly outputs the stored symbols for M number of times to the trellis decoding unit 4012 in a turbo block (TDL) size required for the turbo decoding process.

The turbo decoding length (TDL) may also be referred to as a turbo block. Herein, a TDL should include at least one SCCCC block size. Therefore, as defined in FIG. 5, when it is assumed that one MPH block is a 16-segment unit, and that a combination of 10 MPH blocks form one SCCC block, a TDL should be equal to or larger than the maximum possible combination size. For example, when it is assumed that 2 MPH blocks form one SCCC block, the TDL may be equal to or larger than 32 segments (i.e., 828*32=26496 symbols). Herein, M indicates a number of repetitions for turbo-decoding pre-decided by the feed-back controller 4010.

Also, M represents a number of repetitions of the turbo decoding process, the number being predetermined by the feedback controller 4010.

Additionally, among the values of symbols being channel-equalized and output from the equalizer 1003, the input symbol values corresponding to a section having no mobile service data symbols (including RS parity data symbols during RS frame encoding and CRC data symbols) included therein, bypass the input buffer 4011 without being stored. More specifically, since trellis-encoding is performed on input symbol values of a section wherein SCCC block-encoding has not been performed, the input buffer 4011 inputs the input symbol values of the corresponding section directly to the trellis encoding module 4012 without performing any storage, repetition, and output processes. The storage, repetition, and output processes of the input buffer 4011 are controlled by the feedback controller 4010. Herein, the feedback controller 4010 refers to SCCC-associated information (e.g., SCCC block mode and SCCC outer code mode), which are output from the signaling information decoding unit 1013, in order to control the storage and output processes of the input buffer 4011.

The trellis decoding unit 4012 includes a 12-way TCM decoder. Herein, the trellis decoding unit 4012 performs 12-way trellis decoding as inverse processes of the 12-way trellis encoder.

More specifically, the trellis decoding unit 4012 receives a number of output symbols of the input buffer 4011 and soft-decision values of the feedback formatter 4021 equivalent to each TDL, in order to perform the TCM decoding process.

At this point, based upon the control of the feedback controller 4010, the soft-decision values output from the feedback formatter 4021 are matched with a number of mobile service data symbol places in order to be in a one-to-one (1:1) correspondence. Herein, the number of mobile service data symbol places is equivalent to the TDL being output from the input buffer 4011.

More specifically, the mobile service data being output from the input buffer 4011 are matched with the turbo decoded data being input, so that each respective data place can correspond with one another. Thereafter, the matched data are output to the trellis decoding unit 4012. For example, if the turbo decoded data correspond to the third symbol within the turbo block, the corresponding symbol (or data) is matched with the third symbol included in the turbo block, which is output from the input buffer 4011. Subsequently, the matched symbol (or data) is output to the trellis decoding unit 4012.

In order to do so, while the regressive turbo decoding is in process, the feedback controller 4010 controls the input buffer 4011 so that the input buffer 4011 stores the corresponding turbo block data. Also, by delaying data (or symbols), the soft decision value (e.g., LLR) of the symbol output from the symbol interleaver 4020 and the symbol of the input buffer 4011 corresponding to the same place (or position) within the block of the output symbol are matched with one another to be in a one-to-one correspondence. Thereafter, the matched symbols are controlled so that they can be input to the TCM decoder through the respective path. This process is repeated for a predetermined number of turbo decoding cycle periods. Then, the data of the next turbo block are output from the input buffer 4011, thereby repeating the turbo decoding process.

The output of the trellis decoding unit 4012 signifies a degree of reliability of the transmission bits configuring each symbol. For example, in the transmitting system, since the input data of the trellis encoding module correspond to two bits as one symbol, a log likelihood ratio (LLR) between the likelihood of a bit having the value of '1' and the likelihood of the bit having the value of '0' may be respectively output (in bit units) to the upper bit and the lower bit. Herein, the log likelihood ratio corresponds to a log value for the ratio between the likelihood of a bit having the value of '1' and the likelihood of the bit having the value of '0'. Alternatively, a LLR for the likelihood of 2 bits (i.e., one symbol) being equal to "00", "01", "10", and "11" may be respectively output (in symbol units) to all 4 combinations of bits (i.e., 00, 01, 10, 11). Consequently, this becomes the soft decision value that indicates the degree of reliability of the transmission bits configuring each symbol. A maximum a posteriori probability (MAP) or a soft-out Viterbi algorithm (SOVA) may be used as a decoding algorithm of each TCM decoder within the trellis decoding unit 4012.

The output of the trellis decoding unit 4012 is input to the symbol-byte converter 4013 and the outer block extractor 4014.

The symbol-byte converter 4013 performs a hard-decision process of the soft decision value that is trellis decoded and output from the trellis decoding unit 4012. Thereafter, the symbol-byte converter 4013 groups 4 symbols into byte units, which are then output to the data deinterleaver 1009 of FIG. 36. More specifically, the symbol-byte converter 4013 performs hard-decision in bit units on the soft decision value of the symbol output from the trellis decoding unit 4012. Therefore, the data processed with hard-decision and output in bit units from the symbol-byte converter 4013 not only include main service data, but may also include mobile service data, known data, RS parity data, and MPEG headers.

Among the soft decision values of TDL size of the trellis decoding unit 4012, the outer block extractor 4014 identifies the soft decision values of B size of corresponding to the mobile service data symbols (wherein symbols corresponding to signaling information, RS parity data symbols that are added during the encoding of the RS frame, and CRC data symbols are included) and outputs the identified soft decision values to the feedback deformatter 4015.

The feedback deformatter 4015 changes the processing order of the soft decision values corresponding to the mobile service data symbols. This is an inverse process of an initial change in the processing order of the mobile service data symbols, which are generated during an intermediate step, wherein the output symbols output from the block processor 302 of the transmitting system are being input to the trellis encoding module 256 (e.g., when the symbols pass through the group formatter, the data deinterleaver, the packet formatter, and the data interleaver). Thereafter, the feedback deformatter 1015 performs reordering of the process order of soft decision values corresponding to the mobile service data symbols and, then, outputs the processed mobile service data symbols to the symbol deinterleaver 4016.

This is because a plurality of blocks exist between the block processor 302 and the trellis encoding module 256, and because, due to these blocks, the order of the mobile service data symbols being output from the block processor 302 and the order of the mobile service data symbols being input to the trellis encoding module 256 are not identical to one another. Therefore, the feedback deformatter 4015 reorders (or rearranges) the order of the mobile service data symbols being output from the outer block extractor 4014, so that the order of the mobile service data symbols being input to the symbol deinterleaver 4016 matches the order of the mobile service data symbols output from the block processor 302 of the transmitting system. The reordering process may be embodied as one of software, middleware, and hardware.

Figure 62:
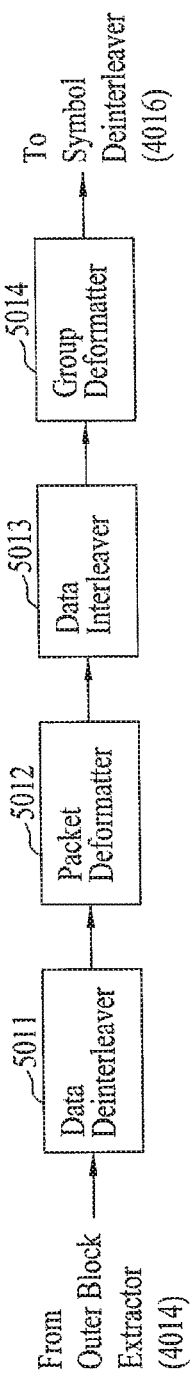
FIG. 62 illustrates a block diagram of an example of a feedback deformatter according to the present invention.

FIG. 62 illustrates a detailed block view of the feedback deformatter 4015 according to an embodiment of the present invention. Herein, the feedback deformatter 4015 includes a data deinterleaver 5011, a packet deformatter 5012, a data interleaver 5013, and a group deformatter 5014. Referring to FIG. 62, the soft decision value of the mobile service data symbol, which is extracted by the outer block extractor 4014, is output directly to the data deinterleaver 5011 of the feedback deformatter 4015 without modification. However, data place holders (or null data) are inserted in data places (e.g., main service data places, known data places, signaling information places, RS parity data places, and MPEG header places), which are removed by the outer block extractor 4014, thereby being output to the data deinterleaver 5011 of the feedback deformatter 4015.

The data deinterleaver 5011 performs an inverse process of the data interleaver 253 included in the transmitting system. More specifically, the data deinterleaver 5011 deinterleaves the input data and outputs the deinterleaved data to the packet deformatter 5012. The packet deformatter 5012 performs an inverse process of the packet formatter 305. More specifically, among the data that are deinterleaved and output from the data deinterleaver 5011, the packet deformatter 5012 removes the place holder corresponding to the MPEG header, which had been inserted to the packet formatter 305. The output of the packet deformatter 5012 is input to the data interleaver 5013, and the data interleaver 5013 interleaves the data being input, as an inverse process of the data deinterleaver 529 included in the transmitting system. Accordingly, data having a data structure as shown in FIG. 5, are output to the group deformatter 5014.

The data deformatter 5014 performs an inverse process of the group formatter 303 included in the transmitting system. More specifically, the group formatter 5014 removes the place holders corresponding to the main service data, known data, signaling information data, and RS parity data. Then, the group formatter 5014 outputs only the reordered (or rearranged) mobile service data symbols to the symbol deinterleaver 4016. According to another embodiment of the present invention, when the feedback deformatter 4015 is embodied using a memory map, the process of inserting and removing place holder to and from data places removed by the outer block extractor 4014 may be omitted.

The symbol deinterleaver 4016 performs deinterleaving on the mobile service data symbols having their processing orders changed and output from the feedback deformatter 4015, as an inverse process of the symbol interleaving process of the symbol interleaver 514 included in the transmitting system. The size of the block used by the symbol deinterleaver 4016 during the deinterleaving process is identical to interleaving size of an actual symbol (i.e., B) of the symbol interleaver 514, which is included in the transmitting system. This is because the turbo decoding process is performed between the trellis decoding unit 4012 and the symbol decoder 4018. Both the input and output of the symbol deinterleaver 4016 correspond to soft decision values, and the deinterleaved soft decision values are output to the outer symbol mapper 4017.

The operations of the outer symbol mapper 4017 may vary depending upon the structure and coding rate of the convolution encoder 513 included in the transmitting system. For example, when data are ½-rate encoded by the convolution encoder 513 and then transmitted, the outer symbol mapper 4017 directly outputs the input data without modification. In another example, when data are ¼-rate encoded by the convolution encoder 513 and then transmitted, the outer symbol mapper 4017 converts the input data so that it can match the input data format of the symbol decoder 4018. For this, the outer symbol mapper 4017 may be input SCCC-associated information (i.e., SCCC block mode and SCCC outer code mode) from the signaling information decoder 1013. Then, the outer symbol mapper 4017 outputs the converted data to the symbol decoder 4018.

The symbol decoder 4018 (i.e., the outer decoder) receives the data output from the outer symbol mapper 4017 and performs symbol decoding as an inverse process of the convolution encoder 513 included in the transmitting system. At this point, two different soft decision values are output from the symbol decoder 4018. One of the output soft decision values corresponds to a soft decision value matching the output symbol of the convolution encoder 513 (hereinafter referred to as a "first decision value"). The other one of the output soft decision values corresponds to a soft decision value matching the input bit of the convolution encoder 513 (hereinafter referred to as a "second decision value").

More specifically, the first decision value represents a degree of reliability the output symbol (i.e., 2 bits) of the convolution encoder 513. Herein, the first soft decision value may output (in bit units) a LLR between the likelihood of 1 bit being equal to '1' and the likelihood of 1 bit being equal to '0' with respect to each of the upper bit and lower bit, which configures a symbol. Alternatively, the first soft decision value may also output (in symbol units) a LLR for the likelihood of 2 bits being equal to "00", "01", "10", and "11" with respect to all possible combinations. The first soft decision value is fed-back to the trellis decoding unit 4012 through the inner symbol mapper 4019, the symbol interleaver 4020, and the feedback formatter 4021. On the other hand, the second soft decision value indicates a degree of reliability the input bit of the convolution encoder 513 included in the transmitting system. Herein, the second soft decision value is represented as the LLR between the likelihood of 1 bit being equal to '1' and the likelihood of 1 bit being equal to '0'. Thereafter, the second soft decision value is output to the outer buffer 4022. In this case, a maximum a posteriori probability (MAP) or a soft-out Viterbi algorithm (SOVA) may be used as the decoding algorithm of the symbol decoder 4018.

The first soft decision value that is output from the symbol decoder 4018 is input to the inner symbol mapper 4019. The inner symbol mapper 4019 converts the first soft decision value to a data format corresponding the input data of the trellis decoding unit 4012. Thereafter, the inner symbol mapper 4019 outputs the converted soft decision value to the symbol interleaver 4020. The operations of the inner symbol mapper 4019 may also vary depending upon the structure and coding rate of the convolution encoder 513 included in the transmitting system.

The symbol interleaver 4020 performs symbol interleaving, as shown in FIG. 26, on the first soft decision value that is output from the inner symbol mapper 4019. Then, the symbol interleaver 4020 outputs the symbol-interleaved first soft decision value to the feedback formatter 4021. Herein, the output of the symbol interleaver 4020 also corresponds to a soft decision value.

With respect to the changed processing order of the soft decision values corresponding to the symbols that are generated during an intermediate step, wherein the output symbols output from the block processor 302 of the transmitting system are being input to the trellis encoding module (e.g., when the symbols pass through the group formatter, the data deinterleaver, the packet formatter, the RS encoder, and the data interleaver), the feedback formatter 4021 alters (or changes) the order of the output values output from the symbol interleaver 4020. Subsequently, the feedback formatter 4020 outputs values to the trellis decoding unit 4012 in the changed order. The reordering process of the feedback formatter 4021 may configure at least one of software, hardware, and middleware. For example, the feedback formatter 4021 may configure to be performed as an inverse process of FIG. 62.

The soft decision values output from the symbol interleaver 4020 are matched with the positions of mobile service data symbols each having the size of TDL, which are output from the input buffer 4011, in order to be in a one-to-one correspondence. Thereafter, the soft decision values matched with the respective symbol position are input to the trellis decoding unit 4012. At this point, since the main service data symbols or the RS parity data symbols and known data symbols of the main service data do not correspond to the mobile service data symbols, the feedback formatter 4021 inserts null data in the corresponding positions, thereby outputting the processed data to the trellis decoding unit 4012. Additionally, each time the symbols having the size of TDL are turbo decoded, no value is fed-back by the symbol interleaver 4020 starting from the beginning of the first decoding process. Therefore, the feedback formatter 4021 is controlled by the feedback controller 4010, thereby inserting null data into all symbol positions including a mobile service data symbol. Then, the processed data are output to the trellis decoding unit 4012.

The output buffer 4022 receives the second soft decision value from the symbol decoder 4018 based upon the control of the feedback controller 4010. Then, the output buffer 4022 temporarily stores the received second soft decision value. Thereafter, the output buffer 4022 outputs the second soft decision value to the RS frame decoder 10006. For example, the output buffer 4022 overwrites the second soft decision value of the symbol decoder 4018 until the turbo decoding process is performed for M number of times. Then, once all M number of turbo decoding processes is performed for a single TDL, the corresponding second soft decision value is output to the RS frame decoder 1006.

The feedback controller 4010 controls the number of turbo decoding and turbo decoding repetition processes of the overall block decoder, shown in FIG. 61. More specifically, once the turbo decoding process has been repeated for a predetermined number of times, the second soft decision value of the symbol decoder 4018 is output to the RS frame decoder 1006 through the output buffer 4022. Thus, the block decoding process of a turbo block is completed. In the description of the present invention, this process is referred to as a regressive turbo decoding process for simplicity.

At this point, the number of regressive turbo decoding rounds between the trellis decoding unit 4012 and the symbol decoder 4018 may be defined while taking into account hardware complexity and error correction performance. Accordingly, if the number of rounds increases, the error correction performance may be enhanced. However, this may lead to a disadvantageous of the hardware becoming more complicated (or complex).

Meanwhile, the data deinterleaver 1009, the RS decoder 1010, and the data derandomizer 1011 correspond to blocks required for receiving the main service data. Therefore, the above-mentioned blocks may not be necessary (or required) in the structure of a digital broadcast receiving system for receiving mobile service data only.

The data deinterleaver 1009 performs an inverse process of the data interleaver included in the transmitting system. In other words, the data deinterleaver 1009 deinterleaves the main service data output from the block decoder 1005 and outputs the deinterleaved main service data to the RS decoder 1010. The data being input to the data deinterleaver 1009 include main service data, as well as mobile service data, known data, RS parity data, and an MPEG header. At this point, among the input data, only the main service data and the RS parity data added to the main service data packet may be output to the RS decoder 1010. Also, all data output after the data derandomizer 1011 may all be removed with the exception for the main service data. In the embodiment of the present invention, only the main service data and the RS parity data added to the main service data packet are input to the RS decoder 1010.

The RS decoder 1010 performs a systematic RS decoding process on the deinterleaved data and outputs the processed data to the data derandomizer 1011.

The data derandomizer 1011 receives the output of the RS decoder 1010 and generates a pseudo random data byte identical to that of the randomizer included in the digital broadcast transmitting system. Thereafter, the data derandomizer 1011 performs a bitwise exclusive OR (XOR) operation on the generated pseudo random data byte, thereby inserting the MPEG synchronization bytes to the beginning of each packet in order to output the data in 188-byte main service data packet units.

RS Frame Decoder

The data output from the block decoder 1005 are in portion units. More specifically, in the transmitting system, the RS frame is divided into several portions, and the mobile service data of each portion are assigned either to regions A/B/C/D within the data group or to any one of regions A/B and regions C/D, thereby being transmitted to the receiving system. Therefore, the RS frame decoder 1006 groups several portions included in a parade in order to form an RS frame. Alternatively, the RS frame decoder 1006 may also group several portions included in a parade in order to form two RS frames. Thereafter, error correction decoding is performed in RS frame units.

Figure 63:
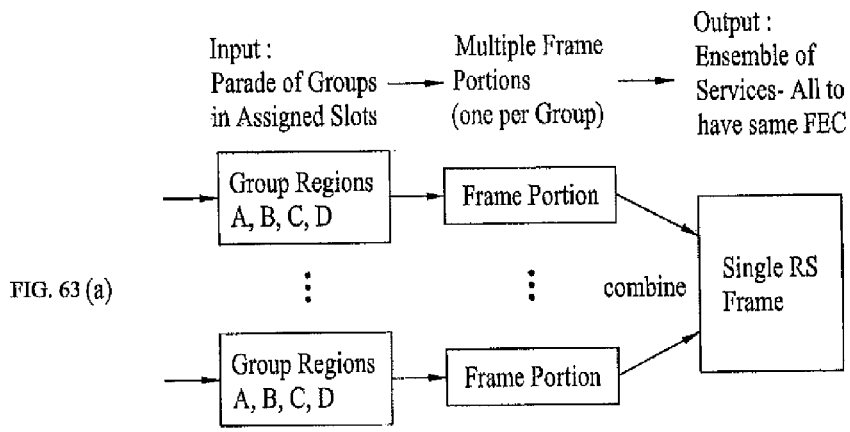
FIG. 63(a), FIG. 63(b), FIG. 64(a), FIG. 64(b), FIG. 64(c), and FIG. 64(d) and FIG. 65(a), FIG. 65(b), FIG. 65(c), FIG. 65(d), FIG. 65(e), and FIG. 65(f) illustrate process steps of error correction decoding according to an embodiment of the present invention.
Figure 63:
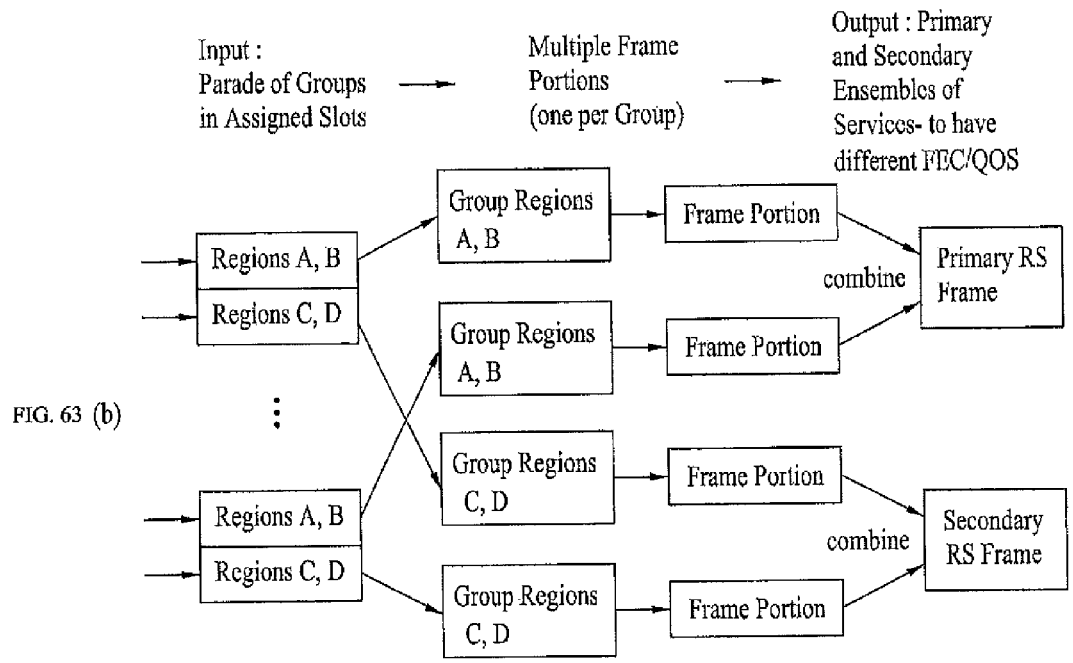

For example, when the RS frame mode value is equal to '00', then one parade transmits one RS frame. At this point, one RS frame is divided into several portions, and the mobile service data of each portion are assigned to regions A/B/C/D of the corresponding data group, thereby being transmitted. In this case, the MPH frame decoder 1006 extracts mobile service data from regions A/B/C/D of the corresponding data group, as shown in FIG. 63(*a*). Subsequently, the MPH frame decoder 1006 may perform the process of forming (or creating) a portion on a plurality of data group within a parade, thereby forming several portions. Then, the several portions of mobile service data may be grouped to form an RS frame. Herein, if stuffing bytes are added to the last portion, the RS frame may be formed after removing the stuffing byte.

In another example, when the RS frame mode value is equal to '01', then one parade transmits two RS frames (i.e., a primary RS frame and a secondary RS frame). At this point, a primary RS frame is divided into several primary portions, and the mobile service data of each primary portion are assigned to regions A/B of the corresponding data group, thereby being transmitted. Also, a secondary RS frame is divided into several secondary portions, and the mobile service data of each secondary portion are assigned to regions C/D of the corresponding data group, thereby being transmitted.

In this case, the MPH frame decoder 1006 extracts mobile service data from regions A/B of the corresponding data group, as shown in FIG. 63(*b*). Subsequently, the MPH frame decoder 1006 may perform the process of forming (or creating) a primary portion on a plurality of data group within a parade, thereby forming several primary portions. Then, the several primary portions of mobile service data may be grouped to form a primary RS frame. Herein, if stuffing bytes are added to the last primary portion, the primary RS frame may be formed after removing the stuffing byte. Also, the MPH frame decoder 1006 extracts mobile service data from regions C/D of the corresponding data group. Subsequently, the MPH frame decoder 1006 may perform the process of forming (or creating) a secondary portion on a plurality of data group within a parade, thereby forming several secondary portions. Then, the several secondary portions of mobile service data may be grouped to form a secondary RS frame. Herein, if stuffing bytes are added to the last secondary portion, the secondary RS frame may be formed after removing the stuffing byte.

More specifically, the RS frame decoder 1006 receives the RS-encoded and/or CRC-encoded mobile service data of each portion from the block decoder 1005. Then, the RS frame decoder 1006 groups several portions, which are input based upon RS frame-associated information output from the signaling information decoder 1013, thereby performing error correction. By referring to the RS frame mode value included in the RS frame-associated information, the RS frame decoder 1006 may form an RS frame and may also be informed of the number of RS code parity data bytes and the code size. Herein, the RS code is used to configure (or form) the RS frame. The RS frame decoder 1006 also refers to the RS frame-associated information in order to perform an inverse process of the RS frame encoder, which is included in the transmitting system, thereby correcting the errors within the RS frame. Thereafter, the RS frame decoder 1006 adds 1 MPEG synchronization data byte to the error-correction mobile service data packet. In an earlier process, the 1 MPEG synchronization data byte was removed from the mobile service data packet during the RS frame encoding process. Finally, the RS frame decoder 1006 outputs the processed mobile service data packet to the derandomizer 1007.

Figure 64:
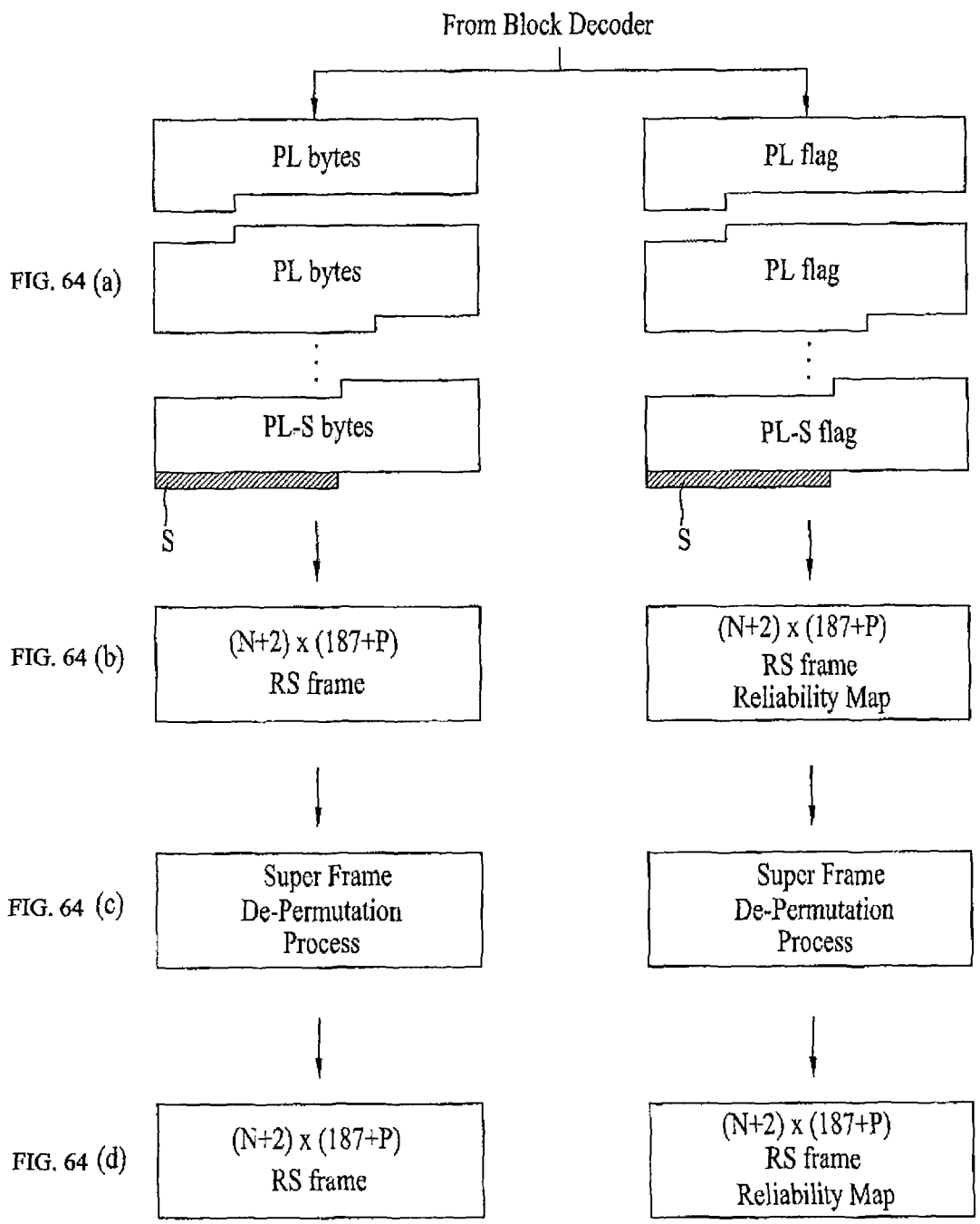

FIG. 64 illustrates, when the RS frame mode value is equal to '00', an exemplary process of grouping several portion being transmitted to a parade, thereby forming an RS frame and an RS frame reliability map, and an exemplary process of performing a row de-permutation process in super frame units as an inverse process of the transmitting system, thereby re-distinguishing (or identifying) the row-de-permuted RS frame and RS frame reliability map. More specifically, the RS frame decoder 1006 receives and groups a plurality of mobile service data bytes, in order to form an RS frame. According to the present invention, in transmitting system, the mobile service data correspond to data RS-encoded in RS frame units and also correspond to data row-permuted in super frame units. At this point, the mobile service data may already be error correction encoded (e.g., CRC-encoded). Alternatively, the error correction encoding process may be omitted.

It is assumed that, in the transmitting system, an RS frame having the size of (N+2)×(187+P) bytes is divided into M number of portions, and that the M number of mobile service data portions are assigned and transmitted to regions A/B/C/D in M number of data groups, respectively. In this case, in the receiving system, each mobile service data portion is grouped, as shown in FIG. 64(*a*), thereby forming an RS frame having the size of (N+2)×(187+P) bytes. At this point, when stuffing bytes (S) are added to at least one portion included in the corresponding RS frame and then transmitted, the stuffing bytes are removed, thereby configuring an RS frame and an RS frame reliability map. For example, as shown in FIG. 23, when S number of stuffing bytes are added to the corresponding portion, the S number of stuffing bytes are removed, thereby configuring the RS frame and the RS frame reliability map.

Herein, when it is assumed that the block decoder 1005 outputs a soft decision value for the decoding result, the RS frame decoder 1006 may decide the '0' and '1' of the corresponding bit by using the codes of the soft decision value. 8 bits that are each decided as described above are grouped to create 1 data byte. If the above-described process is performed on all soft decision values of several portions (or data groups) included in a parade, the RS frame having the size of (N+2)×(187+P) bytes may be configured.

Additionally, the present invention uses the soft decision value not only to configure the RS frame but also to configure a reliability map.

Herein, the reliability map indicates the reliability of the corresponding data byte, which is configured by grouping 8 bits, the 8 bits being decided by the codes of the soft decision value.

For example, when the absolute value of the soft decision value exceeds a pre-determined threshold value, the value of the corresponding bit, which is decided by the code of the corresponding soft decision value, is determined to be reliable. Conversely, when the absolute value of the soft decision value does not exceed the pre-determined threshold value, the value of the corresponding bit is determined to be unreliable. Thereafter, if even a single bit among the 8 bits, which are decided by the codes of the soft decision value and group to configure one data byte, is determined to be unreliable, the corresponding data byte is marked on the reliability map as an unreliable data byte.

Herein, determining the reliability of one data byte is only exemplary. More specifically, when a plurality of data bytes (e.g., at least 4 data bytes) are determined to be unreliable, the corresponding data bytes may also be marked as unreliable data bytes within the reliability map. Conversely, when all of the data bits within the one data byte are determined to be reliable (i.e., when the absolute value of the soft decision values of all 8 bits included in the one data byte exceed the predetermined threshold value), the corresponding data byte is marked to be a reliable data byte on the reliability map. Similarly, when a plurality of data bytes (e.g., at least 4 data bytes) are determined to be reliable, the corresponding data bytes may also be marked as reliable data bytes within the reliability map. The numbers proposed in the above-described example are merely exemplary and, therefore, do not limit the scope or spirit of the present invention.

The process of configuring the RS frame and the process of configuring the reliability map both using the soft decision value may be performed at the same time. Herein, the reliability information within the reliability map is in a one-to-one correspondence with each byte within the RS frame. For example, if a RS frame has the size of (N+2)×(187+P) bytes, the reliability map is also configured to have the size of (N+2)×(187+P) bytes. FIG. 64(*a'*) and FIG. 64(*b'*) respectively illustrate the process steps of configuring the reliability map according to the present invention.

At this point, the RS frame of FIG. 64(*b*) and the RS frame reliability map of FIG. 64(*b'*) are interleaved in super frame units (as shown in FIG. 21). Therefore, the RS frame and the RS frame reliability maps are grouped to create a super frame and a super frame reliability map. Subsequently, as shown in FIG. 64(*c*) and FIG. 64(*c'*), a de-permutation (or deinterleaving) process is performed in super frame units on the RS frame and the RS frame reliability maps, as an inverse process of the transmitting system. Then, when the de-permutation process is performed in super frame units, the processed data are divided into de-permuted (or deinterleaved) RS frames having the size of (N+2)×(187+P) bytes and de-permuted RS frame reliability maps having the size of (N+2)×(187+P) bytes, as shown in FIG. 64(*d*) and FIG. 64(*d'*). Subsequently, the RS frame reliability map is used on the divided RS frames in order to perform error correction.

Figure 65:
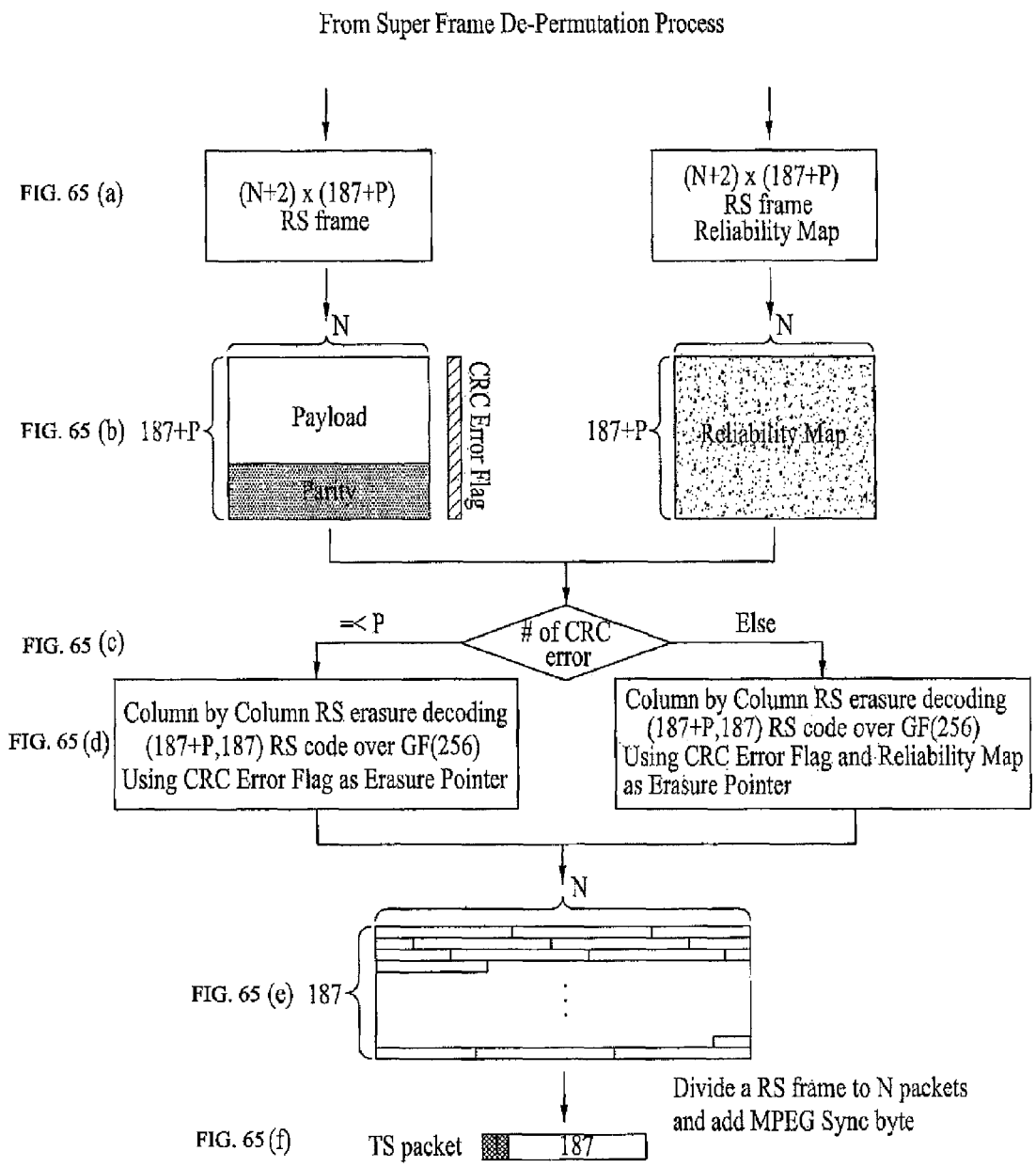

FIG. 65 illustrates example of the error correction processed according to embodiments of the present invention. FIG. 65 illustrates an example of performing an error correction process when the transmitting system has performed both RS encoding and CRC encoding processes on the RS frame.

As shown in FIG. 65(*a*) and FIG. 65(*a'*), when the RS frame having the size of (N+2)×(187+P) bytes and the RS frame reliability map having the size of (N+2)×(187+P) bytes are created, a CRC syndrome checking process is performed on the created RS frame, thereby verifying whether any error has occurred in each row. Subsequently, as shown in FIG. 65(*b*), a 2-byte checksum is removed to configure an RS frame having the size of N×(187+P) bytes. Herein, the presence (or existence) of an error is indicated on an error flag corresponding to each row. Similarly, since the portion of the reliability map corresponding to the CRC checksum has hardly any applicability, this portion is removed so that only N×(187+P) number of the reliability information bytes remain, as shown in FIG. 65(*b'*).

After performing the CRC syndrome checking process, as described above, a RS decoding process is performed in a column direction. Herein, a RS erasure correction process may be performed in accordance with the number of CRC error flags. More specifically, as shown in FIG. 65(*c*), the CRC error flag corresponding to each row within the RS frame is verified. Thereafter, the RS frame decoder 1006 determines whether the number of rows having a CRC error occurring therein is equal to or smaller than the maximum number of errors on which the RS erasure correction may be performed, when performing the RS decoding process in a column direction. The maximum number of errors corresponds to P number of parity bytes inserted when performing the RS encoding process. In the embodiment of the present invention, it is assumed that 48 parity bytes have been added to each column (i.e., P=48).

If the number of rows having the CRC errors occurring therein is smaller than or equal to the maximum number of errors (i.e., 48 errors according to this embodiment) that can be corrected by the RS erasure decoding process, a (235, 187)-RS erasure decoding process is performed in a column direction on the RS frame having (187+P) number of N-byte rows (i.e., 235 N-byte rows), as shown in FIG. 65(d). Thereafter, as shown in FIG. 65(e), the 48-byte parity data that have been added at the end of each column are removed. Conversely, however, if the number of rows having the CRC errors occurring therein is greater than the maximum number of errors (i.e., 48 errors) that can be corrected by the RS erasure decoding process, the RS erasure decoding process cannot be performed. In this case, the error may be corrected by performing a general RS decoding process. In addition, the reliability map, which has been created based upon the soft decision value along with the RS frame, may be used to further enhance the error correction ability (or performance) of the present invention.

More specifically, the RS frame decoder 1006 compares the absolute value of the soft decision value of the block decoder 1005 with the pre-determined threshold value, in order to determine the reliability of the bit value decided by the code of the corresponding soft decision value. Also, 8 bits, each being determined by the code of the soft decision value, are grouped to form one data byte. Accordingly, the reliability information on this one data byte is indicated on the reliability map. Therefore, as shown in FIG. 65(c), even though a particular row is determined to have an error occurring therein based upon a CRC syndrome checking process on the particular row, the present invention does not assume that all bytes included in the row have errors occurring therein. The present invention refers to the reliability information of the reliability map and sets only the bytes that have been determined to be unreliable as erroneous bytes. In other words, with disregard to whether or not a CRC error exists within the corresponding row, only the bytes that are determined to be unreliable based upon the reliability map are set as erasure points.

According to another method, when it is determined that CRC errors are included in the corresponding row, based upon the result of the CRC syndrome checking result, only the bytes that are determined by the reliability map to be unreliable are set as errors. More specifically, only the bytes corresponding to the row that is determined to have errors included therein and being determined to be unreliable based upon the reliability information, are set as the erasure points. Thereafter, if the number of error points for each column is smaller than or equal to the maximum number of errors (i.e., 48 errors) that can be corrected by the RS erasure decoding process, an RS erasure decoding process is performed on the corresponding column. Conversely, if the number of error points for each column is greater than the maximum number of errors (i.e., 48 errors) that can be corrected by the RS erasure decoding process, a general decoding process is performed on the corresponding column.

More specifically, if the number of rows having CRC errors included therein is greater than the maximum number of errors (i.e., 48 errors) that can be corrected by the RS erasure decoding process, either an RS erasure decoding process or a general RS decoding process is performed on a column that is decided based upon the reliability information of the reliability map, in accordance with the number of erasure points within the corresponding column. For example, it is assumed that the number of rows having CRC errors included therein within the RS frame is greater than 48. And, it is alin ordersumed that the number of erasure points decided based upon the reliability information of the reliability map is indicated as 40 erasure points in the first column and as 50 erasure points in the second column. In this case, a (235,187)-RS erasure decoding process is performed on the first column. Alternatively, a (235,187)-RS decoding process is performed on the second column. When error correction decoding is performed on all column directions within the RS frame by using the above-described process, the 48-byte parity data which were added at the end of each column are removed, as shown in FIG. 65(e).

As described above, even though the total number of CRC errors corresponding to each row within the RS frame is greater than the maximum number of errors that can be corrected by the RS erasure decoding process, when the number of bytes determined to have a low reliability level, based upon the reliability information on the reliability map within a particular column, while performing error correction decoding on the particular column. Herein, the difference between the general RS decoding process and the RS erasure decoding process is the number of errors that can be corrected. More specifically, when performing the general RS decoding process, the number of errors corresponding to half of the number of parity bytes (i.e., (number of parity bytes)/2) that are inserted during the RS encoding process may be error corrected (e.g., 24 errors may be corrected). Alternatively, when performing the RS erasure decoding process, the number of errors corresponding to the number of parity bytes that are inserted during the RS encoding process may be error corrected (e.g., 48 errors may be corrected).

After performing the error correction decoding process, as described above, a RS frame configured of 187 N-byte rows (or packet) may be obtained as shown in FIG. 65(e). The RS frame having the size of N×187 bytes is output by the order of N number of 187-byte units. At this point, 1 MPEG synchronization byte, which had been removed by the transmitting system, is added to each 187-byte packet, as shown in FIG. 65(f). Therefore, a 188-byte unit mobile service data packet is output.

As described above, the RS frame decoded mobile service data is output to the data derandomizer 1007. The data derandomizer 1007 performs a derandomizing process, which corresponds to the inverse process of the randomizer included in the transmitting system, on the received mobile service data. Thereafter, the derandomized data are output, thereby obtaining the mobile service data transmitted from the transmitting system. In the present invention, the RS frame decoder 1006 may perform the data derandomizing function. An MPH frame decoder may be configured of M number of RS frame decoders provided in parallel, wherein the number of RS frame encoders is equal to the number of parades (=M) within an MPH frame, a multiplexer for multiplexing each portion and being provided to each input end of the M number of RS frame decoders, and a demultiplexer for demultiplexing each portion and being provided to each output end of the M number of RS frame decoders.

General Digital Broadcast Receiving System

Figure 66:
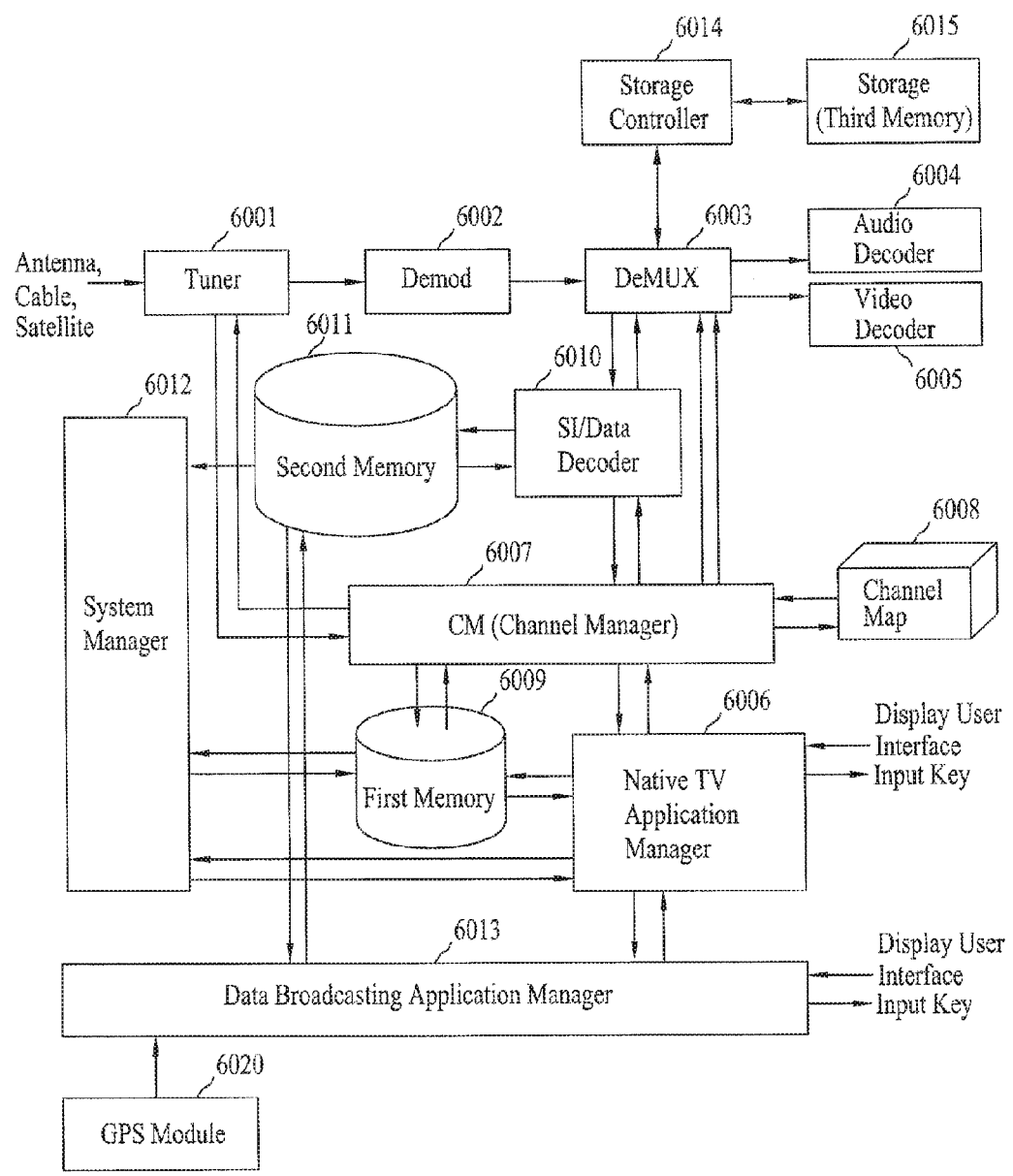
FIG. 66 illustrates a block diagram of a receiving system according to an embodiment of the present invention.

FIG. 66 illustrates a block diagram showing a structure of a digital broadcast receiving system according to an embodiment of the present invention. Herein, the demodulating unit of FIG. 36 may be applied in the digital broadcast receiving system. Referring to FIG. 66, the digital broadcast receiving system includes a tuner 6001, a demodulating unit 6002, a demultiplexer 6003, an audio decoder 6004, a video decoder 6005, a native TV application manager 6006, a channel manager 6007, a channel map 6008, a first memory 6009, an SI and/or data decoder 6010, a second memory 6011, a system manager 6012, a data broadcast application manager 6013, a storage controller 6014, a third memory 6015, and a GPS module 6020. Herein, the first memory 6009 corresponds to a non-volatile random access memory (NVRAM) (or a flash memory). The third memory 6015 corresponds to a large-scale storage device, such as a hard disk drive (HDD), a memory chip, and so on.

The tuner 6001 tunes a frequency of a specific channel through any one of an antenna, cable, and satellite. Then, the tuner 6001 down-converts the tuned frequency to an intermediate frequency (IF), which is then output to the demodulating unit 6002. At this point, the tuner 6001 is controlled by the channel manager 6007. Additionally, the result and strength of the broadcast signal of the tuned channel are also reported to the channel manager 6007. The data that are being received by the frequency of the tuned specific channel include main service data, mobile service data, and table data for decoding the main service data and mobile service data.

According to the embodiment of the present invention, audio data and video data for mobile broadcast programs may be applied as the mobile service data. Such audio data and video data are compressed by various types of encoders in order to be transmitted to a broadcasting station. In this case, the video decoder 6004 and the audio decoder 6005 will be provided in the receiving system in order to correspond to each of the encoders used for the compression process. Thereafter, the decoding process will be performed by the video decoder 6004 and the audio decoder 6005. Then, the processed video and audio data will be provided to the users. Examples of the encoding/decoding scheme for the audio data may include AC 3, MPEG 2 AUDIO, MPEG 4 AUDIO, AAC, AAC+, HE AAC, AAC SBR, MPEG-Surround, and BSAC. And, examples of the encoding/decoding scheme for the video data may include MPEG 2 VIDEO, MPEG 4 VIDEO, H.264, SVC, and VC-1.

The audio decoder 6004 may extract audio data and supplementary information from the audio stream demultiplexed by the demultiplexer 6003. The audio decoder 6004 may inversely scale the extracted audio data on the basis of the scale factor indicated by scale factor index information included in the supplementary information and restore the audio signal.

The audio decoder 6004 may inversely quantize the audio data, convert the inversely quantized audio data into a time-domain signal for each block according to a block length indicated by an identifier included in the supplementary information, and restore the audio signal.

The audio decoder 6004 may decode the audio data on the basis of Huffman table information and region identifying information included in the audio data and restore the audio signal.

The audio decoder 6004 may extract an audio parameter from the audio stream demultiplexed by the demultiplexer 6003. The audio decoder 6004 may calculate subframe number information included in the audio stream on the basis of the extracted audio parameter and calculate start location information of the subframes on the basis of the calculated subframe number information. The audio decoder 6004 may decode the audio data included in the subframes according to the audio parameter on the basis of the calculated start location information.

The audio decoder 6004 may extract the audio data from the audio stream demultiplexed by the demultiplexer 6003, inversely quantize the audio data, and restore a stereo audio signal on the basis of mid data and side data included in the inversely quantized audio data.

The audio decoder 6004 may extract a parameter from the audio stream demultiplexed by the demultiplexer 6003, decode the extracted parameter, and restore the audio signal in an extended region. The audio decoder 6004 may decode the extracted parameter according to algebraic code excited linear prediction (ACELP) and transform coded excitation (TCX) and restore the audio signal in the extended region. If the parameter includes spectral band replication (SBR), the audio decoder 6004 may decode the parameter and restore the audio signal in a high frequency region of a mono channel.

Depending upon the embodiment of the present invention, examples of the mobile service data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the mobile service data may correspond to meta data. For example, the meta data may be written in XML format in order to be transmitted through a DSM-CC protocol.

The demodulating unit 6002 performs VSB-demodulation and channel equalization on the signal being output from the tuner 6001, thereby identifying the main service data and the mobile service data. Thereafter, the identified main service data and mobile service data are output in TS packet units. An example of the demodulating unit 6002 is shown in FIG. 36 to FIG. 65. Therefore, the structure and operation of the demodulator will be described in detail in a later process. However, this is merely exemplary and the scope of the present invention is not limited to the example set forth herein. In the embodiment given as an example of the present invention, only the mobile service data packet output from the demodulating unit 6002 is input to the demultiplexer 6003. In this case, the main service data packet is input to another demultiplexer (not shown) that processes main service data packets. Herein, the storage controller 6014 is also connected to the other demultiplexer in order to store the main service data after processing the main service data packets. The demultiplexer of the present invention may also be designed to process both mobile service data packets and main service data packets in a single demultiplexer.

The storage controller 6014 is interfaced with the demultipelxer in order to control instant recording, reserved (or pre-programmed) recording, time shift, and so on of the mobile service data and/or main service data. For example, when one of instant recording, reserved (or pre-programmed) recording, and time shift is set and programmed in the receiving system (or receiver) shown in FIG. 66, the corresponding mobile service data and/or main service data that are input to the demultiplexer are stored in the third memory 6015 in accordance with the control of the storage controller 6014. The third memory 6015 may be described as a temporary storage area and/or a permanent storage area. Herein, the temporary storage area is used for the time shifting function, and the permanent storage area is used for a permanent storage of data according to the user's choice (or decision).

When the data stored in the third memory 6015 need to be reproduced (or played), the storage controller 6014 reads the corresponding data stored in the third memory 6015 and outputs the read data to the corresponding demultiplexer (e.g., the mobile service data are output to the demultiplexer 6003 shown in FIG. 66). At this point, according to the embodiment of the present invention, since the storage capacity of the third memory 6015 is limited, the compression encoded mobile service data and/or main service data that are being input are directly stored in the third memory 6015 without any modification for the efficiency of the storage capacity. In this case, depending upon the reproduction (or reading) command, the data read from the third memory 6015 pass trough the demultiplexer in order to be input to the corresponding decoder, thereby being restored to the initial state.

The storage controller 6014 may control the reproduction (or play), fast-forward, rewind, slow motion, instant replay functions of the data that are already stored in the third memory 6015 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being input correspond to the analog format, for example, if the transmission mode is NTSC, PAL, and so on, the storage controller 6014 compression encodes the input data and stored the compression-encoded data to the third memory 6015. In order to do so, the storage controller 6014 may include an encoder, wherein the encoder may be embodied as one of software, middleware, and hardware. Herein, an MPEG encoder may be used as the encoder according to an embodiment of the present invention. The encoder may also be provided outside of the storage controller 6014.

Meanwhile, in order to prevent illegal duplication (or copies) of the input data being stored in the third memory 6015, the storage controller 6014 scrambles (or encrypts) the input data and stores the scrambled (or encrypted) data in the third memory 6015. Accordingly, the storage controller 6014 may include a scramble algorithm (or encryption algorithm) for scrambling the data stored in the third memory 6015 and a descramble algorithm (or decryption algorithm) for descrambling (or decrypting) the data read from the third memory 6015. The scrambling method may include using an arbitrary key (e.g., control word) to modify a desired set of data, and also a method of mixing signals.

Meanwhile, the demultiplexer 6003 receives the real-time data output from the demodulating unit 6002 or the data read from the third memory 6015 and demultiplexes the received data. In the example given in the present invention, the demultiplexer 6003 performs demultiplexing on the mobile service data packet. Therefore, in the present invention, the receiving and processing of the mobile service data will be described in detail. However, depending upon the many embodiments of the present invention, not only the mobile service data but also the main service data may be processed by the demultiplexer 6003, the audio decoder 6004, the video decoder 6005, the native TV application manager 6006, the channel manager 6007, the channel map 6008, the first memory 6009, the SI and/or data decoder 6010, the second memory 6011, a system manager 6012, the data broadcast application manager 6013, the storage controller 6014, the third memory 6015, and the GPS module 6020. Thereafter, the processed data may be used to provide diverse services to the users.

The demultiplexer 6003 demultiplexes mobile service data and system information (SI) tables from the mobile service data packet input in accordance with the control of the SI and/or data decoder 6010. Thereafter, the demultiplexed mobile service data and SI tables are output to the SI and/or data decoder 6010 in a section format. In this case, it is preferable that data for the data service are used as the mobile service data that are input to the SI and/or data decoder 6010. In order to extract the mobile service data from the channel through which mobile service data are transmitted and to decode the extracted mobile service data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number.

FIG. 67 illustrates a VCT syntax according to an embodiment of the present invention. The VCT syntax of FIG. 67 is configured by including at least one of a table id field, a section syntax indicator field, a private indicator field, a section length field, a transport stream id field, a version number field, a current next indicator field, a section number field, a last section number field, a protocol version field, and a num_channels_in_section field.

The VCT syntax further includes a first 'for' loop repetition statement that is repeated as much as the num_channels_in_section field value. The first repetition statement may include at least one of a short name field, a major channel number field, a minor channel number field, a modulation mode field, a carrier frequency field, a channel TSID field, a program number field, an ETM location field, an access controlled field, a hidden field, a service type field, a source id field, a descriptor length field, and a second 'for' loop statement that is repeated as much as the number of descriptors included in the first repetition statement. Herein, the second repetition statement will be referred to as a first descriptor loop for simplicity. The descriptor descriptors( ) included in the first descriptor loop is separately applied to each virtual channel.

Furthermore, the VCT syntax may further include an additional descriptor length field, and a third 'for' loop statement that is repeated as much as the number of descriptors additionally added to the VCT. For simplicity of the description of the present invention, the third repetition statement will be referred to as a second descriptor loop. The descriptor additional descriptors( ) included in the second descriptor loop is commonly applied to all virtual channels described in the VCT.

As described above, referring to FIG. 67, the table_id field indicates a unique identifier (or identification) (ID) that can identify the information being transmitted to the table as the VCT. More specifically, the table_id field indicates a value informing that the table corresponding to this section is a VCT. For example, a OxC8 value may be given to the table_id field.

The version number field indicates the version number of the VCT. The section number field indicates the number of this section. The last section number field indicates the number of the last section of a complete VCT. And, the num channel in section field designates the number of the overall virtual channel existing within the VCT section. Furthermore, in the first 'for' loop repetition statement, the short name field indicates the name of a virtual channel. The major channel number field indicates a 'major' channel number associated with the virtual channel defined within the first repetition statement, and the minor channel number field indicates a 'minor' channel number. More specifically, each of the channel numbers should be connected to the major and minor channel numbers, and the major and minor channel numbers are used as user reference numbers for the corresponding virtual channel.

The program_number field is shown for connecting the virtual channel having an MPEG-2 program association table (PAT) and program map table (PMT) defined therein, and the program_number field matches the program number within the PAT/PMT. Herein, the PAT describes the elements of a program corresponding to each program number, and the PAT indicates the PID of a transport packet transmitting the PMT. The PMT described subordinate information, and a PID list of the transport packet through which a program identification number and a separate bit sequence, such as video and/or audio data configuring the program, are being transmitted.

FIG. 68 illustrates a service_type field according to an embodiment of the present invention. The service_type field indicates the service type provided in a corresponding virtual channel. Referring to FIG. 68, it is provided that the service_type field should only indicate an analog television, a digital television, digital audio data, and digital video data. Also, according to the embodiment of the present invention, it may be provided that a mobile broadcast program should be designated to the service_type field. The service_type field, which is parsed by the SI and/or data decoder 6010 may be provided to a receiving system, as shown in FIG. 66, and used accordingly. According to other embodiments of the present invention, the parsed service_type field may also be provided to each of the audio decoder 6004 and video decoder 6005, in order to be used in the decoding process.

The source_id field indicates a program source connected to the corresponding virtual channel. Herein, a source refers to a specific source, such as an image, a text, video data, or sound. The source_id field value has a unique value within the transport stream transmitting the VCT. Meanwhile, a service location descriptor may be included in a descriptor loop (i.e., descriptor{ }) within a next 'for' loop repetition statement. The service location descriptor may include a stream type, PID, and language code for each elementary stream.

FIG. 69 illustrates a service location descriptor according to an embodiment of the present invention. As shown in FIG. 69, the service location descriptor may include a descriptor tag field, a descriptor length field, and a PCR PID field. Herein, the PCR PID field indicates the PID of a transport stream packet within a program specified by a program number field, wherein the transport stream packet includes a valid PCR field. Meanwhile, the service location descriptor includes a number elements field in order to indicate a number of PIDs used in the corresponding program. The number of repetition of a next 'for' descriptor loop repetition statement can be decided, depending upon the value of the number elements field. Referring to FIG. 69, the 'for' loop repetition statement includes a stream_type field, an elementary_PID field, and an ISO 639 language code field. Herein, the stream_type field indicates the stream type of the corresponding elementary stream (i.e., video/audio data). The elementary_PID field indicates the PID of the corresponding elementary stream. The ISO 639 language code field indicates a language code of the corresponding elementary stream.

FIG. 70 illustrates examples that may be assigned to the stream_type field according to the present invention. As shown in FIG. 70, ISO/IEC 11172 Video, ITU-T Rec. H.262 I ISO/IEC 13818-2 Video or ISO/IEC 11172-2 constrained parameter video stream, ISO/IEC 11172 Audio, ISO/IEC 13818-3 Audio, ITU-T Rec. H.222.0 I ISO/IEC 13818-1 private sections, ITU-T Rec. H.222.0 I ISO/IEC 138181 PES packets containing private data, ISO/IEC 13522 MHEG, ITU-T Rec. H.222.0 I ISO/IEC 13818-1 Annex A DSM CC, ITU-T Rec. H.222.1, ISO/IEC 13818-6 type A, ISO/IEC 13818-6 type B, ISO/IEC 13818-6 type C, ISO/IEC 13818-6 type D, ISO/IEC 13818-1 auxiliary, and so on may be applied as the stream type. Meanwhile, according to the embodiment of the present invention, MPH video stream: Non-hierarchical mode, MPH audio stream: Non-hierarchical mode, MPH Non-A/V stream: Non-hierarchical mode, MPH High Priority video stream: Hierarchical mode, MPH High Priority audio stream: Hierarchical mode, MPH Low Priority video stream: Hierarchical mode, MPH Low priority audio stream: Hierarchical mode, and so on may further be applied as the stream type.

As described above, "MPH" corresponds to the initials of "mobile," "pedestrian," and "handheld" and represents the opposite concept of a fixed-type system. Therefore, the MPH video stream: Non-hierarchical mode, the MPH audio stream: Non-hierarchical mode, the MPH Non-A/V stream: Nonhierarchical mode, the MPH High Priority video stream: Hierarchical mode, the MPH High Priority audio stream: Hierarchical mode, the MPH Low Priority video stream:

Hierarchical mode, and the MPH Low priority audio stream: Hierarchical mode correspond to stream types that are applied when mobile broadcast programs are being transmitted and received. Also the Hierarchical mode and the Non-hierarchical mode each correspond to values that are used in stream types having different priority levels. Herein, the priority level is determined based upon a hierarchical structure applied in any one of the encoding or decoding method.

Therefore, when a hierarchical structure-type codec is used, a field value including the hierarchical mode and the non-hierarchical mode is respectively designated in order to identify each stream. Such stream type information is parsed by the SI and/or data decoder 6010, in order to be provided to the video and audio decoders 6004 and 6005. Thereafter, each of the video and audio decoders 6004 and 6005 uses the parsed stream type information in order to perform the decoding process. Other stream types that may be applied in the present invention may include MPEG 4 AUDIO, AC 3, AAC, AAC+, BSAC, HE AAC, AAC SBR, and MPEG-S for the audio data, and may also include MPEG 2 VIDEO, MPEG 4 VIDEO, H.264, SVC, and VC-1 for the video data.

Furthermore, referring to FIG. 70, in fields using the hierarchical mode and the non-hierarchical mode, such as the MPH video stream: Non-hierarchical mode and the MPH audio stream: Non-hierarchical mode, examples of using the MPEG 4 AUDIO, AC 3, AAC, AAC+, BSAC, HE AAC, AAC SBR, and MPEG-S for the audio data, and the MPEG 2 VIDEO, MPEG 4 VIDEO, H.264, SVC, and VC-1 for the video data may also be respectively used as replacements for each of the audio stream and the video stream may be considered as other embodiments of the present invention and may, therefore, be included in the scope of the present invention. Meanwhile, the stream_type field may be provided as one of the fields within the PMT. And, in this case, it is apparent that such stream_type field includes the above-described syntax. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.).

FIG. 71 illustrates bit stream syntax for an event information table (EIT) according to the present invention. In this embodiment, the EIT shown in FIG. 71 corresponds to a PSIP table including information on a title, start time, duration, and so on of an event in a virtual channel. Referring to FIG. 71, the EIT is configured of a plurality of fields including a table id field, a section syntax indicator field, a private indicator field, a source_ID, a version numbers in section field, a current next indicator field, and a num_event field. More specifically, the table id field is an 8-bit field having the value of 'oxCB', which indicates that the corresponding section is included in the EIT. The section syntax indicator field is a 1-bit field having the value of '1'. This indicates that the corresponding section passes through the section length field and is in accordance with a generic section syntax. The private indicator field corresponds to a 1-bit field having the value of '1'.

Also, the source_ID corresponds to an ID identifying a virtual channel that carries an event shown in the above-described table. The version numbers in section field indicates the version of an element included in the event information table. In the present invention, with respect to the previous version number, event change information is included in the event information table, wherein the event change information has a new version number is recognized as the latest change in information. The current next indicator field indicates whether the event information included in the corresponding EIT is current information or next information. And, finally, the num_event field represents the number of events included in the channel having a source ID. More specifically, an event loop shown below is repeated as many times as the number of events.

The above-described EIT field is commonly applied to at least one or more events included in one EIT syntax. A loop statement, which is included as "for (j=0; j<num event in section; j++){ }", describes the characteristics of each event. The following fields represent detailed information of each individual event. Therefore, the following fields are individually applied to each corresponding event described by the EIT syntax. An event ID included in an event loop is an identifier for identifying each individual event. The number of the event ID corresponds to a portion of the identifier for even extended text message (i.e., ETM ID). A start_time field indicates the starting time of an event. Therefore, the start_time field collects the starting time information of a program provided from electronic program information. A length in seconds field indicates the duration of an event. Therefore, the length in seconds field collects the ending time information of a program provided from electronic program information. More specifically, the ending time information is collected by adding the start_time field value and the length in seconds field value. A title text( ) field may be used to indicate the tile of a broadcast program.

Meanwhile, the descriptor applied to each event may be included in the EIT. Herein, a descriptors length field indicates the length of a descriptor. Also, a descriptor loop (i.e., descriptor{ }) included in a 'for' loop repetition statement includes at least one of an AC-3 audio descriptor, an MPEG 2 audio descriptor, an MPEG 4 audio descriptor, an AAC descriptor, an AAC+ descriptor, an HE AAC descriptor, an AAC SBR descriptor, an MPEG surround descriptor, a BSAC descriptor, an MPEG 2 video descriptor, an MPEG 4 video descriptor, an H.264 descriptor, an SVC descriptor, and a VC-1 descriptor. Herein, each descriptor describes information on audio/video codec applied to each event. Such codec information may be provided to the audio/video decoder 6004 and 6005 and used in the decoding process.

Finally, the DCCT/DCCSCT transmits information associated with automatic (or direct) channel change. And, the MGT transmits the versions and PID information of the above-mentioned tables included in the PSIP. Each of the above-described tables included in the PSI/PSIP is configured of a basic unit referred to as a "section", and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PSIP, or a combination of tables included in both the PSI and the PSIP. In order to parse and decode the mobile service data, at least one of the PAT and PMT included in the PSI, and the VCT included in the PSIP is required. For example, the PAT may include the system information for transmitting the mobile service data, and the PID of the PMT corresponding to the mobile service data (or program number). The PMT may include the PID of the TS packet used for transmitting the mobile service data. The VCT may include information on the virtual channel for transmitting the mobile service data, and the PID of the TS packet for transmitting the mobile service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, when the mobile service data correspond to audio data and video data, it is preferable that the mobile service data included (or loaded) in a payload within a TS packet correspond to PES type mobile service data. According to another embodiment of the present invention, when the mobile service data correspond to the data for the data service (or data service data), the mobile service data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95' is assigned as the value of a stream_type field included in the service location descriptor of the PMT or the VCT. More specifically, when the PMT or VCT stream_type field value is '0x95', the receiving system may acknowledge the reception of the data broadcast program including mobile service data. At this point, the mobile service data may be transmitted by a data/object carousel method. The data/object carousel method corresponds to repeatedly transmitting identical data on a regular basis.

At this point, according to the control of the SI and/or data decoder 6010, the demultiplexer 6003 performs section filtering, thereby discarding repetitive sections and outputting only the non-repetitive sections to the SI and/or data decoder 6010. The demultiplexer 6003 may also output only the sections configuring desired tables (e.g., VCT or EIT) to the SI and/or data decoder 6010 by section filtering. Herein, the VCT or EIT may include a specific descriptor for the mobile service data. However, the present invention does not exclude the possibilities of the mobile service data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 6003 performs the section filtering process by referring to a table id field, a version number field, a section number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 6003 may output only an application information table (AIT) to the SI and/or data decoder 6010 by section filtering. The AIT includes information on an application being operated in the receiver for the data service. The AIT may also be referred to as an XAIT, and an AMT. Therefore, any table including application information may correspond to the following description. When the AIT is transmitted, a value of '0x05' may be assigned to a stream type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original network id, transport stream id, and service_id fields may be used for detecting the application information. The component_tag field designates an elementary stream carrying a DSI of a corresponding object carousel. The original network id field indicates a DVB-SI original network id of the TS providing transport connection. The transport stream id field indicates the MPEG TS of the TS providing transport connection, and the service_id field indicates the DVB-SI of the service providing transport connection. Information on a specific channel may be obtained by using the original network id field, the transport stream id field, and the service_id field. The data service data, such as the application data, detected by using the above-described method may be stored in the second memory 6011 by the SI and/or data decoder 6010.

The SI and/or data decoder 6010 parses the DSM-CC section configuring the demultiplexed mobile service data. Then, the mobile service data corresponding to the parsed result are stored as a database in the second memory 6011. The SI and/or data decoder 6010 groups a plurality of sections having the same table identification (table id) in order to configure a table, which is then parsed. Thereafter, the parsed result is stored as a database in the second memory 6011. At this point, by parsing data and/or sections, the SI and/or data decoder 6010 reads all of the remaining actual section data that are not section-filtered by the demultiplexer 6003. Then, the SI and/or data decoder 6010 stores the read data to the second memory 6011. The second memory 6011 corresponds to a table and data/object carousel database storing system information parsed from tables and mobile service data parsed from the DSM-CC section. Herein, a table id field, a section number field, and a last section number field included in the table may be used to indicate whether the corresponding table is configured of a single section or a plurality of sections. For example, TS packets having the PID of the VCT are grouped to form a section, and sections having table identifiers allocated to the VCT are grouped to form the VCT. When the VCT is parsed, information on the virtual channel to which mobile service data are transmitted may be obtained.

Also, according to the present invention, the SI and/or data decoder 6010 parses the SLD of the VCT, thereby transmitting the stream type information of the corresponding elementary stream to the audio decoder 6004 or the video decoder 6005. In this case, the corresponding audio decoder 6004 or video decoder 6005 uses the transmitted stream type information in order to perform the audio or video decoding process. Furthermore, according to the present invention, the SI and/or data decoder 6010 parses an AC-3 audio descriptor, an MPEG 2 audio descriptor, an MPEG 4 audio descriptor, an AAC descriptor, an AAC+ descriptor, an HE AAC descriptor, an AAC SBR descriptor, an MPEG surround descriptor, a BSAC descriptor, an MPEG 2 video descriptor, an MPEG 4 video descriptor, an H.264 descriptor, an SVC descriptor, a VC-1 descriptor, and so on, of the EIT, thereby transmitting the audio or video codec information of the corresponding event to the audio decoder 6004 or video decoder 6005. In this case, the corresponding audio decoder 6004 or video decoder 6005 uses the transmitted audio or video codec information in order to perform an audio or video decoding process.

The obtained application identification information, service component identification information, and service information corresponding to the data service may either be stored in the second memory 6011 or be output to the data broadcasting application manager 6013. In addition, reference may be made to the application identification information, service component identification information, and service information in order to decode the data service data. Alternatively, such information may also prepare the operation of the application program for the data service. Furthermore, the SI and/or data decoder 6010 controls the demultiplexing of the system information table, which corresponds to the information table associated with the channel and events. Thereafter, an A/V PID list may be transmitted to the channel manager 6007.

The channel manager 6007 may refer to the channel map 6008 in order to transmit a request for receiving system-related information data to the SI and/or data decoder 6010, thereby receiving the corresponding result. In addition, the channel manager 6007 may also control the channel tuning of the tuner 6001. Furthermore, the channel manager 6007 may directly control the demultiplexer 6003, in order to set up the A/V PID, thereby controlling the audio decoder 6004 and the video decoder 6005.

The audio decoder 6004 and the video decoder 6005 may respectively decode and output the audio data and video data demultiplexed from the main service data packet. Alternatively, the audio decoder 6004 and the video decoder 6005 may respectively decode and output the audio data and video data demultiplexed from the mobile service data packet. Meanwhile, when the mobile service data include data service data, and also audio data and video data, it is apparent that the audio data and video data demultiplexed by the demultiplexer 6003 are respectively decoded by the audio decoder 6004 and the video decoder 6005. For example, an audio-coding (AC)-3 decoding algorithm, an MPEG-2 audio decoding algorithm, an MPEG-4 audio decoding algorithm, an AAC decoding algorithm, an AAC+ decoding algorithm, an HE AAC decoding algorithm, an AAC SBR decoding algorithm, an MPEG surround decoding algorithm, and a BSAC decoding algorithm may be applied to the audio decoder 6004. Also, an MPEG-2 video decoding algorithm, an MPEG-4 video decoding algorithm, an H.264 decoding algorithm, an SVC decoding algorithm, and a VC-1 decoding algorithm may be applied to the video decoder 6005. Accordingly, the decoding process may be performed.

Meanwhile, the native TV application manager 6006 operates a native application program stored in the first memory 6009, thereby performing general functions such as channel change. The native application program refers to software stored in the receiving system upon shipping of the product. More specifically, when a user request (or command) is transmitted to the receiving system through a user interface (UI), the native TV application manger 6006 displays the user request on a screen through a graphic user interface (GUI), thereby responding to the user's request. The user interface receives the user request through an input device, such as a remote controller, a key pad, a jog controller, an a touch-screen provided on the screen, and then outputs the received user request to the native TV application manager 6006 and the data broadcasting application manager 6013. Furthermore, the native TV application manager 6006 controls the channel manager 6007, thereby controlling channel-associated operations, such as the management of the channel map 6008, and controlling the SI and/or data decoder 6010. The native TV application manager 6006 also controls the GUI of the overall receiving system, thereby storing the user request and status of the receiving system in the first memory 6009 and restoring the stored information.

The channel manager 6007 controls the tuner 6001 and the SI and/or data decoder 6010 in order to manage the channel map 6008 so that it can respond to the channel request made by the user. More specifically, channel manager 6007 sends a request to the SI and/or data decoder 6010 so that the tables associated with the channels that are to be tuned are parsed. The results of the parsed tables are reported to the channel manager 6007 by the SI and/or data decoder 6010. Thereafter, based on the parsed results, the channel manager 6007 updates the channel map 6008 and sets up a PID in the demultiplexer 6003 for demultiplexing the tables associated with the data service data from the mobile service data.

The system manager 6012 controls the booting of the receiving system by turning the power on or off. Then, the system manager 6012 stores ROM images (including downloaded software images) in the first memory 6009. More specifically, the first memory 6009 stores management programs such as operating system (OS) programs required for managing the receiving system and also application program executing data service functions. The application program is a program processing the data service data stored in the second memory 6011 in order to provide the user with the data service. If the data service data are stored in the second memory 6011, the corresponding data service data are processed by the above-described application program or by other application programs, thereby being provided to the user. The management program and application program stored in the first memory 6009 may be updated or corrected to a newly downloaded program. Furthermore, the storage of the stored management program and application program is maintained without being deleted even if the power of the system is shut down. Therefore, when the power is supplied, the programs may be executed without having to be newly downloaded once again.

The application program for providing data service according to the present invention may either be initially stored in the first memory 6009 upon the shipping of the receiving system, or be stored in the first memory 6009 after being downloaded. The application program for the data service (i.e., the data service providing application program) stored in the first memory 6009 may also be deleted, updated, and corrected. Furthermore, the data service providing application program may be downloaded and executed along with the data service data each time the data service data are being received.

When a data service request is transmitted through the user interface, the data broadcasting application manager 6013 operates the corresponding application program stored in the first memory 6009 in order to process the requested data, thereby providing the user with the requested data service. And, in order to provide such data service, the data broadcasting application manager 6013 supports the graphic user interface (GUI). Herein, the data service may be provided in the form of text (or short message service (SMS)), voice message, still image, and moving image. The data broadcasting application manager 6013 may be provided with a platform for executing the application program stored in the first memory 6009. The platform may be, for example, a Java virtual machine for executing the Java program. Hereinafter, an example of the data broadcasting application manager 6013 executing the data service providing application program stored in the first memory 6009, in order to process the data service data stored in the second memory 6011, thereby providing the user with the corresponding data service will now be described in detail.

Assuming that the data service corresponds to a traffic information service, the data service according to the present invention is provided to the user of a receiver that is not equipped with an electronic map and/or a GPS system in the form of at least one of a text (or short message service (SMS)), a voice message, a graphic message, a still image, and a moving image. In this case, when a GPS module 6020 is mounted on the receiving system, as shown in FIG. 66, the GPS module 6020 receives satellite signals transmitted from a plurality of low earth orbit satellites and extracts the current position (or location) information (e.g., longitude, latitude, altitude), thereby outputting the extracted information to the data broadcasting application manager 6013.

At this point, it is assumed that the electronic map including information on each link and nod and other diverse graphic information are stored in one of the second memory 6011, the first memory 6009, and another memory that is not shown. More specifically, according to the request made by the data broadcasting application manager 6013, the data service data stored in the second memory 6011 are read and input to the data broadcasting application manager 6013. The data broadcasting application manager 6013 translates (or deciphers) the data service data read from the second memory 6011, thereby extracting the necessary information according to the contents of the message and/or a control signal. In other words, the data broadcasting application manager 6013 uses the current position information and the graphic information, so that the current position information can be processed and provided to the user in a graphic format.

Figure 72:
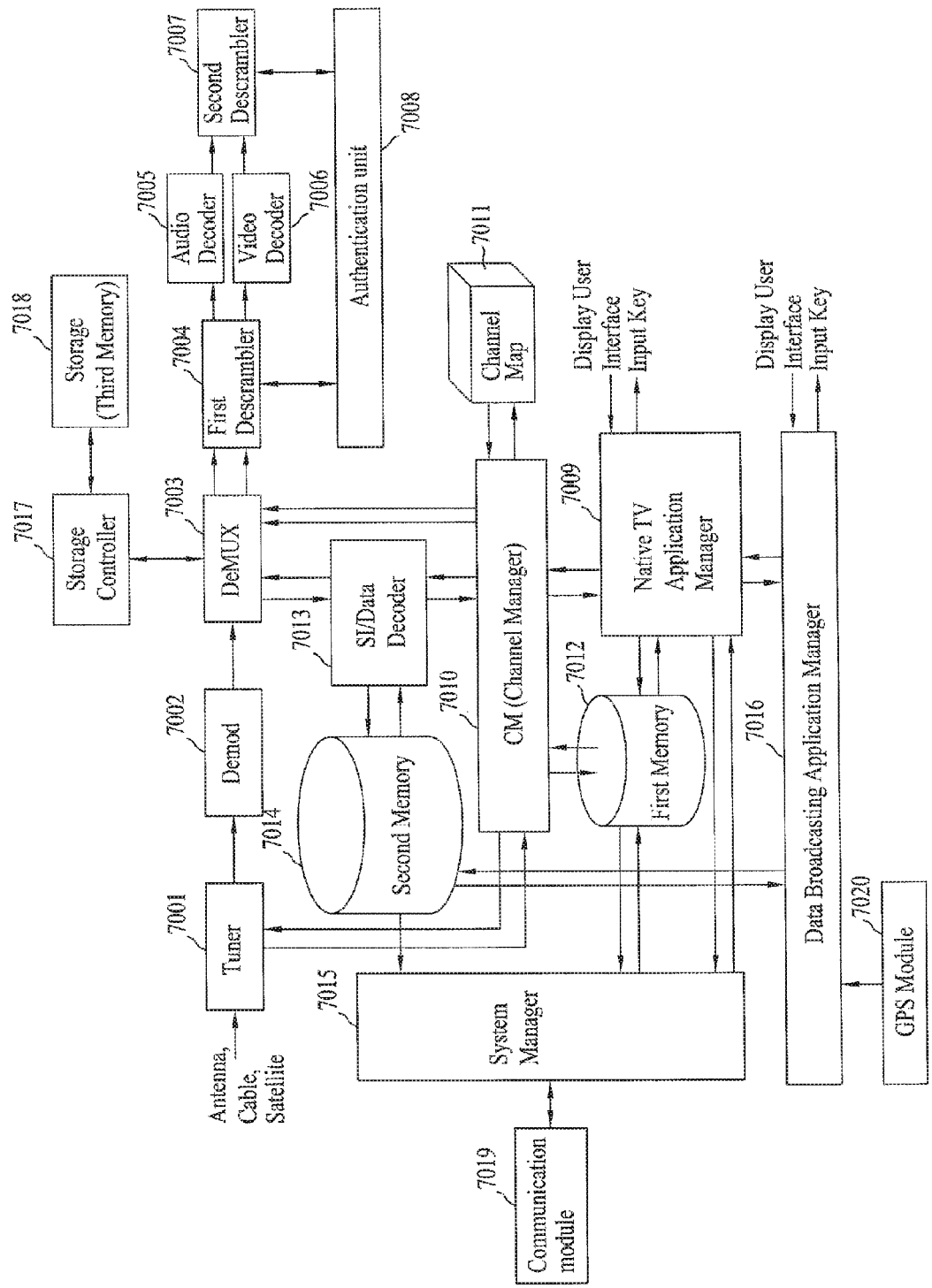
FIG. 72 illustrates a block diagram of a receiving system according to another embodiment of the present invention.

FIG. 72 illustrates a block diagram showing the structure of a digital broadcast (or television) receiving system according to another embodiment of the present invention. Referring to FIG. 72, the digital broadcast receiving system includes a tuner 7001, a demodulating unit 7002, a demultiplexer 7003, a first descrambler 7004, an audio decoder 7005, a video decoder 7006, a second descrambler 7007, an authentication unit 7008, a native TV application manager 7009, a channel manager 7010, a channel map 7011, a first memory 7012, a data decoder 7013, a second memory 7014, a system manager 7015, a data broadcasting application manager 7016, a storage controller 7017, a third memory 7018, a telecommunication module 7019, and a GPS module 7020. Herein, the third memory 7018 is a mass storage device, such as a hard disk drive (HDD) or a memory chip. Also, during the description of the digital broadcast (or television or DTV) receiving system shown in FIG. 72, the components that are identical to those of the digital broadcast receiving system of FIG. 66 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 7004 and 7007, and the authentication means will be referred to as an authentication unit 7008. Such naming of the corresponding components is merely exemplary and is not limited to the terms suggested in the description of the present invention. For example, the units may also be referred to as a decryptor. Although FIG. 72 illustrates an example of the descramblers 7004 and 7007 and the authentication unit 7008 being provided inside the receiving system, each of the descramblers 7004 and 7007 and the authentication unit 7008 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 7008, the scrambled broadcasting contents are descrambled by the descramblers 7004 and 7007, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 7008 and the descramblers 7004 and 7007 will now be described in detail. The receiving system receives the scrambled broadcasting contents through the tuner 7001 and the demodulating unit 7002. Then, the system manager 7015 decides whether the received broadcasting contents have been scrambled. Herein, the demodulating unit 7002 may be included as a demodulating means according to embodiment of the present invention as described in FIG. 36 to FIG. 65. However, the present invention is not limited to the examples given in the description set forth herein. If the system manager 7015 decides that the received broadcasting contents have been scrambled, then the system manager 7015 controls the system to operate the authentication unit 7008. As described above, the authentication unit 7008 performs an authentication process in order to decide whether the receiving system according to the present invention corresponds to a legitimate host entitled to receive the paid broadcasting service. Herein, the authentication process may vary in accordance with the authentication methods.

For example, the authentication unit 7008 may perform the authentication process by comparing an IP address of an IP datagram within the received broadcasting contents with a specific address of a corresponding host. At this point, the specific address of the corresponding receiving system (or host) may be a MAC address. More specifically, the authentication unit 7008 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 7008 performs the authentication process by determining the conformity between the address of the corresponding receiving system and the system information of the receiving system that is mapped with the IP address. In other words, if the authentication unit 7008 determines that the two types of information conform to one another, then the authentication unit 7008 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms to its own unique identification number, in order to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or anther data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiving system-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 7008 of the receiving system extracts the identification information of the receiving system and the identification information included in the EMM of the broadcasting service that is being received. Then, the authentication unit 7008 determines whether the identification information conform to each other, in order to perform the authentication process. More specifically, if the authentication unit 7008 determines that the information conform to each other, then the authentication unit 7008 eventually determines that the receiving system is entitled to receive the request broadcasting service.

In yet another example, the authentication unit 7008 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 7015 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 7015 transmits the payment information to the remote transmitting system through the telecommunication module 7019.

The authentication unit 7008 authenticates the corresponding receiving system and/or the external module. Then, if the authentication process is successfully completed, the authentication unit 7008 certifies the corresponding receiving system and/or the external module as a legitimate system and/or module entitled to receive the requested paid broadcasting service. In addition, the authentication unit 7008 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 7008, the receiving system may descramble the scrambled broadcasting contents received from the transmitting system. At this point, the descrambling process is performed by the first and second descramblers 7004 and 7007. Herein, the first and second descramblers 7004 and 7007 may be included in an internal module or an external module of the receiving system.

The receiving system is also provided with a common interface for communicating with the external module including the first and second descramblers 7004 and 7007, in order to perform the descrambling process. More specifically, the first and second descramblers 7004 and 7007 may be included in the module or in the receiving system in the form of hardware, middleware or software. Herein, the descramblers 7004 and 7007 may be included in any one of or both of the module and the receiving system. If the first and second descramblers 7004 and 7007 are provided inside the receiving system, it is advantageous to have the transmitting system (i.e., at least any one of a service provider and a broadcast station) scramble the corresponding data using the same scrambling method.

Alternatively, if the first and second descramblers 7004 and 7007 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 7015, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advance is inserted in the receiving system, the receiving system receives and loads the CAS software from the memory card in order to perform the authentication process. In this example, the CAS software is read out from the memory card and stored in the first memory 7012 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 7008 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 7008 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 7015, then the memory card is verified and determined to be a normal memory card that may be used in the receiving system. At this point, the CAS software may either be installed in the first memory 7012 upon the shipping of the present invention, or be downloaded to the first memory 7012 from the transmitting system or the module or memory card, as described above. Herein, the descrambling function may be operated by the data broadcasting application manger 7016 as an application program.

Thereafter, the CAS software parses the EMM/ECM packets output from the demultiplexer 7003, in order to verify whether the receiving system is entitled to receive the corresponding data, thereby obtaining the information required for descrambling (i.e., the CW) and providing the obtained CW to the descramblers 7004 and 7007. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 7004 and 7007. Each of the descramblers 7004 and 7007 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system in order to upgrade (or update) the CAS software originally stored in the memory card. As described above, regardless of the type of broadcast receiving system, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipment and management systems may also be minimized.

Meanwhile, the descramblers 7004 and 7007 may be included in the module either in the form of hardware or in the form of software. In this case, the scrambled data that being received are descrambled by the module and then demodulated. Also, if the scrambled data that are being received are stored in the third memory 7018, the received data may be descrambled and then stored, or stored in the memory at the point of being received and then descrambled later on prior to being played (or reproduced). Thereafter, in case scramble/descramble algorithms are provided in the storage controller 7017, the storage controller 7017 scrambles the data that are being received once again and then stores the re-scrambled data to the third memory 7018.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 7019. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 7019 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 7019 may also be configured. Also, the PDU may be configured in the Java application of the receiving system and then output to the telecommunication module 7019. The PDU may also be configured by transmitting the tag value, the actual data that are to be transmitted, and the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA I×EV-DO, which can be connected through a mobile telecommunication base station, such as CDMA and GSM, and also provided with a wireless LAN, mobile internet, WiBro, WiMax, which can be connected through an access point. The above-described receiving system corresponds to the system that is not equipped with a telecommunication function. However, a receiving system equipped with telecommunication function does not require the telecommunication module 7019.

The broadcasting data being transmitted and received through the above-described wireless data network may include data required for performing the function of limiting data reception. Meanwhile, the demultiplexer 7003 receives either the real-time data output from the demodulating unit 7002 or the data read from the third memory 7018, thereby performing demultiplexing. In this embodiment of the present invention, the demultiplexer 7003 performs demultiplexing on the enhanced data packet. Similar process steps have already been described earlier in the description of the present invention. Therefore, a detailed of the process of demultiplexing the enhanced data will be omitted for simplicity.

The first descrambler 7004 receives the demultiplexed signals from the demultiplexer 7003 and then descrambles the received signals. At this point, the first descrambler 7004 may receive the authentication result received from the authentication unit 7008 and other data required for the descrambling process, in order to perform the descrambling process. The audio decoder 7005 and the video decoder 7006 receive the signals descrambled by the first descrambler 7004, which are then decoded and output. Alternatively, if the first descrambler 7004 did not perform the descrambling process, then the audio decoder 7005 and the video decoder 7006 directly decode and output the received signals. In this case, the decoded signals are received and then descrambled by the second descrambler 7007 and processed accordingly.

The audio decoder 7005 may receive the signal descrambled by the first descrambler 7004 or the signal which is not descrambled by the first descrambler 7004 and extract audio data and supplementary information from the audio stream included in the received signal.

The audio decoder 7005 may inversely scale the extracted audio data on the basis of the scale factor indicated by scale factor index information included in the supplementary information and restore the audio signal.

The audio decoder 7005 may inversely quantize the audio data, convert the inversely quantized audio data into a time-domain signal for each block according to a block length indicated by an identifier included in the supplementary information, and restore the audio signal.

The audio decoder 7005 may decode the audio data according to Huffman table information and region identifying information included in the audio data and restore the audio signal.

The audio decoder 7005 may receive the signal descrambled by the first descrambler 7004 or the signal which is not descrambled by the first descrambler 7004 and extract an audio parameter from the audio stream included in the received signal. The audio decoder 7005 may calculate subframe number information included in the audio stream on the basis of the extracted audio parameter and calculate start location information of the subframes on the basis of the calculated subframe number information. The audio decoder 7005 may decode the audio data included in the subframes according to the audio parameter on the basis of the calculated start location information.

The audio decoder 7005 may receive the signal descrambled by the first descrambler 7004 or the signal which is not descrambled by the first descrambler 7004 and extract audio data from the audio stream included in the received signal. The audio decoder 7005 may inversely quantize the audio data and restore a stereo audio signal on the basis of mid data and side data included in the inversely quantized audio data.

The audio decoder 7005 may receive the signal descrambled by the first descrambler 7004 or the signal which is not descrambled by the first descrambler 7004, extract a parameter from the audio stream included in the received signal, decode the extracted parameter, and restore the audio signal in an extended region. The audio decoder 7005 may decode the extracted parameter according to algebraic code excited linear prediction (ACELP) and transform coded excitation (TCX) and restore the audio signal in the extended region. If the parameter includes spectral band replication (SBR), the audio decoder 7005 may decode the parameter and restore the audio signal in a high frequency region of a mono channel.

Figure 73:
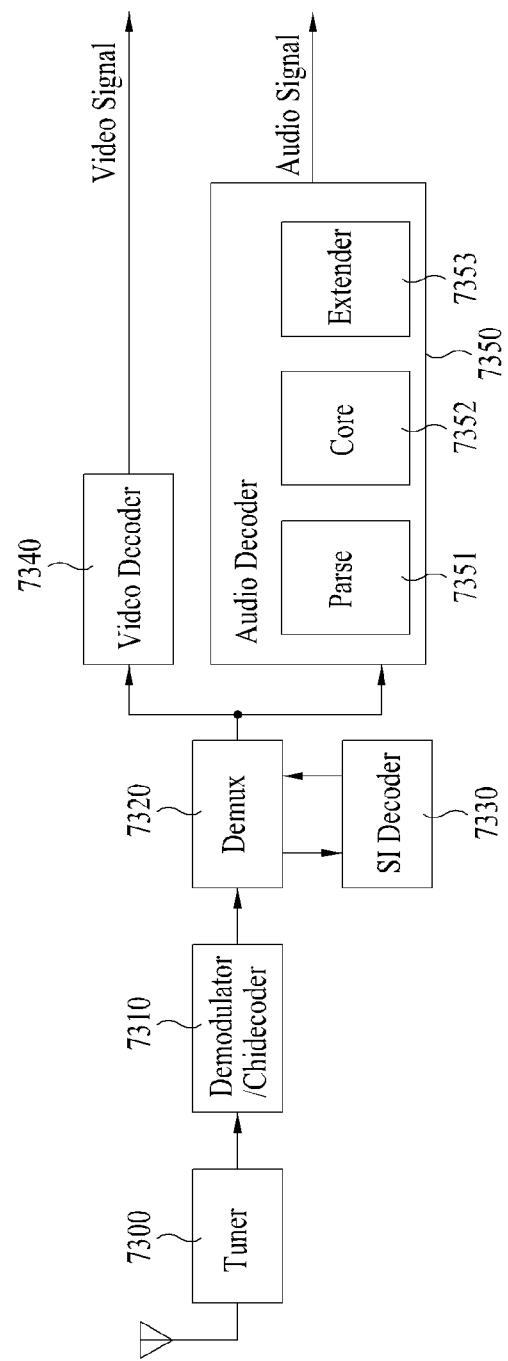
FIG. 73 is a block diagram showing an MPH receiver according to an embodiment of the present invention.

FIG. 73 is a block diagram showing an MPH receiver according to an embodiment of the present invention. The MPH receiver includes a tuner 7300, a demodulator 7310, a demultiplexer 7320, a system information (SI) decoder 7330, a video decoder 7340, and an audio decoder 7350. The audio decoder 7350 includes a parser 7351, a core unit 7352 and an extended unit 7353.

The tuner 7300 tunes to the frequency of a specific channel via any one of an antenna, a cable and a satellite, down-converts the tuned signal into an intermediate frequency (IF) signal, and outputs the converted signal to the demodulator 7310. The received data having the frequency of the specific channel includes main service data, mobile service data and table data for decoding the main service data and the mobile service data.

In the present embodiment, audio data and video data for a mobile broadcast may be applied as the mobile service data. Such audio data and video data will be compressed by various types of encoders and transmitted from a broadcasting station. In this case, the audio data and the video data are decoded by the video and audio decoders 7340 and 7350 corresponding to the encoders used for compression such that a video signal and an audio signal are provided to the user.

The demodulator 7310 performs VSB demodulation and channel equalization with respect to the signal output from the tuner 7300, divides the signal into the main service data and the mobile service data, and outputs the divided signals in the TS packet units.

The demultiplexer 7320 receives and demultiplexes the data output from the demodulator 7310. For example, the demultiplexer 7320 demultiplexes the mobile service data demodulated by the demodulator 7310 into a data stream, a video stream and an audio stream. Here, the video stream and the audio stream may be also called a video bit stream and an audio bit stream, respectively. The demultiplexer 7310 demultiplexes system information which is input under the control of the SI decoder 7330. The system information includes mobile service data, a program specific information/program and system information protocol (PSI/PSIP) table, and so on. The system information may include channel information, event information and so on.

In the embodiment of the present invention, the PSI/PSIP is applied as the system information, but the present invention is not limited thereto. That is, any protocol for transmitting the system information in a table format is applicable to the present invention regardless of the name thereof.

The video and audio decoders 7340 and 7350 may respectively decode the video bit stream and the audio bit stream demultiplexed from the main service data packet or may respectively decode the video bit stream and the audio bit stream demultiplexed from the mobile service data packet. According to the embodiment, in the case where the video bit stream and the audio bit stream as well as the data for the data service are included in the mobile service data, the video bit stream and the audio bit stream demultiplexed by the demultiplexer 7320 may be decoded by the video decoder 7340 and the audio decoder 7350, respectively.

The parser 7351 of the audio decoder 7350 parses the audio bit stream output from the demultiplexer 7320 and generates audio data and various parameters necessary for decoding of the audio signal. The audio data may be time-domain data and or frequency-domain data.

The core unit 7352 is a codec for coding the audio signal excluding supplementary information. The codec is used even in an encoder for encoding the audio signal as well as a decoder. The core unit may be configured in an advanced Audio coding (AAC), MP3, Windows media audio (WMA), OggVorbis or audio coding-3 (AC-3) format and may include a codec which will be developed in the future as well as a codec which was previously developed if the codec function is performed with respect to the audio signal. The core unit 7352 processes the audio signal using a filter bank and uses a process such as a block switching process of changing the size of the window used for processing the audio signal according to the characteristics of the audio signal and quantization/inverse quantization applied to the audio signal. The process performed by the core unit 7352 will be described in detail later. The core unit 7352 generates the time-domain audio signal using the audio data and the parameters output from the demultiplexer 7320.

In addition, for improvement in a bandwidth or improvement in a channel, an extension algorithm may be selectively applied.

The audio decoder 7350 may selectively include the extended unit 7353. The extended unit 7353 indicates a device for processing extended information which is additionally included in the conventional audio signal format for the improvement in the bandwidth or the improvement in the channel. The extended information includes the audio data and the parameters for the extension algorithm. For example, extended information for reproducing a multi-channel audio signal may be included in the supplementary information region of the MPEG-2 or MPEG-4 audio format. In this case, since there is compatibility with the MPEG-2 or MPEG-4 audio signal, the audio signal including the extended information may be used even in the decoder for reproducing only the MPEG-2 or MPEG-4 audio format and the audio signal including the extended information may be used even in the decoder for reproducing the multi-channel audio signal.

The generated time-domain audio signal is output in accordance with a sampling frequency and the number of channels. Hereinafter, the reason why the compression of the audio signal is necessary and the basic principle used for compressing the audio signal will be described.

Figure 74:
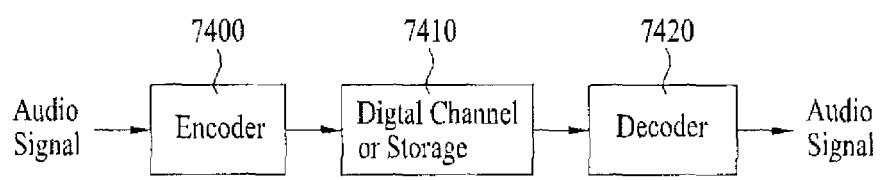
FIG. 74(a) and FIG. 74(b) is a view showing a method of compressing an audio signal and an audio signal processing device for performing the method.
Figure 74:
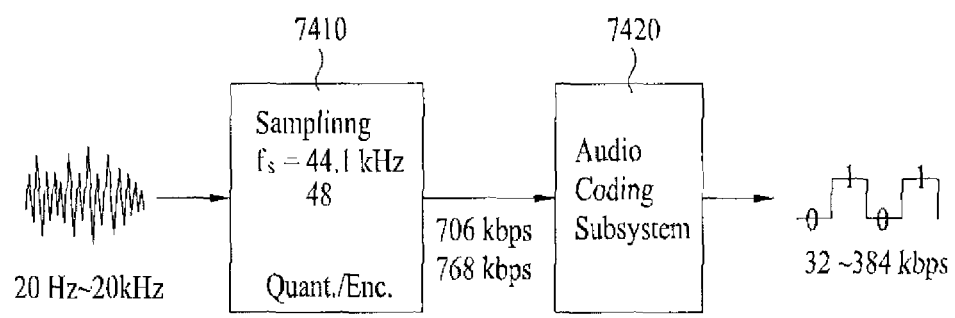

FIG. 74 is a view showing a method of compressing an audio signal and an audio signal processing device for performing the method. FIG. 74A is a schematic view showing a series of processes of encoding the audio signal by an encoder, transmitting the encoded audio signal, decoding the encoded audio signal by the decoder, and generating the audio signal, and FIG. 74B is a view showing the principle of the audio signal compression performed by the encoder.

Referring to FIG. 74B, an audible frequency of a person is 20 Hz to 20 kHz. The audio signal is sampled to a frequency corresponding to twice or more of a maximum frequency in order to prevent an aliasing phenomenon. A sampling frequency which is generally used is 44.1 kHz or 48 kHz. Since an audio signal sample is generally encoded with 16 bits, the sampled audio signal is subjected to the quantization and encoding coding process and is transmitted at a bit rate of 44.1 kHz*16 bits=706 kbps or 48 kHz*16 bits=768 kbps.

Since the bitrate is too excessive in the current transmitting system for transmitting the audio signal, the bitrate needs to be reduced. The audio signal encoder 7400 uses various compression methods in order to reduce the bitrate. If the audio signal is compressed, the bitrate can be reduced to about 32 to 384 kbps. The compressed encoded audio signal may be transmitted via a digital channel or stored in storage medium 7410. The audio signal decoder 7420 decodes the compressed encoded audio signal and outputs the decoded audio signal.

Since a compression method such as a perceptual audio coding (PAC) method is used, the high-quality audio signal can be implemented with low capacity. In the PAC method, the audio signal is compressed in consideration of the perceptual capability of the human and a sound or noise which cannot be heard by the ears of the person is eliminated from original music or several sounds are synthesized and compressed.

The reason why compression is necessary is as follows: 1) perceptual transparency can be maintained and the bitrate can be reduced, 2) the bandwidth can be reduced and transmission cost can be reduced, 3) storage requirements can be reduced, and 4) robustness against an error can be obtained.

Various PAC methods used for compressing the audio signal are different from one another in sound recognition modeling, sound range filtering, and music data processes according to developers and thus are unlikely to be compatible with one another. Accordingly, in order to support various types of compression formats, audio decoders should be mounted by the same number of compression formats. Several examples of the various compression formats are as follows.

MPEG audio layer 3 (MP3) is a technology which is developed by the MPEG-1 audio standard in the early 1990s and is a digital music format which is most popular among netizens up to now. If the MP3 technology is used, the data amount of audio signal can be compressed to about ⅒ to ½. The size of the compressed audio file is 2 to 5 MB per music file and thus high-quality music can be easily exchanged via a network.

The AAC was developed by leaders in audio compression technology using the MPEG-2 or MPEG-4 audio standard in 1997 and is excellent in compression performance and quality. Since the size of the audio signal of the AAC format is smaller than that of an MP3 file and the quality thereof is more excellent than the MP3 file, the AAC is expected to be widely used as a next-generation compression technology. A maximum sampling frequency is 96 Hz and the number of available channels is 48 as a maximum. The compression efficiency of the AAC is about 1.4 times of that of the MP3.

The AC-3 is a third audio coding method which is developed by Dolby Laboratories, Inc. of the United States of America and is an audio format having the concept different from the MP3 or AAC. While the MP3 or AAC is a compression format based on two channels, the AC-3 is a stereophonic support format based on the 5.1 channel (five audio channels and one low-frequency effect channel). In the AC-3, five speakers mounted on the front and back sides, the left and right sides, and the central side and one low-frequency sub woofer speaker are used. The AC-3 is different from the existing analog type surround system in that the channels are completely separated such that a clean sound can be delivered without signal interference.

Among methods of reducing the size of digital audio data, there is a method of reducing the number of bits or a sampling rate as a most classical method. However, this method causes a dynamic sound to be lost and generates noise. If the sampling frequency is reduced, the sharpness of a sound deteriorates. However, if a high-efficiency compression technology is used, the size of the file of the audio signal is reduced, but the amount of digitalized information is not changed.

Figure 75:
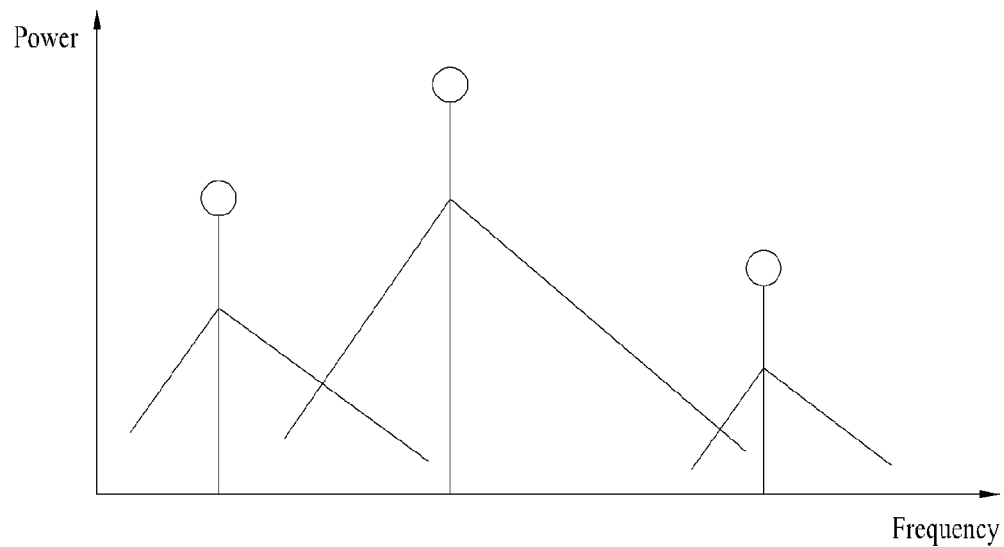
FIG. 75 is a view illustrating a masking effect used for compressing an audio signal.

FIG. 75 is a view illustrating a masking effect used for compressing the audio signal. The audio encoder encodes the audio signal using the masking effect. The masking effect is one of important characteristics of sound perception and is a phenomenon that a small sound less than a predetermined threshold is masked by a large sound, that is, a phenomenon that a sound suppresses the perception of another sound. For example, the masking effect is a phenomenon that a user cannot hear the voice of a friend sitting next to the user when a train passes. The masking effect may be used on the basis of bit allocation when the audio signal is encoded. For example, the bit may not be allocated to a region which is not perceived due to the masking effect. The masking effect includes simultaneous masking which is described in the frequency domain and forward masking which is described in the time domain.

The hearing organ of the human analyzes the frequency of the input signal by numerous filter banks having different characteristics. At this time, the masking effect is generated due to a limitation in the resolution of the hearing organ of the human in the frequency analysis process and the signal is perceived by such a preprocessing effect. The perceived signal is determined by a masking threshold generated by the masking effect.

Figure 80:
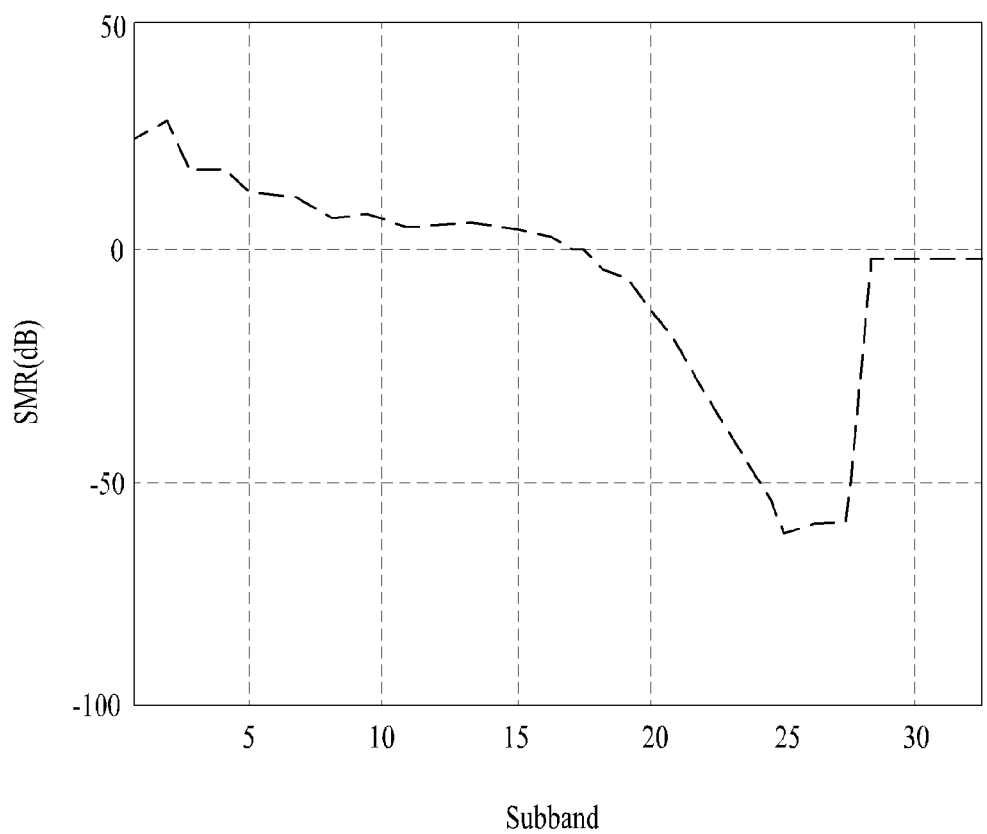
FIG. 80 is a graph showing an SMR curve of sub-bands in a specific frame according to FIG. 79.

A masking function is separated and considered according to the components of the audio signal shown in FIG. 80. The masking threshold is obtained using the masking functions according to the components. The sound less than the masking threshold is not encoded and quantization noise becomes equal to or less than the masking threshold. Hereinafter, the encoder and the decoder for processing the audio signal using the masking threshold will be described.

Figure 81:
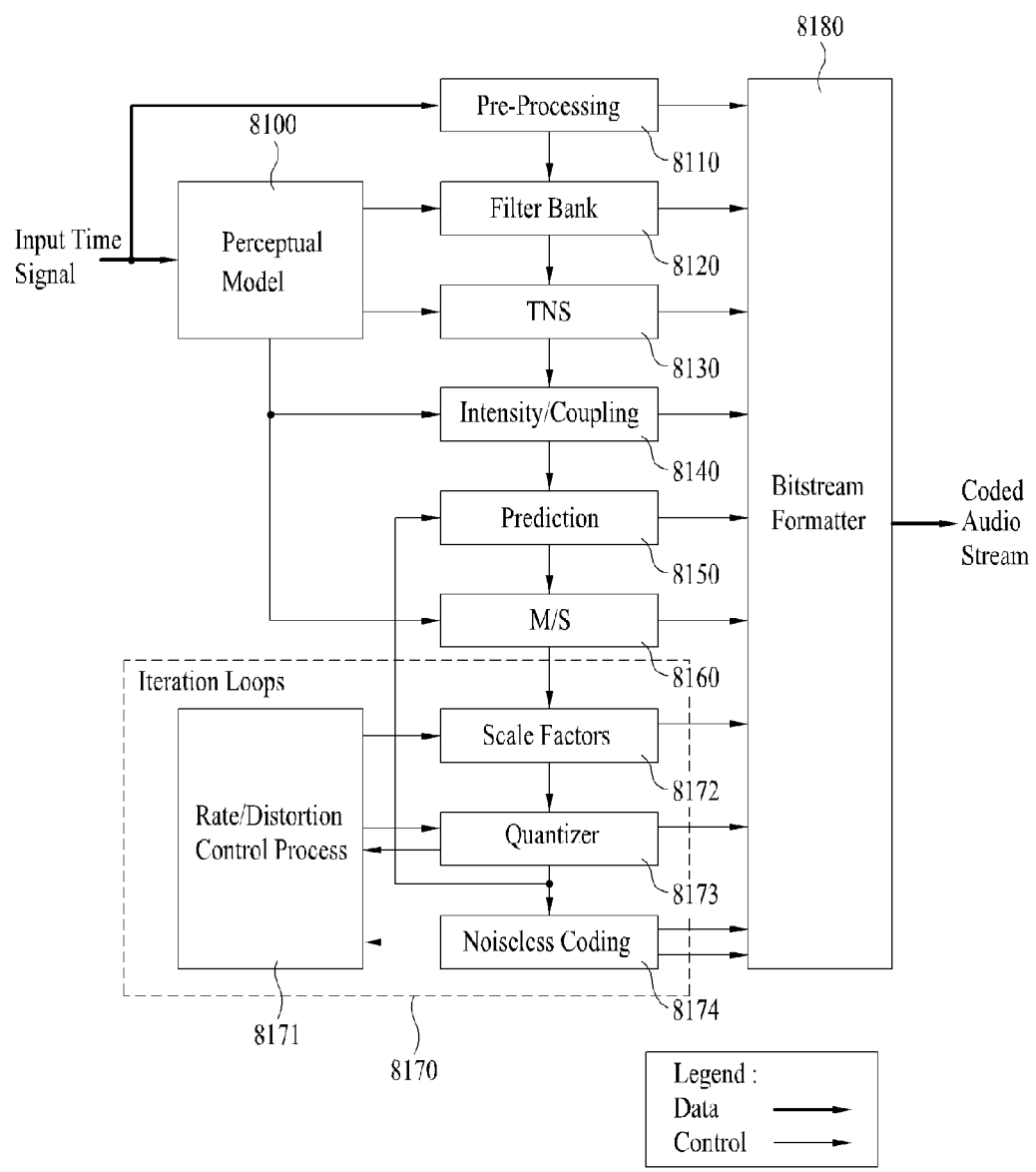
FIG. 81 is a block diagram showing an AAC encoding apparatus according to an embodiment of the present invention.

FIG. 81 is a block diagram showing the basic structure of a general audio encoder. The audio encoder includes a time/frequency (T/F) mapping unit 7600, a psycho-acoustic model unit 7610, a bit allocation and quantization unit 7620, and a bit stream packing unit 7630.

The time-domain audio signal is converted into the frequency-domain audio signal by the T/F mapping unit 7600. At this time, in order to generate the frequency-domain audio signal in band units, a filter bank may be used. The psycho-acoustic model unit 7610 eliminates perceptual redundancy using psycho-acoustic modeling, obtains information such as the masking threshold, and provides bit allocation information used for quantization. The psycho-acoustic modeling unit 7610 converts the audio signal into the frequency-domain audio signal and computes the masking threshold. Next, bits are allocated using a signal-to-masking ratio, a signal-to-noise ratio (SNR) and a noise-to-masking ratio (NMR). The bit stream packing unit 7630 generates a bit stream using the quantized digital audio signal. Although not shown in FIG. 76, the quantized audio signal is subjected to an entropy coding process before being input to the bit stream packing unit 7630.

In the entropy coding process, the length of the code representing a symbol varies according to a probability that the symbol is generated. If the code is allocated such that an average code length is closest to the entropy in the transmission of the digital signal, the efficiency is most excellent. Accordingly, in the entropy coding process, the average information amount per symbol is decided according to the probability that the symbol is generated, such that the average code length is close to the entropy. The entropy coding method includes a Huffman coding method, an arithmetic coding method and a Lempel-Ziv-Welch (LZW) coding method. In the present invention, the audio signal is coded using at least one of the three entropy coding methods or an entropy coding method which will be developed in the future.

The Huffman coding method is one of the entropy coding used for noiseless compression and is an algorithm using codes having different lengths according to the appearance frequency of a data character. The Huffman coding method uses a longer code as the symbol generation probability is decreased and uses a shorter code as the symbol generation probability is increased.

In the Huffman coding method, it is assumed that the probabilities of the input symbols are previously known. If the probabilities are not known, the Huffman coding method may include two steps. In a first step, all the input symbols are read in order to compute the probabilities and, in a second step, the Huffman coding process is performed. The Huffman coding method has a problem that a probability table should be transmitted together with the compressed data. This is because the encoding apparatus cannot perform the coding process without the probability table. As a compression rate is increased, the size of the probability table is increased. In order to solve such problems, an adaptive Huffman algorithm is developed. In the adaptive Huffman algorithm, a Huffman tree is adaptively updated while inputting symbols.

In the arithmetic coding method, one codeword is not applied to one input symbol, but is applied to all of input symbols. The codeword indicates a value in a range from 0 to 1. That is, a function for mapping the input symbols to a value in the range from 0 to 1 is required. The arithmetic method is efficient in the case where a binary symbol is received, the number of input symbols is small, or the symbol generation probability is biased.

An adaptive arithmetic coding method is based on a finite-context model. The finite-context model calculates the probability of the input symbol on the basis of the context for generating the symbol. Herein, the context indicates a previous input symbol. The case where the previous symbol is not considered is called order-0, the case where the considered previous symbol is 1 is called order-1, the case where the considered previous symbol is 2 is called order-2, and the case where the considered previous symbol is n is called order-n. However, order-3 or more is not generally used. The finite-context model has a problem that, as the order of the context is linearly increased, a storage space required for storing the context is geometrically increased. That is, the size of storage space used is rapidly increased. Accordingly, there is a need for efficient management of the storage space.

The LZW coding method is a dictionary-based compression method which is developed for solving the problems of a statistical compression method. In the Huffman coding method, the symbol should be read twice. In contrast, in the LZW coding method, a code table is made and data is compressed while the symbol is read once. In the LZW coding method, a small code table is made in a file and a pattern which is found while reading the file is added to the table. As a large number of patterns are generated, a large number of code tables are used and a compression rate is improved. In the LZW coding method, the dictionary indicates a string coded previously. The encoder checks an input string using a sliding window. The window is constituted by a search buffer and a look-ahead buffer. The search buffer includes a string coded previously and the look-ahead buffer includes a string which will be coded in the future. The encoder checks the search buffer while moving a pointer and finds the location of a string matching with the string included in the look-ahead buffer. A movement distance of the pointer which is moved from the look-ahead buffer is called an offset.

The encoder checks whether the symbol included in the search buffer matches with the symbol included in the look-ahead buffer from a symbol next to the symbol indicated by the pointer. The length of the string matched between the both buffers is called a length of match.

The encoder always finds a longest length of match in the search buffer. If the longest length of match is found, the encoder represents it in the form of <o, l c>. Here, o denotes the offset, l denotes the length and c denotes the code.

Figure 76:
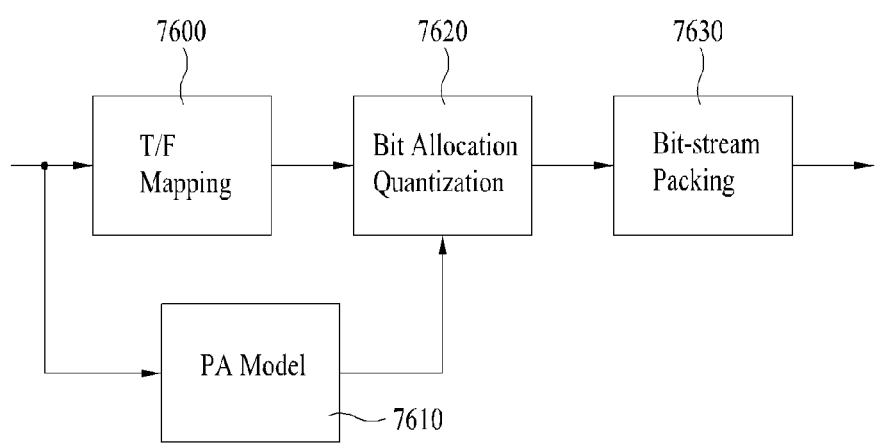
FIG. 76 is a block diagram showing the basic structure of a general audio encoder.
Figure 77:
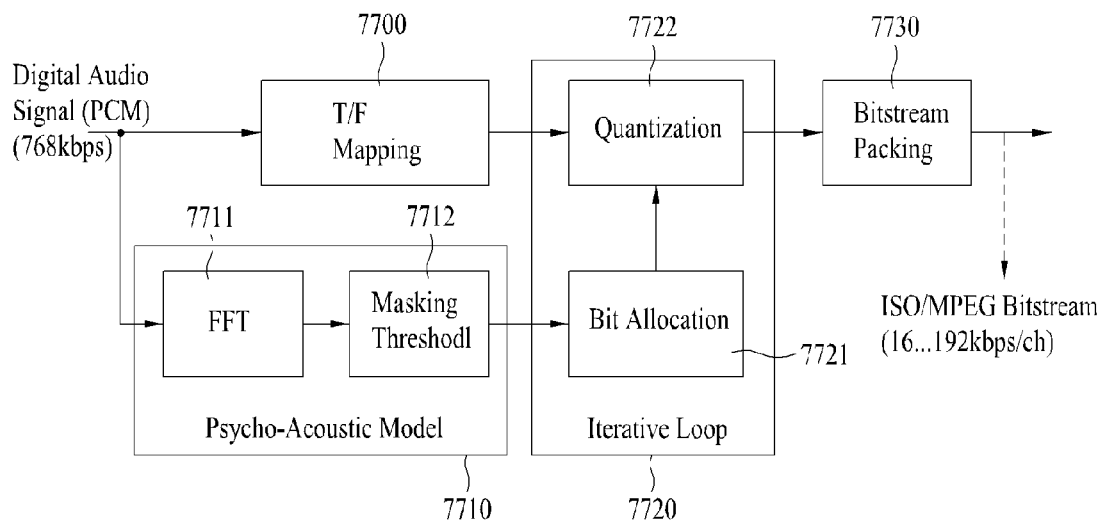
FIG. 77 is a view showing in detail an audio signal encoding apparatus of FIG. 76 according to an embodiment of the present invention.

FIG. 77 is a view showing in detail an audio signal encoding apparatus of FIG. 76 according to an embodiment of the present invention. Referring to FIG. 77, the audio signal encoding apparatus includes a T/F mapping unit 7700, a PA modeling unit 7710, a bit allocation unit 7721, a quantization unit 7722, and a bit stream packing unit 7730. The description of the same components as FIG. 76 will be omitted.

The PA modeling unit 7710 includes a Fast Fourier Transformer (FFT) unit 7711 and a masking threshold calculation unit 7712. The audio signal is transformed to the frequency-domain audio signal by the FFT UNIT 7711. Next, the masking threshold calculation unit 7712 calculates a masking threshold in the frequency domain using the transformed frequency-domain audio signal. That is, the perceptual redundancy is eliminated by the PA modeling unit using the FFT and the masking threshold is then obtained in order to provide bit allocation information used for quantization.

The FFT is an algorithm for Fourier Transform of discrete data values. The FFT transforms only feature points instead of all of frequency points. This is because the feature appears although the feature points are extracted and transformed and the remaining portions are compensated for.

The bit allocation unit 7721 and the quantization unit 7722 form an iterative loop 7720. That is, a process of performing quantization using bit values obtained by the psycho-acoustic model is repeated in order to decide an optimal bit number. The bit allocation information is sent to the bit stream packing unit 7730 as the supplementary information in order to be included in an audio bit stream. The audio signal input to the audio signal encoding apparatus may be input in the form of a PCM and a bit rate is about 768 kbps. In the case where the audio signal is encoded using the psycho-acoustic model in the audio signal encoding apparatus, the output audio bit stream becomes about 16 to 192 kbps per channel.

Figure 78:
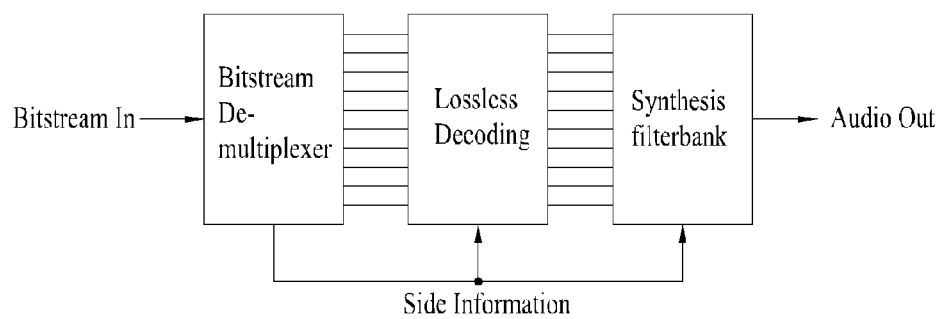
FIG. 78 is a block diagram showing an audio signal decoding apparatus.

FIG. 78 is a block diagram showing an audio signal decoding apparatus. Referring to FIG. 78, the decoding apparatus includes a demultiplexer 7800, a lossless decoder 7810 and a synthesis filter bank 7820.

The demultiplexer 7800 parses an audio bit stream transmitted from the encoding apparatus and generates encoded audio signal and supplementary information. The encoded audio signal and supplementary information exist in each frequency band. Next, the encoded audio signal and the supplementary information are subjected to a lossless decoding process in order to generate a quantized audio signal. The lossless decoding process may use an entropy decoding method. Next, the synthesis filter bank 7820 inversely quantizes and transforms the quantized audio signal and the supplementary information to the time-domain audio signal.

In the process of lossless-decoding and transforming the audio signal to the time-domain audio signal, the supplementary information may be used. That is, the bit allocation information, the quantization information and so on may be included in the supplementary information in order to be used in the process of decoding the audio signal. Information for reproducing a multi-channel audio signal, information for reproducing an audio signal having a three-dimensional (3D) effect, or information for reproducing an audio signal having various ambient effects may be included in the supplementary information. Hereinafter, an encoding apparatus using the psycho-acoustic model will be described in detail.

Figure 79:
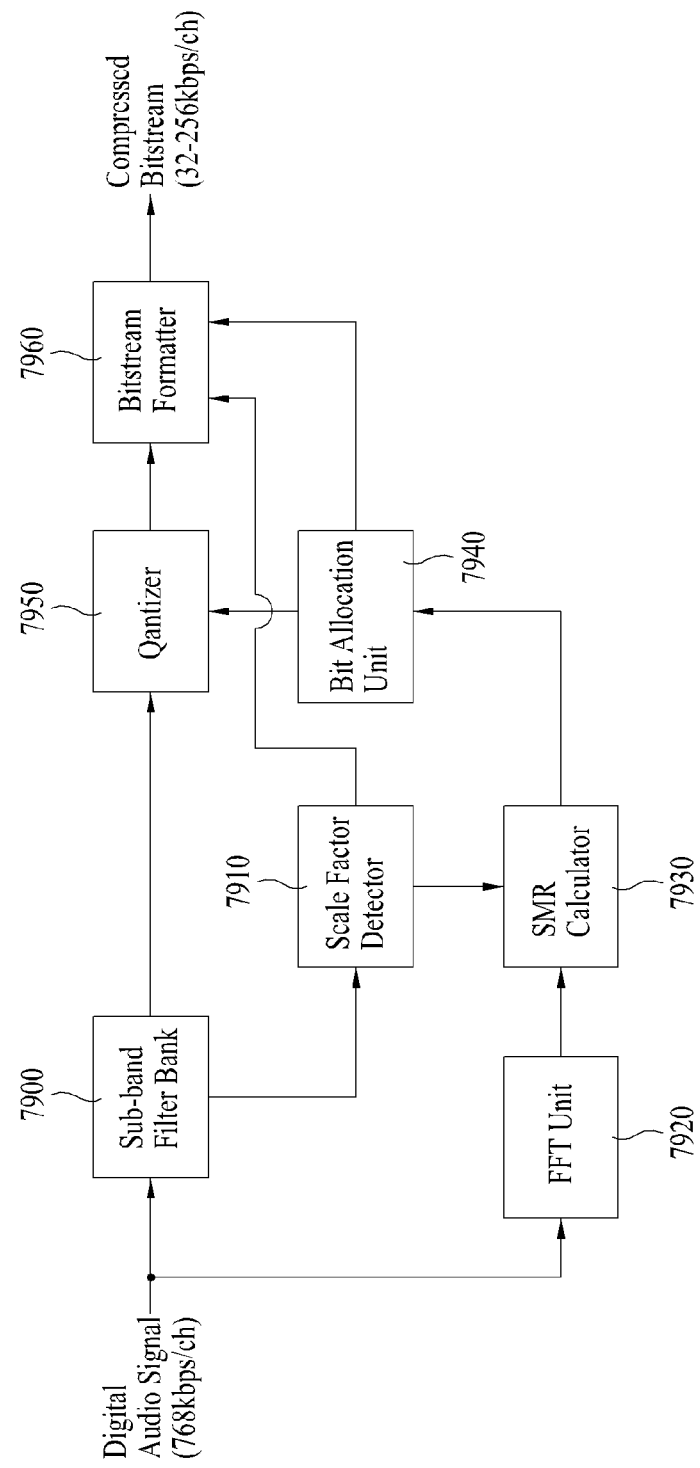
FIG. 79 is a view showing the basic configuration of the encoding apparatus according to the general MPEG standard.

FIG. 79 is a view showing the basic configuration of the encoding apparatus according to the general MPEG standard. Referring to FIG. 79, the encoding apparatus includes a sub-band filter bank 7900, a scale factor detector 7910, a FFT 7920, a signal-to-masking ratio (SMR) calculator 7930, a bit allocation unit 7940, a quantizer 7950 and a bit stream formatter 7960.

The sub-band filter bank 7900 divides a digital audio signal of 168 kbps/ch, which is digitalized to 16 bits of 48 kHz, into 32 sub-bands. The scale factor detector 7910 detects scale factors of the 32 sub-bands of the digital audio signal output from the sub-band filter bank 7900. The FFT unit 7920 Fourier transforms the digital audio signal of 168 kbps/ch and outputs the spectrum thereof. The SMR calculator 7930 compares the spectrum output from the FFT unit 7920 with the scale factor detected by the scale factor detector 7910, selects a maximum spectrum of each of the sub-bands, and calculates an SMR using a masking threshold and signal power corresponding to the maximum spectrum.

The bit allocation unit 7940 calculates a noise-to-masking ratio (NMR) using the SMR calculated by the SMR calculator and a SNR and allocates bits according to the NMR. The quantizer 7950 quantizes the digital audio signal output from the sub-band filter bank 7900 according to the bits allocated by the bit allocation unit 7940. The bit stream formatter 7960 includes the supplementary information in the digital audio signal quantized by the quantizer 7950 and generates a compressed bit stream. The audio signal decoding apparatus reproduces the audio signal by the inverse process of the above-described encoding method.

The FFT unit 7920 and the SMR calculator 7930 use the psycho-acoustic model. Here, the supplementary information indicates information necessary for restoring the compressed quantized digital video signal and includes, for example, scale factor index information and bit allocation information. The scale factor index information may be used to the bit allocation information according to implementation of the encoder and the decoder.

In more detail, in order to eliminate statistical redundancy, the input digital audio signal is converted into sub-band samples by passing through the filter bank. The filter bank may be configured by arranging filters at the same interval or different intervals according to the frequency bands as if low frequency regions are densely configured. The perceptual redundancy is eliminated by the psycho-acoustic model using the FFT, the mask threshold is obtained, and bit allocation information used for quantization is provided.

In layers 1 and 2 of the MPEG, a single sub-band filter bank having 32 filters arranged at the same interval is used. Each of the filters used for sub-band analysis is based on a 512-tap low-pass filter and the frequency transitions by a matrix operation such that 32 sub-bands having the same size are obtained. The present invention is not limited to the filter bank and includes filter banks configured by various methods.

Generally, the SMR calculated by the psycho-acoustic model may be expressed by Equation 14 when a ratio of the masking threshold which is the result of the psycho-acoustic model to the signal power calculated from the scale factor is expressed by dB.

$$SMR \text{ (dB)} = \text{signal power (dB)} - \text{masking threshold (dB)} \quad \text{Equation 14}$$

where, 32 SMRs corresponding to the sub-bands are obtained in one frame. The physical meaning of the SMR indicates a degree that the signal power is relatively larger than the masking threshold in each of the sub-bands.

FIG. 80 is a graph showing an SMR curve of the sub-bands in a specific frame according to FIG. 79. As shown in FIG. 80, the SMR has a positive value of 0 dB or more between a sub-band 1 and a sub-band 17 and has a negative value of 0 dB or less between a sub-band 18 and a sub-band 32. At this time, since all of the signals are already masked in the sub-band section having the negative value of 0 dB or less (for example, between the sub-band 18 and the sub-band 32), the bits are no longer allocated. Accordingly, the bits should be allocated in the sub-band section having the positive value of 0 dB or more (for example, between the sub-band 1 and the sub-band 17).

In order to detect the scale factor for normalizing the sample values of the sub-bands, a maximum value of normalized absolute values of 12 samples should be found. Next, the maximum value and 64 scale factors suggested in the MPEG are compared and a scale factor which is larger next to the normalized maximum value is defined as the scale factor of the frame.

The bit allocation unit 7940 of FIG. 79 repeatedly performs a process of allocating one bit to a sub-band having a largest NMR among the 32 sub-bands, newly calculating the NMRs of the sub-bands, and allocating one bit to a sub-band having a largest NMR until a total bit number allocated to one frame is used up.

The NMR used for the bit allocation process may be expressed by Equation 15 using the SNR and the SMR.

$$NMR(\text{dB}) = SMR(\text{dB}) - SNR(\text{dB}) \quad \text{Equation 15}$$

where, the SNR denotes a ratio of original signal power to quantization noise generated in the quantization process. The physical meaning of the NMR indicates a degree that the quantization noise of a sub-band is relatively larger than the masking threshold. It can be seen that, as the NMR is increased, noise to be eliminated is increased.

Accordingly, more bits are allocated to a sub-band having a larger NMR by bit allocation. If one bit is allocated, the SNR is improved by 6 dB. Therefore, the bit allocation indicates a process of allocating the bits to the sub-bands such that the NMRs thereof become negative values and making the quantization noise to be less than the masking threshold.

Accordingly, the noise generated in the encoding process is not caused to be heard by the ears of the person and thus the compression can be realized without the loss of the sound quality.

Since the SMR is a fixed value obtained by the signal power and the masking threshold, Equation 15 is changed by the SNR.

FIG. 81 is a block diagram showing an AAC encoding apparatus according to an embodiment of the present invention. Referring to FIG. 81, the AAC encoding apparatus includes a psycho-acoustic modeling unit 8100, a pre-processing unit 8110, a filter bank 8120, a temporal noise shaping (TNS) unit 8130, an intensity/coupling unit 8140, a prediction unit 8150, a mid/side (M/S) stereo processing unit 8160, a data restoration unit 8170 and a bit stream formatter 8180. The data restoration unit 8170 has an iteration loop structure and includes a rate/distortion control unit 8171, a scale factor extractor 8172, a quantizer 8173 and a noiseless coding unit 8174.

Pulse code modulation (PCM) audio signals are input to the psycho-acoustic modeling unit 8100 and the pre-processing unit 8110. The pre-processing unit 8110 changes the sampling frequencies of the input audio signals according to the bitrate and outputs the audio signals. In some cases, the pre-processing unit 8110 may not be included.

The psycho-acoustic modeling unit 8100 collects signals having proper scale factors of the input audio signals and calculates the masking thresholds of scale factor bands using a masking phenomenon generated by interaction of the signals. The outputs of the psycho-acoustic modeling unit 8100 are input to the filter bank 8120, the TNS unit 8130, the intensity/coupling unit 8140 and the M/S stereo processing unit 8160.

The filter bank 8120 eliminates the statistical redundancy of the audio signal using the masking threshold of the psycho-acoustic modeling unit 8100 and the signal output from the pre-processing unit 8110 and outputs the signal to the TNS unit 8130. That is, the filter bank 8120 divides the overall band of the audio signal into 32 sub-bands having the same frequency width and codes the 32 sub-bands to sub-band samples. In the present invention, the filter bank for dividing the overall frequency into the sub-bands having different intervals or the filter bank for dividing the overall frequency into the sub-bands having the same interval may be used.

The sub-band samples coded by the filter bank 8120 are input to the data restoration unit 8170 via the TNS unit 8130, the intensity/coupling unit 8140, the prediction unit 8150 and the M/S stereo processing unit 8160. The TNS unit 8130, the intensity/coupling unit 8140, the prediction unit 8150 and the M/S stereo processing unit 8160 may be selectively used in the encoder.

That is, the TNS unit 8130 receives the output of the filter bank 8120 and the psycho-acoustic modeling unit 8100 and controls the temporal shape of the quantization noise in each window used for transformation. At this time, the temporal noise shaping can be realized by applying a process of filtering frequency data.

The intensity/coupling unit 8140 is a module for more efficiently processing a stereo signal, which receives the output of the psycho-acoustic modeling unit 8100 and the output of the TNS unit 8130, codes only quantized information of the scale factor band of one of two channels and transmits only the scale factor of the other channel. The intensity/coupling unit 8140 is not necessarily used in the encoder, and it is checked whether or not the intensity/ coupling unit is used in the units of the scale factor band, in consideration of various matters.

The prediction unit 8150 receives the output of the intensity/coupling unit 8140 and the output of the quantizer 8173 of the data restoration unit 8170 and predicts frequency coefficient values of a current frame. A difference between the predicted value and an actual frequency component is quantized and coded such that the amount of generated bits can be reduced. At this time, the prediction unit 8150 may be selectively used in frame units. That is, since complexity for predicting a next frequency coefficient is increased if the prediction unit 8150 is used, the prediction unit may not be used. In some cases, a prediction difference may be larger than an original signal and thus the amount of bits which are actually generated by the prediction may be larger compared with the case where the prediction is not performed. At this time, the prediction unit 8150 is not used.

The M/S stereo processing unit 8160 is a module for more efficiently processing the stereo signal, which receives the output of the psycho-acoustic modeling unit 8100 and the output of the prediction unit 8150, transforms the outputs to a sum signal of or a difference signal between a left channel signal and a right channel signal, and processes the signals. The M/S stereo processing unit 8160 is not necessarily used in the encoder and it is checked whether or not the M/S stereo processing unit is used in the units of the scale factor band, in consideration of various matters. The output of the M/S stereo processing unit 8160 is input to the scale factor extractor 8172 of the data restoration unit 8110.

The scale factor extractor 8172 extracts scale factors under the control of the rate/distortion control unit 8171, normalizes the sub-band samples output from the M/S stereo processing unit 8160, and outputs the normalized sub-band samples to the quantizer 8173.

The quantizer 8173 quantizes the sub-band samples normalized by the scale factor extractor 8172 and outputs the quantized sub-band samples to the noiseless coding unit 8174. That is, the quantizer 8173 quantizes the sub-band samples of each band such that the level of the quantization noise of each band becomes less than the masking threshold in order not to be heard by the human.

The signal quantized by the quantizer 8173 is coded by the noiseless coding unit 8174 and is output to the rate/distortion control unit 8171 and the bit stream formatter 8180. The bit stream formatter 8180 collects information of the modules 8110 to 8170, and forms and transmits a bit stream.

In the AAC coding process of FIG. 81, the structure for obtaining the masking threshold in the frequency domain by the psycho-acoustic model and allocating the bits on the basis of the masking threshold such that the quantization noise is not heard is equal to that of the MP3 coding process. However, in the AAC coding process, the frequency converting process is different from that of the MP3 in that a 2048-point modified discrete cosine transform (MDCT) having a higher frequency resolution than that of the MP3 is performed (filter bank), the TNS which is a technology of shaping the noise in the time domain is used, and the prediction for eliminating the statistical redundancy between the frames is used. In the AAC coding process, a pre-processing unit 8110 for changing the sampling frequency according to the transmission bitrate is included.

In such a structure, the noiseless coding unit 8174 of the AAC uses a Huffman coding method. The Huffman coding method is similar to the MP3 in that two or four MDCT coefficients (n-tuples) are coded using a Huffman codebook, but is different from the MP3 in that a region using the same codebook is divided into sections and an rzero region and a count1 region do not exist. That is, in the AAC coding process, the sections are divided in order to bind the regions having similar statistical characteristics with respect to the MDCT spectrum coefficient and most suitable codebooks of the sections are selected in order to perform the Huffman coding process. At this time, the number of Huffman codebooks used for the AAC is total 12.

In the AAC, a maximum value which can be expressed by a Huffman table is 15 and an escape coding (ESC) process should be performed in order to express a value larger than the maximum value. That is, in order to code information of 16 or more, a codeword corresponding to 16 is Huffman coded and then escape sequence of Equation 16 is prefixed.

$$\text{escape sequence} = \text{<escape prefix><escape separator><escape word>} \quad \text{Equation 16}$$

where, <escape prefix> denotes an N-bit binary number "1", <escape separator> denotes a binary number "0", and <escape word> denotes a coefficient expressed by an unsigned integer. Accordingly, N is a minimum value which can express the MDCT coefficient in which $2(N+4)$ is located at <escape word>.

While the number of bits used for performing the coding process by the ESC process is decided by selecting the Huffman codebook in the MP3, the number of bits used is decided according to the coefficients of the ESC process in the AAC. Hereinafter, the AAC decoding apparatus will be described.

Figure 82:
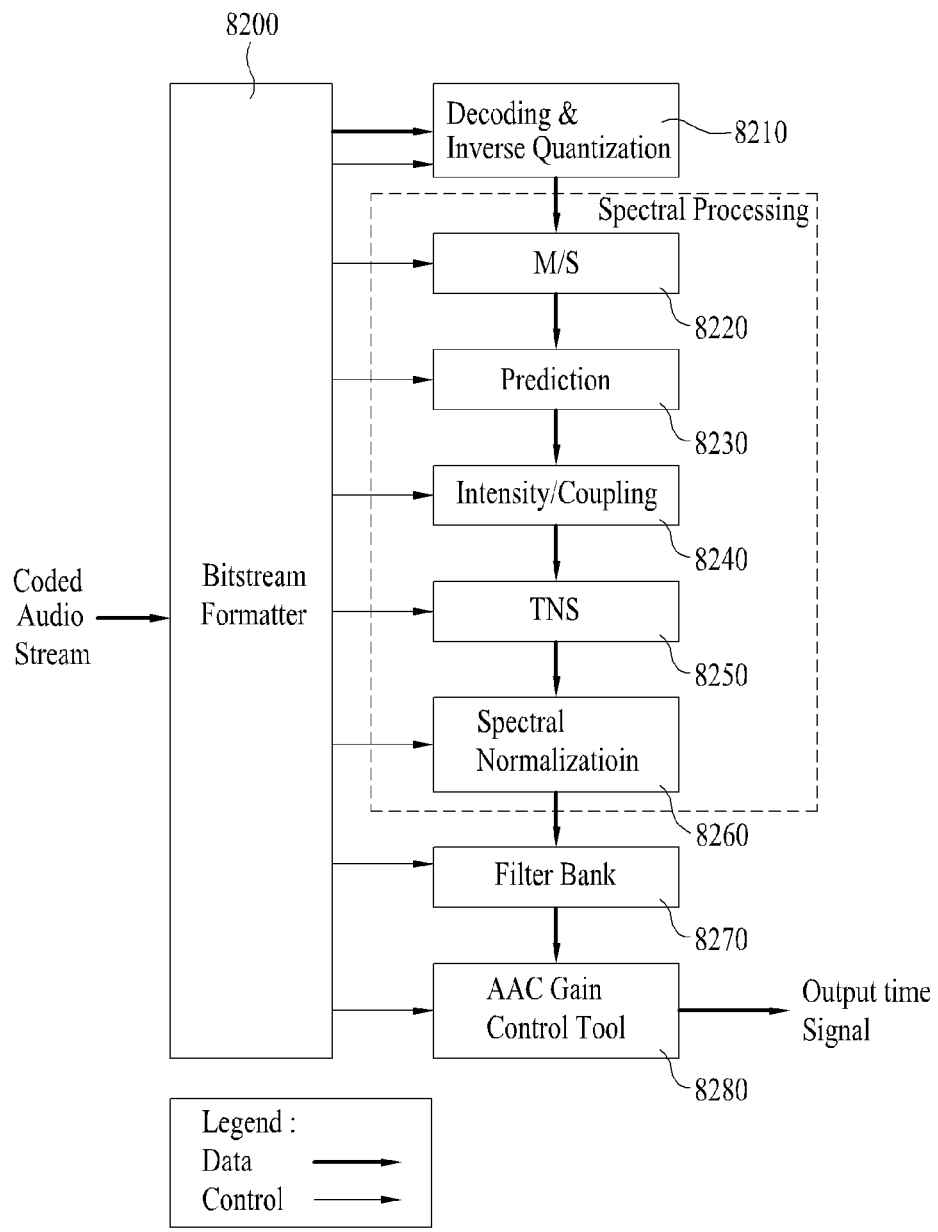
FIG. 82 is a block diagram showing an AAC decoding apparatus according to an embodiment of the present invention.

FIG. 82 is a block diagram showing an AAC decoding apparatus according to an embodiment of the present invention. Referring to FIG. 82, the AAC decoding apparatus includes a bit stream formatter 8200, a decoding and inverse quantization unit 8210, an M/S stereo processing unit 8220, a prediction unit 8230, an intensity/coupling unit 8240, a TNS unit 8250, a normalization unit 8260, a filter bank 8270 and an AAC gain control tool 8280.

If a coded audio bit stream is received, the bit stream formatter 8200 extracts information necessary for decoding by a demultiplexing process and the decoding and inverse quantization unit 8210 performs the Huffman decoding and inverse quantization process. Next, the audio signal is reproduced by the M/S stereo restoration, prediction, intensity/coupling stereo restoration, TNS filtering, normalization, filter bank and AAC gain control process. The decoding process is equal to or similar to the coding process of FIG. 81 and thus the detailed description thereof will be omitted.

The M/S stereo processing unit 8220, the prediction unit 8230, the intensity/coupling unit 8240, the TNS unit 8250 and the normalization unit 8260 process the frequency-domain audio signal and the audio signal output from the filter bank 8270 is transformed to the time-domain audio signal. A process for processing audio signals, for example, a block switching scheme for converting a time-domain audio signal into a frequency-domain audio signal, will hereinafter be described with reference to the annexed drawings.

Figure 83:
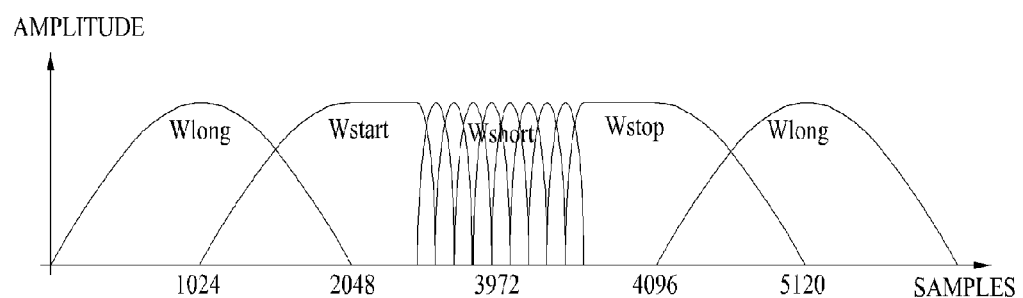
FIG. 83 is a conceptual diagram illustrating the block switching scheme according to the present invention.

FIG. 83 is a conceptual diagram illustrating the block switching scheme according to the present invention. An audio encoding device is able to process an audio signal using a block which has different lengths according to characteristics of the audio signal. In this case, the encoding device can transmit an identifier for indicating length information of a block capable of processing the audio signal to a decoding device. The identifier may be transmitted as additional information to the decoding device, may be transmitted from a header area of the audio signal to the decoding device, or may be transmitted from each data frame of the audio signal.

The decoding device determines the block length for processing the audio signal on the basis of the identifier, uses filter banks of different lengths based on the individual block lengths, and finally processes the audio signal using windows of different lengths.

As described above, the above-mentioned scheme for processing the audio signal using the above windows of different lengths is called a block switching scheme. This block switching scheme has been widely used to prevent the occurrence of pre-echo by most of transform-based audio coding systems (e.g., AAC, MP3).

For example, if a predetermined frequency-domain signal (e.g., the sound of a flute or piping sound) is continued for a long period of time, this frequency-domain signal can be properly processed by a long window without any problems. However, if a loud sound (e.g., the clicking sound of the castanets) is continued for a short period of time, the use of the long window is ineffective. If the loud sound is processed by the long window, the pre-echo signal occurs, such that it seems as if a silent or mute part had any pseudo sound. In order to prevent the above-mentioned pre-echo problem, a short window may be used to process the loud sound. In the case of using the short window, the pre-echo signal occurs for a short period of time. This pre-echo signal may not be recognized by the pre-masking effect.

Referring to FIG. 83, the audio signal is processed in a time domain on the basis of a sample unit. However, if the loud sound suddenly occurs as described above, there is a need to process the audio signal of the loud sound. According to the AAC scheme, 8 short windows are used. According to the present invention, the number of short windows is not limited to only any specific number, and can also be set to other numbers.

When the long window is switched to the short window or the short window is switched to the long window, there is a need to use a medium-type window. The medium-type window is composed of the half of the long window and the half of the short window. The medium-type window may be a start window or a stop window. The start window is used to switch the long window to the short window. The stop window is used to switch the short window to the long window.

The switching or non-switching of the above windows is decided by the encoding device, flag information indicating the window conversion is transmitted to the decoding device. The decoding device multiplies an audio signal by a different-length window using the flag information, such that it performs an IMDCT having different lengths.

Figure 84:
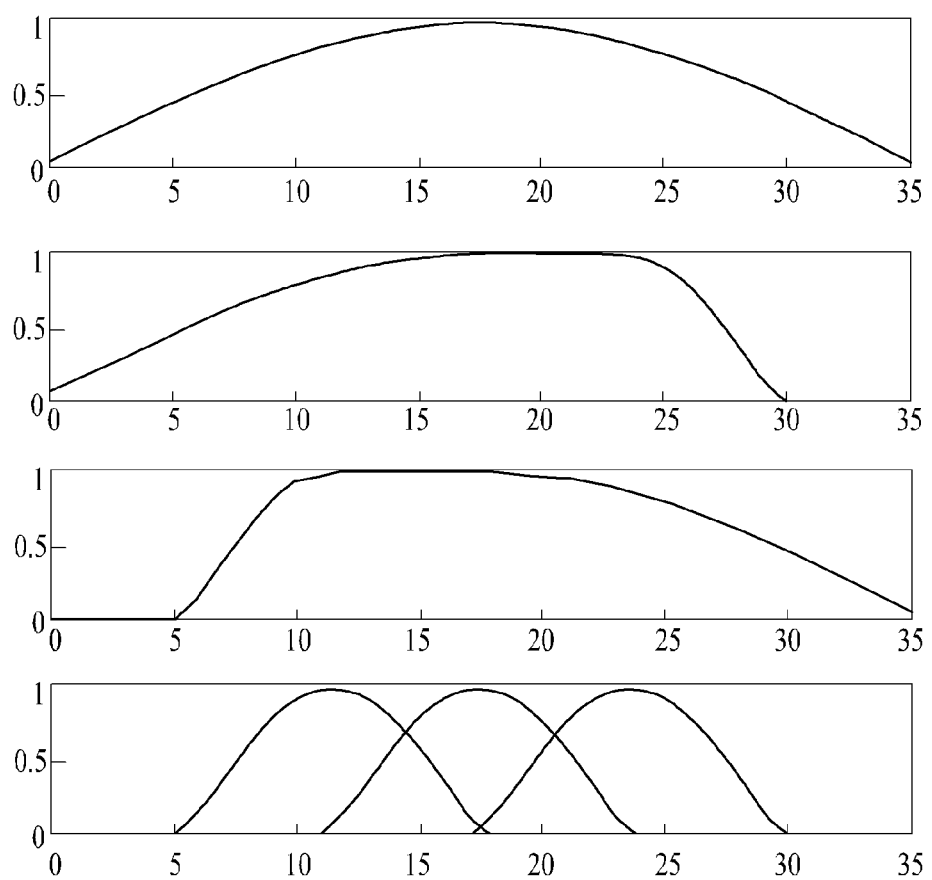
FIG. 84 illustrates windows used for the block switching for use in the MP3 scheme according to one embodiment of the present invention.

FIG. 84 illustrates windows used for the block switching for use in the MP3 scheme according to one embodiment of the present invention. Referring to FIG. 84, a first window is indicative of the long window for processing an audio signal, a second window is indicative of the start window used to switch the long window to the short window, a third window is indicative of the stop window used to switch the short window to the long window, and the last window is indicative of the short window used when the loud sound suddenly occurs. The MP3 scheme is designed to use 3 short windows differently from the AAC scheme, but it should be noted that there is no limitation in the number of short windows according to the present invention.

Figure 85:
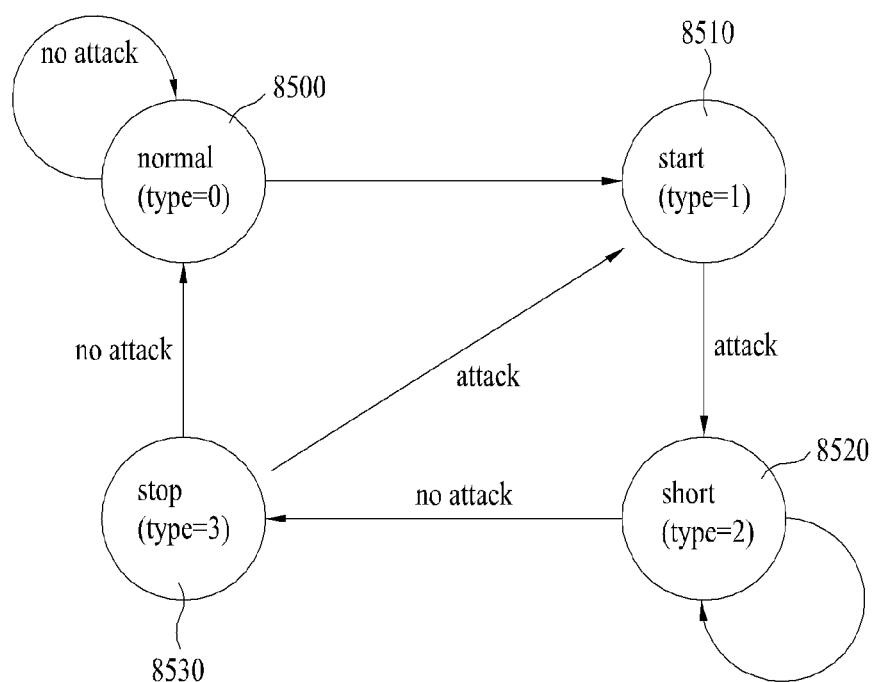
FIG. 85 is a conceptual diagram illustrating the switching process of individual windows during the MP3-based block switching process according to the present invention.

FIG. 85 is a conceptual diagram illustrating the switching process of individual windows during the MP3-based block switching process according to the present invention. Referring to FIG. 85, a long window (type=0) is used under a normal state as denoted by 8500. If the sound is not suddenly changed, the device processes the audio process using the long window. If the loud sound is suddenly generated, the start window (type=1) is used as denoted by 8510. Then, the short window (type=2) is used as denoted by 8520. If the above-mentioned status for suddenly generating the loud sound is continued, the short window is continuously used. If the above-mentioned status for suddenly generating the loud sound disappears, the device is used as denoted by 8530. If the above-mentioned status for suddenly generating the loud sound occurs again, the start window is used again. If the above-mentioned status does not occur, the long window is used. A filterbank which uses the above-mentioned windows will hereinafter be described in detail.

Figure 86:
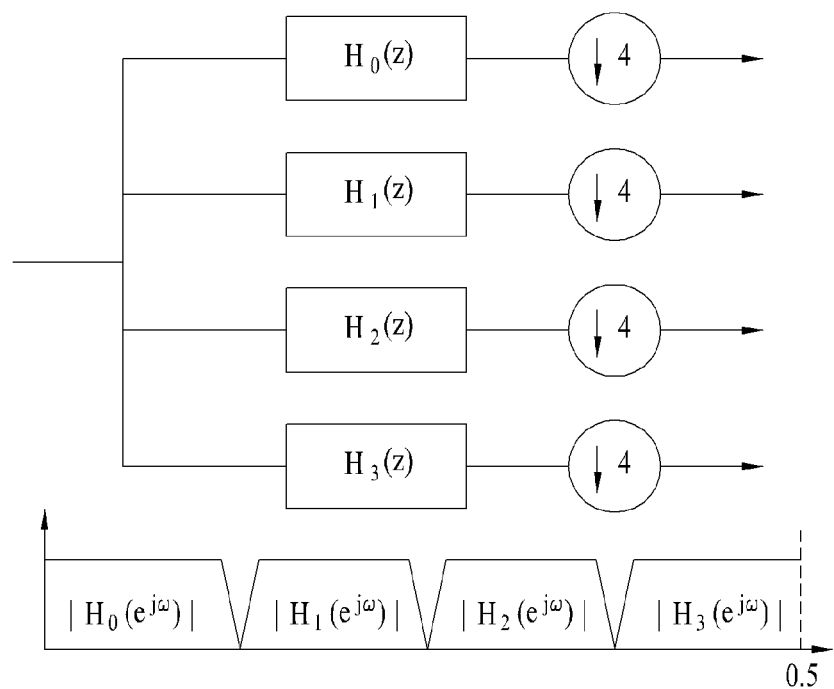
FIG. 86 illustrates the filterbank according to one embodiment of the present invention.

FIG. 86 illustrates the filterbank according to one embodiment of the present invention. FIG. 86 illustrates a 4-band filter bank, but the scope of the present invention is not limited to only the 4-band filterbank. There are a variety of filter banks, for example, a polyphase filterbank, a Modified Discrete Cosine Transform (MDCT), etc. The polyphase filterbank is one of MPEG audio basic technologies. The sub-band encoding scheme (e.g., MPEG audio technology) needs to perform the sub-sampling, which divides a band into several sub-bands by the filterbank without generating the aliasing, such that an audio signal is processed by a low sampling frequency according to the sub-sampling process. A quadrature mirror filter (QMF) is firstly used for the above-mentioned frequency division. If the frequency band is divided into about 4 sub-bands, it should be noted that the QMF has been widely used for this frequency division.

However, the number of QMF calculations is almost proportional to the number of bands. In order to divide a total band into 32 bands, a huge number of calculations are needed. In order to solve this problem, a polyphase filterbank is needed. The polyphase filterbank simultaneously processes the 32 bands, so that it removes or offsets the aliasing and increases the calculation efficiency.

The MDCT method is a representative frequency division method which has a superior efficiency and offsets the aliasing. The MDCT method has been widely used for Dolby AC-3, MPEG audio, etc. The MDCT method simultaneously converts 512 samples of a time domain to signals of a frequency domain.

The encoding device according to the present invention performs time-frequency conversion according to a block size decided by audio-signal characteristics. In this case, the encoding device uses at least one of the polyphase filterbank and the MDCT, such that it acquires a frequency spectrum of the audio signal. For example, the encoding device can generate a frequency-domain audio signal via the MDCT having a Time Domain Aliasing Cancellation (TDAC).

The decoding device applies a frequency spectrum of a dequantized audio signal to an inverse filterbank. Then, the decoding device performs overlapping of the audio signal generated from the inverse filterbank, and generates a time-domain audio signal. For example, the inverse filterbank may be a synthesis filterbank. The MPEG audio format for the filterbank will hereinafter be described.

Figure 87:
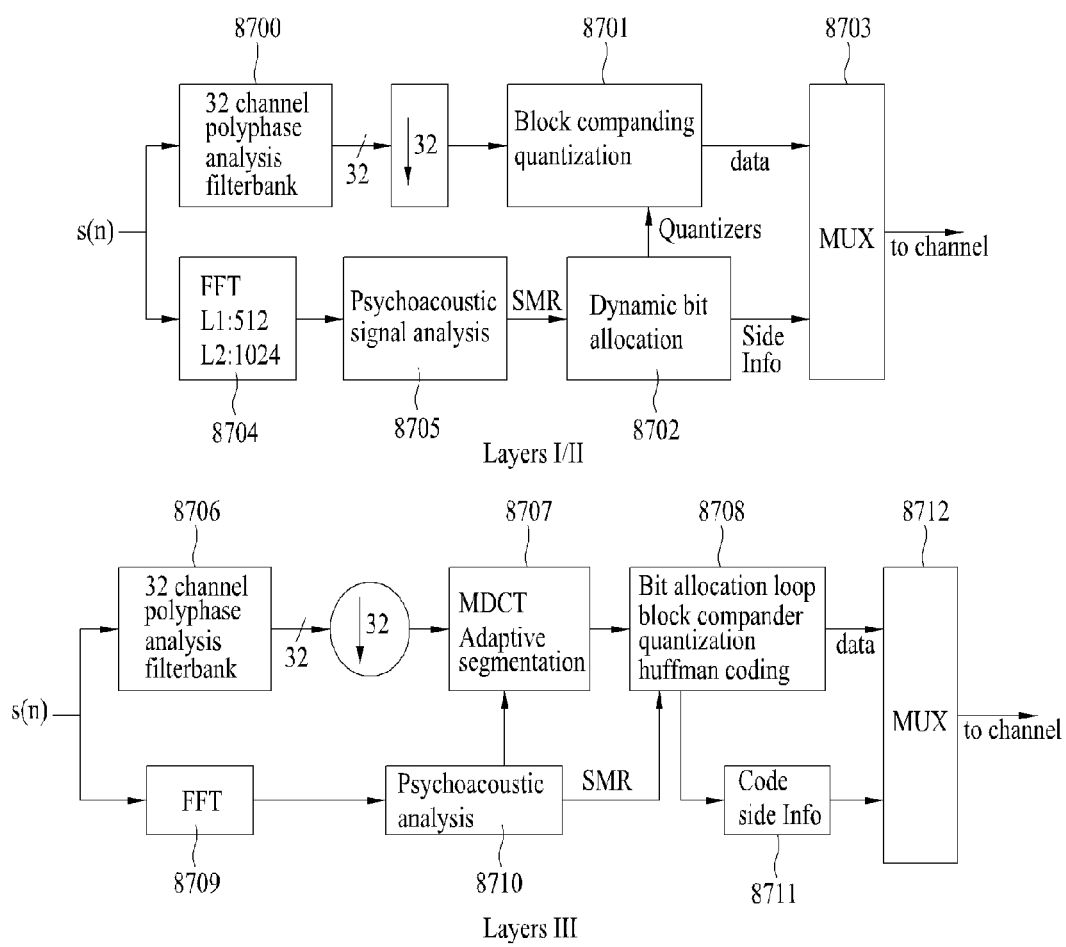
FIG. 87 is a block diagram illustrating the encoding device of the MPEG layers 1, 2, and 3 which use the filterbank according to one embodiment of the present invention.

FIG. 87 is a block diagram illustrating the encoding device of the MPEG layers 1, 2, and 3 which use the filterbank according to one embodiment of the present invention. Referring to FIG. 87, the encoding device for the MPEG layers 1 and 2 includes a 32-channel polyphase analysis filter bank 8700, a block companding and quantization unit 8701, a FFT unit 8704, a psychoacoustic modeling unit 8705, a bit allocation unit 8705, and a multiplexer 8703.

Functions of the above-mentioned components have already been disclosed, so that their detailed description will herein be omitted for the convenience of description. The encoding device of the MPEG layers 1 and 2 converts a time-domain audio signal into a frequency-domain audio signal using the 32-channel polyphase analysis filterbank 8700.

The encoding device of the MPEG layer 3 includes a 32-channel polyphase analysis filterbank 8706, a MDCT 8707, a bit allocation unit 8708, a FFT unit 8709, a psychoacoustic modeling unit 8710, an additional information encoder 8711, and a multiplexer 8712.

Functions of the above-mentioned components have already been disclosed, so that their detailed description will herein be omitted for the convenience of description. The encoding device of the MPEG layer 3 simultaneously uses the 32-channel polyphase analysis filterbank 8706 and the MDCT 8707. In this case, the above-mentioned structure composed of the 32-channel polyphase analysis filterbank 8706 and the MDCT 8707 is called a hybrid filterbank.

Figure 88:
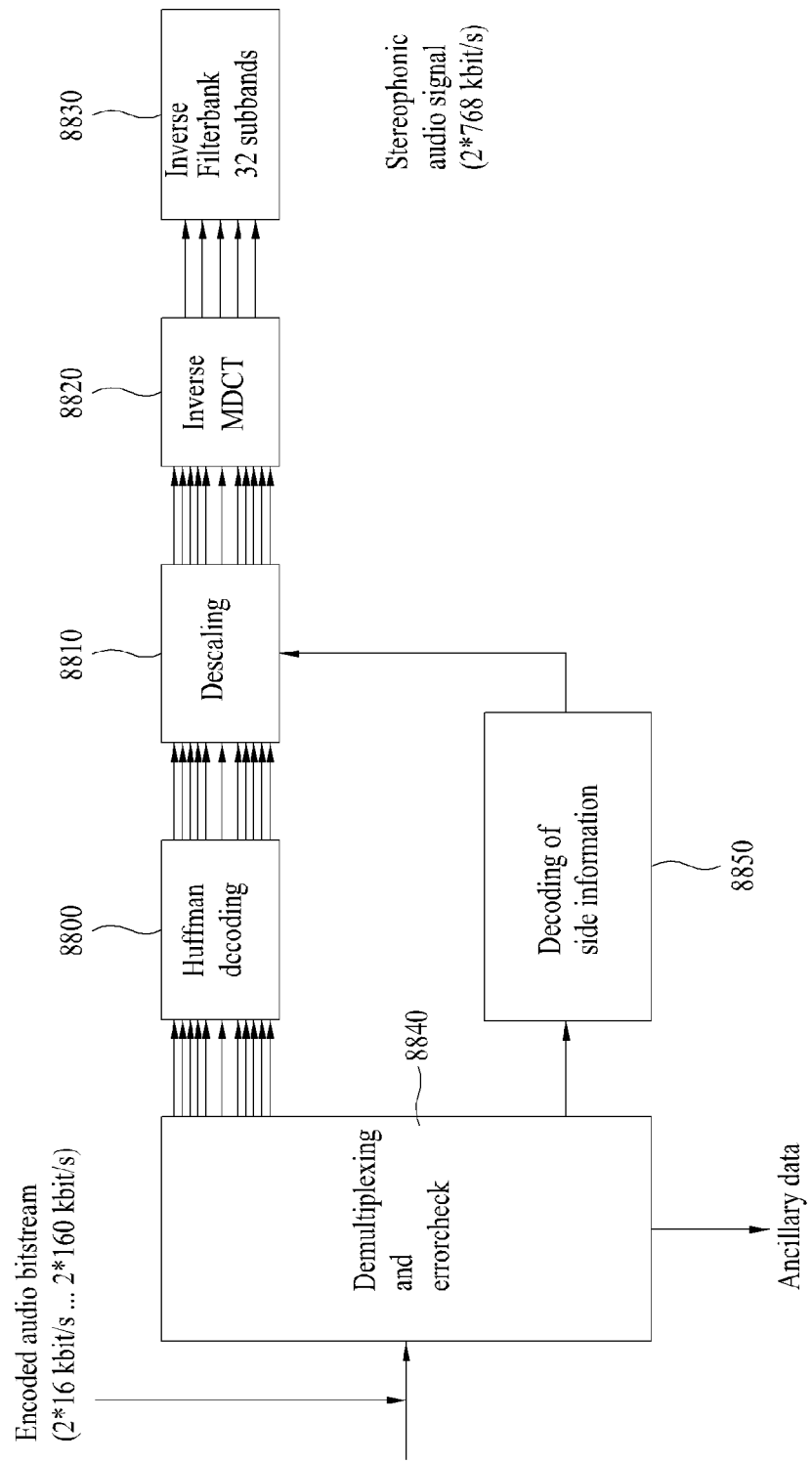
FIG. 88 is a block diagram illustrating a decoding device of the MPEG layer 3.

FIG. 88 is a block diagram illustrating a decoding device of the MPEG layer 3 which uses the filterbank according to one embodiment of the present invention. Referring to FIG. 88, the decoding device of the MPEG layer 3 includes a demultiplexing and error check unit 8840, a Huffman decoding unit 8800, a descaling unit 8810, an inverse MDCT unit 8820, an inverse filterbank 8830, and an additional information decoding unit 8850.

If the encoded bit stream is input to the demultiplexing and error check unit 8840, the demultiplexing and error check unit 8840 demultiplexes an audio bit stream, separates the audio signal from the additional information, and checks errors which may be encountered during a transmission time. The Huffman decoding unit 8800 decodes the encoded audio signal. The decoded audio signal along with the additional information generated from the additional information decoding unit 8850 is input to the descaling unit 8810.

The descaling unit 8810 adjusts a scale of the audio signal using the above-mentioned additional information. Then, the audio signal is input to the inverse MDCT 8820 and the inverse filterbank 8830. In more detail, the MPEG layer 3—encoding device uses the hybrid filterbank, so that the MPEG layer 3—decoding device converts the received audio signal into a time-domain audio signal via the hybrid filterbank, that is, via inverse MDCT unit 8820 and the inverse filterbank 8830.

The Time Domain Aliasing Cancellation (TDAC) scheme for use in the MDCT will hereinafter be described.

Figure 89:
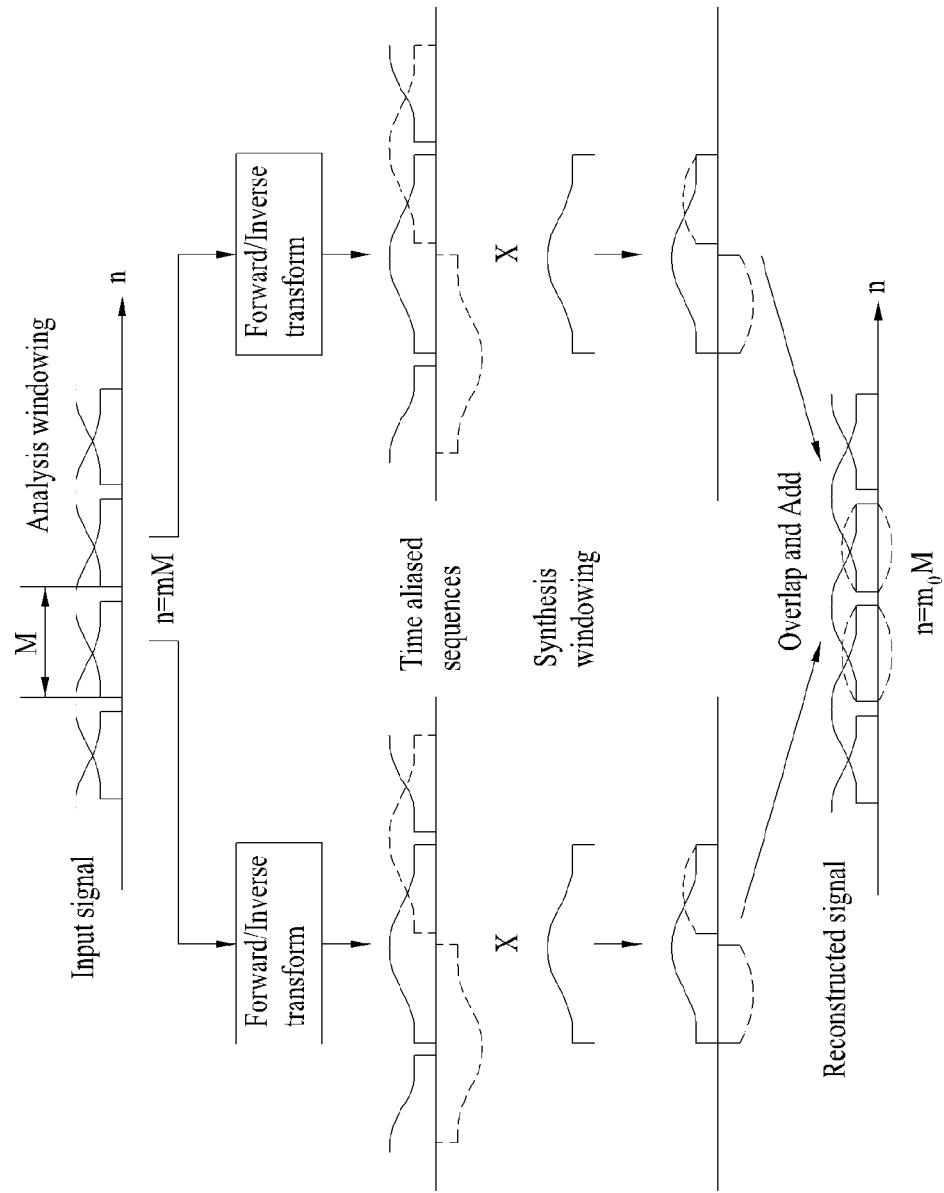
FIG. 89 is a conceptual diagram illustrating the MDCT/Inverse MDCT (IMDCT) and the windowing according to one embodiment of the present invention.

FIG. 89 is a conceptual diagram illustrating the MDCT/Inverse MDCT (IMDCT) and the windowing. In other words, FIG. 89 illustrates the process for offsetting or removing the aliasing by the TDAC scheme.

Referring to FIG. 89, if an input audio signal passes through the analysis windowing and the MDCT/IMDCT (See a Forward/Inverse Transform of FIG. 90), the audio signal is converted into a time-domain signal after passing through the frequency domain. In this case, the analysis window is applied to the audio signal, such that it overlaps with a neighboring window. For example, the analysis window may be applied to the audio signal such that it may overlap with the neighboring window by 50%.

If the audio signal of the frequency domain is converted into a time-domain audio signal, the aliasing phenomenon inevitably occurs. The dotted line of FIG. 89 is indicative of the aliasing. If the aliased audio signal passes through the synthesis window, there are the audio signal and the aliasing signal in the synthesis window. Then, audio signals generated from the synthesis window are summed up, such that the audio signals are overlapped with each other. In this case, the aliasing signals having opposite phases are summed up, such that the aliasing signal is removed from a restored audio signal. For example, the +90° aliasing signal, which is +90 degrees out of phase from an audio signal processed by the n-th window, is added to the −90° aliasing signal, which is −90 degrees out of phase from the other audio signal processed by the (n+1)-th window, such that the aliasing signal is removed.

In another embodiment of the transmitting system, mobile service data is transmitted on the basis of an Internet protocol (IP).

In one embodiment of the present invention, main service data is transmitted on the basis of an MPEG-2 and mobile service data is transmitted on the basis of the IP.

Figure 90:
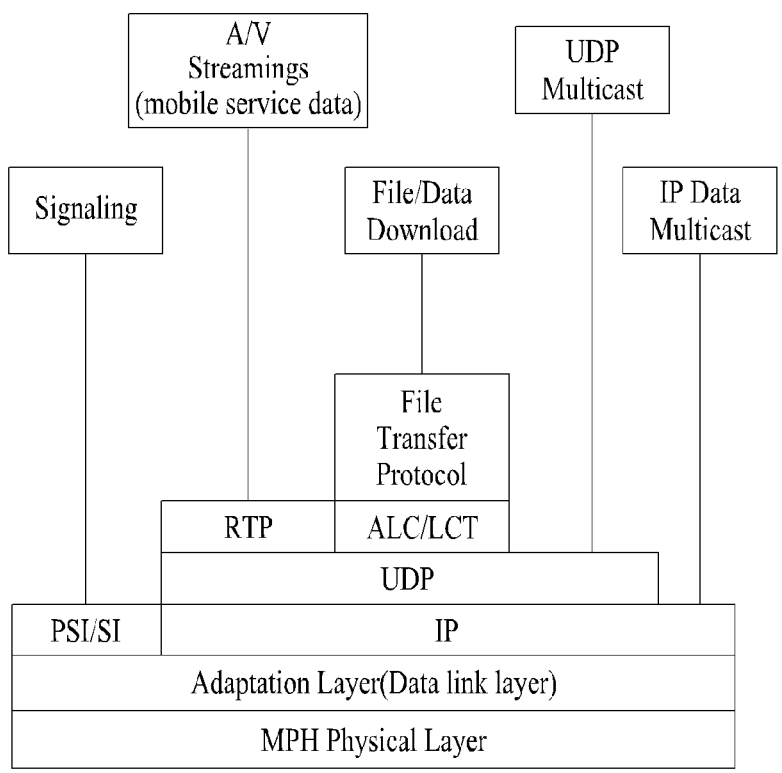
FIG. 90 is a view showing another embodiment of the protocol stack for the mobile service according to the present invention.

FIG. 90 shows another embodiment of a protocol stack for providing the IP-based mobile service in order to prevent the above-described problem.

In FIG. 90, an adaptation layer is interposed between the IP layer and the physical layer such that the IP datagram and the PSI/PSIP data are transmitted without using the MPEG-2 TS format.

Figure 91:
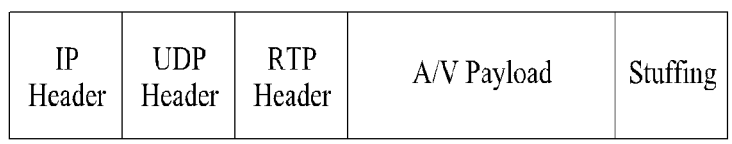
FIG. 91 is a view showing an example of an IP datagram generated by the protocol stack shown in FIG. 90.

Even in FIG. 90, the signaling for the mobile service is encapsulated to the PSI/PSIP section structure and is referred to as PSI/PSIP data, for convenience of description. A RTP header, a UDP header, and an IP header are sequentially prefixed to the A/V payload for the mobile service in order to configure the IP datagram as shown in FIG. 91. That is, Audio stream may be included in A/V Payload field of the IP datagram as shown in FIG. 91 and may be transmitted to a broadcast receiver. And the broadcast receiver receives the IP datagram including the Audio stream and restores audio signal by extracting an audio stream from the IP datagram.

The adaptation layer is a data link layer for dividing the IP datagram and the PSI/PSIP data of the section type and linking the data such that the divided data can be processed in the upper layer.

That is, in the adaptation layer, a RS frame including the PSI/PSIP data, the IP datagram and an identifier for identifying the PSI/PSIP data and the IP datagram is generated.

As described above, the present invention has the following advantages. More specifically, the present invention is highly protected against (or resistant to) any error that may occur when transmitting supplemental data through a channel. And, the present invention is also highly compatible to the conventional receiving system. Moreover, the present invention may also receive the supplemental data without any error even in channels having severe ghost effect and noise.

Furthermore, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of transmitting broadcast signals by a transmitting system, the method comprising:
generating FEC (Forward Error Correction) frames, wherein one of the FEC frames is generated by encoding at least one of broadcast data and signaling data to add first parity data, wherein the broadcast data include at least one of video data and audio data and wherein the signaling data include at least one of video codec information for the video data and audio codec information for the audio data;
dividing the FEC frame into a plurality of portions, wherein the plurality of portions have a same size;
interleaving data of the plurality of portions;
first encoding transmission parameters to add second parity data;
second encoding the first-encoded transmission parameters at a code rate; and
transmitting the broadcast signals including a transmission frame that contains the interleaved data and the second-encoded transmission parameters,
wherein the transmission parameters include information related to a number of the first parity data,
wherein the transmission frame comprises multiple sub-frames that are concatenated in time, and
wherein the transmission parameters further include information related to a sub-frame.

2. The method of claim 1, wherein the transmission parameters further include information related to fast service acquisition.

3. An apparatus for transmitting broadcast signals, the apparatus comprising:
an encoder to generate FEC frames, wherein one of the FEC frames is generated by encoding at least one of broadcast data and signaling data to add first parity data, wherein the broadcast data include at least one of video data and audio data and wherein the signaling data include at least one of video codec information for the video data and audio codec information for the audio data;
a divider to divide the FEC frame into a plurality of portions, wherein the plurality of portions have a same size;
an interleaver to interleave data of the plurality of portions;
a first signaling encoder to first encode transmission parameters to add second parity data;
a second signaling encoder to second encode the first-encoded transmission parameters at a code rate; and
a transmitter to transmit the broadcast signals including a transmission frame that contains the interleaved data and the second-encoded transmission parameters,
wherein the transmission parameters include information related to a number of the first parity data,
wherein the transmission frame comprises multiple sub-frames that are concatenated in time, and
wherein the transmission parameters further include information related to a sub-frame.

4. The apparatus of claim 3, wherein the transmission parameters further include information related to fast service acquisition.

5. A method of receiving broadcast signals by a receiving system, the method comprising:
receiving the broadcast signals including a transmission frame that includes broadcast data, signaling data, and transmission parameters, wherein the broadcast data include at least one of video data and audio data and wherein the signaling data include at least one of video codec information for the video data and audio codec information for the audio data;
demodulating the received broadcast signals;
decoding the transmission parameters in the transmission frame of the demodulated broadcast signals;
de-interleaving the broadcast data and the signaling data in the transmission frame of the demodulated broadcast signals; and
error correction decoding FEC frames based on parity data, wherein one of the FEC frames includes a plurality of portions that include at least one of the de-interleaved broadcast data and the de-interleaved signaling data, wherein the plurality of portions have a same size,
wherein the transmission parameters include information related to a number of the parity data,
wherein the transmission frame comprises multiple sub-frames that are concatenated in time, and
wherein the transmission parameters further include information related to a sub-frame.

6. The method of claim 5, wherein the transmission parameters further include information related to fast service acquisition.

7. The method of claim 5, further comprising:
decoding at least one of the video data and the audio data in the error correction decoded broadcast data, wherein the video data are decoded based on the video codec information in the signaling data and wherein the audio data are decoded based on the audio codec information in the signaling data.

8. An apparatus for receiving broadcast signals, the apparatus comprising:
a tuner to receive the broadcast signals including a transmission frame that includes broadcast data, signaling data, and transmission parameters, wherein the broadcast data include at least one of video data and audio data and wherein the signaling data include at least one of video codec information for the video data and audio codec information for the audio data;
a demodulator to demodulate the received broadcast signals;
a signaling decoder to decode the transmission parameters in the transmission frame of the demodulated broadcast signals;
a de-interleaver to de-interleave the broadcast data and the signaling data in the transmission frame of the demodulated broadcast signals; and
a decoder to error correction decode FEC frames based on parity data, wherein one of the FEC frames includes a plurality of portions that include at least one of the de-interleaved broadcast data and the de-interleaved signaling data, wherein the plurality of portions have a same size,
wherein the transmission parameters include information related to a number of the parity data,
wherein the transmission frame comprises multiple sub-frames that are concatenated in time, and
wherein the transmission parameters further include information related to a sub-frame.

9. The apparatus of claim 8, wherein the transmission parameters further include information related to fast service acquisition.

10. The apparatus of claim 8, further comprising:
an audio/video decoder to decode at least one of the video data and the audio data in the error correction decoded broadcast data, wherein the video data are decoded based on the video codec information in the signaling data and wherein the audio data are decoded based on the audio codec information in the signaling data.

* * * * *